(12) United States Patent
Yoshioka et al.

(10) Patent No.: US 9,351,402 B2
(45) Date of Patent: May 24, 2016

(54) CIRCUIT BOARD, AND SEMICONDUCTOR DEVICE HAVING COMPONENT MOUNTED ON CIRCUIT BOARD

(71) Applicant: Panasonic Corporation, Osaka (JP)

(72) Inventors: Shingo Yoshioka, Osaka (JP); Hiroaki Fujiwara, Fukushima (JP); Hiromitsu Takashita, Osaka (JP); Tsuyoshi Takeda, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/554,334

(22) Filed: Nov. 26, 2014

(65) Prior Publication Data

US 2015/0156873 A1 Jun. 4, 2015

Related U.S. Application Data

(62) Division of application No. 13/504,281, filed as application No. PCT/JP2010/006378 on Oct. 28, 2010, now Pat. No. 8,929,092.

(30) Foreign Application Priority Data

| Oct. 30, 2009 | (JP) | 2009-251269 |
| Oct. 30, 2009 | (JP) | 2009-251378 |
| Nov. 4, 2009 | (JP) | 2009-253130 |
| Nov. 4, 2009 | (JP) | 2009-253501 |
| Nov. 4, 2009 | (JP) | 2009-253502 |

(51) Int. Cl.
*H05K 1/09* (2006.01)
*H05K 1/11* (2006.01)
(Continued)

(52) U.S. Cl.
CPC ............ *H05K 1/111* (2013.01); *H01L 21/4846* (2013.01); *H01L 23/49811* (2013.01);
(Continued)

(58) Field of Classification Search
CPC ............ H05K 1/00; H05K 1/02; H05K 1/11; H05K 1/16; H05K 3/00; H05K 3/10; H01B 5/00; H01L 23/24; H01L 23/29; H01L 23/48
USPC ................. 174/251, 250, 255, 258, 262, 266; 361/783, 767; 257/700, 774; 29/846
See application file for complete search history.

(56) References Cited

U.S. PATENT DOCUMENTS

| 4,808,360 A | 2/1989 | Natori et al. |
| 4,820,762 A | 4/1989 | Tsaur |

(Continued)

FOREIGN PATENT DOCUMENTS

| CN | 1725474 | 1/2006 |
| CN | 1860832 | 11/2006 |

(Continued)

OTHER PUBLICATIONS

Chinese Office Action issued Jul. 28, 2014 in corresponding Chinese Patent Application No. 201210362390.8 (with partial translation).

(Continued)

*Primary Examiner* — Xiaoliang Chen
(74) *Attorney, Agent, or Firm* — Wenderoth, Lind & Ponack, L.L.P.

(57) ABSTRACT

A circuit board includes an electric circuit having a wiring section and a pad section in the surface of an insulating base substrate. The electric circuit is configured such that a conductor is embedded in a circuit recess formed in the surface of the insulating base substrate, and the surface roughness of the conductor is different in the wiring section and the pad section of the electric circuit. In this case, it is preferable that the surface roughness of the conductor in the pad section is greater than the surface roughness of the conductor in the wiring section.

2 Claims, 28 Drawing Sheets

(51) Int. Cl.
*H01L 21/48* (2006.01)
*H01L 23/498* (2006.01)
*H05K 3/10* (2006.01)
*H05K 3/18* (2006.01)
*H05K 3/38* (2006.01)
*H01L 23/00* (2006.01)

(52) U.S. Cl.
CPC ........... *H05K3/107* (2013.01); *H01L 24/16* (2013.01); *H01L 24/81* (2013.01); *H01L 2224/16237* (2013.01); *H01L 2224/81191* (2013.01); *H01L 2224/81385* (2013.01); *H01L 2924/12042* (2013.01); *H01L 2924/3011* (2013.01); *H05K 3/184* (2013.01); *H05K 3/38* (2013.01); *H05K 2201/0373* (2013.01); *H05K 2201/0391* (2013.01); *H05K 2201/09736* (2013.01); *H05K 2201/2072* (2013.01); *H05K 2203/0307* (2013.01); *H05K 2203/0565* (2013.01); *Y02P 70/611* (2015.11); *Y10T 29/49155* (2015.01)

(56) References Cited

U.S. PATENT DOCUMENTS

| | | | |
|---|---|---|---|
| 4,865,873 A | 9/1989 | Cole, Jr. et al. | |
| 5,041,356 A | 8/1991 | Takeda et al. | |
| 5,266,446 A | 11/1993 | Chang et al. | |
| 5,523,174 A | 6/1996 | Tamaki | |
| 5,643,483 A | 7/1997 | Kubota et al. | |
| 5,650,640 A | 7/1997 | Stafford et al. | |
| 5,760,466 A | 6/1998 | Masuri et al. | |
| 5,792,595 A | 8/1998 | Takayanagi et al. | |
| 5,917,531 A | 6/1999 | Nagahata et al. | |
| 6,004,619 A | 12/1999 | Dippon et al. | |
| 6,133,066 A * | 10/2000 | Murakami | 438/108 |
| 6,184,479 B1 | 2/2001 | Okabe et al. | |
| 6,204,454 B1 * | 3/2001 | Gotoh et al. | 174/255 |
| 6,246,249 B1 * | 6/2001 | Fukasawa et al. | 324/756.02 |
| 6,413,687 B1 | 7/2002 | Hattori et al. | |
| 6,448,504 B1 | 9/2002 | Taguchi | |
| 6,640,434 B1 | 11/2003 | Wojewnik et al. | |
| 6,937,044 B1 * | 8/2005 | Agahdel et al. | 324/756.02 |
| 8,225,502 B2 | 7/2012 | Kaneko | |
| 2001/0030013 A1 | 10/2001 | Bezama et al. | |
| 2001/0052183 A1 | 12/2001 | Iba et al. | |
| 2002/0117400 A1 | 8/2002 | Hotta | |
| 2002/0197458 A1 * | 12/2002 | Peng et al. | 428/209 |
| 2003/0148904 A1 | 8/2003 | Moore | |
| 2003/0160339 A1 | 8/2003 | Ikegami et al. | |
| 2004/0134682 A1 | 7/2004 | En et al. | |
| 2004/0197487 A1 | 10/2004 | Aoki et al. | |
| 2005/0067378 A1 | 3/2005 | Fuerhaupter et al. | |
| 2005/0163919 A1 | 7/2005 | Murata | |
| 2005/0202261 A1 | 9/2005 | Takai et al. | |
| 2005/0258522 A1 | 11/2005 | En et al. | |
| 2006/0012920 A1 * | 1/2006 | Kobae et al. | 360/245.9 |
| 2006/0055021 A1 | 3/2006 | Yamamoto | |
| 2006/0165877 A1 | 7/2006 | Yanagimoto et al. | |
| 2006/0237855 A1 | 10/2006 | Kroehnert et al. | |
| 2007/0013049 A1 | 1/2007 | Asai et al. | |
| 2007/0072425 A1 * | 3/2007 | Kikui | H05K 1/053 438/692 |
| 2007/0185297 A1 * | 8/2007 | Tanaka | B32B 7/04 528/10 |
| 2007/0218192 A1 | 9/2007 | Kimura et al. | |
| 2007/0267650 A1 * | 11/2007 | Hsieh | 257/99 |
| 2008/0008824 A1 | 1/2008 | Cho et al. | |
| 2008/0014336 A1 | 1/2008 | Asai et al. | |
| 2008/0023815 A1 | 1/2008 | Asai et al. | |
| 2009/0035541 A1 * | 2/2009 | Yokozawa | B32B 15/08 428/209 |
| 2009/0039486 A1 * | 2/2009 | Shimazaki et al. | 257/676 |
| 2009/0051041 A1 | 2/2009 | Otsuka et al. | |
| 2009/0078451 A1 * | 3/2009 | Niki et al. | 174/250 |
| 2009/0095514 A1 | 4/2009 | Kaneko | |
| 2009/0229857 A1 | 9/2009 | Fredenberg et al. | |
| 2009/0272562 A1 * | 11/2009 | Yoshioka et al. | 174/250 |
| 2009/0272564 A1 * | 11/2009 | Yoshioka et al. | 174/255 |
| 2010/0038124 A1 | 2/2010 | Liu et al. | |
| 2010/0044087 A1 | 2/2010 | Fukuhara et al. | |
| 2010/0065322 A1 * | 3/2010 | Ogawa et al. | 174/262 |
| 2010/0065324 A1 | 3/2010 | Liu et al. | |
| 2010/0218982 A1 | 9/2010 | Fujiwara et al. | |
| 2010/0263921 A1 | 10/2010 | Nakahara et al. | |
| 2010/0264549 A1 | 10/2010 | Ko et al. | |
| 2010/0270057 A1 | 10/2010 | Yanagimoto et al. | |
| 2010/0289098 A1 | 11/2010 | Li et al. | |

FOREIGN PATENT DOCUMENTS

| | | |
|---|---|---|
| DE | 196 45 854 | 5/1998 |
| EP | 0 260 514 | 3/1988 |
| EP | 0 817 549 | 1/1998 |
| EP | 1 487 018 | 12/2004 |
| JP | 57-134996 | 8/1982 |
| JP | 58-186994 | 11/1983 |
| JP | 63-183445 | 7/1988 |
| JP | 2-68988 | 3/1990 |
| JP | 06-268095 | 9/1994 |
| JP | 06-283536 | 10/1994 |
| JP | 7-281437 | 10/1995 |
| JP | 7-509322 | 10/1995 |
| JP | 10-78654 | 3/1998 |
| JP | 10-233562 | 9/1998 |
| JP | 11-212262 | 8/1999 |
| JP | 2000-231190 | 8/2000 |
| JP | 2000-236145 | 8/2000 |
| JP | 2000-236149 | 8/2000 |
| JP | 2000-261143 | 9/2000 |
| JP | 2001-201851 | 7/2001 |
| JP | 2001-251042 | 9/2001 |
| JP | 2002-252445 | 9/2002 |
| JP | 2002-353219 | 12/2002 |
| JP | 2002-361475 | 12/2002 |
| JP | 2003-46243 | 2/2003 |
| JP | 2003-209343 | 7/2003 |
| JP | 2003-264359 | 9/2003 |
| JP | 2003-273484 | 9/2003 |
| JP | 2003-309346 | 10/2003 |
| JP | 2004-48030 | 2/2004 |
| JP | 2004-281427 | 10/2004 |
| JP | 2004-349357 | 12/2004 |
| JP | 2005/167059 | 6/2005 |
| JP | 2007-88288 | 4/2007 |
| JP | 2008-22002 | 1/2008 |
| JP | 2008-58710 | 3/2008 |
| JP | 2008-205331 | 9/2008 |
| JP | 2008-218459 | 9/2008 |
| JP | 2009-238896 | 10/2009 |
| WO | 88/05252 | 7/1988 |
| WO | 94/01985 | 1/1994 |
| WO | 2005/104638 | 11/2005 |

OTHER PUBLICATIONS

Supplementary European Search Report issued May 24, 2012 in European Patent Application No. EP 09 83 0368.

International Search Report issued Jan. 26, 2010 in International (PCT) Application No. PCT/JP2009/070106.

Partial European Search Report issued May 15, 2012 in European Patent Application No. EP 12 00 1246.

U.S. Office Action issued Apr. 12, 2012 in U.S. Appl. No. 12/431,950.

International Search Report issued Jan. 11, 2011 in International (PCT) Application No. PCT/JP2010/006378.

European Office Action issued Dec. 13, 2012 in European Patent Application No. 09 830 368.8.

European Search Report issued Apr. 15, 2013 in European Patent Application No. EP 13 00 0238.9.

(56) References Cited

OTHER PUBLICATIONS

European Office Action issued Apr. 18, 2013 in European Patent Application No. 12 001 246.3.
Extended European Search Report issued Dec. 9, 2013 in corresponding European Application No. 10826347.6.
U.S. Office Action issued May 14, 2015 in corresponding U.S. Appl. No. 14/481,188.
Office Action issued Aug. 14, 2015 in corresponding U.S. Appl. No. 13/562,500.
US Final Office Action issued Oct. 5, 2015 in corresponding U.S. Appl. No. 14/481,188.

* cited by examiner

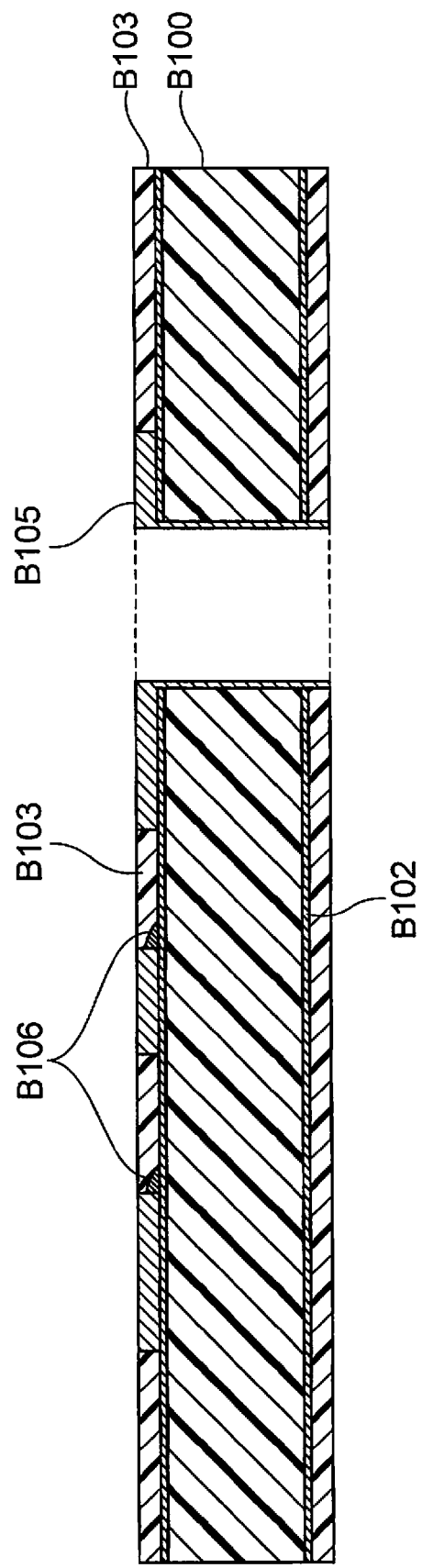

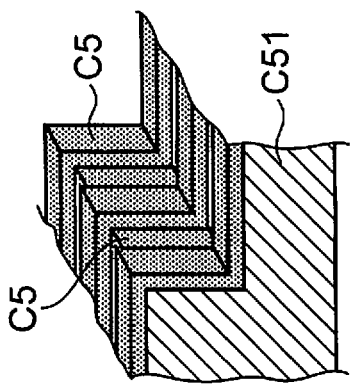
FIG.15B
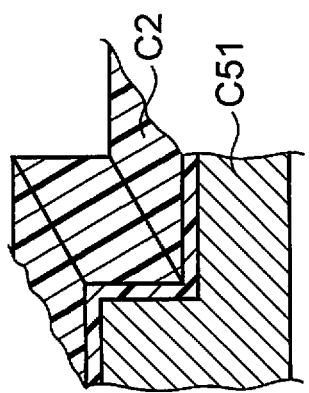
FIG.15A
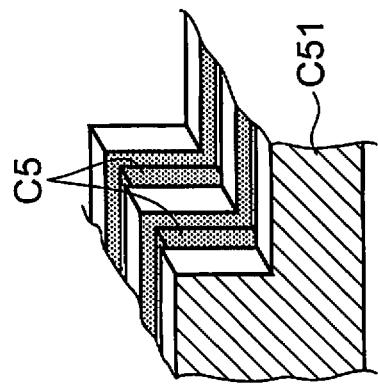
FIG.15D
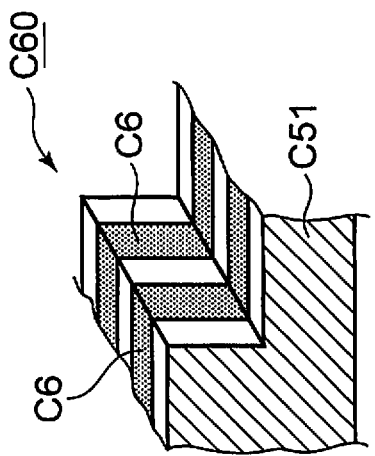
FIG.15C
FIG.15E

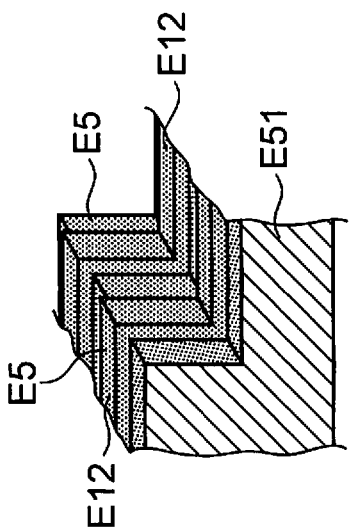
FIG.21A
FIG.21B
FIG.21C
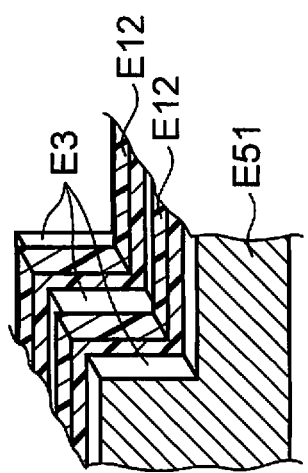
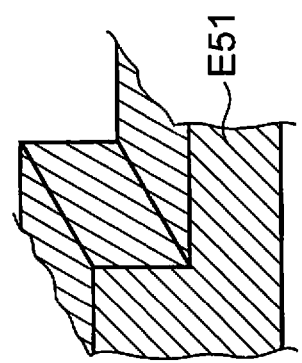
FIG.21D
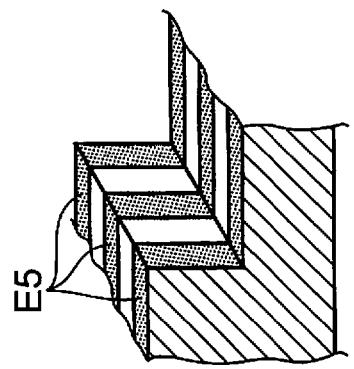
FIG.21E
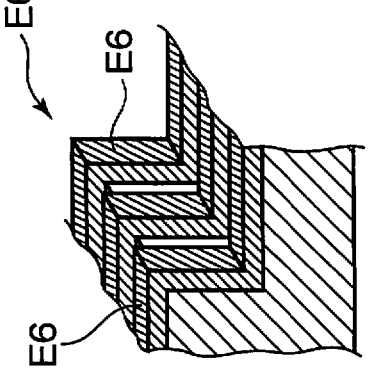

I1···INSULATING BASE SUBSTRATE
I7···ELECTRIC CIRCUIT
I8···PAD SECTION

A···CIRCUIT BOARD
J1···INSULATING BASE SUBSTRATE
J3···CIRCUIT TRENCH
J6···ELECTRIC CIRCUIT
J30···HIGH-DENSITY PORTION
J31···LOW-DENSITY PORTION

CIRCUIT BOARD, AND SEMICONDUCTOR DEVICE HAVING COMPONENT MOUNTED ON CIRCUIT BOARD

BACKGROUND OF THE INVENTION

1. Technical Field

The present invention pertains to the technical field of circuit boards and semiconductor devices.

2. Background Art

As disclosed in, for example, Patent Document 1 (paragraph 0015), it is conventionally known that an embedded circuit forming technique using CMP (Chemical Mechanical Polishing) processing is used in a method for producing a semiconductor integrated circuit device.

Specifically, as shown in FIG. 5, the circuit forming technique using CMP processing includes the steps of: forming a wiring trench (wiring groove) b in the surface of an insulating base substrate a (FIG. 5A); forming a metal member layer c on the surface of the insulating base substrate a and in the wiring trench b so as to fill the wiring trench b (FIG. 5B); and forming an embedded circuit d by removing the metal member layer c that is outside the wiring trench b by CMP processing (FIG. 5C).

CITATION LIST

Patent Literature

Patent Literature 1: JP 2009-238896A

SUMMARY OF THE INVENTION

As shown in FIG. 5D, it is often the case that the circuit d includes a wiring section e and a pad section f, and a component x, such as a semiconductor chip, is mounted on the pad section f via a solder bump. However, because the surface of the circuit d has been polished by CMP processing, the surface of the wiring section e and the surface of the pad section f have also been planarized and thus are very smooth. Consequently, there is a possibility that the adhesion of solder to the pad section f might be reduced, causing a poor connection and reducing the reliability of the semiconductor device.

In view of the above, it is a primary object of the present invention to improve the adhesion of solder to a pad section of an electric circuit provided in the surface of a circuit board, as well as improving the mountability of a component on the circuit board. Other objects of the present invention will be apparent as the following description of the configuration and effects of the present invention proceeds.

Specifically, an aspect of the present invention is a circuit board in which an electric circuit including a wiring section and a pad section is provided on a surface of an insulating base substrate, wherein the electric circuit has a configuration in which a conductor is embedded in a circuit recess formed in the surface of the insulating base substrate, and a surface roughness of the conductor is different in the wiring section and the pad section of the electric circuit.

According to this configuration, the surface roughness of the conductor in the pad section and the surface roughness of the conductor in the wiring section are not the same. In contrast, in the embedded circuit forming technique using CMP processing, the entirety of the insulating base substrate surface and the circuit surface are polished, and therefore the surface roughness of the conductor in the pad section and the surface roughness of the conductor in the wiring section are always the same. When the surface roughness of the conductor in the pad section is greater than the surface roughness of the conductor in the wiring section, the adhesion of solder when a component such as a semiconductor chip is mounted on the pad section is improved, and the mountability of the component on the circuit board is improved. In the wiring section, the surface roughness of the conductor is relatively small, and thus the wiring will have an approximately constant cross-sectional area, as a result of which the speed of transmission of signals is stabilized. On the other hand, when the surface roughness of the conductor in the pad section is smaller than the surface roughness of the conductor in the wiring section, the following advantages can be obtained. Specifically, because the pad section has a relatively large area, when the surface roughness of the conductor in the pad section is relatively large, the flowability of a resin sealant for packaging is reduced. Accordingly, when the surface roughness of the conductor in the pad section is smaller than the surface roughness of the conductor in the wiring section, it is possible to suppress reduction of the flowability of the resin sealant and to obtain an excellent package that does not have voids or the like.

In the above configuration, it is preferable that the surface roughness of the conductor in the pad section is greater than the surface roughness of the conductor in the wiring section. This is because both improvement of the mountability of the component on the circuit board and stabilization of the speed of transmission of signals are achieved.

In the case where the surface roughness of the conductor in the pad section is greater than the surface roughness of the conductor in the wiring section, it is preferable that a ratio (RzPT/RzLT) between a ten-point average roughness (RzPT) of the surface of the conductor in the pad section and a ten-point average roughness (RzLT) of the surface of the conductor in the wiring section is 2 or greater ((RzPT/RzLT) ≥2). This is because the effect of improving the adhesion of solder when a component is mounted on the pad section and the effect of stabilizing the speed of transmission of signals in the wiring section can be reliably obtained. From this point of view, the ratio (RzPT/RzLT) is preferably 5 or greater ((RzPT/RzLT)≥5), and more preferably 10 or greater ((RzPT/RzLT)≥10).

Also, in the case where the surface roughness of the conductor in the pad section is greater than the surface roughness of the conductor in the wiring section, it is preferable that fine recesses in the shape of a line, curve, grid, ring, spiral, zig-zag and/or dot are formed in the surface of the conductor in the pad section when planarly viewed. This is because the effect of improving the adhesion of solder in the pad section can be obtained by simply forming a simple shape in the surface of the conductor in the pad section.

In this case, it is preferable that fine recesses in a shape of a line, curve, grid, ring, spiral, zig-zag and/or dot are formed in a bottom surface of the circuit recess in the pad section when planarly viewed, and as a result of the conductor following the shape of the bottom surface of the circuit recess in the pad section, the fine recesses are formed in the surface of the conductor in the pad section. This eliminates the need to form the fine recesses in the surface of the conductor in the pad section and therefore shortens the process. For example, by depositing the conductor on the circuit recess by electroless plating, the conductor can follow the shape of the bottom surface of the circuit recess in the pad section.

In the case where the conductor follows the shape of the bottom surface of the circuit recess in the pad section, it is preferable that the ratio (RzT/RzB) between the ten-point average roughness (RzT) of the surface of the conductor and the ten-point average roughness (RzB) of the bottom surface of the circuit recess is 0.1 or greater and 2.0 or less (0.1≤(RzT/RzB)≤2.0). This is because the shape of the bottom surface of the circuit recess in the pad section is reliably reflected to the shape of the surface of the conductor in the pad section, and the fine recesses are reliably formed in the surface of the conductor in the pad section. From this point of view, it is more preferable that the ratio (RzT/RzB) is 0.5 or greater and 1.2 or less (0.5≤(RzT/RzB)≤1.2).

Another aspect of the present invention is a circuit board in which an electric circuit including a wiring section and a pad section is provided on a surface of an insulating base substrate, wherein the electric circuit has a configuration in which a conductor is embedded in a circuit recess formed in the surface of the insulating base substrate, and a surface roughness of a bottom surface of the circuit recess is different in the wiring section and the pad section of the electric circuit.

According to this configuration, in the case where the surface roughness of the bottom surface of the circuit recess in the pad section is greater than the surface roughness of the bottom surface of the circuit recess in the wiring section, excellent bonding strength of the conductor to the insulating base substrate is obtained in the pad section, and separation of the conductor in the pad section from the insulating base substrate is suppressed. On the other hand, in the case where the surface roughness of the bottom surface of the circuit recess in the wiring section is greater than the surface roughness of the bottom surface of the circuit recess in the pad section, excellent bonding strength of the conductor to the insulating base substrate is obtained in the wiring section, and separation of the conductor in the wiring section from the insulating base substrate is suppressed.

In the above configuration, it is preferable that the surface roughness of the bottom surface of the circuit recess in the pad section is greater than the surface roughness of the bottom surface of the circuit recess in the wiring section. This is because separation of the component mounted on the pad section from the insulating base substrate is also suppressed.

In the case where the surface roughness of the bottom surface of the circuit recess in the pad section is greater than the surface roughness of the bottom surface of the circuit recess in the wiring section, it is preferable that the ratio (RzPB/RzLB) between the ten-point average roughness (RzPB) of the bottom surface of the circuit recess in the pad section and the ten-point average roughness (RzLB) of the bottom surface of the circuit recess in the wiring section is 2 or greater ((RzPB/RzLB)≥2). This is because the effect of suppressing separation of the conductor in the pad section from the insulating base substrate and the effect of suppressing separation of the component mounted on the pad section from the insulating base substrate are reliably obtained. From this point of view, more preferably, the ratio (RzPB/RzLB) is 5 or greater ((RzPB/RzLB)≥5), and even more preferably 10 or greater ((RzPB/RzLB)≥10).

Also, in the case where the surface roughness of the bottom surface of the circuit recess in the pad section is greater than the surface roughness of the bottom surface of the circuit recess in the wiring section, it is preferable that fine recesses in the shape of a line, curve, grid, ring, spiral, zig-zag and/or dot are formed in the bottom surface of the circuit recess in the pad section when planarly viewed. This is because the effect of suppressing separation of the conductor in the pad section from the insulating base substrate and the effect of suppressing separation of the component mounted on the pad section from the insulating base substrate are obtained by simply forming a simple shape in the bottom surface of the circuit recess in the pad section.

In this case, it is preferable that fine recesses in a shape of a line, curve, grid, ring, spiral, zig-zag and/or dot are formed in the surface of the conductor in the pad section when planarly viewed, as a result of the conductor following the shape of the bottom surface of the circuit recess in the pad section. This is because the adhesion of solder when a component such as a semiconductor chip is mounted on the pad section is improved, and the mountability of the component on the circuit board is improved. This also eliminates the need to form the fine recesses in the surface of the conductor in the pad section and therefore shortens the process. For example, by depositing the conductor on the circuit recess by electroless plating, the conductor can follow the shape of the bottom surface of the circuit recess in the pad section.

Also, in the case where the conductor follows the shape of the bottom surface of the circuit recess in the pad section, it is preferable that the ratio (RzT/RzB) between the ten-point average roughness (RzT) of the surface of the conductor and the ten-point average roughness (RzB) of the bottom surface of the circuit recess is 0.1 or greater and 2.0 or less (0.1≤(RzT/RzB)≤2.0). This is because the shape of the bottom surface of the circuit recess in the pad section is reliably reflected to the shape of the surface of the conductor in the pad section, and the fine recesses are reliably formed in the surface of the conductor in the pad section. From this point of view, it is more preferable that the ratio (RzT/RzB) is 0.5 or greater and 1.2 or less (0.5≤(RzT/RzB)≤1.2).

Still another aspect of the present invention is a semiconductor device in which a component is mounted on the pad section of the circuit board configured as described above.

According to the circuit board and semiconductor device of the present invention, it is possible to improve the adhesion of solder to the pad section of the electric circuit provided in the surface of the circuit board, as well as improving the mountability of a component on the circuit board. It is also possible to stabilize the speed of transmission of signals in the wiring section. Furthermore, it is possible to suppress reduction of the flowability of the resin sealant and to obtain an excellent package that does not have voids or the like. It is also possible to suppress separation of the conductor in the wiring section from the insulating base substrate, separation of the conductor in the pad section from the insulating base substrate, and separation of the component mounted on the pad section from the insulating base substrate.

BRIEF DESCRIPTION OF THE DRAWINGS

FIG. 11 is a schematic cross-sectional view illustrating the contour of a circuit formed by the conventional full additive method.

FIGS. 15A-15E show schematic cross-sectional views illustrating respective steps of a method for producing a three-dimensional circuit board according to Embodiment 3-2.

FIGS. 21A-21E show schematic cross-sectional views illustrating respective steps for producing a three-dimensional circuit board according to Embodiment 4-2.

DETAILED DESCRIPTION OF THE INVENTION

Figure 1A:
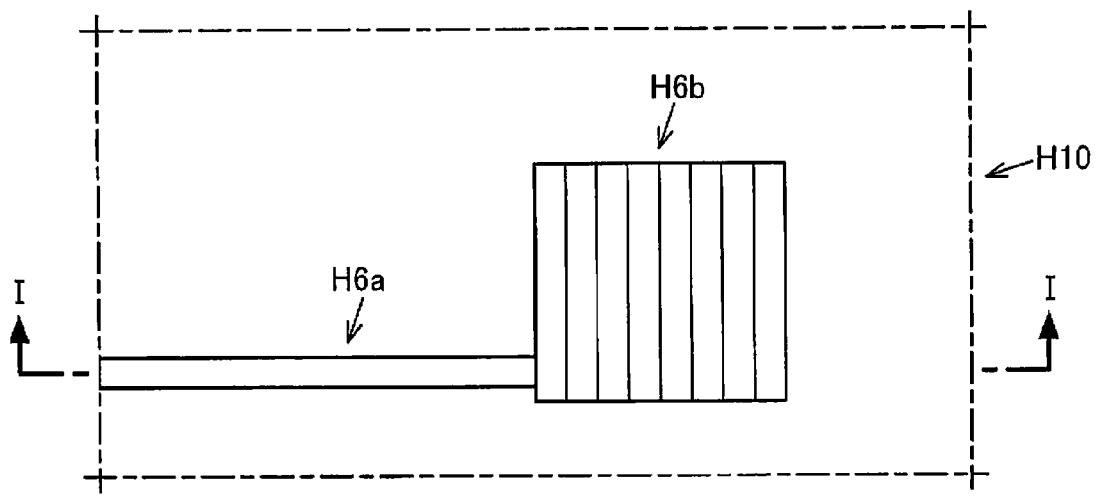
FIG. 1A is a partially enlarged plan view of a circuit board according to an embodiment of the present invention.

As shown in FIGS. 1A and B, a circuit board H10 according to the present embodiment is a circuit board H10 in which an electric circuit H6 including a wiring section H6a and a pad section H6b is provided in the surface of an insulating base substrate H1. The electric circuit H6 (embedded circuit) has a configuration in which a conductor H5 is embedded in a circuit recess H3 formed in the surface of the insulating base substrate H1. The surface roughness of the conductor H5 is different in the wiring section H6a and in the pad section H6b in the electric circuit H6.

Particularly, in the present embodiment, the surface roughness of the conductor H5 in the pad section H6b is greater than the surface roughness of the conductor H5 in the wiring section H6a. By doing so, in the pad section H6b, the surface roughness of the conductor H5 is relatively large, and therefore the adhesion of solder when a component H20 (see FIG. 3) such as a semiconductor chip is mounted on the pad section H6b is improved, and the mountability of the component H20 to the circuit board H10 is improved. Also, in the wiring section H6a, the surface roughness of the conductor H5 is relatively small, and therefore the wiring will have an approximately constant cross-sectional area, as a result of which the speed of transmission of signals is stabilized. In other words, both improvement of the mountability of the component on the circuit board H10 and stabilization of the speed of transmission of signals are achieved.

In the present embodiment, the ratio (RzPT/RzLT) between the ten-point average roughness (RzPT) of the surface of the conductor H5 in the pad section H6b and the ten-point average roughness (RzLT) of the surface of the conductor H5 in the wiring section H6a is 2 or greater ((RzPT/RzLT)≥2). By doing so, the effect of improving the adhesion of solder when the component H20 is mounted on the pad section H6b and the effect of stabilizing the speed of transmission of signals in the wiring section H6a are reliably obtained. From this point of view, it is more preferable that the ratio (RzPT/RzLT) is 5 or greater ((RzPT/RzLT)≥5) and more preferably 10 or greater ((RzPT/RzLT)≥10).

In the case where the ratio (RzPT/RzLT) is excessively small, the effect of improving the adhesion of solder when the component H20 is mounted on the pad section H6b and the effect of stabilizing the speed of transmission of signals in the wiring section H6a will be insufficient. In the case where the ratio (RzPT/RzLT) is excessively large, a large amount of solder will be required when the component H20 is mounted on the pad section H6b, which makes microprocessing difficult.

In the present embodiment, linear fine recesses are formed in the surface of the conductor H5 in the pad section H6b when planarly viewed. The linear fine recesses make the surface roughness of the conductor H5 in the pad section H6b greater than the surface roughness of the conductor H5 in the wiring section H6a. By simply forming a simple shape in the surface of the conductor H5 in the pad section H6b, the effect of improving the adhesion of solder to the pad section H6b is obtained.

In the present embodiment, in the circuit recess H3, linear fine recesses are formed in the bottom surface of a circuit recess H3b (see FIG. 2B) in the pad section H6b when planarly viewed. As a result of the conductor H5 following the shape of the linear fine recesses formed in the bottom, the fine recesses are formed in the surface of the conductor H5 in the pad section H6b. This eliminates the need to form the fine recesses in the surface of the conductor H5 in the pad section H6b and therefore shortens the process.

In the present embodiment, the ratio (RzT/RzB) between the ten-point average roughness (RzT) of the surface of the conductor H5 and the ten-point average roughness (RzB) of the bottom surface of the circuit recess H3 is 0.1 or greater and 2.0 or less ($0.1 \leq (RzT/RzB) \leq 2.0$). By doing so, the shape of the bottom surface of the circuit recess H3b in the pad section H6b is reliably reflected to the shape of the surface of the conductor H5 in the pad section H6b, as a result of which the fine recesses are reliably formed in the surface of the conductor H5 in the pad section H6b. From this point of view, it is more preferable that the ratio (RzT/RzB) is 0.5 or greater and 1.2 or less ($0.5 \leq (RzT/RzB) \leq 1.2$).

In the case where the ratio (RzT/RzB) is excessively small, the effect in which as a result of the shape of the bottom surface of the circuit recess H3b in the pad section H6b being reflected to the shape of the surface of the conductor H5 in the pad section H6b, the fine recesses are formed in the surface of the conductor H5 in the pad section H6b will be insufficient. In the case where the ratio (RzT/RzB) is excessively large, in the wiring section H6a, the effect of stabilizing the speed of transmission of signals will be insufficient, and in the pad section H6b, a large amount of solder will be required when the component H20 is mounted on the pad section H6b, which makes microprocessing difficult.

Figure 1B:
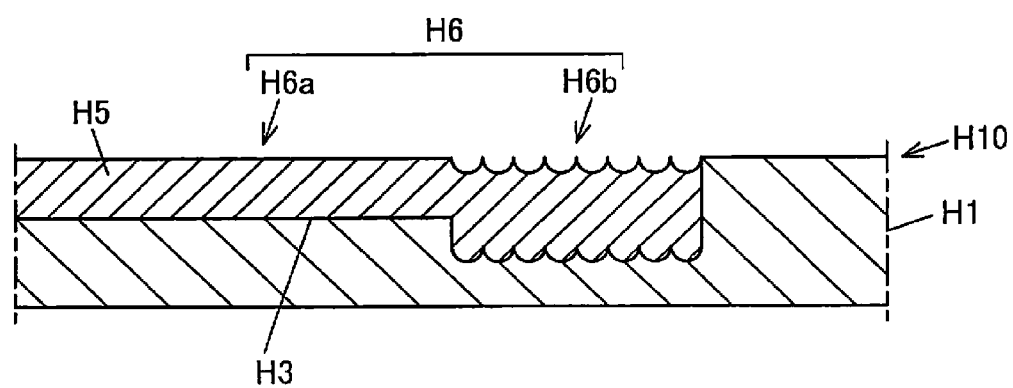
FIG. 1B is a cross-sectional view taken along the line I-I.

Similarly, as shown in FIGS. 1A and 1B, a circuit board H10 according to the present embodiment is a circuit board H10 in which an electric circuit H6 including a wiring section H6a and a pad section H6b is provided in the surface of an insulating base substrate H1. The electric circuit H6 (embedded circuit) has a configuration in which a conductor H5 is embedded in a circuit recess H3 formed in the surface of the insulating base substrate H1. The surface roughness of the bottom surface of the circuit recess H3 is different in the wiring section H6a and in the pad section H6b in the electric circuit H6.

Particularly, in the present embodiment, the surface roughness of the bottom surface of the circuit recess H3b (see FIG. 2B) in the pad section H6b is greater than the surface roughness of the bottom surface of the circuit recess H3a (see FIG. 2B) in the wiring section H6a. By doing so, in the pad section H6b, excellent bonding strength of the conductor H5 to the insulating base substrate H1 is obtained, and separation of the conductor H5 in the pad section H6b from the insulating base substrate H1 is suppressed. Separation of a component H20 (see FIG. 3) such as a semiconductor chip mounted on the pad section H6b from the insulating base substrate H1 is also suppressed.

In the present embodiment, the ratio (RzPB/RzLB) between the ten-point average roughness (RzPB) of the bottom surface of the circuit recess H3b in the pad section H6b and the ten-point average roughness (RzLB) of the bottom surface of the circuit recess H3a in the wiring section H6a is 2 or greater (($RzPB/RzLB) \geq 2$). By doing so, the effect of suppressing separation of the conductor H5 in the pad section H6b from the insulating base substrate H1 and the effect of suppressing separation of the component H20 mounted on the pad section H6b from the insulating base substrate H1 are reliably obtained. From this point of view, it is more preferable that the ratio (RzPB/RzLB) is 5 or greater (($RzPB/RzLB) \geq 5$) and even more preferably 10 or greater (($RzPB/RzLB) \geq 10$).

In the case where the ratio (RzPB/RzLB) is excessively small, the effect of suppressing separation of the conductor H5 in the pad section H6b from the insulating base substrate H1 and the effect of suppressing separation of the component H20 mounted on the pad section H6b from the insulating base substrate H1 will be insufficient. In the case where the ratio (RzPB/RzLB) is excessively large, the circuit recess H3b in the pad section H6b needs to be recessed more than necessary, causing waste processing.

In the present embodiment, linear fine recesses are formed in the bottom surface of the circuit recess H3b in the pad section H6b when planarly viewed. The linear fine recesses make the surface roughness of the bottom surface of the circuit recess H3b in the pad section H6b greater than the surface roughness of the bottom surface of the circuit recess H3a in the wiring section H6a. By doing so, by simply forming a simple shape in the bottom surface of the circuit recess H3b in the pad section H6b, the effect of suppressing separation of the conductor H5 in the pad section H6b from the insulating base substrate H1 and the effect of suppressing separation of the component H20 mounted on the pad section H6b from the insulating base substrate H1 are obtained.

In the present embodiment, as a result of the conductor H5 following the shape of the bottom surface of the circuit recess H3b in the pad section H6b, linear fine recesses are formed in the surface of the conductor H5 in the pad section H6b when planarly viewed. By doing so, the adhesion of solder when the component H20 is mounted on the pad section H6b is improved, and the mountability of the component H20 on the circuit board H10 is improved. It also eliminates the need to form the fine recesses in the surface of the conductor H5 in the pad section H6b and therefore shortens the process.

In the present embodiment, the ratio (RzT/RzB) between the ten-point average roughness (RzT) of the surface of the conductor H5 and the ten-point average roughness (RzB) of the bottom surface of the circuit recess H3 is 0.1 or greater and 2.0 or less ($0.1 \leq (RzT/RzB) \leq 2.0$). By doing so, the shape of the bottom surface of the circuit recess H3b in the pad section H6b is reliably reflected to the shape of the surface of the conductor H5 in the pad section H6b, as a result of which the fine recesses are reliably formed in the surface of the conductor H5 in the pad section H6b. From this point of view, it is more preferable that the ratio (RzT/RzB) is 0.5 or greater and 1.2 or less ($0.5 \leq (RzT/RzB) \leq 1.2$).

In the case where the ratio (RzT/RzB) is excessively small, the effect in which as a result of the shape of the bottom surface of the circuit recess H3b in the pad section H6b being reflected to the shape of the surface of the conductor H5 in the pad section H6b, the fine recesses are formed in the surface of the conductor H5 in the pad section H6b will be insufficient. In the case where the ratio (RzT/RzB) is excessively large, in the wiring section H6a, the effect of stabilizing the speed of transmission of signals will be insufficient, and in the pad section H6b, a large amount of solder will be required when the component H20 is mounted on the pad section H6b, which makes microprocessing difficult.

Hereinafter, the present invention will be described in further detail by describing a method for producing a circuit board H10 according to the present embodiment.

FIG. 2 shows process diagrams illustrating a method for producing a circuit board H10 according to the present embodiment. In FIG. 2, reference numeral H1 denotes an insulating base substrate, reference numeral H2 denotes a resin coating film, reference numeral H3 denotes a circuit recess serving as a circuit pattern, reference numeral H3a denotes a circuit recess in a wiring section, reference numeral H3b denotes a circuit recess in a pad section, reference numeral H4 denotes a plating catalyst, reference numeral H5 denotes an electroless plating serving as a conductor, reference numeral H6 denotes an electric circuit, reference numeral H6a denotes a wiring section, and reference numeral H6b denotes a pad section.

<Resin Coating Film Forming Step>

Figure 2A:
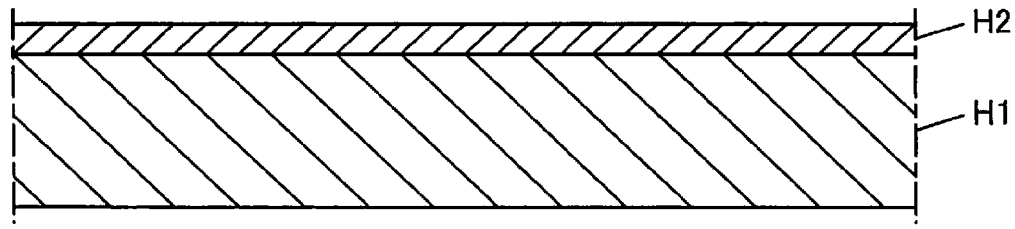
FIGS. 2A-2E show process diagrams illustrating a method for manufacturing a circuit board according to an embodiment of the present invention.

First, as shown in FIG. 2A, a resin coating film H2 is formed on the surface of an insulating base substrate H1.

As the insulating base substrate H1, any type of organic substrate conventionally used in production of circuit boards can be used without any particular limitation. Specific examples of the organic substrate include substrates made of epoxy resin, acrylic resin, polycarbonate resin, polyimide resin, polyphenylene sulfide resin, polyphenylene ether resin, cyanate resin, benzoxazine resin and bismaleimide resin.

The epoxy resin is not particularly limited as long as it can constitute any type of organic substrate that can be used to produce a circuit board. Specific examples include bisphenol A epoxy resin, bisphenol F epoxy resin, bisphenol S epoxy resin, aralkyl epoxy resin, phenol novolac epoxy resin, alkyl phenol novolac epoxy resin, biphenol epoxy resin, naphthalene epoxy resin, dicyclopentadiene epoxy resin, an epoxidized product of a condensate of phenol and aromatic aldehyde having a phenolic hydroxy group, triglycidyl isocyanurate, and cycloaliphatic epoxy resin. Furthermore, in order to impart flame retardancy, epoxy resin as described above, nitrogen-containing resin, silicone-containing resin or the like that has been brominated or phosphorus-modified can be used. As the epoxy resin and the resin, any of the epoxy resins and the resins can be used singly or as a combination of two or more.

In the case where the base substrate is made of any of the aforementioned resins, generally, a curing agent is contained to cure the resin. The curing agent is not particularly limited as long as it can be used as a curing agent. Specifically, for example, dicyandiamide, a phenolic curing agent, an anhydride curing agent, an aminotriazine novolac curing agent, cyanate resin or the like can be used.

As the phenolic curing agent, for example, a novolac, aralkyl or terpene-type phenolic curing agent can be used. Furthermore, in order to impart flame retardancy, phosphorus-modified phenol resin, phosphorus-modified cyanate resin or the like can be used. Also, as the curing agent, any of the curing agents listed above may be used singly or as a combination of two or more.

As will be described below, in a circuit pattern forming step, a circuit recess H3 serving as a circuit pattern will be formed in the surface of the insulating base substrate H1 by laser processing. Accordingly, it is preferable to use a resin having a good absorption coefficient (UV absorption coefficient) of laser light in the wavelength range of 100 nm to 400 nm. Specifically, for example, polyimide resin or the like can be used.

The insulating base substrate H1 may contain a filler. The filler is not particularly limited, and may be inorganic or organic fine particles. By inclusion of a filler, the filler will be exposed at the laser processed portion, and the adhesion between the plating (conductor H5) and the resin (insulating base substrate H1) can be improved by irregularities formed by the filler.

Specific examples of materials for constituting the inorganic fine particles include: high dielectric fillers such as aluminum oxide ($Al_2O_3$), magnesium oxide (MgO), boron nitride (BN), aluminum nitride (AlN), silica ($SiO_2$), barium titanate ($BaTiO_3$) and titanium oxide ($TiO_2$); magnetic fillers such as hard ferrite; inorganic flame retardants such as magnesium hydroxide ($Mg(OH)_2$), aluminum hydroxide ($Al(OH)_3$), antimony trioxide ($Sb_2O_3$), antimony pentoxide ($Sb_2O_5$), guanidine salt, zinc borate, molybdenum compound and zinc stannate; talc ($Mg_3(Si_4O_{10})(OH)_2$), barium sulfate ($BaSO_4$), calcium carbonate ($CaCO_3$), and mica. As the inorganic fine particles, any of the inorganic fine particles listed above may be used singly or as a combination of two or more. The inorganic fine particles listed above have high levels of heat conductivity, relative dielectric constant, flame retardancy, particle size distribution and flexibility in selecting the color, and therefore in order to selectively exhibit a desired function, appropriate blending and particle size design are performed, and thereby a high level of filling can be easily achieved. Although not particularly limited, it is preferable to use a filler having an average particle size that is less than or equal to the thickness of the insulating layer, more preferably, a filler having an average particle size of 0.01 μm to 10 μm, and even more preferably 0.05 μm to 5 μm.

The inorganic fine particles may be surface-treated with a silane coupling agent in order to enhance the dispersibility in the insulating base substrate H1. The insulating base substrate H1 may contain a silane coupling agent in order to enhance the dispersibility of the inorganic fine particles in the insulating base substrate H1. The silane coupling agent is not particularly limited. Specific examples include epoxy silane, mercapto silane, amino silane, vinyl silane, styryl silane, methacryloxy silane, acryloxy silane and titanate-based silane coupling agents. As the silane coupling agent, any of the silane coupling agents listed above may be used singly or as a combination of two or more.

Also, the insulating base substrate H1 may contain a dispersing agent in order to enhance the dispersibility of the inorganic fine particles in the insulating base substrate H1. The dispersing agent is not particularly limited. Specific examples include alkyl ether, sorbitan ester, alkyl polyether amine, and polymer-based dispersing agents. As the dispersing agent, any of the dispersing agents listed above may be used singly or as a combination of two or more.

A specific example of the organic fine particles that can be used as the filler can be fine rubber particles.

The form of the insulating base substrate H1 is not particularly limited. Specific examples include a sheet, a film, a prepreg, a molded article having a three-dimensional shape and the like. The thickness of the insulating base substrate H1 is not particularly limited, either. In the case of, for example, a sheet, a film, and a prepreg, the thickness is, for example, about 10 to 500 μm, preferably 10 to 200 μm, more preferably 20 to 200 μm, and even more preferably 20 to 100 μm.

The insulating base substrate H1 may be formed as, for example, a molded article having a three-dimensional shape by pouring a material for forming an insulating base substrate into a metal mold, frame or the like, followed by pressing and curing, or may be formed as a molded article having a three-dimensional shape by punching a sheet, film or prepreg and curing a punched-out piece or curing by application of heat and pressure.

Next, the resin coating film (resist) H2 is not particularly limited as long as it can be removed in a coating film removal step, which will be described below. The resin coating film H2 is preferably a resin coating film that can be easily dissolution-removed or separation-removed from the surface of the insulating base substrate H1 by being dissolved in or swollen with a specific fluid. Specific examples include a coating film made of soluble resin that can be easily dissolved in an organic solvent or alkaline solution and a coating film made of swellable resin that can be swollen with a specific fluid (swelling fluid). Examples of the swellable resin coating film include, not only a resin coating film that swells without substantially dissolving in a specific fluid and thereby easily separates from the surface of the insulating base substrate H1, but also a resin coating film that swells with and at least partially dissolves in a specific fluid and thereby easily separates from the surface of the insulating base substrate H1, and a resin coating film that dissolves in a specific fluid and thereby easily separates from the surface of the insulating base substrate H1. By using such a resin coating film, the resin coating film H2 can be easily and well removed from the surface of the insulating base substrate H1. If the resin coating film collapses during removal of the resin coating film H2, a problem arises in that the plating catalyst H4 attached to the resin coating film H2 will scatter, and the scattered plating catalyst re-attaches to the insulating base substrate H1, forming an unwanted plating in that portion. With the present embodiment, such a problem can be prevented because the resin coating film H2 can be easily and well removed from the surface of the insulating base substrate H1.

The method for forming a resin coating film H2 is not particularly limited. Specific examples include a method in which a fluid material capable of forming a resin coating film H2 is applied to the surface of the insulating base substrate H1 and dried, and a method in which a fluid material as described above is applied to a support substrate and dried to form a resin coating film and the resin coating film is transferred to the surface of the insulating base substrate H1. Another example of the method is attaching a preformed resin film made of a resin coating film H2 to the surface of the insulating base substrate H1. The method for applying a fluid material is not particularly limited. Specifically, for example, a conventionally known spin coating method, bar coater method or the like can be used.

As the material for forming the resin coating film H2, any resin can be used without any particular limitation as long as it can be easily dissolution-removed or separation-removed from the surface of the insulating base substrate H1 by being dissolved in or swollen with a specific fluid. Preferably, a resin having a degree of swelling in a specific fluid of 50% or greater, more preferably 100% or greater, and even more preferably 500% or greater is used. In the case where the degree of swelling is excessively low, the resin coating film is likely to be less separable.

The degree of swelling (SW) of the resin coating film can be obtained from a pre-swelling weight m(b) and a post-swelling weight m(a), using the formula:

degree of swelling SW={(m(a)−m(b))/m(b)}×100(%)

The resin coating film H2 as described above can be easily formed by a method in which an elastomer suspension or emulsion is applied to the surface of the insulating base substrate H1 and thereafter dried, a method in which an elastomer suspension or emulsion is applied to a support base substrate and thereafter dried to form a coating film and the coating film is transferred to the surface of the insulating base substrate H1, or other methods.

Specific examples of the elastomer include diene-based elastomers such as styrene-butadiene copolymers, acryl-based elastomers such as acrylic acid ester copolymers, and polyester-based elastomers. With such an elastomer, a swellable resin coating film having a desired degree of swelling can be easily formed by adjusting the degree of crosslinking, the degree of gelation or the like of the elastomer resin particles dispersed as a suspension or emulsion.

Particularly, the resin coating film H2 as described above is preferably a coating film whose degree of swelling varies depending on the pH of the swelling fluid. In the case where such a coating film is used, by using different fluid conditions in a catalyst application step and in a coating film removal step, which will be described below, the resin coating film H2 can maintain strong adhesion to the insulating base substrate H1 at the pH used in the catalyst application step, and the resin coating film H2 can be easily separation-removed from the insulating base substrate H1 at the pH used in the coating film removal step.

More specifically, for example, in the case where the catalyst application step, which will be described below, includes a step of treatment in an acidic colloidal catalyst metal solution having a pH in the range of, for example, 1 to 3, and the coating film removal step, which will be described below, includes a step of swelling the resin coating film in an alkaline solution having a pH in the range of, for example, 12 to 14, the resin coating film H2 is preferably a resin coating film that has a degree of swelling in the acidic colloidal catalyst metal solution of 60% or less and more preferably 40% or less, and preferably has a degree of swelling in the alkaline solution of 50% or greater, more preferably 100% or greater, and even more preferably 500% or greater.

Examples of the resin coating film H2 described above include a sheet made of an elastomer having a specific amount of carboxyl groups, a sheet obtained by entirely curing an alkali-developable photocurable resist used as a dry film resist (hereinafter also referred to as "DFR") for patterning a printed circuit board, a thermosetting sheet and an alkali-developable sheet.

Specific examples of the elastomer having a carboxyl group include elastomers having a carboxyl group within the molecule by inclusion of a monomer unit having a carboxyl group as a copolymerizable component: diene-based elastomers, such as styrene-butadiene copolymers, acryl-based elastomers such as acrylic acid ester copolymers, and polyester-based elastomers. With such an elastomer, a resin coating film having a desired alkali degree of swelling can be formed by adjusting the acid equivalent, the degree of crosslinking, the degree of gelation or the like of the elastomer dispersed as a suspension or emulsion. Also, the degree of swelling in a specific fluid used in the coating film removal step can be further increased, and a resin coating film that dissolves in the fluid can be easily formed. The carboxyl group in the elastomer has the effect of separating the resin coating film H2 from the surface of the insulating base substrate H1 by swelling the resin coating film with an aqueous alkaline solution. As used herein, "acid equivalent" refers to the polymer molecular weight per carboxyl group.

Specific examples of the monomer unit having a carboxyl group include (meth)acrylic acid, fumaric acid, cinnamic acid, crotonic acid, itaconic acid and maleic anhydride.

The carboxyl group content in such an elastomer having a carboxyl group is preferably 100 to 2000 acid equivalents, and more preferably 100 to 800 acid equivalents. In the case where the acid equivalent is excessively small (where the number of carboxyl groups is relatively excessively large), the compatibility with the solvent or other compositions will be decreased, and the resistance to a pre-treatment fluid for electroless plating is likely to be low. In the case where the acid equivalent is excessively large (where the number of carboxyl groups is relatively excessively small), the separability in an aqueous alkaline solution is likely to be low.

The molecular weight of the elastomer is 10,000 to 1,000,000, preferably 20,000 to 500,000, and more preferably 20,000 to 60,000. In the case where the molecular weight of the elastomer is excessively large, separability is likely to deteriorate. In the case where the molecular weight of the elastomer is excessively small, viscosity is likely to deteriorate, as a result of which it will be difficult to maintain a uniform thickness of the swellable resin coating film, and the resistance to the pre-treatment fluid for plating is likely to be low.

Also, as DFR, it is possible to use, for example, a sheet made of a photocurable resin composition containing a photopolymerization initiator and composed of a resin component such as acrylic resin, epoxy resin, styrene resin, phenol resin or urethane resin, containing a specific amount of carboxyl groups. Specific examples of the DFR include sheets obtained by entirely curing a dry film of a photopolymerizable resin composition as disclosed in JP 2000-231190A, JP 2001-201851A and JP H11-212262A, and commercially available alkali-developable DFR such as UFG series manufactured by Asahi Kasei Corporation.

Furthermore, other examples of the resin coating film H2 include resin composed mainly of rosin and containing a carboxyl group (for example, NAZDAR 229 manufactured by Yoshikawa Chemical Co., Ltd.) and resin composed mainly of phenol and containing a carboxyl group (for example, 104F manufactured by LEKTRACHEM Ltd.).

The resin coating film H2 can be easily formed by a method in which a resin suspension or emulsion is applied to the surface of the insulating base substrate H1 by a conventionally known application means such as a spin coating method or bar coater method and dried, or a method in which DFR formed on a support base substrate is attached to the surface of the insulating base substrate H1 by using a vacuum laminator or the like and entirely cured.

The thickness of the resin coating film H2 is preferably, for example, 10 μm or less and more preferably 5 μm or less, and preferably 0.1 μm or greater and more preferably 1 μm or greater. In the case where the thickness is excessively large, the precision of forming a fine circuit pattern (circuit recess H3) by laser processing, machining or the like has tendency to be low. In the case where the thickness is excessively small, it tends to be difficult to form a resin coating film H2 having a uniform thickness.

Also, as the resin coating film H2, for example, a resin coating film composed mainly of a resin (carboxyl group-containing acrylic resin) containing an acrylic resin having about 100 to 800 acid equivalents of carboxyl groups can also preferably be used.

Furthermore, other than those listed above, the following are also suitable for use as the resin coating film H2. That is, examples of properties required of resist materials for constituting the resin coating film H2 include (1) strong resistance to a fluid (a chemical for forming plating nuclei) for immersion of the insulating base substrate H1 on which the resin coating film H2 has been formed in a catalyst application step, which will be described below, (2) ease of removal of the resin coating film (resist) 2 in a coating film removal step, which will be described below, for example, a step of immersing in an alkali the insulating base substrate H1 on which the resin coating film H2 has been formed, (3) high film formability, (4) ease of dry film (DFR) formation, (5) high storage stability, and like properties. As the chemical for forming plating nuclei, in the case of an acidic colloidal Pd—Sn catalyst system, which will be described below, examples of the chemical for forming plating nuclei are all aqueous acidic (pH 1 to 3) solutions. In the case of an alkaline Pd ion catalyst system, the catalyst-added activator is weakly alkaline (pH 8 to 12), and others are acidic. Accordingly, for resistance to the chemical for forming plating nuclei, resistance that allows to withstand pH 1 to 11 and preferably pH 1 to 12 is needed. Note that, the phrase "allows to withstand" means that when a sample on which a resist film has been formed is immersed in the chemical, swelling and dissolution of the resist are sufficiently suppressed, thus enabling it to serve as a resist. Generally, the immersion temperature is room temperature to 60° C., the immersion time is 1 to 10 minutes, and the resist film thickness is about 1 to 10 μm, but the present invention is not limited to these ranges. As an alkali separation chemical for use in the coating film removal step, as will be described below, for example, an aqueous NaOH solution and an aqueous sodium carbonate solution are generally used. It is desirable that the chemical has a pH of 11 to 14 and preferably a pH of 12 to 14, and the resist film can be easily removed therewith. Immersion and spraying treatments are generally performed at an aqueous NaOH solution concentration of about 1 to 10%, the treatment temperature of room temperature to 50° C., and the treatment time of 1 to 10 minutes, but the present invention is not limited to these ranges. Since the resist is formed on an insulating material, film formability is also important. Uniform film formation is necessary that does not cause repelling or the like. Dry-film formation is carried out for simplification of the production process, reduction of material loss, and the like, but film flexibility is necessary to secure handleability. A dry-filmed resist is attached to an insulating material by a laminator (roll, vacuum). The attachment temperature is room temperature to 160° C., and the pressure and the time are suitably selected. Accordingly, tackiness is required at the time of attachment. For this reason, the dry-filmed resist is generally processed to have a three-layer structure, being sandwiched between a carrier film and a cover film while this also serves to prevent grime adhesion, but the present invention is not limited thereto. Storage stability refers most preferably to storage stability at room temperature, but storage stability under refrigeration and freezing is also necessary. Accordingly, it is necessary to process the dry film so as not to undergo compositional separation or cracking due to impaired flexibility under low temperatures.

In light of the above, the resin coating film H2 may be made of polymer resin obtained by polymerizing (a) at least one carboxylic acid or acid anhydride monomer having at least one polymerizable unsaturated group within the molecule and (b) at least one monomer polymerizable with the monomer (a), or a resin composition containing the polymer resin. Examples of known techniques include those disclosed in JP H7-281437A, JP 2000-231190A, and JP 2001-201851A. Examples of the monomer (a) include (meth)acrylic acid, fumaric acid, cinnamic acid, crotonic acid, itaconic acid, maleic anhydride, maleic acid half ester, butyl acrylate, and the like, and such monomers may be used singly or as a combination of two or more. An example of the monomer (b) is generally a monomer that is non-acidic and has one polymerizable unsaturated group within the molecule, but the monomer (b) is not limited thereto. The monomer (b) is selected so as to maintain various properties such as resistance in a catalyst application step and flexibility of a cured film. Specific examples include methyl(meth)acrylate, ethyl (meth)acrylate, iso-propyl(meth)acrylate, n-butyl(meth) acrylate, sec-butyl(meth)acrylate, tert-butyl(meth)acrylate, 2-hydroxylethyl(meth)acrylate, 2-hydroxylpropyl(meth) acrylate, and the like. Other examples include vinyl alcohol esters such as vinyl acetate, (meth)acrylonitrile, styrene or polymerizable styrene derivatives, and the like. Also, it is also possible to obtain by polymerization of only the aforementioned carboxylic acid or acid anhydride having one polymerizable unsaturated group within the molecule. Furthermore, in order to allow a three-dimensional crosslink, it is possible to select a monomer having multiple unsaturated groups as the monomer for use in the polymer and to introduce a reactive functional group such as an epoxy group, a hydroxyl group, an amino group, an amide group, a vinyl group, or the like into the molecular framework.

In the case where a carboxyl group is contained in the resin, it is sufficient that the amount of carboxyl group contained in the resin is 100 to 2000 acid equivalents, and preferably 100 to 800 acid equivalents. In the case where the acid equivalent is excessively low, it is likely that compatibility with a solvent or other compositions is deteriorated or resistance to a pretreatment fluid for plating is deteriorated. In the case where the acid equivalent is excessively high, separability is likely to deteriorate. The composition ratio of the monomer (a) is preferably 5 to 70 mass %.

It is possible that the resin composition contains as a main resin the aforementioned polymer resin that serves as an essential component and that at least one of oligomers, monomers, fillers, and other additives is added thereto. The main resin is preferably a linear polymer having thermoplastic properties. In order to control fluidity, crystallinity, and like properties, grafting may be performed for branching. The molecular weight thereof is a number average molecular weight of about 1000 to 500,000, and preferably 5,000 to 50,000. An excessively small molecular weight is likely to result in impaired film flexibility and impaired resistance to the chemical for forming plating nuclei (acid resistance). An excessively large molecular weight is likely to result in deteriorated alkali separability and deteriorated attachability in the case of processing into a dry film. Crosslinking points may be introduced for enhancement of resistance to the chemical for forming plating nuclei as well as for thermal deformation suppression at the time of laser processing and fluidity control.

Any monomer and oligomer may be used as long as they are resistant to the chemical for forming plating nuclei and easily removable with an alkali. It can be envisaged that they are used as tackifiers in a manner similar to a plasticizer in order to enhance attachment of the dry film (DFR). Moreover, a cross-linking agent may be added to increase various kinds of resistance. Specific examples include methyl(meth)acrylate, ethyl(meth)acrylate, iso-propyl (meth)acrylate, n-butyl (meth)acrylate, sec-butyl(meth)acrylate, tert-butyl(meth) acrylate, 2-hydroxyethyl(meth)acrylate, 2-hydroxylpropyl (meth)acrylate, and the like. Other examples include vinyl alcohol esters such as vinyl acetate, (meth)acrylonitrile, styrene or polymerizable styrene derivatives, and the like. Also, the monomer (b) can be obtained by polymerization of only the aforementioned carboxylic acid or acid anhydride having one polymerizable unsaturated group within the molecule. Moreover, a polyfunctional unsaturated compound may also be contained. Any of the aforementioned monomers or oligomers obtained by reacting the monomers may be used. In addition to the aforementioned monomers, it is also possible to contain two or more other photopolymerizable monomers. Examples of such monomers include 1,6-hexanediol di(meth)acrylate, 1,4-cyclohexanediol di(meth)acrylate, polypropyleneglycol di(meth)acrylate, polyethyleneglycol di(meth)acrylate, polyoxyethylenepolyoxypropyleneglycol di(meth)acrylate, and like polyoxyalkyleneglycol di(meth) acrylates, 2-di(p-hydroxyphenyl)propane di(meth)acrylate, glycerol tri(meth)acrylate, dipentaerythritol penta(meth) acrylate, trimethylolpropane triglycidyl ether tri(meth)acrylate, bisphenol A diglycidyl ether tri(meth)acrylate, 2,2-bis (4-methacryloxypentaethoxyphenyl)propane, polyfunctional(meth)acrylates containing a urethane group, and the like. Any of the aforementioned monomers or oligomers obtained by reacting the monomers may be used.

The filler is not particularly limited, and examples include silica, aluminum hydroxide, magnesium hydroxide, calcium carbonate, clay, kaolin, titanium oxide, barium sulfate, alumina, zinc oxide, talc, mica, glass, potassium titanate, wollastonite, magnesium sulfate, aluminum borate, organic fillers, and the like. Since a preferable thickness of the resist is as small as 0.1 to 10 µm, it is preferable that the size of the filler is also small. Although it is preferable to use a filler that has a small average particle size, and from which coarse particles are taken away, it is possible to crush the particles when dispersing or remove coarse particles by filtration.

Examples of other additives include photopolymerizable resins (photopolymerization initiators), polymerization inhibitors, colorants (dyes, pigments, color producing pigments), thermal-polymerization initiators, crosslinking agents such as epoxy and urethane, and the like.

In the circuit pattern forming step described next, the resin coating film H2 is subjected to laser processing or the like, and it is therefore necessary to impart laser ablation characteristics to the resist material. As the laser processing machine, for example, a carbon dioxide laser, an excimer laser, a UV-YAG laser or the like is selected. These laser processing machines have various specific wavelengths, and it is thus possible to enhance productivity by selecting a material that exhibits a large UV absorption coefficient at such a wavelength. Among them, a UV-YAG laser is suitable for microprocessing, and since the laser wavelength has third-order harmonics at 355 nm and fourth-order harmonics at 266 nm, it is desirable that the resist material (material for the resin coating film H2) exhibits a relatively large UV absorption coefficient at these wavelengths. The larger the UV absorption coefficient, the better the resulting resist (resin coating film H2) will be, achieving enhanced productivity. Of course, the present invention is not limited thereto, and there may be a case where a resist material that exhibits a relatively low UV absorption coefficient is preferable. The lower the UV absorption coefficient, the more UV light passes through the resist (resin coating film H2), so that the UV energy can be concentrated on processing on the underlying insulating base substrate H1, and a particularly favorable outcome can be obtained in the case where, for example, the insulating base substrate H1 is made of a material that is difficult to be processed. As described above, it is preferable to design the resist material according to the ease of laser processing of the resist (resin coating film H2), the ease of laser processing of the insulating base substrate H1, the relationship therebetween and the like.

<Circuit Pattern Forming Step>

Figure 2B:
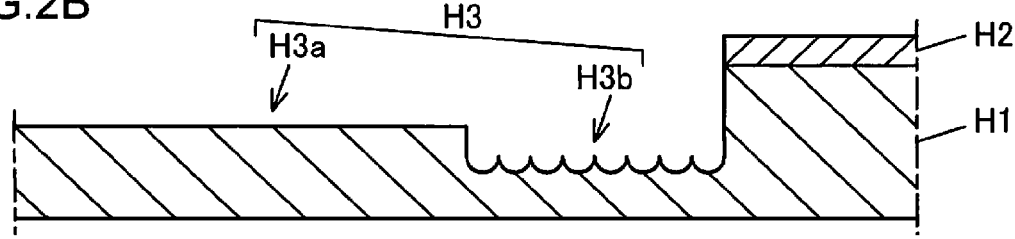

Next, as shown in FIG. 2B, a circuit recess H3 serving as a circuit pattern is formed in the surface of the insulating base substrate H1 by forming a trench (groove) H3a and a pore H3b that have a specific shape and a specific depth from the outer surface of the resin coating film H2 that is greater than the thickness of the resin coating film H2. The circuit recess H3 can be formed by cutting work or machining work such as embossing, but is preferably formed by laser processing because a favorable outcome is obtained. The trench H3a of the circuit recess H3 is a circuit recess in the wiring section H6a and the pore H3b of the circuit recess H3 is a circuit recess in the pad section H6b. Also, the circuit recess H3 may include a via for interlayer connection depending on the situation.

The width of the circuit recess H3a in the wiring section H6a in the circuit recess H3 is not particularly limited. However, in the case where laser processing is used, a fine trench having a line width of 20 µm or less can be easily formed. The length and width of the circuit recess H3b in the pad section H6b in the circuit recess H3 are not particularly limited, either. FIG. 1 shows an example in which the pad section H6b has a rectangular shape when planarly viewed, but the shape is not limited thereto and may be other shapes.

The method for forming the circuit recess H3 is not particularly limited. Specifically, laser processing, cutting work such as dicing, and embossing can be used. In order to form a highly precise fine circuit recess H3, laser processing is preferable. With laser processing, by controlling the output (energy or power) of the laser, the depth to which the insulating base substrate H1 is recessed through the resin coating film H2 can be easily adjusted. For embossing, it is preferable to use embossing with a fine resin die as used in, for example, the field of nano-imprinting.

As described above, by forming a specific circuit recess H3, a portion is defined in which an electroless plating film is later applied to form an electric circuit H6.

In the case where the circuit recess H3 is formed by laser processing, the circuit recess H3a in the wiring section H6a can be formed by forming a single trench by causing laser light to be scanned only once along a circuit pattern. However, as is clear from FIG. 1A, the pad section H6b is wider than the width of the wiring section H6a and has a large area, and therefore the circuit recesses H3b of the pad section H6b can be formed by causing laser light to be scanned a plurality of times. In the present embodiment, as is clear from FIGS. 1 and 2, by causing laser light to be scanned in parallel a plurality of times, the pad section H6b having a rectangular shape when planarly viewed is formed. As a result, a plurality of linear fine recesses when planarly viewed are formed in the bottom surface of the circuit recess H3b in the pad section H6b, as indications for laser light scanning. As a result, a plurality of irregularities are formed in the bottom surface of the circuit recess H3b in the pad section H6b. Because of the fine recesses (the plurality of irregularities) in the bottom surface of the circuit recess H3b in the pad section H6b, the surface roughness of the bottom surface of the circuit recess H3b in the pad section H6b is greater than the surface roughness of the bottom surface of the circuit recess H3a in the wiring section H6a. That is, in the wiring section H6a, laser light is scanned along a circuit pattern only once, and thus no irregularities are formed in the bottom surface of the circuit recess H3a in the wiring section H6a. In this case, the ratio (RzPB/RzLB) between the ten-point average roughness (RzPB) of the bottom surface of the circuit recess H3b in the pad section H6b and the ten-point average roughness (RzLB) of the bottom surface of the circuit recess H3a in the wiring section H6a is preferably 2 or greater ((RzPB/RzLB)≥2), more preferably 5 or greater ((RzPB/RzLB)≥5), and even more preferably 10 or greater ((RzPB/RzLB)≥10), as described above.

Then, in a plating step, which is performed subsequently, the circuit recess H3 is filled with a conductor H5 made of an electroless plating to form a circuit H6. The plating film by electroless plating grows from the bottom surface of the circuit recess H3, so that the shape of the surface of the conductor H5 follows the shape of the bottom surface of the circuit recess H3. Accordingly, the shape of the surface of the conductor H5 in the pad section H6b follows and reflects the shape of the bottom surface of the circuit recess H3b in the pad section H6b. As a result, a plurality of linear fine recesses are formed in the surface of the conductor H5 in the pad section H6b when planarly viewed. As a result, a plurality of irregularities are formed in the surface of the conductor H5 in the pad section H6b. Because of the fine recesses (the plurality of irregularities) in the surface of the conductor H5 in the pad section H6b, the surface roughness of the conductor H5 in the pad section H6b is greater than the surface roughness of the conductor H5 in the wiring section H6a. In other words, in the wiring section H6a, no irregularities are formed in the bottom surface of the circuit recess H3a, and thus no irregularities are formed in the surface of the conductor H5 in the wiring section H6a. In this case, the ratio (RzPT/RzLT) between the ten-point average roughness (RzPT) of the surface of the conductor H5 in the pad section H6b and the ten-point average roughness (RzLT) of the surface of the conductor H5 in the wiring section H6a is preferably 2 or greater ((RzPT/RzLT)≥2), more preferably 5 or greater ((RzPT/RzLT)≥5), and even more preferably 10 or greater ((RzPT/RzLT)≥10), as described above. Furthermore, in the case where the conductor H5 follows the shape of the bottom surface of the circuit recess H3, the ratio (RzT/RzB) between the ten-point average roughness (RzT) of the surface of the conductor H5 and the ten-point average roughness (RzB) of the bottom surface of the circuit recess H3 is preferably 0.1 or greater and 2.0 or less (0.1≤(RzT/RzB)≤2.0), and more preferably 0.5 or greater and 1.2 or less (0.5≤(RzT/RzB)≤1.2), as described above.

On the other hand, in the case of cutting work such as dicing and embossing using nano-imprinting, mechanical cutting work may be performed or a prefabricated mold may be used such that the surface roughness of the bottom surface of the circuit recess H3b in the pad section H6b becomes greater than the surface roughness of the bottom surface of the circuit recess H3a in the wiring section H6a. Then, electroless plating may be performed under the above-described electroless plating conditions.

<Catalyst Application Step>

Figure 2C:
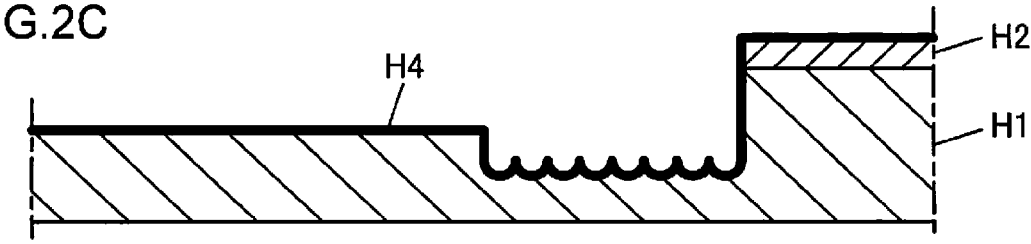

Next, as shown in FIG. 2C, a plating catalyst H4 is applied to the surface of the circuit recess H3 formed in the insulating base substrate H1 and the entire surface of the resin coating film H2 coating the insulating base substrate H1. In other words, the plating catalyst H4 is applied to the surface in which the circuit recess H3 has been formed and the entire surface in which no circuit recess H3 has been formed. As used herein, the concept of the plating catalyst H4 encompasses a catalyst precursor.

The plating catalyst or precursor thereof H4 is a catalyst applied in advance in order to form an electroless plating film only on a portion where the formation of the electroless plating film in the plating step, which will be described later, is desired. As the plating catalyst H4, catalysts known for use in electroless plating can be used without particular limitations. Also, it is possible that the precursor H4 of the plating catalyst is applied in advance and the plating catalyst H4 is generated after removing the resin coating film H2. Specific examples of the plating catalyst H4 include metal palladium (Pd), platinum (Pt), silver (Ag), and the like, and precursors and the like that generate such catalysts.

An example of a method for applying the plating catalyst H4 may be a method that involves treatment under acidic conditions of pH 1 to 3 with an acidic colloidal Pd—Sn solution and then treatment with an acid solution, or a like method. More specifically, the following method can be used.

First, the surface of the insulating base substrate H1 in which the circuit trench (circuit grove) H3 has been formed is washed for a specific period of time with a warm solution of a surfactant (cleaner/conditioner) to remove oil or the like adhering to the surface. Next, if necessary, soft etching treatment is performed with a sodium persulfate-sulfuric acid-based soft etching agent. Further, acid washing is performed in an acidic solution, such as an aqueous sulfuric acid solution or an aqueous hydrochloric acid solution, having a pH of 1 to 2. Next, pre-dip treatment for allowing chloride ions to be adsorbed on the surface of the insulating base substrate H1 is performed by immersing the substrate in a pre-dip fluid containing an aqueous stannous chloride solution as a principal component in a concentration of about 0.1%. Thereafter, the substrate is further immersed in an acidic colloidal plating catalyst solution, such as an acidic Pd—Sn colloid, having a pH of 1 to 3 that contains stannous chloride and palladium chloride to cause aggregation and adsorption of Pd and Sn. Then, a redox reaction is caused between adsorbed stannous chloride and palladium chloride ($SnCl_2+PdCl_2 \rightarrow SnCl_4+Pd\downarrow$). Thereby, metal palladium, which is the plating catalyst H4, deposits.

As the acidic colloidal plating catalyst solution, a known acidic colloidal Pd—Sn catalyst solution or the like can be used, and a commercially available plating process using an acidic colloidal plating catalyst solution may be used. Such a process is, for example, systematized and commercially distributed by Rohm and Haas Company.

Through the catalyst application process, as shown in FIG. 2C, the plating catalyst H4 can be applied to the surface of the resin coating film H2 and the surface of the circuit recess H3.

<Coating Film Removal Step>

Figure 2D:
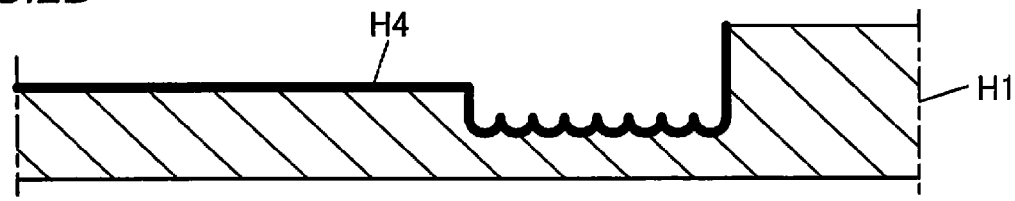

Next, as shown in FIG. 2D, the resin coating film H2 is removed by being swollen with or dissolved in a specific fluid. Specifically, in the case where the resin coating film H2 is made of soluble resin, the resin coating film H2 is dissolved using an organic solvent or alkali solution and removed from the surface of the insulating base substrate H1. In the case where the resin coating film H2 is made of swellable resin, the resin coating film H2 is swollen using a specific fluid and separated and removed from the surface of the insulating base substrate H1. In this step, by removing the resin coating film H2, as shown in FIG. 2D, the plating catalyst H4 can be left only in the surface of the circuit recess H3 (including the bottom surface of the circuit recess H3a in the wiring section H6a and the bottom surface of the circuit recess H3b in the pad section H6b).

According to the coating film removal step, it is possible to leave the plating catalyst H4 only in the surface of the portion in which the circuit recess H3 has been formed of the insulating base substrate H1. On the other hand, the plating catalyst H4 that has been applied to the surface of the resin coating film H2 is removed from the insulating base substrate H1, together with the resin coating film H2. From the viewpoint of preventing a situation in which the plating catalyst H4 that has been removed from the insulating base substrate H1 scatters and re-attaches to the surface of the insulating base substrate H1, it is preferable that the resin coating film H2 is continuously and entirely removed without collapsing into pieces when removed from the insulating base substrate H1.

As the fluid that dissolves or swells the resin coating film H2, any fluid can be used without any particular limitation as long as it can dissolve or swell the resin coating film H2 to such a degree that the resin coating film H2 can be easily dissolution-removed or separation-removed from the insulating base substrate H1 without substantially decomposing or dissolving the insulating base substrate H1 and the plating catalyst H4. Such a resin coating film removing fluid can be selected as appropriate depending on the type, thickness and the like of the resin coating film H2. Specifically, for example, in the case where photocurable epoxy resin is used as the resist resin, an organic solvent, or an aqueous alkaline solution of resist removing agent can be used. Also, for example, in the case where the resin coating film H2 is made of an elastomer such as an diene-based elastomer, an acryl-based elastomer or a polyester-based elastomer, or where the resin coating film H2 is made of polymer resin obtained by polymerizing (a) at least one carboxylic acid or acid anhydride monomer having at least one polymerizable unsaturated group within the molecule and (b) at least one monomer polymerizable with the monomer (a), or a resin composition containing the polymer resin, or where the resin coating film H2 is made of the above-described carboxyl group-containing acrylic resin, for example, an aqueous alkaline solution, such as an aqueous sodium hydroxide solution, having a concentration of about 1 to 10% can be preferably used.

In the case where the above-described plating process in which the substrate is treated under acidic conditions is used in the catalyst application step, it is preferable that the resin coating film H2 is made of an elastomer having a degree of swelling under acidic conditions of 60% or less, preferably 40% or less, and a degree of swelling under alkaline conditions of 50% or greater such as an diene-based elastomer, an acryl-based elastomer or a polyester-based elastomer, or that the resin coating film H2 is made of polymer resin obtained by polymerizing (a) at least one carboxylic acid or acid anhydride monomer having at least one polymerizable unsaturated group within the molecule and (b) at least one monomer polymerizable with the monomer (a), or a resin composition containing the polymer resin, or that the resin coating film H2 is made of the above-described carboxyl group-containing acrylic resin. Such a resin coating film easily dissolves or swells by being immersed in an aqueous alkaline solution having a pH of 11 to 14, and preferably a pH of 12 to 14, such as an aqueous sodium hydroxide solution having a concentration of about 1 to 10%, and is dissolution-removed or separation-removed. In order to enhance solubility and separability, ultrasonic irradiation may be performed during immersion. Also, if necessary, the resin coating film may be peeled off with light force.

As the method for removing the resin coating film H2, for example, a method can be used in which the insulating base substrate H1 that has been coated with the resin coating film H2 is immersed in a resin coating film removing fluid for a specific period of time. In order to enhance the dissolution-removability or separation-removability, it is particularly preferable to perform ultrasonic irradiation during immersion. If the resin coating film H2 is not easily separation-removed or dissolution-removed, for example, the resin coating film may be peeled off with light force if necessary.

<Plating Step>

Figure 2E:
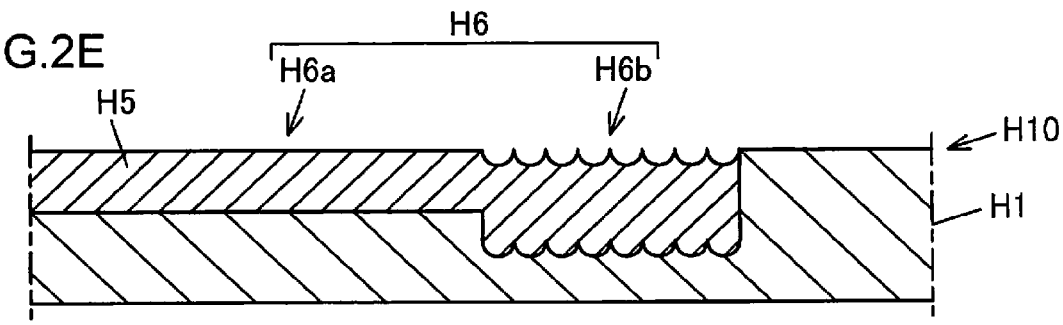

Next, as shown in FIG. 2E, an electroless plating is applied to the insulating base substrate H1 from which the coating film has been removed. By applying an electroless plating to the insulating base substrate H1, an electroless plating film is formed on the circuit recess H3 in which the plating catalyst H4 remains, the circuit recess H3 is filled with a conductor H5 made of an electroless plating, and an electric circuit H6 is formed in the surface of the insulating base substrate H1. With this electroless plating treatment, an electroless plating film is deposited, with high precision, only in the portion in which the circuit recess H3 has been formed, and an electric circuit H6 is formed along the circuit pattern.

At this time, because the plating catalyst H4 remains in the bottom surface of the circuit recess H3a in the wiring section H6a and the bottom surface of the circuit recess H3b in the pad section H6b, the plating film by electroless plating grows from the bottom surface of the circuit recess H3a in the wiring section H6a and the bottom surface of the circuit recess H3b in the pad section H6b. Accordingly, the shape of the surface of the conductor H5 made of an electroless plating follows and reflects the shape of the bottom surface of the circuit recess H3. As a result, a plurality of linear fine recesses are formed in the surface of the conductor H5 in the pad section H6b when planarly viewed, and thus a plurality of irregularities can be obtained. On the other hand, such fine recesses are not formed in the surface of the conductor H5 in the wiring section H6a, and thus no irregularities are obtained.

A usable method of the electroless plating treatment may be a method in which the insulating base substrate H1 to which the plating catalyst H4 has been partially applied is immersed in an electroless plating fluid, and an electroless plating film is deposited only on the portion to which the plating catalyst H4 has been applied.

Examples of metals for use in electroless plating include copper (Cu), nickel (Ni), cobalt (Co), aluminum (Al), and the like. Among these, plating containing Cu as a principal component is preferable in terms of excellent conductivity. In the case where Ni is contained, such plating is preferable in terms of excellent corrosion resistance and adhesion to solder.

The thickness of the electroless plating film is not particularly limited. Specifically, the thickness is, for example, about 0.1 to 10 μm, and preferably 1 to 5 μm.

Due to the plating step, the electroless plating film deposits only on the portion on the surface of the insulating base substrate H1 where the plating catalyst H4 remains. Accordingly, a conductor H5 made of electroless plating can be precisely formed only on the portion where formation of an electric circuit H6 is desired, while deposition of the electroless plating film on the portion where the circuit recess H3 is not formed can be suppressed. Accordingly, even in the case where a plurality of fine wiring sections H6a having a narrow line width with a small pitch interval are to be formed, unnecessary plating film does not remain between adjacent wiring sections H6a. Therefore, the occurrence of short circuiting and migration can be suppressed.

With the plating step described above, the electroless plating film can be deposited only in the laser processed portion of the surface of the insulating base substrate H1. By doing so, an embedded circuit H6 is formed in the surface of the insulating base substrate H1. The electric circuit H6 is formed by filling the circuit recess H3 with a conductor H5 made of an electroless plating in the plating step, and the plating film by electroless plating grows from the bottom surface of the circuit recess H3, so that the shape of the surface of the conductor H5 follows the shape of the bottom surface of the circuit recess H3, that is, the shape of the surface of the conductor H5 in the pad section H6b follows and reflects the shape of the bottom surface of the circuit recess H3b in the pad section H6b, and the shape of the surface of the conductor H5 in the wiring section H6a follows and reflects the bottom surface of the circuit recess H3a in the wiring section H6a. As a result, the surface roughness of the bottom surface of the circuit recess H3b in the pad section H6b becomes greater than the surface roughness of the bottom surface of the circuit recess H3a in the wiring section H6a, and correspondingly the surface roughness of the conductor H5 in the pad section H6b becomes greater than the surface roughness of the conductor H5 in the wiring section H6a.

Figure 3:
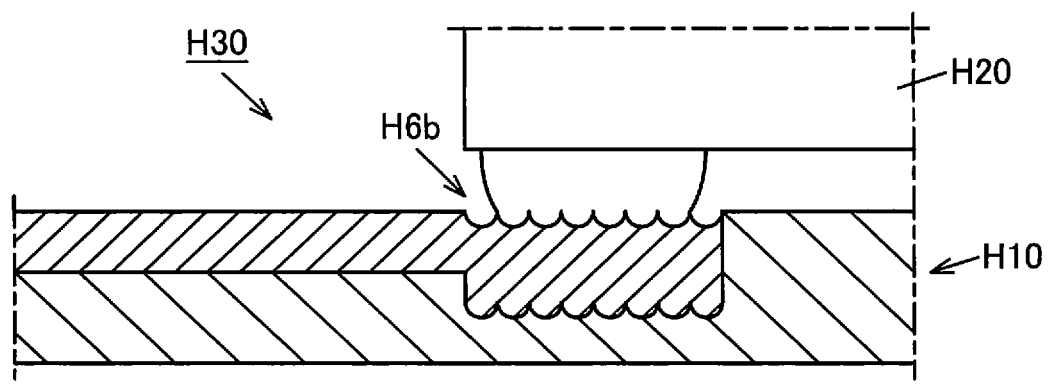
FIG. 3 is a partially enlarged cross-sectional view of a semiconductor device in which a component has been mounted, via a solder bump, on a pad section of the circuit board according to an embodiment of the present invention.

Through the aforementioned steps, the circuit board H10 as shown in FIG. 1 is produced in which the embedded electric circuit H6 including the wiring section H6a and the pad section H6b is provided in the surface of the insulating base substrate H1. In the circuit board H10, the surface roughness of the conductor H5 is different in the wiring section H6a and in the pad section H6b, and in particular, the surface roughness of the conductor H5 in the pad section H6b is greater than the surface roughness of the conductor H5 in the wiring section H6a. As a result, in the pad section H6b, because the surface roughness of the conductor H5 is relatively large, as shown in FIG. 3, the adhesion of solder when a component H20 such as a semiconductor chip is mounted on the pad section H6b is improved, and the mountability of the component H20 on the circuit board H10 is improved. Also, in the wiring section H6a, because the surface roughness of the conductor H5 is relatively small, the wiring will have an approximately constant cross-sectional area, as a result of which the speed of transmission of signals is stabilized. In other words, both improvement of the mountability of the component on the circuit board H10 and stabilization of the speed of transmission of signals are achieved. In FIG. 3, reference numeral H30 denotes a semiconductor device in which the component H20 is mounted on the circuit board H10.

Figure 4A:
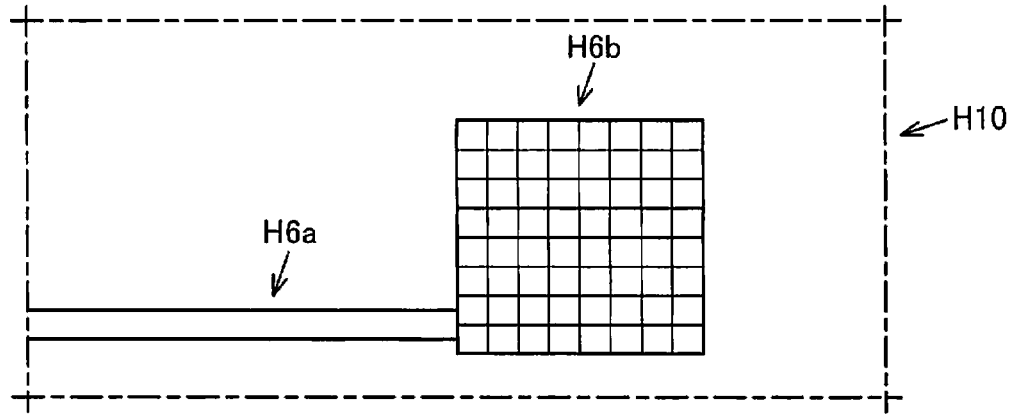
FIGS. 4A, 4B and 4C are partially enlarged plan views showing variations of the pad section of the circuit board.

Next, several variations of the pad section H6b of the circuit board H10 will be described with reference to FIG. 4. FIG. 4A shows a case in which a grid of fine recesses is formed in the surface of the conductor H5 in the pad section H6b when planarly viewed, instead of forming linear fine recesses when planarly viewed. In this case, such a grid of fine recesses when planarly viewed is formed in the bottom surface of the circuit recess H3b by laser processing, cutting work such as dicing, embossing using nano-imprinting or the like when forming a circuit recess H3b in the pad section H6b in the circuit pattern forming step. Due to the growth of an electroless plating film, the surface shape (a grid of fine recesses) of the conductor H5 that follows and reflects the bottom shape is obtained.

Figure 4B:
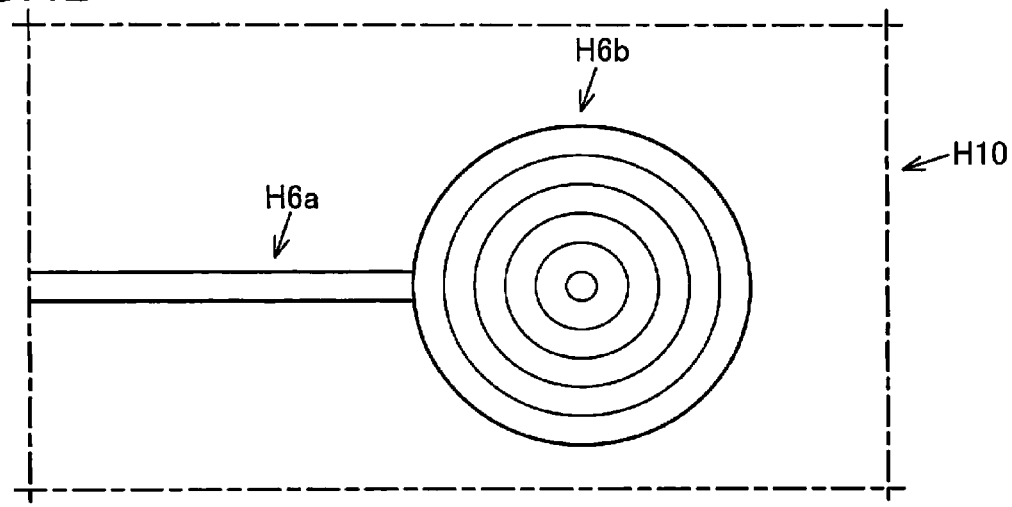
Figure 4C:
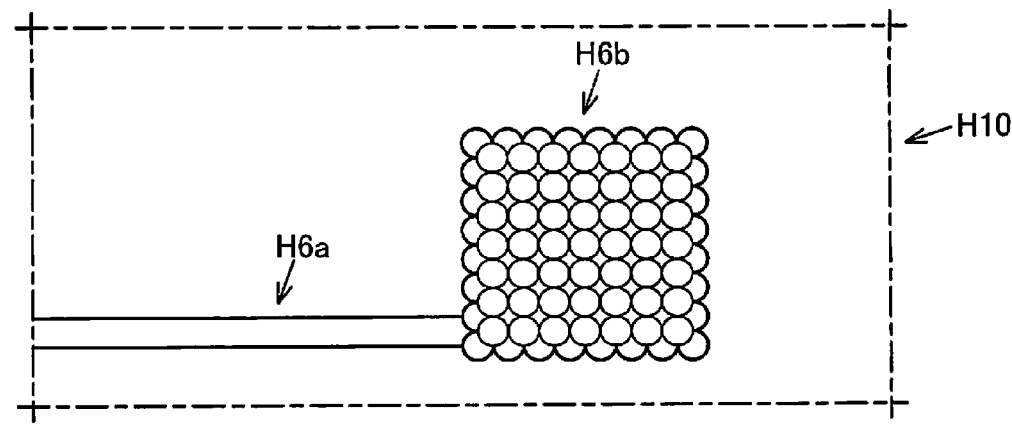
Figure 5A:
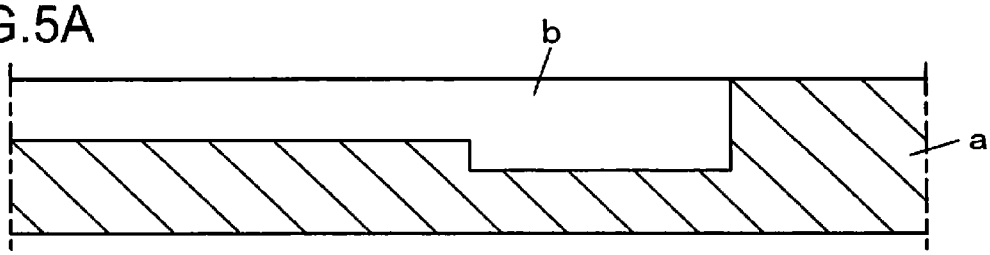
FIGS. 5A-5D show process diagrams illustrating a conventional method for forming an embedded circuit using CMP processing.
Figure 5B:
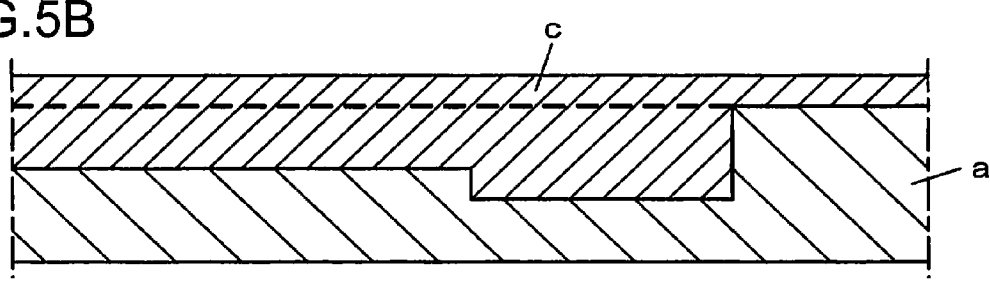
Figure 5C:
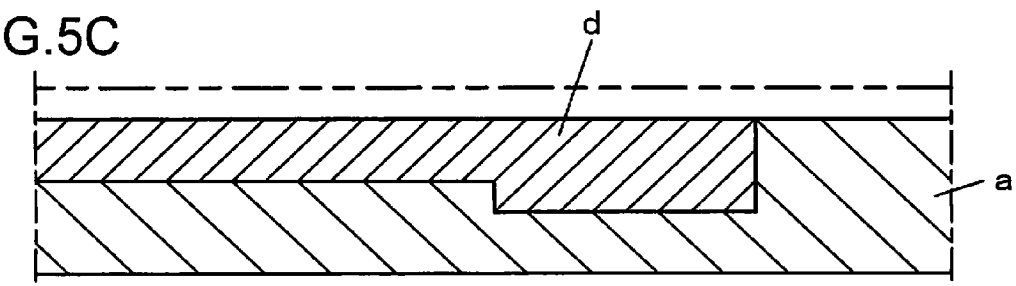
Figure 5D:
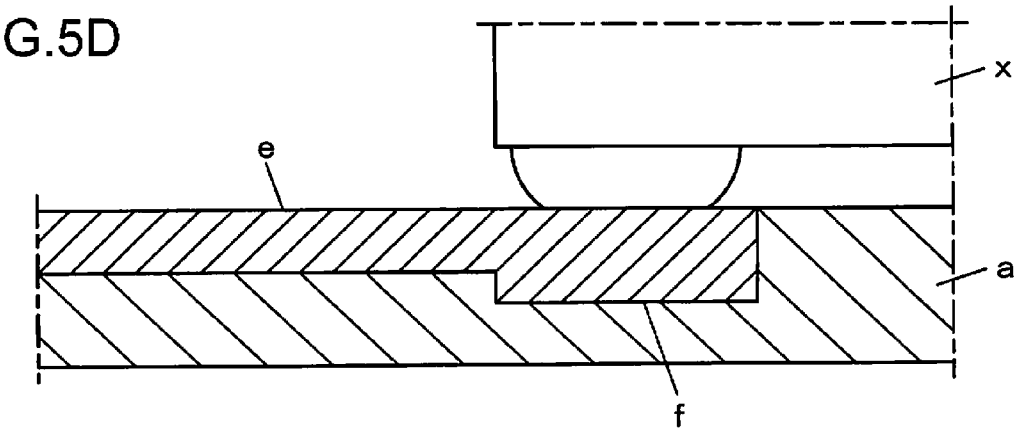

Similarly, FIG. 4B shows a case in which a plurality of ring-shaped fine recesses having different diameters are concentrically formed in the surface of the conductor H5 in the pad section H6b when planarly viewed. In this case, the pad section H6b has a circular shape when planarly viewed. FIG. 4C shows a case in which a large number of dotted fine recesses are formed in the surface of the conductor H5 in the pad section H6b when planarly viewed. Besides these, it is also possible to form fine recesses in the shape of a curve, spiral, zig-zag or the like when planarly viewed. Alternatively, these shapes may be combined, and in the circuit pattern forming step, the circuit recess H3b in the pad section H6b may be formed by laser processing, cutting work such as dicing, embossing using nano-imprinting or the like.

In the above embodiment, a description has been given of the case where the surface roughness of the conductor H5 is different in the wiring section H6a and the pad section H6b of the electric circuit H6 and the surface roughness of the conductor H5 in the pad section H6b is greater than the surface roughness of the conductor H5 in the wiring section H6a. However, besides this, the case where the surface roughness of the conductor H5 in the pad section H6b is smaller than the surface roughness of the conductor H5 in the wiring section H6a is also encompassed in the scope of the present invention. In this case, an advantage can be obtained in which an excellent package that can suppress reduction of the flowability of a resin sealant for packaging and does not have voids or the like can be obtained.

Also, in the above embodiment, a description has been given of the case where the surface roughness of the bottom surface of the circuit recess H3 is different in the wiring section H6a and the pad section H6b of the electric circuit H6, and the surface roughness of the bottom surface of the circuit recess H3b in the pad section H6b is greater than the surface roughness of the bottom surface of the circuit recess H3a in the wiring section H6a. However, besides this, the case where the surface roughness of the bottom surface of the circuit recess H3a in the wiring section H6a is greater than the surface roughness of the bottom surface of the circuit recess H3b in the pad section H6b is also encompassed in the scope of the present invention. In this case, an advantage can be obtained in which in the wiring section H6a, excellent bonding strength of the conductor H5 to the insulating base substrate H1 can be obtained and separation of the conductor H5 in the wiring section H6a from the insulating base substrate H1 can be suppressed.

Generally, when a comparison is made between the method for producing a circuit board H10 according to the present embodiment illustrated in FIG. 2 and the circuit forming technique using CMP processing illustrated in FIG. 5, because the method for producing a circuit board H10 according to the present embodiment does not require polish processing that is required by the circuit forming technique using CMP processing (in other words, the conductor H5 grows from the bottom surface of the circuit recess H3, follows and reflects the shape of the bottom surface of the circuit recess H3 and keeps the shape), in the electric circuit H6, the entire conductor H5 will have a uniform thickness, and therefore the reliability is maintained. In contrast, the circuit forming technique using CMP processing requires polish processing. Thus, in the electric circuit H6, a variation is created in the thickness of the conductor H5, that is, in the portion in which the position of the bottom surface of the circuit recess H3 is low, the conductor H5 will be thick, and in the portion in which the position of the bottom surface of the circuit recess H3 is high, the conductor H5 will be thin, and therefore the reliability is lowered. Furthermore, as a result of polish processing being performed, a situation may occur in which the conductor H5 is removed and the portion in which the position of the bottom surface of the circuit recess H3 is high is exposed, causing a possibility that the component H20 cannot be mounted on the pad section H6b and a possibility that signal transmission is not possible in the wiring section H6a.

[Embodiment 2]

The present invention relates to a method for manufacturing a circuit board and a circuit board obtained by the production method.

In electric equipment such as portable information terminal devices, e.g., mobile phones; computers and peripherals therefor; various types of home information appliances; and the like, its functionality is being rapidly enhanced. Along with this trend, there is a growing demand for electric circuits with a further increased density in circuit boards mounted on such electric equipment. In order to meet the demand for circuits with an increased density, there is a need for methods that can precisely form electric circuit wiring having an even smaller line width and line interval (the width of a space between adjacent electric circuits). Highly densified circuit wiring is likely to cause short-circuiting, migration and the like between wires.

A known method for manufacturing a circuit board is to form an electric circuit on an insulating base substrate by a subtractive method, additive method or the like. The subtractive method is a method for forming an electric circuit by removing (subtracting) a metal foil from a portion of the surface of a metal foil-clad laminate plate other than the portion where formation of an electric circuit is desired. The additive method is a method for forming an electric circuit by applying an electroless plating only to the portion of an insulating base substrate where formation of an electric circuit is desired.

The subtractive method is a method in which the metal foil on the surface of a metal foil-clad laminate plate is etched such that the metal foil is left on the portion where formation of an electric circuit is desired and that the metal foil on the other portion is removed. This method is disadvantageous in terms of production cost because the metal of the removed portion is wasted. With the additive method, on the other hand, metal wiring can be formed only in the portion where formation of an electric circuit is desired by electroless plating. Accordingly, waste of metal is avoided and waste of resources is little. From such a point of view, the additive method is a preferable circuit forming method.

A method for forming an electric circuit made of metal wiring using a full additive method, which is a conventional typical additive method, will be described with reference to FIG. 10. FIG. 10 shows schematic cross-sectional views illustrating respective steps for forming metal wiring by a conventional full additive method.

Figure 10A:
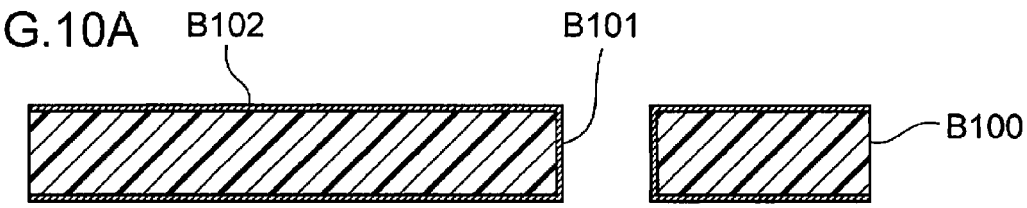
FIGS. 10A-10E show schematic cross-sectional views illustrating respective steps for forming metal wiring by a conventional full additive method.
Figure 10B:
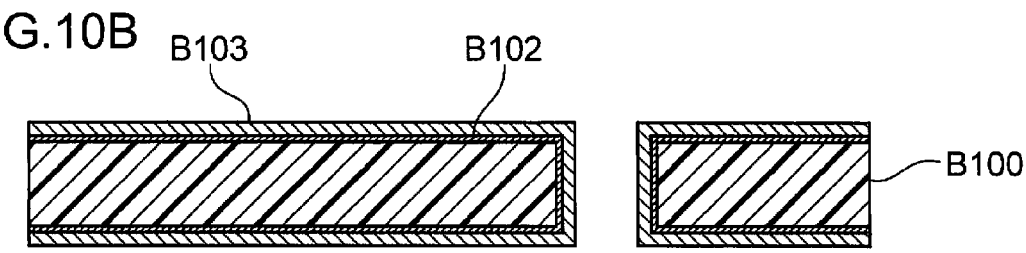
Figure 10C:
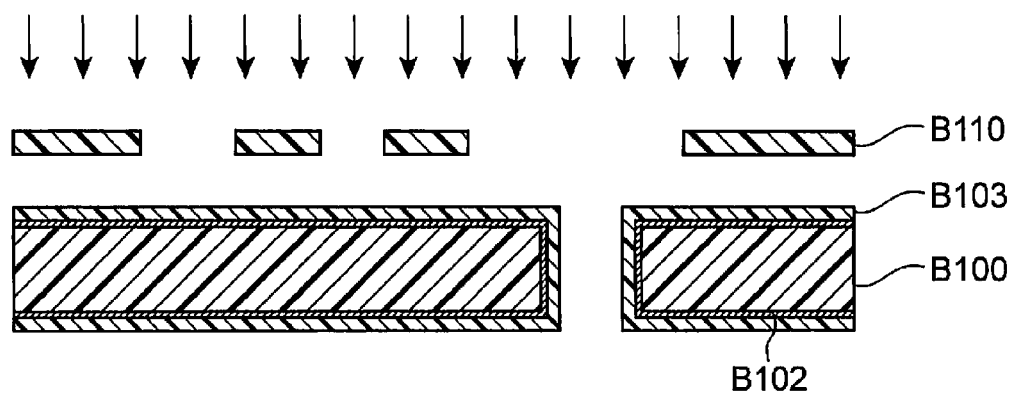
Figure 10D:
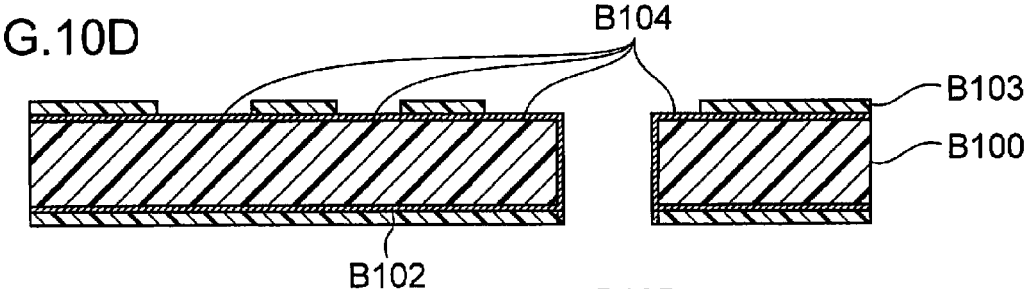
Figure 10E:
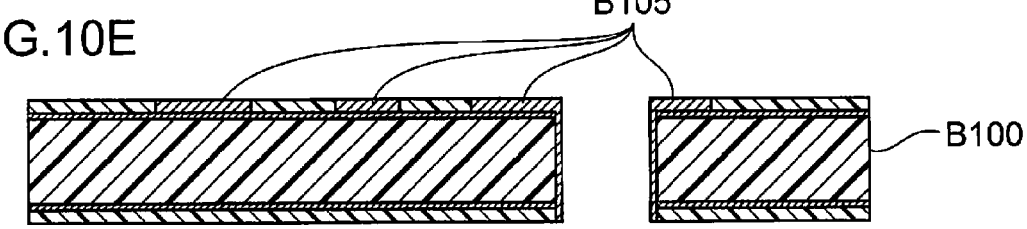

First, as shown in FIG. 10A, a plating catalyst B102 is applied to the surface of an insulating base substrate B100 in which a through-hole B101 has been formed. The surface of the insulating base substrate B100 has been roughened in advance. Next, as shown in FIG. 10B, a photoresist layer B103 is formed on the insulating base substrate B100 to which the plating catalyst B102 has been applied. Next, as shown in FIG. 10C, the photoresist layer B103 is exposed to light via a photomask B110 in which a specific circuit pattern has been formed. Next, as shown in FIG. 10D, the exposed photoresist layer B103 is developed to form a circuit pattern B104. Then, as shown in FIG. 10E, an electroless plating such as an electroless copper plating is applied so as to form metal wiring B105 in the surface of the circuit pattern B104 formed as a result of development and the inner wall surface of the through-hole B101. By performing steps as described above, a circuit made of the metal wiring B105 is formed on the insulating base substrate B100.

With the above-described conventional additive method, the plating catalyst B102 is applied to the entire surface of the insulating base substrate B100. As a result, the following problem arises. Specifically, if the photoresist layer B103 is developed with high precision, a plating can be formed only in the portion that is not protected by the photoresist. However, if the photoresist layer B103 is not developed with high precision, as shown in FIG. 11, an unwanted plated portion B106 may remain in the portion in which a plating does not need to be formed. Such a situation occurs because the plating catalyst B102 is applied to the entire surface of the insulating base substrate B100. The unwanted plated portion B106 causes short-circuiting, migration and the like between adjacent circuits. Such short-circuiting and migration are more likely to occur in the case where a circuit having a small line width and line interval is formed. FIG. 11 is a schematic cross-sectional view illustrating the contour of a circuit formed by the conventional full additive method.

There are production methods that are different from the above-described method for manufacturing a circuit board, for example, those disclosed in JP S57-134996A and JP S58-186994A.

As another additive method, JP S57-134996A discloses the following method.

First, a solvent-soluble first photosensitive resin layer and an alkali-soluble second photosensitive resin layer are formed on an insulating substrate (insulating base substrate). Then, the first and second photosensitive resin layers are exposed to light via a photomask having a specific circuit pattern. Next, the first and second photosensitive resin layers are developed. Next, a catalyst is adsorbed to the entire surface that includes recesses created as a result of development, after which the alkali-soluble second photosensitive resin is dissolved with an alkali solution so as to remove only an unnecessary catalyst. Thereafter, an electroless plating is applied so as to precisely form a circuit only in the portion in which the catalyst is present.

JP S58-186994A discloses the following method.

First, a resin protective film is coated on an insulating substrate (insulating base substrate) (first step). Next, a trench and a through-hole that correspond to a wiring pattern are independently or simultaneously drawn/formed in the insulating substrate coated with the protective film by machining or laser beam radiation (second step). Next, an activation layer is formed on the entire surface of the insulating substrate (third step). Next, the protective film is separated so as to remove the activation layer on the insulating substrate and leave the activation layer only in the trench and the inner wall surface of the through-hole (fourth step). Next, a plating without a plating protective film is applied to the insulating substrate so as to selectively form a conductive layer only in the trench and the inner wall surface of the through-hole that have been activated (fifth step).

The method disclosed in JP S57-134996A, however, requires forming two types of photosensitive resin layers having different solvent-solubilities, developing the photosensitive resin layers using two types of solvents, and dissolving the second photosensitive resin in an alkali solution after the catalyst has been adsorbed, and thus the production process is very complex.

JP S58-186994A also discloses that thermosetting resin serving as a protective film is coated on an insulating substrate, heated and cured, and thereafter the protective film and the insulating substrate are cut along a specific wiring pattern, and that the thermosetting resin on the surface of the insulating substrate is removed with a solvent (line 16 of the lower left column to line 11 of the lower right column on page 2 of JP S58-186994A).

JP S58-186994A does not disclose specific types of thermosetting resins that can be used as the protective film. Generally used thermosetting resins have strong resistance to solvents, and thus there has been a problem in that it is difficult to remove the resin with an ordinary solvent. Also, such thermosetting resins have a high level of adhesion to a resin base substrate, and thus it has been difficult to precisely remove only the protective film, without leaving a fragment of the protective film on the surface of the resin base substrate. Also, if a strong solvent is used to sufficiently separate the resin or where immersion is performed for a long time, the plating catalyst on the surface of the base substrate is also removed. In this case, no conductive layer will be formed in the portion from which the plating catalyst has been removed. Also, if a strong solvent is used or immersion is performed for a long time, there are cases where the protective film made of thermosetting resin is broken into pieces, causing the plating catalyst in the protective film to be re-dispersed in the solvent. Also, there is a possibility that the plating catalyst that has been re-dispersed in the solvent might re-attach to the surface of the resin base substrate, forming an unwanted plating film in that portion. Accordingly, with a method such as that disclosed in JP S58-186994, it is difficult to form a circuit having a precise contour.

The present invention has been conceived in view of the above circumstances, and it is an object of the present invention to provide a method for manufacturing a circuit board with which it is possible to form even an electric circuit having a small line width and line interval on an insulating base substrate with high precision. Another object is to provide a circuit board obtained by the method for manufacturing a circuit board.

In order to form an electric circuit on an insulating base substrate with high precision, the present inventors first developed a method for manufacturing a circuit board that is different from conventional methods, the method including: a coating film forming step of forming a resin coating film on a surface of an insulating base substrate; a circuit pattern forming step of forming a circuit pattern section by forming at least either a circuit trench or hole having a desired shape and depth by laser processing or machining the insulating base substrate from an outer surface side of the resin coating film; a catalyst application step of applying a plating catalyst or precursor thereof to a surface of the circuit pattern section and a surface of the resin coating film; a coating film separation step of separating the resin coating film from the insulating base substrate; and a plating treatment step of applying an electroless plating to the insulating base substrate from which the resin coating film has been separated. Then, the present inventors focused attention on the insulating base substrate and the resin coating film that are used in the method for manufacturing a circuit board described above, in particular to the surface roughness of the insulating base substrate.

Usually, when producing a circuit board, it is often the case that little consideration is given to the surface roughness of the insulating base substrate used. Even if consideration is given to the surface roughness of the insulating base substrate, it is generally believed that in the case of conventional methods for forming an electric circuit on an insulating base substrate, the surface roughness is preferably large to some extent in order to increase the adhesion between the electric circuit and the insulating base substrate. Also, in the case of forming an electric circuit by partially removing a metal foil on the surface of a metal-clad laminate plate obtained by laminating the metal foil on a prepreg and molding by application of heat and pressure, the smoothness of the insulating base substrate serving as a support base substrate of an electric circuit is likely to be reduced during removal of the metal foil. Because of this, it has been accepted as a common practice to use as the insulating base substrate, those having a relatively large surface roughness, instead of reducing the surface roughness by performing smoothing processing or the like.

However, the present inventors found that when an insulating base substrate having a relatively large surface roughness is used in the method for manufacturing a circuit board described above, a phenomenon occurs in which it is difficult to form an electric circuit with high precision.

The present inventors assumed the following reasons for this phenomenon.

When an insulating base substrate having a relatively large surface roughness is used, at the time of forming a resin coating film, particularly a resin coating film having a thickness of 5 μm or less on the surface of the insulating base substrate in the coating film forming step, it seems difficult to form a resin coating film having a uniform thickness. This is considered to cause the above phenomenon.

Specifically, first, when an insulating base substrate having a relatively large surface roughness, for example, an insulating base substrate having a surface roughness Ra of 0.6 μm and a surface roughness Rz of 7 μm is used and a resin coating film, particularly a thin resin coating film is formed on the surface of the insulating base substrate, the insulating base substrate is likely to be exposed from the resin coating film. If there is a portion in which the insulating base substrate is exposed from the resin coating film, a plating layer may be undesirably formed in the exposed portion although it is not a portion where formation of an electric circuit is desired.

Furthermore, even if the insulating base substrate is not exposed from the resin coating film, a particular portion of the resin coating film formed on the surface of the insulating base substrate may become thin. If, for example, such a portion in which the resin coating film is thin exists in a location near the portion in which a circuit trench or hole is to be formed, the resin coating film of the portion in which the resin coating film is thin, which is near the portion in which a circuit trench or hole is to be formed, may be removed when forming the circuit trench or hole. And, a plating layer may be formed even in the portion in which formation of an electric circuit is not desired, which is near the circuit trench or hole.

It appears that the above problem can be solved by increasing the thickness of the resin coating film, which is formed on the surface of the insulating base substrate, to for example 10 μm, but if the thickness of the resin coating film is increased, in the circuit pattern forming step, for example, it tends to be difficult to form a circuit trench or hole with high precision by laser processing or the like. Accordingly, in the above-described method for manufacturing a circuit board, in order to form an electric circuit with high precision, the resin coating film preferably has a thickness of 5 μm or less. In this case, however, the problem described above arises.

Consequently, the present inventors concluded that using an insulating base substrate having a relatively large surface roughness in the above-described method for manufacturing a circuit board makes it difficult to form an electric circuit with high precision regardless of the thickness of the resin coating film formed on the surface of the insulating base substrate.

With this in mind, the present inventors arrived at the present invention as described below that uses an insulating base substrate having a relatively low surface roughness in the above-described method for manufacturing a circuit board.

A method for manufacturing a circuit board according to an embodiment of the present invention includes: a coating film forming step of forming a resin coating film on a surface of an insulating base substrate; a circuit pattern forming step of forming a circuit pattern section by forming at least either a circuit trench or hole having a desired shape and depth by laser processing or machining the insulating base substrate from an outer surface side of the resin coating film; a catalyst application step of applying a plating catalyst or precursor thereof to a surface of the circuit pattern section and a surface of the resin coating film; a coating film separation step of separating the resin coating film from the insulating base substrate; and a plating treatment step of applying an electroless plating to the insulating base substrate from which the resin coating film has been separated, wherein in the coating film forming step, an insulating base substrate with a smooth surface having a surface roughness Ra of 0.5 μm or less is used as the insulating base substrate and the resin coating film is formed on the smooth surface side.

With this configuration, even an electric circuit having a small line width and line interval can be formed on the insulating base substrate with high precision.

The reason is presumably as follows.

First, the smooth surface, which is the surface on the side on which the resin coating film is formed, of the insulating base substrate has a smoothness as high as a surface roughness Ra of 0.5 μm or less, and thus even if the resin coating film formed on the smooth surface of the insulating base substrate is thin, it seems that the resin coating film can be formed uniformly. Specifically, it seems that a situation is unlikely to occur in which the insulating base substrate is easily exposed from the resin coating film or only a particular portion of the resin coating film becomes thin. Accordingly, it seems that the occurrence of the above-described problem caused by the insulating base substrate being exposed or by the thickness of a particular portion of the resin coating film being reduced is suppressed.

It is preferable that the smooth surface has a surface roughness represented by Ra that is 1/10 or less of the thickness of the resin coating film. With this configuration, it is possible to form an electric circuit on the insulating base substrate with higher precision.

This further suppresses a situation in which the insulating base substrate is exposed or only a particular portion of the resin coating film becomes thin, and therefore it seems that the occurrence of the above-described problem caused by the insulating base substrate being exposed or the like can be further suppressed.

Also, it is preferable that the smooth surface has a surface roughness represented by Rz that is less than or equal to the thickness of the resin coating film. With this configuration, it is possible to form an electric circuit on the insulating base substrate with higher precision.

This further suppresses a situation in which the insulating base substrate is exposed or only a particular portion of the resin coating film becomes thin, and therefore it seems that the occurrence of the above-described problem caused by the insulating base substrate being exposed or the like can be further suppressed.

Also, it is preferable that the insulating base substrate used in the coating film forming step is obtained by pressing with a smooth plate, smooth film, smooth sheet or smooth foil.

With this configuration, even when an insulating base substrate having a relatively large surface roughness is used, an electric circuit can be easily formed on the insulating base substrate with high precision if the insulating base substrate is obtained by pressing with a smooth plate, smooth film, smooth sheet or smooth foil.

A circuit board according to another embodiment of the present invention is obtained by the above method for manufacturing a circuit board. With this configuration, it is possible to obtain a circuit board in which even an electric circuit having a small line width and line interval is formed on an insulating base substrate with high precision.

According to the present invention, it is possible to provide a method for manufacturing a circuit board with which even an electric circuit having a small line width and line interval can be formed on an insulating base substrate with high precision. Also, a circuit board obtained by the method for manufacturing a circuit board is provided.

Specifically, Embodiment 2 of the present invention encompasses the following.

2-1. A method for manufacturing a circuit board including:

a coating film forming step of forming a resin coating film on a surface of an insulating base substrate;

a circuit pattern forming step of forming a circuit pattern section by forming at least either a circuit trench or hole having a desired shape and depth by laser processing or machining the insulating base substrate from an outer surface side of the resin coating film;

a catalyst application step of applying a plating catalyst or precursor thereof to a surface of the circuit pattern section and a surface of the resin coating film;

a coating film separation step of separating the resin coating film from the insulating base substrate; and a plating treatment step of applying an electroless plating to the insulating base substrate from which the resin coating film has been separated, wherein in the coating film forming step, an insulating base substrate with a smooth surface having a surface roughness Ra of 0.5 μm or less is used as the insulating base substrate and the resin coating film is formed on the smooth surface side.

2-2. The method for manufacturing a circuit board according to 2-1,
wherein the smooth surface has a surface roughness represented by Ra that is 1/10 or less of the thickness of the resin coating film.

2-3. The method for manufacturing a circuit board according to 2-1 or 2-2,
wherein the smooth surface has a surface roughness represented by Rz that is less than or equal to the thickness of the resin coating film.

2-4. The method for manufacturing a circuit board according to any one of 2-1 to 2-3,
wherein the insulating base substrate used in the coating film forming step is obtained by pressing with a smooth plate, smooth film, smooth sheet or smooth foil.

2-5. A circuit board obtained by the method for manufacturing a circuit board according to any one of 2-1 to 2-4.

Hereinafter, embodiments of the present invention will be described, but the present invention is not limited thereto.

[Embodiment 2-1]

A method for manufacturing a circuit board according to the present embodiment includes: a coating film forming step of forming a resin coating film on a surface of an insulating base substrate; a circuit pattern forming step of forming a circuit pattern section by forming at least either a circuit trench or hole having a desired shape and depth by laser processing or machining the insulating base substrate from an outer surface side of the resin coating film; a catalyst application step of applying a plating catalyst or precursor thereof to a surface of the circuit pattern section and a surface of the resin coating film; a coating film separation step of separating the resin coating film from the insulating base substrate; and a plating treatment step of applying an electroless plating to the insulating base substrate from which the resin coating film has been separated, wherein in the coating film forming step, an insulating base substrate with a smooth surface having a surface roughness Ra of 0.5 μm or less is used as the insulating base substrate and the resin coating film is formed on the smooth surface side.

The method for manufacturing a circuit board according to Embodiment 2-1 of the present invention will be described first. FIG. 6 is a schematic cross-sectional view illustrating respective steps of the method for manufacturing a circuit board according to Embodiment 2-1.

Figure 6A:
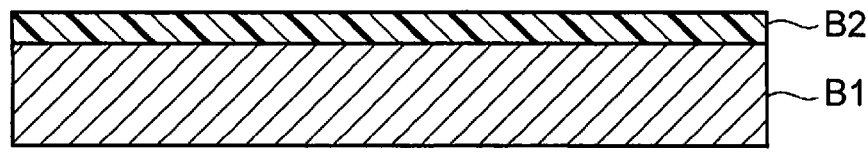
FIGS. 6A-6E show schematic cross-sectional views illustrating respective steps of a method for manufacturing a circuit board according to Embodiment 2-1.

First, as shown in FIG. 6A, a resin coating film B2 is formed on the surface of an insulating base substrate B1. Although described in detail later, an insulating base substrate with a smooth surface having a surface roughness Ra of 0.5 μm or less is used as the insulating base substrate B1. The resin coating film B2 is formed on the smooth surface. This step corresponds to the coating film forming step.

Figure 6B:
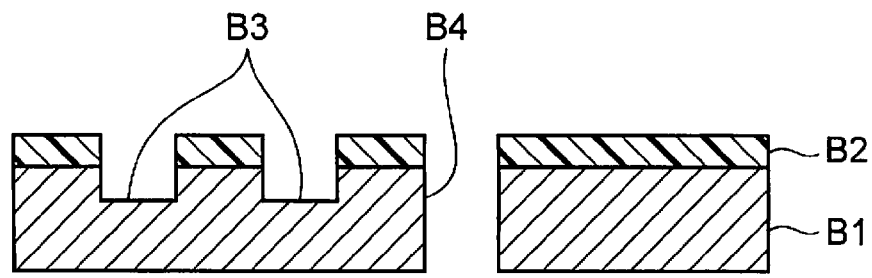

Next, as shown in FIG. 6B, the insulating base substrate B1 on which the resin coating film B2 has been formed is laser processed or machined from the outer surface side of the resin coating film B2 so as to form at least either a circuit trench B3 or through-hole B4 having a desired shape and depth. In other words, only the circuit trench B3 may be formed, or only the through-hole B4 may be formed, or both the circuit trench B3 and the through-hole B4 may be formed, as necessary. In the laser processing or machining for forming the circuit trench B3, cutting is performed to a degree that is deeper than the thickness of the resin coating film B2 with respect to the outer surface of the resin coating film B2. The laser processing or machining for forming the through-hole B4 is a drilling process in which cutting is performed to a degree that is deeper than the thicknesses of the resin coating film B2 and the insulating base substrate B1. The circuit trench B3 and the through-hole B4 correspond to the circuit pattern section, and this step corresponds to the circuit pattern forming step.

Figure 6C:
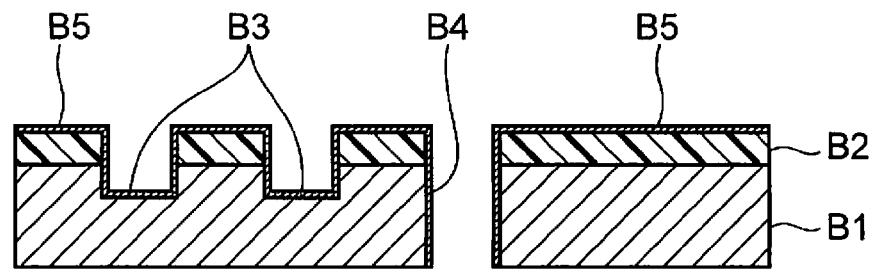

Next, as shown in FIG. 6C, a plating catalyst or precursor thereof B5 is applied to the surfaces of the circuit trench B3 and the through-hole B4 and the surface of the resin coating film B2 in which neither the circuit trench B3 nor the through-hole B4 is formed. This step corresponds to the catalyst application step.

Figure 6D:
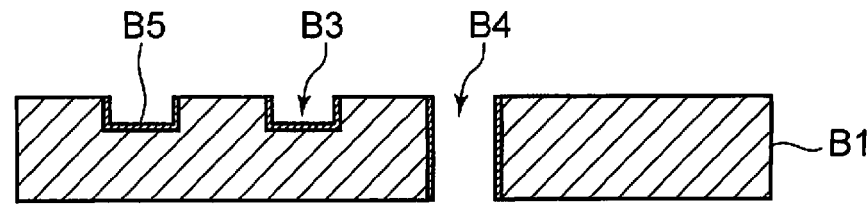

Next, as shown in FIG. 6D, the resin coating film B2 is separated from the insulating base substrate B1. By doing so, the plating catalyst or precursor thereof B5 can be left only in the surface of the portion in which the circuit trench B3 and the through-hole B4 are formed, of the insulating base substrate B1. The plating catalyst or precursor thereof B5 applied to the surface of the resin coating film B2, on the other hand, is removed together with the resin coating film B2, while being carried on the resin coating film B2. This step corresponds to the coating film separation step.

Figure 6E:
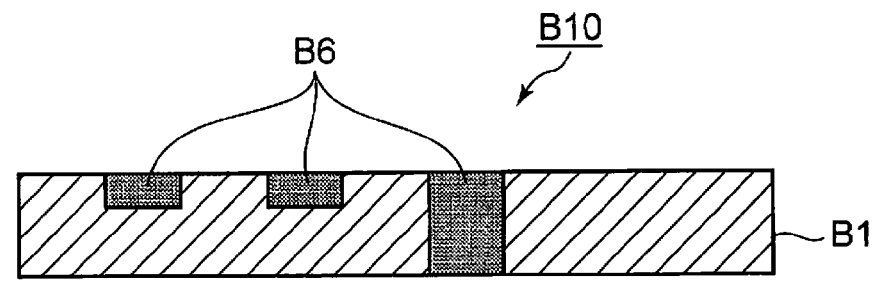

Next, an electroless plating is applied to the insulating base substrate B1 from which the resin coating film B2 has been separated. By doing so, a plating layer is formed only in the portion in which the plating catalyst or precursor thereof B5 remains. Specifically, as shown in FIG. 6E, the plating layer that will be an electric circuit B6 is formed in the portion in which the circuit trench B3 and the through-hole B4 have been formed. The electric circuit B6 may be made of the plating layer or a thick film formed by further applying an electroless plating (fill-up plating) to the plating layer. More specifically, for example, as shown in FIG. 6E, the electric circuit B6 made of the plating layer may be formed so as to fill the circuit trench B3 and the entire through-hole B4, thereby removing the level difference between the insulating base substrate B1 and the electric circuit. This step corresponds to the plating treatment step.

Through the aforementioned steps, the circuit board B10 as shown in FIG. 6E is formed. In the circuit board B10 formed in the manner described above, even an electric circuit having a small line width and line interval is formed on an insulating base substrate with high precision. In other words, according to the above-described production method, even an electric circuit having a small line width and line interval can be formed on an insulating base substrate with high precision.

After the plating treatment step has been performed, specifically, before or after the fill-up plating, desmear treatment may be performed. By performing desmear treatment, unnecessary resin that has adhered to the plating layer can be removed. In the case where a multilayer circuit board including the obtained circuit board is considered, the surface of the portion, in which the plating layer is not formed, of the insulating base substrate may be roughened to improve the adhesion to an upper layer or the like of the circuit board. Furthermore, the via-hole bottom may be desmeared. By doing so, unnecessary resin that has adhered to the via-hole bottom can be removed.

The desmear treatment is not particularly limited, and any known desmear treatment can be used. Specifically, for example, immersion in a permanganate solution or the like can be used.

Figure 7A:
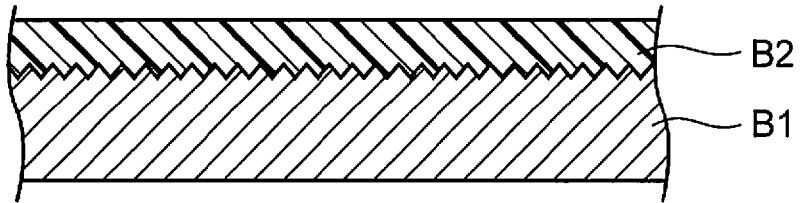
FIGS. 7A-7E show diagrams illustrating the state of an insulating base substrate B1 after the respective steps of Embodiment 2-1.
Figure 7B:
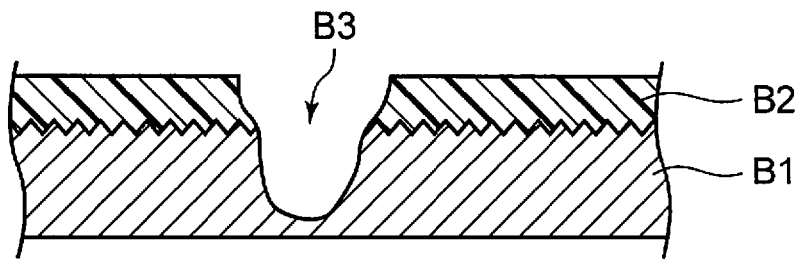
Figure 7C:
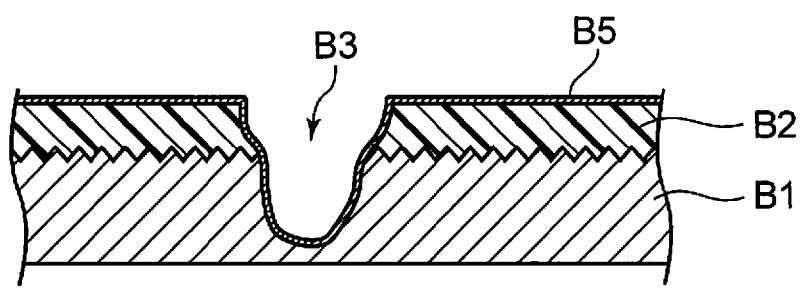
Figure 7D:
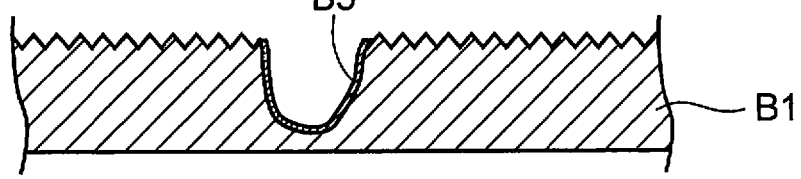
Figure 7E:
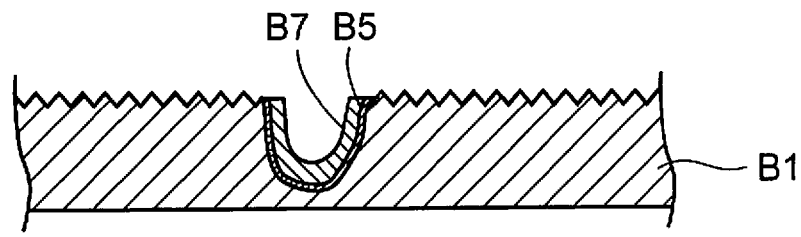

The above-described effect of enhancing the precision of the electric circuit formed on the insulating base substrate is assumed to be based on the following mechanism. FIG. 7 shows diagrams illustrating the state of the insulating base substrate B1 after the respective steps of Embodiment 2-1. FIG. 7A shows the state of the insulating base substrate B1 after the coating film forming step. FIG. 7B shows the state of the insulating base substrate B1 after the circuit pattern forming step. FIG. 7C shows the state of the insulating base substrate B1 after the catalyst application step. FIG. 7D shows the state of the insulating base substrate B1 after the coating film separation step. FIG. 7E shows the state of the insulating base substrate B1 after the plating treatment step. Note that FIG. 7 shows a case in which the circuit trench B3 is formed as the circuit pattern section. Hereinafter, the case in which the circuit trench B3 is formed will be described, but the same applies to the case in which the through-hole B4 is formed.

First, as shown in FIG. 7A, in the insulating base substrate B1 after the coating film forming step, it seems that a resin coating film B2 having a relatively uniform thickness is formed on the insulating base substrate B1. This is presumably due to the fact that the smooth surface, which is the surface on the side on which the resin coating film B2 is formed, of the insulating base substrate B1 has a smoothness as high as a surface roughness Ra of 0.5 µm or less. More specifically, it is presumed that a situation is unlikely to occur in which the insulating base substrate B1 is easily exposed from the resin coating film B2 or only a particular portion of the resin coating film B2 becomes thin.

Next, as shown in FIG. 7B, in the insulating base substrate B1 after the circuit pattern forming step, a circuit trench B3 is formed in the insulating base substrate B1 by laser processing or machining. With respect to the resin coating film B2 formed on the insulating base substrate B1, it seems that only the resin coating film of the portion corresponding to the position in which the circuit trench B3 is formed has been removed with high precision. In other words, it seems that the resin coating film B2 of a portion other than the portion corresponding to the position in which the circuit trench B3 is formed remains with high precision.

By performing the catalyst application step, as shown in FIG. 7C, a plating catalyst or precursor thereof B5 is applied to the surface of the circuit trench B3 and the surface of the resin coating film B2 in which no circuit trench B3 has been formed.

After that, by performing the coating film separation step, as shown in FIG. 7D, it seems that the plating catalyst or precursor thereof B5 remains only in the surface of the circuit trench B3 with high precision.

By performing the plating treatment step, as shown in FIG. 7E, it seems that a plating layer B7 that will be an electric circuit can be formed with high precision.

From the foregoing, according to the method for manufacturing a circuit board of the present embodiment, it seems that even in the case of forming an electric circuit having a small line width and line interval on an insulating base substrate, an electric circuit can be formed with high precision.

The present inventors have also found that, in contrast, in the case where an insulating base substrate B21 having a relatively large surface roughness exceeding a surface roughness Ra of 0.5 µm is used, it is difficult to form an electric circuit with high precision even if it is formed in the same manner as the present embodiment, or in other words, a phenomenon occurs in which the precision of the formed electric circuit is deteriorated. The phenomenon in which the precision of the formed electric circuit is deteriorated is assumed to be due to the following reason.

FIG. 8 shows diagrams illustrating the state of the insulating base substrate B21 having a relatively large surface roughness. FIGS. 8A to E are diagrams that respectively correspond to FIGS. 7A to E.

Figure 8A:
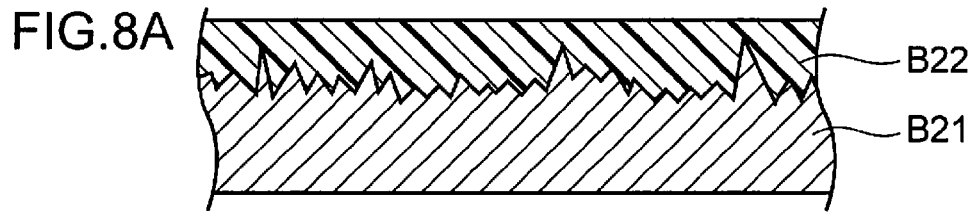
FIGS. 8A-8E show diagrams illustrating the state of an insulating base substrate B21 having a relatively large surface roughness.

First, when a resin coating film is formed on the surface of the insulating base substrate B21 having a relatively large surface roughness, it seems that the resin coating film B22 will have a non-uniform thickness. Specifically, for example, the insulating base substrate B21 may be exposed from the resin coating film B22, or as shown in FIG. 8A, there may be a portion in which the resin coating film B22 is thin. The following describes the case in which there is a portion in which the resin coating film B22 is thin.

Figure 8B:
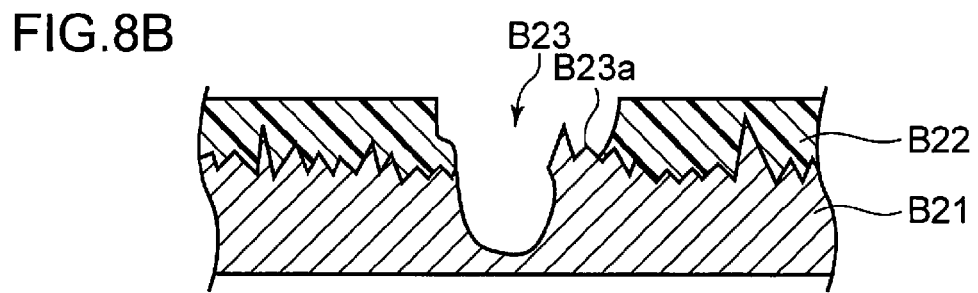

In this case, if the portion in which the resin coating film B22 is thin is near the portion in which a circuit trench B23 is to be formed, as shown in FIG. 8B, the resin coating film B22 near the circuit trench B23 is removed when forming the circuit trench B23. Specifically, it seems that the resin coating film other than the resin coating film of the portion corresponding to the position in which the circuit trench B23 is formed is also removed, forming an exposed portion B23a of the insulating base substrate in a position other than the position in which the circuit trench B23 is formed.

Figure 8C:
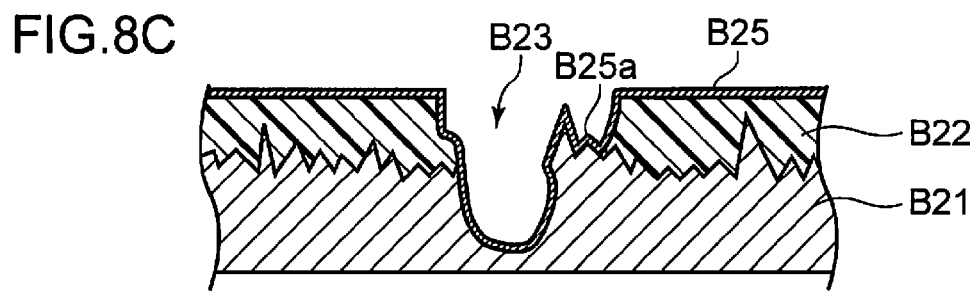

Then, by performing the catalyst application step, as shown in FIG. 8C, it seems that a plating catalyst or precursor thereof B25 is applied not only to the surface of the circuit trench B23 and the surface of the resin coating film B22 in which the circuit trench B23 is not formed, but also to the surface of the exposed portion B23a of the insulating base substrate.

Figure 8D:
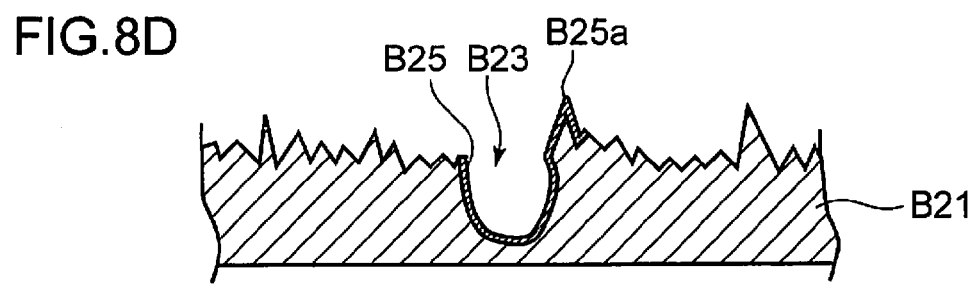

After that, by performing the coating film separation step, as shown in FIG. 8D, it seems that the plating catalyst or precursor thereof B25 remains not only on the surface of the circuit trench B23 but also on the surface of the exposed portion B23a of the insulating base substrate, as a plating catalyst or precursor thereof B25a.

Figure 8E:
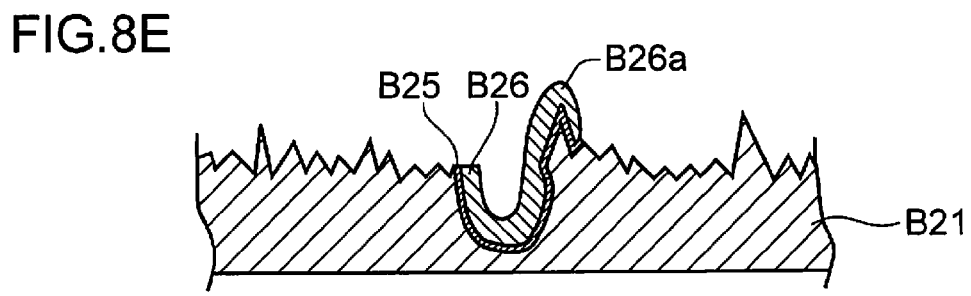

Then, by performing the plating treatment step, as shown in FIG. 8E, it seems that not only a plating layer B26 that will be an electric circuit is formed, but also a plating layer B26a due to the exposed portion B23a of the insulating base substrate is also formed.

From the above, it is seen that the plating layer is formed in a portion other than the portion in which a circuit is to be formed. In other words, it seems difficult to form an electric circuit on an insulating base substrate with high precision.

Hereinafter, each constituent element of the present embodiment will be described.

The insulating base substrate B1 used in the coating film forming step is a base substrate with a smooth surface having a surface roughness Ra of 0.5 µm or less. A specific example of the base substrate can be a resin base substrate containing resin. It is sufficient that the insulating base substrate B1 has a smooth surface having a surface roughness Ra of 0.5 µm or less, and thus a resin base substrate or the like with a smooth surface having a surface roughness Ra of 0.5 µm or less may be used as-is, or a resin base substrate having a relatively large surface roughness that has undergone smoothing processing, which will be described below, may be used. In the coating film forming step, a resin coating film is formed on the smooth surface side. Accordingly, the side of the insulating base substrate on which the resin coating film is not formed, or in other words, a surface other than the smooth surface may have a relatively large surface roughness.

The smooth surface preferably has a surface roughness Ra of 0.5 µm or less, and more preferably 0.3 µm or less. In the case where the surface roughness of the smooth surface is excessively large, as described above, it is likely that an electric circuit cannot be formed with high precision. The surface roughness of the smooth surface is preferably as low as possible, with its lower limit value being set to a surface roughness that can be produced, for example, 0.01 µm if possible.

As the resin, any resin can be used without any particular limitation as long as it can constitute any type of organic substrate that can be used to produce a circuit board. Specific examples include epoxy resin, acrylic resin, polycarbonate resin, polyimide resin, and polyphenylene sulfide resin.

The epoxy resin is not particularly limited as long as it can constitute any type of organic substrate that can be used to produce a circuit board. Specific examples include bisphenol A epoxy resin, bisphenol F epoxy resin, bisphenol S epoxy resin, aralkyl epoxy resin, phenol novolac epoxy resin, alkyl phenol novolac epoxy resin, biphenol epoxy resin, naphthalene epoxy resin, dicyclopentadiene epoxy resin, an epoxidized product of a condensate of phenol and aromatic aldehyde having a phenolic hydroxy group, triglycidyl isocyanurate, and cycloaliphatic epoxy resin. Furthermore, in order to impart flame retardancy, epoxy resin as described above or the like that has been brominated or phosphorus-modified can be used. As the epoxy resin, any of the epoxy resins can be used singly or as a combination of two or more.

In the case where the base substrate is made of any of the aforementioned resins, generally, a curing agent is contained to cure the resin. The curing agent is not particularly limited as long as it can be used as a curing agent. Specifically, for example, dicyandiamide, a phenolic curing agent, an anhydride curing agent, an aminotriazine novolac curing agent or the like can be used. As the phenolic curing agent, for example, a novolac, aralkyl or terpene-type phenolic curing agent can be used. As the curing agent, any of the curing agents listed above may be used singly or as a combination of two or more.

The insulating base substrate B1 may contain a filler. The filler is not particularly limited, and it can be inorganic or organic fine particles.

Specific examples of materials for constituting the inorganic fine particles include: high dielectric fillers such as aluminum oxide ($Al_2O_3$), magnesium oxide (MgO), boron nitride (BN), aluminum nitride (AlN), silica ($SiO_2$), barium titanate ($BaTiO_3$) and titanium oxide ($TiO_2$); magnetic fillers such as hard ferrite; inorganic flame retardants such as magnesium hydroxide ($Mg(OH)_2$), aluminum hydroxide ($Al(OH)_2$), antimony trioxide ($Sb_2O_3$), antimony pentoxide ($Sb_2O_5$), guanidine salt, zinc borate, molybdenum compound and zinc stannate; talc ($Mg_3(Si_4O_{10})(OH)_2$), barium sulfate ($BaSO_4$), calcium carbonate ($CaCO_3$), and mica. As the inorganic fine particles, any of the inorganic fine particles listed above may be used singly or as a combination of two or more. The inorganic fine particles listed above have high levels of heat conductivity, relative dielectric constant, flame retardancy, particle size distribution and flexibility in selecting the color, and therefore in order to selectively exhibit a desired function, appropriate blending and particle size design are performed, and thereby a high level of filling can be easily achieved.

The inorganic fine particles may be surface-treated with a silane coupling agent in order to enhance the dispersibility in the insulating base substrate. The insulating base substrate may contain a silane coupling agent in order to enhance the dispersibility of the inorganic fine particles in the insulating base substrate. Specific examples of the silane coupling agent include epoxy silane, mercapto silane, amino silane, vinyl silane, styryl silane, methacryloxy silane, acryloxy silane and titanate-based silane coupling agents. As the silane coupling agent, any of the silane coupling agents listed above may be used singly or as a combination of two or more.

Also, the insulating base substrate may contain a dispersing agent in order to enhance the dispersibility of the inorganic fine particles in the insulating base substrate. Specific examples of the dispersing agent include alkyl ether, sorbitan ester, alkyl polyether amine, and polymer-based dispersing agents. As the dispersing agent, any of the dispersing agents listed above may be used singly or as a combination of two or more.

A specific example of the organic fine particles can be fine rubber particles.

The form of the insulating base substrate is not particularly limited. Specifically, it may be a sheet, a film, a prepreg, a molded article having a three-dimensional shape, or the like. The thickness of the insulating base substrate B1 is not particularly limited. Specifically, in the case where the insulating base substrate is a sheet, a film or a prepreg, the thickness is preferably, for example, about 10 to 200 μm, and more preferably 20 to 100 μm. The insulating base substrate may contain inorganic fine particles such as silica particles.

The resin coating film B2 is not particularly limited as long as it can be separated in the coating film separation step. Specifically, for example, a resin coating film made of soluble resin that can easily dissolve in an organic solvent or an alkali solution or swellable resin that can swell with a specific fluid (swelling fluid), which will be described below, or the like can be used. Among them, it is particularly preferable to use the swellable resin coating film because precise removal is easy. As the swellable resin coating film, for example, a resin coating film or the like that does not substantially dissolve in a specific fluid (swelling fluid), which will be described below, and that can be easily separated from the surface of the insulating base substrate B1 by being swollen can be used.

The method for forming the resin coating film B2 is not particularly limited. Specific examples include a method in which a fluid material is applied to the principal surface of the insulating base substrate B1 and then dried, and a method in which a preformed resin film or the like that will be the resin coating film B2 is attached to the principal surface of the insulating base substrate B1. The method for applying the fluid material is not particularly limited. Specifically, for example, a conventionally known spin coating method, a bar coater method or the like can be used.

The resin coating film B2 preferably has a thickness of 10 μm or less, and more preferably 5 μm or less. On the other hand, the resin coating film B2 preferably has a thickness of 0.1 μm or greater, and more preferably 1 μm or greater. In the case where the resin coating film B2 is excessively thick, the precision of a trench, a hole and the like formed by laser processing or machining is likely to be low. In the case where the resin coating film B2 is excessively thin, it tends to be difficult to form a resin coating film having a uniform thickness, but in the present embodiment, as described above, a uniform resin coating film is easily formed even when the resin coating film B2 is thin.

As described above, the surface roughness of the smooth surface is preferably as low as possible. More specifically, it is more preferable that the surface roughness falls in the following range, in relation to the thickness of the resin coating film formed on the smooth surface.

The smooth surface preferably has a surface roughness represented by Ra that is 1/10 or less of the thickness of the resin coating film, and more preferably 1/15 or less. Also, the smooth surface preferably has a surface roughness represented by Rz that is less than or equal to the thickness of the resin coating film, and more preferably 2/3 or less of the thickness of the resin coating film.

As described above, by doing so, it is possible to form an electric circuit on the insulating base substrate with higher precision. This is presumably because even when a thin resin coating film in which a circuit trench or through-hole can be formed with high precision, for example, a resin coating film having a thickness of 5 μm or less is formed, it is possible to further suppress a situation in which the insulating base substrate is exposed or only a particular portion of the resin coating film from becomes thin. Accordingly, it seems that the occurrence of the above-described problems caused by exposure of the insulating base substrate, or the like can be further suppressed.

"Ra" used in the present invention is the arithmetic average height of a roughness curve defined by JIS B 0601:2001. "Rz" used in the present invention is the maximum height of a roughness curve defined by JIS B 0601:2001. Ra and Rz can be measured by using, for example, a surface roughness measurement machine, a laser microscope, an atomic force microscope or the like. Specifically, these surface roughnesses can be measured by surface roughness analysis using a scanning confocal laser microscope (LEXT OLS 3000 manufactured by Olympus Corporation), or the like.

Next is a description of an example of a swellable resin coating film suitable as the resin coating film B2.

As the swellable resin coating film, a resin coating film having a degree of swelling in a swelling fluid of 50% or greater can be preferably used. Furthermore, it is more preferable to use a resin coating film having a degree of swelling in a swelling fluid of 100% or greater, and even more preferably a resin coating film having a degree of swelling in a swelling fluid of 1000% or less. In the case where the degree of swelling is too low, the swellable resin coating film is likely to be less separable in the coating film separation step. In the case where the degree of swelling is excessively high, the strength of the coating film will be decreased and the coating film is likely to be less separable as it may rupture when being separated.

The method for forming the swellable resin coating film is not particularly limited. Specific examples include a method in which a fluid material that can form a swellable resin coating film is applied to the smooth surface of the insulating base substrate B1 and dried, and a method in which a fluid material as described above is applied to a support substrate and dried to form a coating film and the coating film is transferred to the smooth surface of the insulating base substrate B1.

As the fluid material that can form the swellable resin coating film, for example, an elastomer suspension, emulsion or the like can be used. Specific examples of the elastomer include diene-based elastomers such as styrene-butadiene copolymers, acryl-based elastomers such as acrylic acid ester copolymers, and polyester-based elastomers. With such an elastomer, a swellable resin coating film having a desired degree of swelling can be easily formed by adjusting the degree of crosslinking, the degree of gelation or the like of the elastomer resin particles dispersed as a suspension or emulsion.

As the swellable resin coating film, in particular, it is preferable to use a coating film whose degree of swelling varies depending on the pH of the swelling fluid. In the case where such a coating film is used, by using different fluid conditions in the catalyst application step and in the coating film separation step, the swellable resin coating film can maintain strong adhesion to the insulating base substrate at the pH used in catalyst application step, and the swellable resin coating film can be easily separated at the pH used in the coating film separation step.

More specifically, for example, in the case where the catalyst application step includes a step of treatment in an acidic plating catalyst colloidal solution (acidic colloidal catalyst metal solution) having a pH in the range of 1 to 3, and the coating film separation step includes a step of swelling the swellable resin coating film in an alkaline solution having a pH in the range of 12 to 14, the swellable resin coating film is preferably a resin coating film that has a degree of swelling in the acidic plating catalyst colloidal solution of 25% or less, and more preferably 10% or less, and preferably has a degree of swelling in the alkaline solution of 50% or greater, more preferably 100% or greater, and even more preferably 500% or greater.

Examples of the swellable resin coating film include a sheet made of an elastomer having a specific amount of carboxyl groups, a sheet obtained by entirely curing an alkali-developable photocurable resist used as a dry film resist (hereinafter also referred to as "DFR") for patterning a printed circuit board, a thermosetting sheet and an alkali-developable sheet.

Specific examples of the elastomer having a carboxyl group include elastomers having a carboxyl group within the molecule by inclusion of a monomer unit having the carboxyl group as a copolymerizable component: diene-based elastomers, such as styrene-butadiene copolymers and acryl-based elastomers such as acrylic acid ester copolymers, and polyester-based elastomers. With such an elastomer, a swellable resin coating film having a desired alkali degree of swelling can be formed by adjusting the acid equivalent, the degree of crosslinking, the degree of gelation or the like of the elastomer dispersed as a suspension or emulsion. The carboxyl group in the elastomer has the effect of separating the swellable resin coating film from the surface of the insulating base substrate by swelling the swellable resin coating film with an aqueous alkaline solution. As used herein, "acid equivalent" refers to a polymer weight per equivalent of carboxyl group.

Specific examples of the monomer unit having a carboxyl group include (meth)acrylic acid, fumaric acid, cinnamic acid, crotonic acid, itaconic acid and maleic anhydride.

The carboxyl group content in such an elastomer having a carboxyl group is preferably 100 to 2000 acid equivalents, and more preferably 100 to 800 acid equivalents. In the case where the acid equivalent is excessively large, it is likely that compatibility with a solvent or other compositions is deteriorated and resistance to a pre-treatment fluid for plating is deteriorated. In the case where the acid equivalent is excessively small, separability in an aqueous alkaline solution is likely to deteriorate.

The molecular weight of the elastomer is preferably 10,000 to 1,000,000, and more preferably 20,000 to 60,000. In the case where the molecular weight of the elastomer is excessively large, separability is likely to deteriorate. In the case where the molecular weight of the elastomer is excessively small, viscosity is likely to deteriorate, as a result of which it will be difficult to maintain a uniform thickness of the swellable resin coating film, and the resistance to the pre-treatment fluid for plating is likely to deteriorate.

Also, as DFR, it is possible to use, for example, a sheet made of a photocurable resin composition containing a photopolymerization initiator and composed of a resin component such as acrylic resin, epoxy resin, styrene resin, phenol resin or urethane resin, containing a specific amount of carboxyl groups. Specific examples of the DFR include sheets obtained by entirely curing a dry film of a photopolymerizable resin composition as disclosed in JP 2000-231190A, JP 2001-201851A and JP H11-212262A, and commercially available alkali-developable DFR such as UFG series manufactured by Asahi Kasei Corporation.

Furthermore, other examples of the resin coating film include resin composed mainly of rosin and containing a carboxyl group (for example, NAZDAR 229 manufactured by Yoshikawa Chemical Co., Ltd.) and resin composed mainly of phenol and containing a carboxyl group (for example, 104F manufactured by LEKTRACHEM Ltd.).

The swellable resin coating film can be easily formed by a method in which a resin suspension or emulsion is applied to the surface of the insulating base substrate by a conventionally known application means such as a spin coating method or bar coater method and dried, or a method in which DFR formed on a support base substrate is attached to the surface of the insulating base substrate by using a vacuum laminator or the like and entirely cured.

The width of the circuit trench and the through-hole formed in the circuit pattern forming step is not particularly limited. Specifically, for example, it is preferable that the circuit trench includes a portion having a line width of at least 5 to 30 µm. The circuit trench B3 defines the portion in which the plating layer is formed by electroless plating, or in other words, the portion in which the electric circuit is formed. Specifically, for example, the width of the circuit trench formed here is the line width of the electric circuit formed in the present embodiment. In other words, in the case of an electric circuit having such a small line width, a circuit board including a sufficiently densified circuit can be obtained. The depth of the circuit trench is the depth of the electric circuit formed in the present embodiment in the case where the level difference between the electric circuit and the insulating base substrate is removed by fill-up plating. Also, in the case where laser processing is used, a fine circuit having a line width of 20 µm or less can also be easily formed.

The plating catalyst or precursor thereof B5 is a catalyst applied in order to form an electroless plating film only on a portion where the formation of the electroless plating film by electroless plating in the plating treatment step is desired. As the plating catalyst, catalysts known for use in electroless plating can be used without particular limitations. Also, it is possible that a precursor of the plating catalyst is applied in advance and the plating catalyst is generated after separating the resin coating film. Specific examples of the plating catalyst include metal palladium (Pd), platinum (Pt), silver (Ag), and the like, and precursors and the like that generate such catalysts.

An example of a method for applying the plating catalyst or precursor thereof B5 may be a method that involves treatment under acidic conditions of pH 1 to 3 with an acidic colloidal Pd—Sn solution and then treatment with an acid solution, or a like method. A specific example may be as follows.

First, the surface of the insulating base substrate B1 in which the circuit trench B3 and the through-hole B4 have been formed is washed for a specific period of time with a warm solution of a surfactant (cleaner/conditioner) to remove oil or the like adhering to the surface. Next, if necessary, soft etching treatment is performed with a sodium persulfate-sulfuric acid-based soft etching agent. Further, acid washing is performed in an acidic solution, such as an aqueous sulfuric acid solution or an aqueous hydrochloric acid solution, having a pH of 1 to 2. Next, pre-dip treatment for allowing chloride ions to be adsorbed on the surface of the insulating base substrate B1 is performed by immersing the substrate in a pre-dip fluid containing an aqueous stannous chloride solution as a principal component in a concentration of about 0.1%. Thereafter, the substrate is further immersed in an acidic colloidal plating catalyst solution, such as an acidic Pd—Sn colloid, having a pH of 1 to 3 that contains stannous chloride and palladium chloride to cause aggregation and adsorption of Pd and Sn. Then, a redox reaction is caused between adsorbed stannous chloride and palladium chloride ($SnCl_2+PdCl_2 \rightarrow SnCl_4+Pd\downarrow$). Thereby, metal palladium, which is a plating catalyst, deposits.

As the acidic colloidal plating catalyst solution, a known acidic colloidal Pd—Sn catalyst solution or the like can be used, and a commercially available plating process using an acidic colloidal plating catalyst solution may be used. Such a process is, for example, systematized and commercially distributed by Rohm and Haas Company.

As the method for removing the resin coating film B2, a method can be used in which the insulating base substrate B1 that has been coated with the resin coating film B2 is immersed in a fluid such as an alkali solution for a specific period of time so as to dissolution-remove or swell-separate the resin coating film B2. As the alkali solution, for example, an aqueous sodium hydroxide solution having a concentration of about 1 to 10% or the like can be used. Removal efficiency may be enhanced by ultrasonic irradiation during immersion. When the coating film is separated after being swollen, the coating film may be peeled off with light force.

The case will be described in which the aforementioned swellable resin coating film is used as the resin coating film B2.

As the fluid (swelling fluid) for swelling the swellable resin coating film B2, any fluid can be used without any particular limitation as long as it can swell the swellable resin coating film B2 to such a degree that the resin coating film B2 can be easily separated, without substantially decomposing or dissolving the insulating base substrate B1, the swellable resin coating film B2 and the plating catalyst or precursor thereof B5. Such a swelling fluid can be selected as appropriate depending on the type, thickness and the like of the swellable resin coating film B2. Specifically, for example, in the case where the swellable resin coating film is made of an elastomer such as a diene-based elastomer, acryl-based elastomer or polyester-based elastomer, for example, an aqueous alkaline solution, such as an aqueous sodium hydroxide solution, having a concentration of about 1 to 10% can be preferably used.

In the case where a plating process including treatment under acidic conditions as described above is used in the catalyst application step, the swellable resin coating film B2 is preferably made of an elastomer having a degree of swelling under acidic conditions of 10% or less and a degree of swelling under alkaline conditions of 50% or greater, such as for example, an diene-based elastomer, acryl-based elastomer or polyester-based elastomer. Such a swellable resin coating film will easily swell and separate in an aqueous alkaline solution having a pH of 12 to 14, for example, an aqueous sodium hydroxide solution having a concentration of about 1 to 10%. In order to enhance separability, ultrasonic irradiation may be performed during immersion. The swellable resin coating film may be peeled off with light force to achieve separation if necessary.

As the method for swelling the swellable resin coating film B2, a method can be used in which the insulating base substrate B1 that has been coated with the swellable resin coating film B2 is immersed in the swelling fluid for a specific period of time. In order to enhance separability, it is particularly preferable to perform ultrasonic irradiation during immersion. If the swellable resin coating film is not separated by simply being swollen, the resin coating film may be peeled off with light force if necessary.

A usable method of the electroless plating treatment may be a method in which the insulating base substrate B1 to which the plating catalyst or precursor thereof B5 has been partially applied is immersed in an electroless plating fluid, and an electroless plating film (a plating layer) is deposited only on the portion to which the plating catalyst or precursor thereof B5 has been applied.

Examples of metals for use in electroless plating include copper (Cu), nickel (Ni), cobalt (Co), aluminum (Al), and the like. Among these, plating containing Cu as a principal component is preferable in terms of excellent conductivity. In the case where Ni is contained, such plating is preferable in terms of excellent corrosion resistance and adhesion to solder.

The thickness of the electroless plating film B6 is not particularly limited. Specifically, it is preferably, for example, about 0.1 to 10 μm and more preferably about 1 to 5 μm. In particular, creating the circuit trench B3 so as to have a large depth enables plating having a large thickness and metal wiring having a large cross-sectional area to be easily formed. In this case, such a thickness is preferable in terms of enhancement of the strength of metal wiring.

Due to the plating treatment step, the electroless plating film deposits only on the portion on the surface of the insulating base substrate B1 where the plating catalyst or precursor thereof B5 remains. Accordingly, a conductive layer can be precisely formed only on the portion where formation of the circuit trench is desired, while deposition of the electroless plating film on the portion where the circuit trench is not formed can be suppressed. Accordingly, even in the case where a plurality of fine circuits having a narrow line width with a small pitch interval are to be formed, unnecessary plating film does not remain between adjacent circuits. Therefore, the occurrence of short circuiting and migration can be suppressed.

[Embodiment 2-2]

The insulating base substrate B1 used in the coating film forming step may be obtained by pressing with a smooth plate, smooth film, smooth sheet or smooth foil. In other words, prior to the coating film forming step, a smoothing step may be performed in which at least a surface, in which the resin coating film is to be formed, of an insulating base substrate for use in the coating film forming step is smoothed. More specifically, a method for manufacturing a circuit board according to the present embodiment includes: a smoothing step of smoothing an insulating base substrate by pressing with a smooth plate, smooth film, smooth sheet or smooth foil such that at least one surface roughness Ra will be 0.5 μm or less; a coating film forming step of forming a resin coating film on the smoothed surface of the insulating base substrate; a circuit pattern forming step of forming a circuit pattern section by forming at least either a circuit trench or hole having a desired shape and depth by laser processing or machining the insulating base substrate from an outer surface side of the resin coating film; a catalyst application step of applying a plating catalyst or precursor thereof to a surface of the circuit pattern section and a surface of the resin coating film; a coating film separation step of separating the resin coating film from the insulating base substrate; and a plating treatment step of applying an electroless plating to the insulating base substrate from which the resin coating film has been separated. The steps other than the smoothing step, namely, the coating film forming step, the circuit pattern forming step, the catalyst application step, the coating film separation step and the plating treatment step are the same as those of Embodiment 2-1 above.

The smoothing step is not particularly limited as long as it is possible to make at least a surface, on which a resin coating film is to be formed, of an insulating base substrate for use in the coating film forming step as smooth as a surface roughness Ra of 0.5 μm or less by pressing the insulating base substrate with a smooth plate, smooth film, smooth sheet or smooth foil. Specifically, for example, the following process is performed. First, a PET film is laminated on the surface of an insulating base substrate. The resulting laminate body is molded by application of heat and pressure. After that, the PET film is separated. By doing so, an insulating base substrate with a smooth surface having a surface roughness Ra of 0.5 μm or less can be obtained. Also, the insulating base substrate before pressing with a smooth plate, smooth film, smooth sheet or smooth foil can have any surface roughness. Specifically, when an insulating base substrate having a surface roughness Ra exceeding 0.5 μm is used, an insulating base substrate with a smooth surface having a surface roughness Ra of 0.5 μm or less can be obtained. When an insulating base substrate originally having a surface roughness Ra of 0.5 μm or less is used, the surface roughness can be further reduced, and thus an electric circuit can be formed with higher precision.

The smooth plate, smooth film, smooth sheet or smooth foil is not particularly limited as long as it has a surface roughness Ra of 0.5 μm or less. Specific examples include a polyethylene terephthalate (PET) film, a polytetrafluoroethylene sheet, the S plane of metal foil, and the M plane of metal foil with low roughness that have a surface roughness Ra of 0.5 μm or less. In the case where the PET film or the like is separated after the insulating base substrate has been cured and molded, the surface of the PET film may be subjected to mold release processing in advance so as to facilitate separation.

The molding by application of heat and pressure can be performed, for example, with a pressure of 0.1 to 4 Pa at a temperature of 40 to 200° C. for 0.5 to 180 minutes.

As described above, the smoothing step is not particularly limited as long as it is possible to make at least a surface, on which a resin coating film is to be formed, of an insulating base substrate as smooth as a surface roughness Ra of 0.5 μm or less by pressing the insulating base substrate with a smooth plate, smooth film, smooth sheet or smooth foil. Specifically, for example, the following process is performed.

First, there is a method in which a smooth plate, smooth film, smooth sheet or smooth foil is laminated on the surface of a base substrate, the resulting laminate body is molded by application of heat and pressure to cure the resin constituting the insulating base substrate, and thereafter the smooth plate, smooth film, smooth sheet or smooth foil is removed by separation or etching.

There is another method in which a smooth plate, smooth film, smooth sheet or smooth foil is laminated on the surface of a base substrate, the resulting laminate body is molded by application of heat and pressure and cured to a B-stage, and thereafter the smooth plate, smooth film, smooth sheet or smooth foil is separated and then heated to further cure the substrate.

There is still another method in which a smooth plate, smooth film, smooth sheet or smooth foil is laminated on the surface of a base substrate, the resulting laminate body is pressed and optionally heated so as not to cure the substrate and the smooth plate, smooth film, smooth sheet or smooth foil is separated and then heated to further cure the substrate.

There is still another method in which a smooth plate, smooth film, smooth sheet or smooth foil is laminated on the surface of a base substrate, the resulting laminate body is molded by application of heat and pressure and cured to a B-stage, thereafter application of pressure is stopped, and heat is applied to further cure the substrate.

According to the above-described production method, even when an insulating base substrate having a surface roughness Ra exceeding 0.5 μm is used, as in Embodiment 2-1 above, an electric circuit can be formed on the insulating base substrate with high precision.

[Embodiment 2-3]

In Embodiments 2-1 and 2-2 above, a circuit board obtained by forming an electric circuit on a planar insulating base substrate has been described, but the present invention is not particularly limited thereto. Specifically, a circuit board (three-dimensional circuit board) provided with an electric circuit with precise wiring can be obtained even when a three-dimensional insulating base substrate having a stepped three-dimensional face is used as an insulating base substrate.

Hereinafter, a three-dimensional method for manufacturing a circuit board according to Embodiment 2-3 will be described.

FIG. 9 shows schematic cross-sectional views illustrating respective steps for producing a three-dimensional circuit board according to Embodiment 2-3.

Figure 9A:
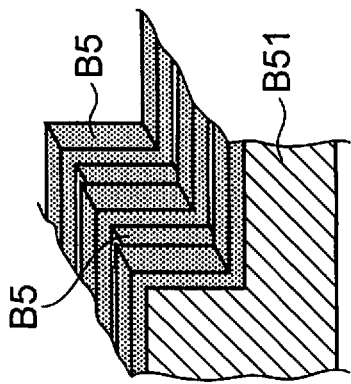
FIGS. 9A-9E show schematic cross-sectional views illustrating respective steps for producing a three-dimensional circuit board according to Embodiment 2-3.

First, as shown in FIG. 9A, a resin coating film B2 is formed on the surface of a three-dimensional insulating base substrate B51 having a stepped portion. This step corresponds to the coating film forming step.

As the three-dimensional insulating base substrate B51, any type of resin molded article that can be used to produce a conventionally known three-dimensional circuit board can be used without any particular limitation. It is preferable to obtain such a molded article by injection molding from the viewpoint of production efficiency. Specific examples of the resin material for obtaining the resin molded article include polycarbonate resin, polyamide resin, various types of polyester resins, polyimide resin, and polyphenylene sulfide resin.

The method for forming the resin coating film B2 is not particularly limited. Specifically, for example, the same forming method as that used in Embodiment 2-1 can be used.

Figure 9B:
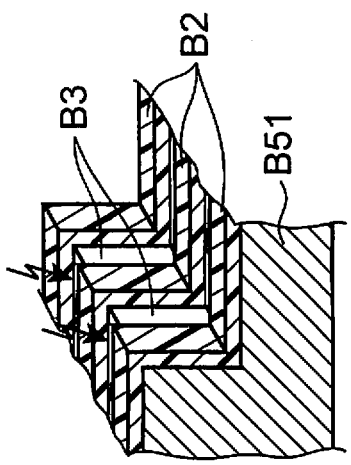

Next, as shown in FIG. 9B, the three-dimensional insulating base substrate B51 on which the resin coating film B2 has been formed is laser processed or machined from the outer surface side of the resin coating film B2 so as to form at least either a circuit trench B3 or through-hole having a desired shape and depth. In other words, only the circuit trench B3 may be formed, only the through-hole B4 may be formed, or both the circuit trench B3 and the through-hole B4 may be formed as necessary. In the laser processing or machining for forming the circuit trench B3, cutting is performed to a degree that is deeper than the thickness of the resin coating film B2 with respect to the outer surface of the resin coating film B2. The laser processing or machining for forming the through-hole is a drilling process in which cutting is performed to a degree that is deeper than the thicknesses of the resin coating film B2 and the insulating base substrate B1. The circuit trench B3 and the through-hole correspond to the circuit pattern section, and this step corresponds to the circuit pattern forming step. Note that FIG. 9 shows the case where the circuit trench B3 is formed as the circuit pattern section. Hereinafter, the case in which the circuit trench B3 is formed will be described, but the same applies to the case in which the through-hole is formed.

The portion in which the plating layer is formed by electroless plating, or in other words, the portion in which the electric circuit is formed is defined by the circuit trench B3.

Figure 9C:
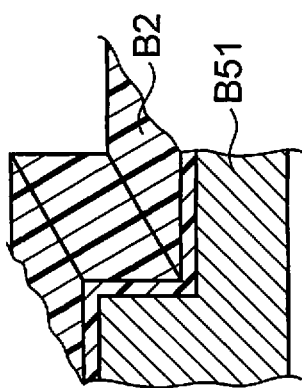

Next, as shown in FIG. 9C, a plating catalyst or precursor thereof B5 is applied to the surface of the circuit trench B3 and the surface, in which the circuit trench B3 is not formed, of the resin coating film B2. This step corresponds to the catalyst application step. With the catalyst application process, as shown in FIG. 9C, the plating catalyst or precursor thereof B5 can be applied to the surface of the circuit trench B3 and the surface of the resin coating film B2.

Figure 9D:
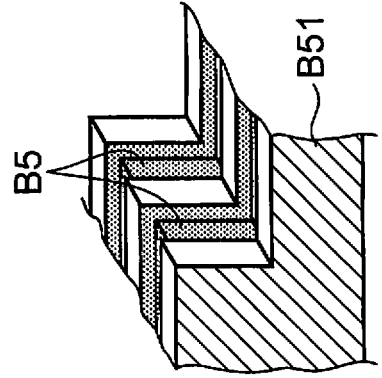

Next, as shown in FIG. 9D, the resin coating film B2 is separated from the three-dimensional insulating base substrate B51. By doing so, the plating catalyst or precursor thereof B5 can be left only in the surface of the portion in which the circuit trench B3 is formed, of the three-dimensional insulating base substrate B51. The plating catalyst or precursor thereof B5 applied to the surface of the resin coating film B2, on the other hand, is removed together with the resin coating film B2, while being carried on the resin coating film B2. This step corresponds to the coating film separation step.

Figure 9E:
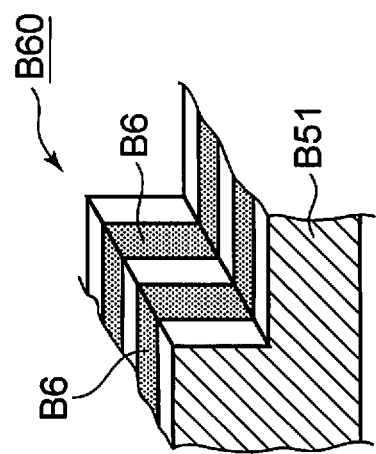

Next, as shown in FIG. 9E, an electroless plating is applied to the three-dimensional insulating base substrate B51 from which the resin coating film B2 has been separated. By doing so, a plating layer B6 is formed only in the portion in which the plating catalyst or precursor thereof B5 remains. In other words, the plating layer B6 that will be an electric circuit is formed in the portion in which the circuit trench B3 or the through-hole B4 are formed. This step corresponds to the plating treatment step.

Through the above steps, a circuit board B60 as shown in FIG. 9E is formed in which the electric circuit B6 is formed on the three-dimensional insulating base substrate B51. In the circuit board B60 formed in the above-described manner, even when the electric circuit formed on the insulating base substrate has a small line width and line interval, the electric circuit can be formed with high precision. Also, in the circuit board according to the present embodiment, the circuit is formed even in the face having a stepped portion of the three-dimensional circuit board with precision and ease.

[Embodiment 3]

The present invention relates to another method for manufacturing a circuit board and a circuit board obtained by the production method.

In electric equipment such as portable information terminal devices, e.g., mobile phones; computers and peripherals therefor; various types of home information appliances; and the like, its functionality is being rapidly enhanced. Along with this trend, there is a growing demand for electric circuits with a further increased density in circuit boards mounted on such electric equipment. In order to meet the demand for circuits with an increased density, there is a need for methods that can precisely form electric circuit wiring having an even smaller line width and line interval (the width of a space between adjacent electric circuits). Highly densified circuit wiring is likely to cause short-circuiting, migration and the like between wires.

A known method for manufacturing a circuit board is to form an electric circuit on an insulating base substrate by a subtractive method, additive method or the like. The subtractive method is a method for forming an electric circuit by removing (subtracting) a metal foil from a portion of the surface of a metal foil-clad laminate plate other than the portion where formation of an electric circuit is desired. The additive method is a method for forming an electric circuit by applying an electroless plating only to the portion of an insulating base substrate where formation of an electric circuit is desired.

The subtractive method is a method in which a thick metal foil is etched such that the metal foil is left on the portion where formation of an electric circuit is desired and that the metal foil on the other portion is removed. This method is disadvantageous in terms of production cost because the metal of the removed portion is wasted. With the additive method, on the other hand, metal wiring can be formed only in the portion where formation of an electric circuit is desired by electroless plating. Accordingly, waste of metal is avoided and waste of resources is little. From such a point of view, the additive method is a preferable circuit forming method.

A method for forming an electric circuit made of metal wiring using a full additive method, which is a conventional typical additive method, will be described with reference to FIG. 16. FIG. 16 shows schematic cross-sectional views illustrating respective steps for forming metal wiring by a conventional full additive method.

Figure 16A:
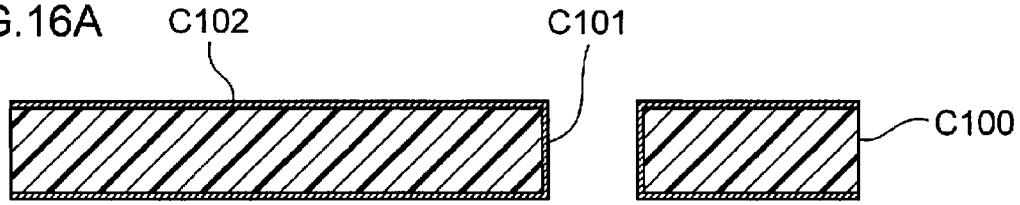
FIGS. 16A-16E show schematic cross-sectional views illustrating respective steps for forming metal wiring by a conventional full additive method.
Figure 16B:
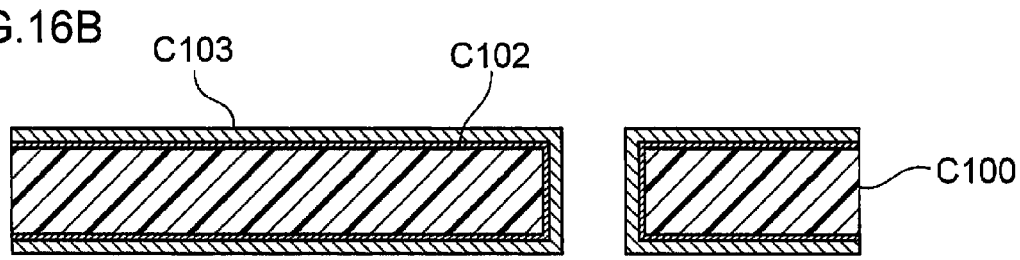
Figure 16C:
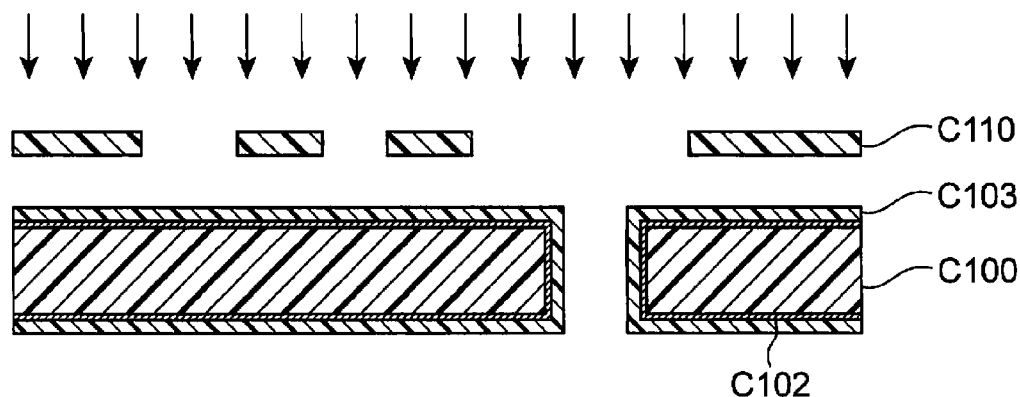
Figure 16D:
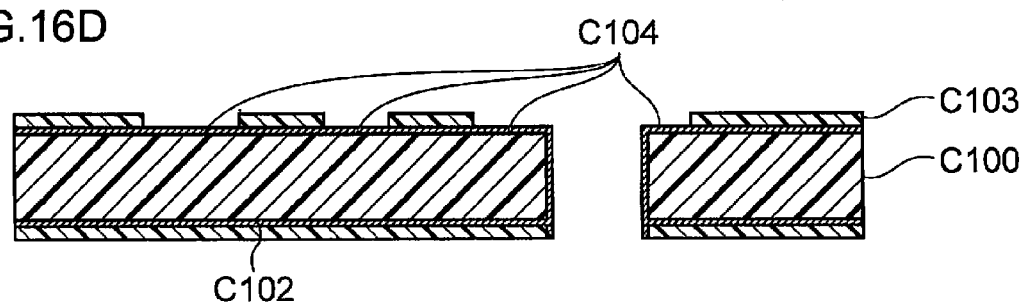
Figure 16E:
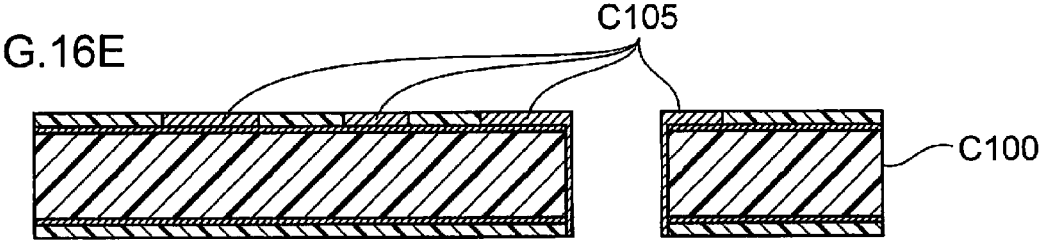

First, as shown in FIG. 16A, a plating catalyst C102 is applied to the surface of an insulating base substrate C100 in which a through-hole C101 has been formed. The surface of the insulating base substrate C100 has been roughened in advance. Next, as shown in FIG. 16B, a photoresist layer C103 is formed on the insulating base substrate C100 to which the plating catalyst C102 has been applied. Next, as shown in FIG. 16C, the photoresist layer C103 is exposed to light via a photomask C110 in which a specific circuit pattern has been formed. Next, as shown in FIG. 16D, the exposed photoresist layer C103 is developed to form a circuit pattern C104. Then, as shown in FIG. 16E, an electroless plating such as an electroless copper plating is applied so as to form metal wiring C105 in the surface of the circuit pattern C104 formed as a result of development and the inner wall surface of the through-hole C101. By performing steps as described above, a circuit made of the metal wiring C105 is formed on the insulating base substrate C100.

Figure 17:
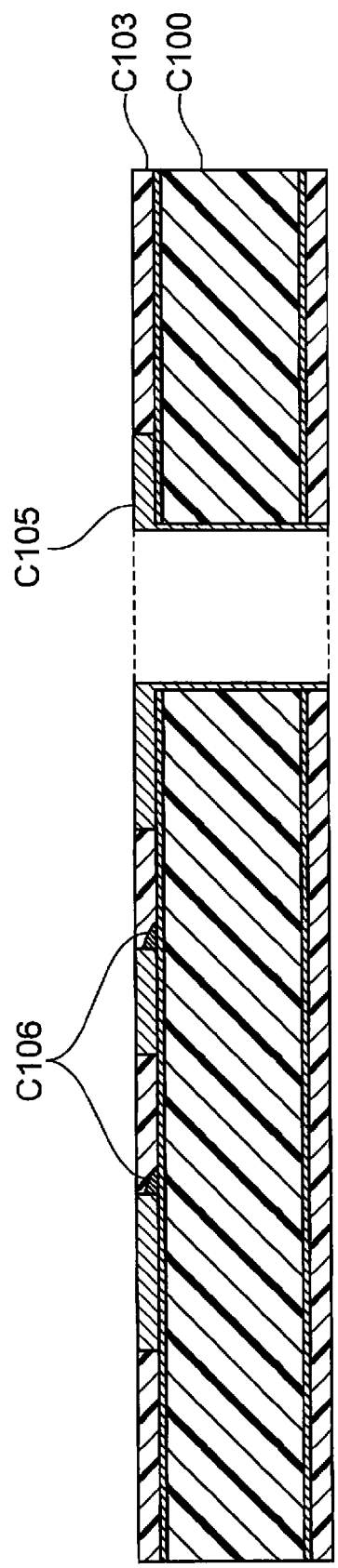
FIG. 17 is a schematic cross-sectional view illustrating the contour of a circuit formed by the conventional full additive method.

With the above-described conventional additive method, the plating catalyst C102 is applied to the entire surface of the insulating base substrate C100. As a result, the following problem arises. Specifically, if the photoresist layer C103 is developed with high precision, a plating can be formed only in the portion that is not protected by the photoresist. However, if the photoresist layer C103 is not developed with high precision, as shown in FIG. 17, an unwanted plated portion C106 may remain in the portion in which a plating does not need to be formed. Such a situation occurs because the plating catalyst C102 is applied to the entire surface of the insulating base substrate C100. The unwanted plated portion C106 causes short-circuiting, migration and the like between adjacent circuits. Such short-circuiting and migration are more likely to occur in the case where a circuit having a small line width and line interval is formed. FIG. 17 is a schematic cross-sectional view illustrating the contour of a circuit formed by the conventional full additive method.

There are production methods that are different from the above-described method for manufacturing a circuit board, for example, those disclosed in JP S57-134996A and JP S58-186994A.

As another additive method, JP S57-134996A discloses the following method.

First, a solvent-soluble first photosensitive resin layer and an alkali-soluble second photosensitive resin layer are formed on an insulating substrate (insulating base substrate). Then, the first and second photosensitive resin layers are exposed to light via a photomask having a specific circuit pattern. Next, the first and second photosensitive resin layers are developed. Next, a catalyst is adsorbed to the entire surface that includes recesses created as a result of development, after which the alkali-soluble second photosensitive resin is dissolved with an alkali solution so as to remove only an unnecessary catalyst. Thereafter, an electroless plating is applied so as to precisely form a circuit only in the portion in which the catalyst is present.

JP S58-186994A discloses the following method.

First, a resin protective film is coated on an insulating substrate (insulating base substrate) (first step). Next, a trench and a through-hole that correspond to a wiring pattern are independently or simultaneously drawn/formed in the insulating substrate coated with the protective film by machining or laser beam radiation (second step). Next, an activation layer is formed on the entire surface of the insulating substrate (third step). Next, the protective film is separated so as to remove the activation layer on the insulating substrate and leave the activation layer only in the trench and the inner wall surface of the through-hole (fourth step). Next, a plating without a plating protective film is applied to the insulating substrate so as to selectively form a conductive layer only in the trench and the inner wall surface of the through-hole that have been activated (fifth step).

The method disclosed in JP S57-134996A, however, requires forming two types of photosensitive resin layers having different solvent-solubilities, developing the photosensitive resin layers using two types of solvents, and dissolving the second photosensitive resin in an alkali solution after the catalyst has been adsorbed, and thus the production process is very complex.

JP S58-186994A also discloses that thermosetting resin serving as a protective film is coated on an insulating substrate, heated and cured, and thereafter the protective film and the insulating substrate are cut along a specific wiring pattern, and that the thermosetting resin on the surface of the insulating substrate is removed with a solvent (line 16 of the lower left column to line 11 of the lower right column on page 2 of JP S58-186994A).

JP S58-186994A does not disclose specific types of thermosetting resins that can be used as the protective film. Generally used thermosetting resins have strong resistance to solvents, and thus there has been a problem in that it is difficult to remove the resin with an ordinary solvent. Also, such thermosetting resins have a high level of adhesion to a resin base substrate, and thus it has been difficult to precisely remove only the protective film, without leaving a fragment of the protective film on the surface of the resin base substrate. Also, if a strong solvent is used to sufficiently separate the resin or where immersion is performed for a long time, the plating catalyst on the surface of the base substrate is also removed. In this case, no conductive layer will be formed in the portion from which the plating catalyst has been removed. Also, if a strong solvent is used or immersion is performed for a long time, there are cases where the protective film made of thermosetting resin is broken into pieces, causing the plating catalyst in the protective film to be re-dispersed in the solvent. Also, there is a possibility that the plating catalyst that has been re-dispersed in the solvent might re-attach to the surface of the resin base substrate, forming an unwanted plating film in that portion. Accordingly, with a method such as that disclosed in JP S58-186994, it is difficult to form a circuit having a precise contour.

The present invention has been conceived in view of the above circumstances, and it is an object of the present invention to provide a method for manufacturing a circuit board with which it is possible to form a highly precise electric circuit on an insulating base substrate with ease. Another object is to provide a circuit board obtained by the method for manufacturing a circuit board.

A method for manufacturing a circuit board according to an embodiment of the present invention includes: a coating film forming step of forming a resin coating film on a surface of an insulating base substrate; a circuit pattern forming step of forming a circuit pattern section by forming a recess having a depth greater than a thickness of the resin coating film with reference to an outer surface of the resin coating film; a catalyst application step of applying a plating catalyst or precursor thereof to a surface of the circuit pattern section and a surface of the resin coating film; a coating film removal step of removing the resin coating film from the insulating base substrate; and a plating treatment step of forming an electroless plating film only in a portion in which the plating catalyst or precursor thereof remains after the resin coating film is removed.

According to such a production method, after a resin coating film has been formed on an insulating base substrate, a specific circuit pattern section is formed by laser processing or the like, and a plating catalyst or precursor thereof is applied to the surface of the circuit pattern section and the surface of the resin coating film, while the portion in which a plating film is not to be formed is protected with the resin coating film. Thereafter, the resin coating film is removed from the insulating base substrate, whereby it is possible to easily leave the plating catalyst or precursor thereof in the portion where formation of a plating film is desired, and remove the plating catalyst or precursor thereof from the other portion. Accordingly, by performing the plating treatment step of forming an electroless plating film, the electroless plating film can be easily formed only in the portion where formation of a plating film is desired, which is the portion in which the plating catalyst or precursor thereof remains.

Accordingly, a highly precise electric circuit can be easily formed on the insulating base substrate. That is, the contour of the formed circuit can be maintained highly precisely. As a result, for example, even when a plurality of circuits are formed at a regular interval, it is possible to suppress a situation in which fragments of the electroless plating film or the like are left between circuits, as a result of which the occurrence of short-circuiting, migration and the like can be suppressed. Also, a circuit having a desired depth can be formed.

Also, the coating film removal step is preferably a step in which the resin coating film is separated from the insulating base substrate after the resin coating film is swollen with a specific fluid or after the resin coating film is partially dissolved in a specific fluid. According to such a production method, the resin coating film can be easily separated from the insulating base substrate. Consequently, a highly precise electric circuit can be more easily formed on the insulating base substrate.

Also, the degree of swelling in the fluid of the resin coating film is preferably 50% or greater. By using a resin coating film having such a degree of swelling, the resin coating film can be easily separated from the insulating base substrate. Consequently, a highly precise electric circuit can be more easily formed on the insulating base substrate. The resin coating film may be a film that has a large degree of swelling in the fluid and dissolves in the fluid.

It is preferable that the catalyst application step includes a step of treatment in an acidic colloidal catalyst metal solution, the specific fluid in the coating film removal step is an alkaline solution, and the resin coating film has a degree of swelling in the acidic colloidal catalyst metal solution of less than 50% and a degree of swelling in the alkaline solution of 50% or greater.

According to such a production method, the resin coating film is not easily separated in the catalyst application step in which it is treated under acidic conditions, but is easily separated in the coating film removal step in which it is treated with an alkaline solution, performed after the catalyst application step. Therefore, the resin coating film is selectively separated in the coating film removal step. Accordingly, in the catalyst application step, the portion in which the electroless plating film is not to be formed is precisely protected, and in the coating film removal step performed after application of the plating catalyst or precursor thereof, the resin coating film can be easily separated. Consequently, more precise circuit forming is possible.

The coating film removal step is preferably a step in which the resin coating film is dissolved in a specific fluid and removed. According to such a production method, the resin coating film can be easily removed from the insulating base substrate. Consequently, a highly precise electric circuit can be more easily formed on the insulating base substrate.

The resin coating film is preferably a resin coating film formed by applying an elastomer suspension or emulsion to the surface of an insulating base substrate and drying it. By using such a resin coating film, the resin coating film can be easily formed on the surface of the insulating base substrate. Consequently, a highly precise electric circuit can be more easily formed on the insulating base substrate.

Also, the resin coating film is preferably a resin coating film formed by transferring a resin coating film formed on a support substrate to the surface of the insulating base substrate. More preferably, the resin coating film that is transferred is a resin coating film formed by applying an elastomer suspension or emulsion to the surface of a support substrate and drying it. Such a resin coating film is preferable because a large number of resin coating films can be prepared in advance and excellent mass production can be achieved.

The elastomer is preferably selected from the group consisting of a diene-based elastomer, an acryl-based elastomer and a polyester-based elastomer that have a carboxyl group. More preferably, the diene-based elastomer is a styrene-butadiene copolymer. With such an elastomer, a resin coating film having a desired degree of swelling can be easily formed by adjusting the degree of crosslinking or the degree of gelation. Also, a resin coating film that has a large degree of swelling in the fluid used in the coating film removal step and dissolves in the fluid can be easily formed.

As the resin coating film, a coating film composed mainly of resin containing an acrylic resin having 100 to 800 acid equivalents of carboxyl groups is also preferably used.

The resin coating film is preferably made of polymer resin obtained by polymerizing (a) at least one carboxylic acid or acid anhydride monomer having at least one polymerizable unsaturated group within the molecule and (b) at least one monomer polymerizable with the monomer (a), or a resin composition containing the polymer resin. By using such a resin coating film, the resin coating film can be easily formed on the surface of the insulating base substrate. Consequently, a highly precise electric circuit can be more easily formed on the insulating base substrate. Also, such a resin coating film is often capable of dissolving in the fluid used in the coating film removal step, and thus can be effectively used not only for separation-removal but also for dissolution-removal.

Also, in the resin coating film, the acid equivalent of the polymer resin is preferably 100 to 800 acid equivalents.

The resin coating film preferably has a thickness of 10 μm or less because a fine circuit can be formed with high precision.

Also, the circuit pattern section preferably includes a portion having a width of 20 μm or less because an antenna circuit or the like that requires microprocessing can be formed.

The circuit pattern forming step is preferably a step in which a circuit pattern section is formed by laser processing because a finer fine circuit can be formed with high precision. It is preferable also because the depth of cut or the like can be easily adjusted by varying the output of the laser or the like, and therefore the depth of a circuit trench or the like to be formed can be easily adjusted. With use of laser processing, it is possible to form a through-hole for use in interlayer connection or embed a capacitor within the insulating base substrate.

The circuit pattern forming step is preferably a step in which a circuit pattern section is formed by using an embossing method because the circuit pattern section can be easily formed by stamping with a die.

In the circuit pattern forming step, it is preferable to form a through-hole in the insulating base substrate when forming a circuit pattern section. According to such a production method, a through-hole that can be used as a via hole or an inner via hole can be formed when the circuit pattern section is formed. Then, an electroless plating is applied to the formed through-hole, thereby a via hole or an inner via hole is formed.

A configuration in which the insulating base substrate has a stepped surface formed in a step shape and the insulating base substrate surface is the stepped surface is also preferable. Specifically, a configuration in which the insulating base substrate includes a stepped surface formed in a step shape, and the coating film forming step, the circuit pattern forming step, the catalyst application step, the coating film removal step and the plating treatment step are performed on the stepped surface is also preferable. According to such a production method, a circuit that rides over the step can be easily formed.

Also, it is preferable that the resin coating film contains a fluorescent material, and after the coating film removal step, an inspection step of performing inspection for a film removal failure by using luminescence from the fluorescent material is further performed. In the production method described above, there is concern that in the case where the line width and the line interval are extremely small, the resin coating film that should have been removed might remain in a very small amount between adjacent circuit pattern sections without being removed completely. There is another concern that a fragment of the resin coating film removed when forming the circuit pattern section might enter and remain in the formed circuit pattern section. If the resin coating film is left between circuit pattern sections, an electroless plating film will be formed on that portion, which may cause migration, short-circuiting or the like. If a fragment of the resin coating film is left in the formed circuit pattern section, it may cause poor heat resistance or propagation loss in the electric circuit. In such cases, as described above, the presence or absence of a film removal failure and the location of the film removal failure can be checked by inclusion of a fluorescent material in the resin coating film, and after the coating film removal step, directing light from a specific light emitting source to the surface from which the coating film has been removed so as to cause the fluorescent material of only the portion in which the resin coating film remains to be lit.

Also, a circuit board according to another embodiment of the present invention is obtained by the above method for manufacturing a circuit board. With this configuration, it is possible to obtain a circuit board in which a highly precise electric circuit is formed on an insulating base substrate.

Specifically, Embodiment 3 of the present invention encompasses the following.

3-1. A method for manufacturing a circuit board including:
a coating film forming step of forming a resin coating film on a surface of an insulating base substrate;
a circuit pattern forming step of forming a circuit pattern section by forming a recess having a depth greater than a thickness of the resin coating film with respect to an outer surface of the resin coating film;
a catalyst application step of applying a plating catalyst or precursor thereof to a surface of the circuit pattern section and a surface of the resin coating film;
a coating film removal step of removing the resin coating film from the insulating base substrate; and
a plating treatment step of forming an electroless plating film only in a portion in which the plating catalyst or precursor thereof remains after the resin coating film is removed.

3-2. The method for manufacturing a circuit board according to 3-1,
wherein the coating film removal step is a step in which the resin coating film is separated from the insulating base substrate after the resin coating film is swollen with a specific fluid or after the resin coating film is partially dissolved in a specific fluid.

3-3. The method for manufacturing a circuit board according to 3-2,
wherein the resin coating film has a degree of swelling in the fluid of 50% or greater.

3-4. The method for manufacturing a circuit board according to 3-2,
wherein the catalyst application step includes a step of treatment in an acidic colloidal catalyst metal solution, the specific fluid in the coating film removal step is an alkaline solution, and the resin coating film has a degree of swelling in the acidic colloidal catalyst metal solution of less than 50% and a degree of swelling in the alkaline solution of 50% or greater.

3-5. The method for manufacturing a circuit board according to 3-1,
wherein the coating film removal step is a step in which the resin coating film is dissolved in the specific fluid and removed.

3-6. The method for manufacturing a circuit board according to any one of 3-1 to 3-5,
wherein the resin coating film is a resin coating film formed by applying an elastomer suspension or emulsion to the surface of the insulating base substrate and drying it.

3-7. The method for manufacturing a circuit board according to any one of 3-1 to 3-5,
wherein the resin coating film is a resin coating film formed by transferring a resin coating film formed on a support substrate to the surface of the insulating base substrate.

3-8. The method for manufacturing a circuit board according to 3-6,
wherein the elastomer is selected from the group consisting of a diene-based elastomer, an acryl-based elastomer and a polyester-based elastomer that have a carboxyl group.

3-9. The method for manufacturing a circuit board according to 3-8,
wherein the diene-based elastomer is a styrene-butadiene copolymer.

3-10. The method for manufacturing a circuit board according to any one of 3-1 to 3-9,
wherein the resin coating film is composed mainly of resin containing an acrylic resin having 100 to 800 carboxyl groups.

3-11. The method for manufacturing a circuit board according to any one of 3-1 to 3-5,
wherein the resin coating film is made of polymer resin obtained by polymerizing (a) at least one carboxylic acid or acid anhydride monomer having at least one polymerizable unsaturated group within the molecule and (b) at least one monomer polymerizable with the monomer (a), or a resin composition containing the polymer resin.

3-12. The method for manufacturing a circuit board according to 3-11,
wherein the polymer resin has an acid equivalent of 100 to 800.

3-13. The method for manufacturing a circuit board according to any one of 3-1 to 3-12,
wherein the resin coating film has a thickness of 10 μm or less.

3-14. The method for manufacturing a circuit board according to any one of 3-1 to 3-13,
wherein the circuit pattern section includes a portion having a width of 20 μm or less.

3-15. The method for manufacturing a circuit board according to any one of 3-1 to 3-14,
wherein the circuit pattern forming step is a step in which the circuit pattern section is formed by laser processing.

3-16. The method for manufacturing a circuit board according to any one of 3-1 to 3-14,
wherein the circuit pattern forming step is a step in which the circuit pattern section is formed by an embossing method.

3-17. The method for manufacturing a circuit board according to any one of 3-1 to 3-16,
wherein, in the circuit pattern forming step, a through-hole is formed in the insulating base substrate during formation of the circuit pattern section.

3-18. The method for manufacturing a circuit board according to any one of 3-1 to 3-17,
wherein the insulating base substrate includes a stepped surface formed in a step shape, and the insulating base substrate surface is the stepped surface.

3-19. The method for manufacturing a circuit board according to any one of 3-1 to 3-18,
wherein the resin coating film contains a fluorescent material, and
the method further includes, after the coating film removal step, an inspection step of performing inspection for a film removal failure by using luminescence from the fluorescent material.

3-20. A circuit board obtained by the method for manufacturing a circuit board according to any one of 3-1 to 3-19.

According to the present invention, it is possible to provide a method for manufacturing a circuit board with which a highly precise electric circuit can be easily formed on an insulating base substrate. Also, a circuit board obtained by the method for manufacturing a circuit board is provided. That is, the contour of the electric circuit formed by an electroless plating film can be maintained highly precisely. By doing so, it is possible to suppress a situation in which an unwanted fragment of the electroless plating film or the like is left in a portion other than the circuit forming portion, as a result of which the occurrence of short-circuiting, migration and the like can be suppressed.

Hereinafter, embodiments of the present invention will be described, but the present invention is not limited thereto.

[Embodiment 3-1]

A circuit board manufacturing method of the present embodiment includes: a coating film forming step of forming a resin coating film on a surface of an insulating base substrate; a circuit pattern forming step of forming a circuit pattern section by forming a recess having a depth greater than a thickness of the resin coating film with reference to an outer surface of the resin coating film; a catalyst application step of applying a plating catalyst or precursor thereof to a surface of the circuit pattern section and a surface of the resin coating film; a coating film removal step of removing the resin coating film from the insulating base substrate; and a plating treatment step of forming an electroless plating film in a portion in which the plating catalyst or precursor thereof remains after the resin coating film is removed.

A circuit board manufacturing method according to Embodiment 3-1 of the present invention will be described first. FIG. 12 shows schematic cross-sectional views illustrating respective steps of the method for manufacturing a circuit board according to Embodiment 3-1.

Figure 12A:
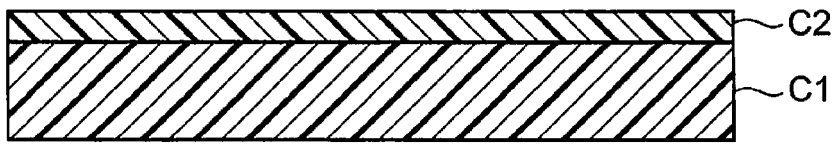
FIGS. 12A-12E show schematic cross-sectional views illustrating respective steps of a method for manufacturing a circuit board according to Embodiment 3-1.

First, as shown in FIG. 12A, a resin coating film C2 is formed on the surface of an insulating base substrate C1. This step corresponds to the coating film forming step.

Figure 12B:
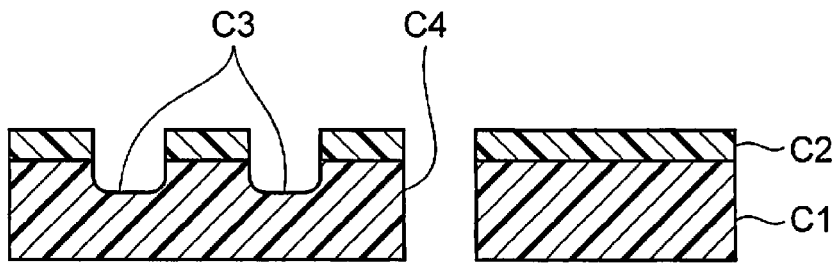

Next, as shown in FIG. 12B, a circuit pattern section is formed by forming a recess having a depth greater than the thickness of the resin coating film C2 with respect to the outer surface of the resin coating film C2. The circuit pattern section may be a recess that extends through the resin coating film C2 to the surface of the insulating base substrate C1 or a circuit trench C3 that is formed by recessing into the insulating base substrate C1. If necessary, the insulating base substrate C1 may be drilled to form a through-hole C4 therein as a part of the circuit trench C3. The circuit trench C3 defines the portion in which an electroless plating film is formed by electroless plating, or in other words, the portion in which an electric circuit is formed. This step corresponds to the circuit pattern forming step. The following description will be given focusing on the circuit trench C3 as the circuit pattern section.

Figure 12C:
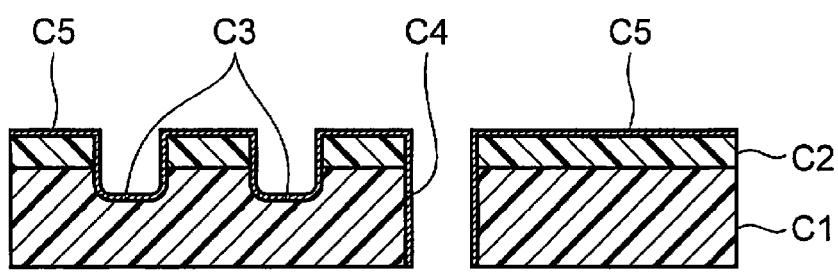

Next, as shown in FIG. 12C, a plating catalyst or precursor thereof C5 is applied to the surface of the circuit trench C3 and the surface of the resin coating film C2 in which the circuit trench C3 is not formed. This step corresponds to the catalyst application step.

Figure 12D:
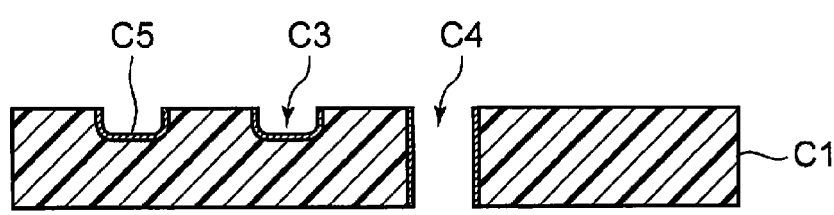

Next, as shown in FIG. 12D, the resin coating film C2 is removed from the insulating base substrate C1. By doing so, the plating catalyst or precursor thereof C5 can be left only in the surface of the portion, in which the circuit trench C3 is formed, of the insulating base substrate C1. The plating catalyst or precursor thereof C5 applied to the surface of the resin coating film C2, on the other hand, is removed together with the resin coating film C2, while being carried on the resin coating film C2. This step corresponds to the coating film removal step.

Figure 12E:
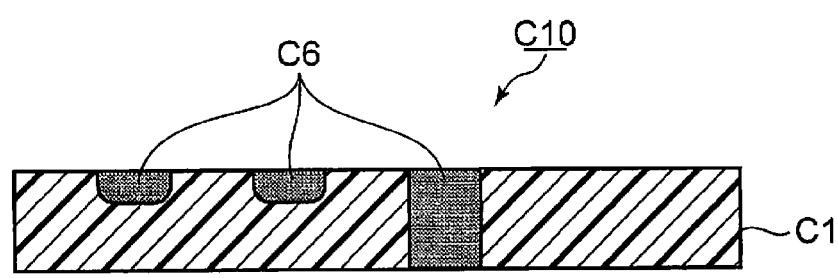

Next, an electroless plating is applied to the insulating base substrate C1 from which the resin coating film C2 has been removed. By doing so, an electroless plating film is formed only in the portion in which the plating catalyst or precursor thereof C5 remains. Specifically as shown in FIG. 12E, the electroless plating film that will be an electric circuit C6 is formed in the portion in which the circuit trench C3 has been formed. The electric circuit C6 may be made of the electroless plating film or a thick film formed by further applying an electroless plating (fill-up plating) to the electroless plating film. Specifically, for example, as shown in FIG. 12E, the electric circuit C6 made of the electroless plating film is formed so as to fill the circuit trench C3 and the entire through-hole C4, thereby removing the level difference between the insulating base substrate C1 and the electric circuit. This step corresponds to the plating treatment step.

Through the aforementioned steps, the circuit board C10 as shown in FIG. 12E is formed. In the circuit board C10 formed in the manner described above, the electric circuit C6 is formed on the insulating base substrate C1 with high precision.

Hereinafter, each constituent element of the present embodiment will be described.

<Coating Film Forming Step>

As described above, the coating film forming step is a step in which a resin coating film C2 is formed on the surface of an insulating base substrate C1.

(Insulating Base Substrate)

The insulating base substrate C1 used in the coating film forming step is not particularly limited as long as it can be used to produce a circuit board. Specifically, for example, a resin base substrate containing resin can be used.

As the resin base substrate, any type of organic substrate that can be used to produce a circuit board, for example, a multilayer circuit board can be used without any particular limitation. Specific examples of the organic substrate include substrates conventionally used to produce multilayer circuit boards, such as substrates made of epoxy resin, acrylic resin, polycarbonate resin, polyimide resin, polyphenylene sulfide resin, polyphenylene ether resin, cyanate resin, benzoxazine resin and bismaleimide resin.

The epoxy resin is not particularly limited as long as it can constitute any type of organic substrate that can be used to produce a circuit board. Specific examples include bisphenol A epoxy resin, bisphenol F epoxy resin, bisphenol S epoxy resin, aralkyl epoxy resin, phenol novolac epoxy resin, alkyl phenol novolac epoxy resin, biphenol epoxy resin, naphthalene epoxy resin, dicyclopentadiene epoxy resin, an epoxidized product of a condensate of phenol and aromatic aldehyde having a phenolic hydroxy group, triglycidyl isocyanurate, and cycloaliphatic epoxy resin. Furthermore, in order to impart flame retardancy, epoxy resin as described above, nitrogen-containing resin, silicone-containing resin or the like that has been brominated or phosphorus-modified can be used. As the epoxy resin and the resin, any of the epoxy resins and the resins can be used singly or as a combination of two or more.

In the case where the base substrate is made of any of the aforementioned resins, generally, a curing agent is contained to cure the resin. The curing agent is not particularly limited as long as it can be used as a curing agent. Specifically, for example, dicyandiamide, a phenolic curing agent, an anhydride curing agent, an aminotriazine novolac curing agent, cyanate resin or the like can be used. As the phenolic curing agent, for example, a novolac, aralkyl or terpene-type phenolic curing agent can be used. Furthermore, in order to impart flame retardancy, phosphorus-modified phenol resin, phosphorus-modified cyanate resin or the like can be used. As the curing agent, any of the curing agents listed above may be used singly or as a combination of two or more.

Although not particularly limited, because the circuit pattern is formed by laser processing, it is preferable to use a resin having a good laser light absorption coefficient in a wavelength range of 100 to 400 nm. Specifically, for example, polyimide resin can be used.

Also, the insulating base substrate (insulating layer) may contain a filler. The filler is not particularly limited, and may be inorganic or organic fine particles. By inclusion of a filler, the filler will be exposed at the laser processed portion, and the adhesion between the plating and the resin can be increased by irregularities formed by the filler.

Specific examples of materials for constituting the inorganic fine particles include: high dielectric fillers such as aluminum oxide ($Al_2O_3$), magnesium oxide (MgO), boron nitride (BN), aluminum nitride (AlN), silica ($SiO_2$), barium titanate ($BaTiO_3$) and titanium oxide ($TiO_2$); magnetic fillers such as hard ferrite; inorganic flame retardants such as magnesium hydroxide ($Mg(OH)_2$), aluminum hydroxide ($Al(OH)_2$), antimony trioxide ($Sb_2O_3$), antimony pentoxide ($Sb_2O_5$), guanidine salt, zinc borate, molybdenum compound and zinc stannate; talc ($Mg_3(Si_4O_{10})(OH)_2$), barium sulfate ($BaSO_4$), calcium carbonate ($CaCO_3$), and mica. As the inorganic fine particles, any of the inorganic fine particles listed above may be used singly or as a combination of two or more. The inorganic fine particles listed above have high levels of heat conductivity, relative dielectric constant, flame retardancy, particle size distribution and flexibility in selecting the color, and therefore in order to selectively exhibit a desired function, appropriate blending and particle size design are performed, and thereby a high level of filling can be easily achieved. Although not particularly limited, it is preferable to use a filler having an average particle size that is less than or equal to the thickness of the insulating layer, more preferably, a filler having an average particle size of 0.01 µm to 10 µm, and even more preferably 0.05 µm to 5 µm.

The inorganic fine particles may be surface-treated with a silane coupling agent in order to enhance the dispersibility in the insulating base substrate. The insulating base substrate may contain a silane coupling agent in order to enhance the dispersibility of the inorganic fine particles in the insulating base substrate. The silane coupling agent is not particularly limited. Specific examples include epoxy silane, mercapto silane, amino silane, vinyl silane, styryl silane, methacryloxy silane, acryloxy silane and titanate-based silane coupling agents. As the silane coupling agent, any of the silane coupling agents listed above may be used singly or as a combination of two or more.

Also, the insulating base substrate may contain a dispersing agent in order to enhance the dispersibility of the inorganic fine particles in the insulating base substrate. The dispersing agent is not particularly limited. Specific examples include alkyl ether, sorbitan ester, alkyl polyether amine, and polymer-based dispersing agents. As the dispersing agent, any of the dispersing agents listed above may be used singly or as a combination of two or more.

(Resin Coating Film)

The resin coating film C2 is not particularly limited as long as it can be removed in the coating film removal step. Specifically, for example, soluble resin that can easily dissolve in an organic solvent or an alkali solution, swellable resin coating film made of resin that can swell with a specific fluid (swelling fluid), which will be described below, or the like can be used. Among them, it is particularly preferable to use the swellable resin coating film because precise removal is easy. The swellable resin coating film preferably has, for example, a degree of swelling in the fluid (swelling fluid) of 50% or greater. As the swellable resin coating film, not only a resin coating film that does not substantially dissolve in the fluid (swelling fluid) and can be easily separated from the surface of the insulating base substrate C1, but also a resin coating film that swells with and at least partially dissolves in the fluid (swelling fluid) and thereby easily separates from the surface of the insulating base substrate C1 and a resin coating film that dissolves in the fluid (swelling fluid), and thereby easily separates from the surface of the insulating base substrate C1 can be used.

The method for forming the resin coating film C2 is not particularly limited. Specific examples include a method in which a fluid material that can form a resin coating film is applied to the surface of the insulating base substrate C1 and then dried, and a method in which a fluid material as described above is applied to a support substrate and dried to form a resin coating film and the resin coating film is transferred to the surface of the insulating base substrate C1. The method for applying the fluid material is not particularly limited. Specifically, for example, a conventionally known spin coating method, a bar coater method or the like can be used.

The resin coating film C2 preferably has a thickness of 10 µm or less, and more preferably 5 µm or less. Also, the resin coating film C2 preferably has a thickness of 0.1 µm or greater, and more preferably 1 µm or greater. In the case where the resin coating film C2 is excessively thick, the precision of the circuit pattern section, including such as a circuit trench and a through-hole, formed by laser processing or machining in the circuit pattern forming step is likely to be low. In the case where the resin coating film C2 is excessively thin, it tends to be difficult to form a resin coating film having a uniform thickness.

Next is a description of an example of a swellable resin coating film suitable as the resin coating film C2.

As the swellable resin coating film, a resin coating film having a degree of swelling in a swelling fluid of 50% or greater can be preferably used. Furthermore, it is more preferable to use a resin coating film having a degree of swelling in a swelling fluid of 100% or greater. In the case where the degree of swelling is excessively low, the swellable resin coating film is likely to be less separable in the coating film removal step.

The method for forming the swellable resin coating film is not particularly limited, and the same method as the method for forming the resin coating film C2 described above can be used. Specific examples include a method in which a fluid material that can form a swellable resin coating film is applied to the surface of the insulating base substrate C1 and then dried, and a method in which a fluid material as described above is applied to a support substrate and dried to form a swellable resin coating film and the swellable resin coating film is transferred to the surface of the insulating base substrate C1.

As the fluid material that can form the swellable resin coating film, for example, an elastomer suspension, emulsion or the like can be used. Specific examples of the elastomer include diene-based elastomers such as styrene-butadiene copolymers, acryl-based elastomers such as acrylic acid ester copolymers, and polyester-based elastomers. With such an elastomer, a swellable resin coating film having a desired degree of swelling can be easily formed by adjusting the degree of crosslinking, the degree of gelation or the like of the elastomer resin particles dispersed as a suspension or emulsion.

As the swellable resin coating film, in particular, it is preferable to use a coating film whose degree of swelling varies depending on the pH of the swelling fluid. In the case where such a coating film is used, by using different fluid conditions in the catalyst application step and in the coating film removal step, the swellable resin coating film can maintain strong adhesion to the insulating base substrate at the pH used in catalyst application step, and the swellable resin coating film can be easily separated at the pH used in the coating film removal step.

More specifically, for example, in the case where the catalyst application step includes a step of treatment in an acidic plating catalyst colloidal solution (acidic colloidal catalyst metal solution) having a pH in the range of 1 to 3, and the coating film removal step includes a step of swelling the swellable resin coating film in an alkaline solution having a pH in the range of 12 to 14, the swellable resin coating film is preferably a resin coating film that has a degree of swelling in the acidic plating catalyst colloidal solution of less than 50%, and more preferably 40% or less, and preferably has a degree of swelling in the alkaline solution of 50% or greater, more preferably 100% or greater, and even more preferably 500% or greater.

Examples of the swellable resin coating film include a sheet made of an elastomer having a specific amount of carboxyl groups, a sheet obtained by entirely curing an alkali-developable photocurable resist used as a dry film resist (hereinafter also referred to as "DFR") for patterning a printed circuit board, a thermosetting sheet and an alkali-developable sheet.

Specific examples of the elastomer having a carboxyl group include elastomers having a carboxyl group within the molecule by inclusion of a monomer unit having the carboxyl group as a copolymerizable component: diene-based elastomers, such as styrene-butadiene copolymers and acryl-based elastomers such as acrylic acid ester copolymers, and polyester-based elastomers. With such an elastomer, a swellable resin coating film having a desired alkali degree of swelling can be formed by adjusting the acid equivalent, the degree of crosslinking, the degree of gelation or the like of the elastomer dispersed as a suspension or emulsion. The carboxyl group in the elastomer has the effect of separating the swellable resin coating film from the surface of the insulating base substrate by swelling the swellable resin coating film with an aqueous alkaline solution. As used herein, "acid equivalent" refers to a polymer weight per equivalent of carboxyl group.

Specific examples of the monomer unit having a carboxyl group include (meth)acrylic acid, fumaric acid, cinnamic acid, crotonic acid, itaconic acid and maleic anhydride.

The carboxyl group content in such an elastomer having a carboxyl group is preferably 100 to 2,000 acid equivalents, and more preferably 100 to 800 acid equivalents. In the case where the acid equivalent is excessively small, it is likely that compatibility with a solvent or other compositions is deteriorated and resistance to a pre-treatment fluid for plating is deteriorated. In the case where the acid equivalent is excessively large, separability in an aqueous alkaline solution is likely to deteriorate.

As the molecular weight of the elastomer, the molecular weight of the elastomer is preferably 10,000 to 1,000,000, and more preferably 20,000 to 60,000. In the case where the molecular weight of the elastomer is excessively large, separability is likely to deteriorate. In the case where the molecular weight of the elastomer is excessively small, viscosity is likely to deteriorate, as a result of which it will be difficult to maintain a uniform thickness of the swellable resin coating film, and the resistance to the pre-treatment fluid for plating is likely to deteriorate.

The resin coating film can be a film made of polymer resin obtained by polymerizing (a) at least one carboxylic acid or acid anhydride monomer having at least one polymerizable unsaturated group within the molecule and (b) at least one monomer polymerizable with the monomer (a), and a resin composition containing the polymer resin.

It is possible that the resin composition contains as a main resin the aforementioned polymer resin that serves as an essential component and that at least one of oligomers, monomers, fillers, and other additives is added thereto. The main resin is preferably a linear polymer having thermoplastic properties. In order to control fluidity, crystallinity, and like properties, grafting may be performed for branching. The molecular weight thereof is a number average molecular weight of about 1,000 to 500,000, and preferably 5,000 to 50,000. An excessively small molecular weight is likely to result in impaired film flexibility and impaired resistance to the chemical for forming plating nuclei (acid resistance). An excessively large molecular weight is likely to result in deteriorated alkali separability and deteriorated attachability in the case of processing into a dry film. Crosslinking points may be introduced for enhancement of resistance to the chemical for forming plating nuclei as well as for thermal deformation suppression at the time of laser processing and fluidity control.

Regarding the composition of the polymer resin as the main resin, as described above, it can be obtained by polymerizing (a) a carboxylic acid or acid anhydride monomer having at least one polymerizable unsaturated group within the molecule and (b) a monomer polymerizable with the monomer (a). Examples of known techniques include those disclosed in JP H7-281437A, JP 2000-231190A, and JP 2001-201851A.

Examples of the monomer (a) include (meth)acrylic acid, fumaric acid, cinnamic acid, crotonic acid, itaconic acid, maleic anhydride, maleic acid half ester, butyl acrylate, and the like, and such monomers may be used singly or as a combination of two or more.

An example of the monomer (b) is generally a monomer that is non-acidic and has one polymerizable unsaturated group within the molecule, but the monomer (b) is not limited thereto. The monomer (b) is selected so as to maintain various properties such as resistance in a plating step and flexibility of a cured film. Specific examples include methyl(meth)acrylate, ethyl (meth)acrylate, iso-propyl(meth)acrylate, n-butyl (meth)acrylate, sec-butyl(meth)acrylate, tert -butyl(meth) acrylate, 2-hydroxylethyl(meth)acrylate, 2-hydroxylpropyl (meth)acrylate, and the like. Other examples include vinyl alcohol esters such as vinyl acetate, (meth)acrylonitrile, styrene or polymerizable styrene derivatives, and the like. Also, it is possible to obtain by polymerization of only the aforementioned carboxylic acid or acid anhydride having one polymerizable unsaturated group within the molecule. Furthermore, in order to allow a three-dimensional crosslink, it is possible to select a monomer having multiple unsaturated groups as the monomer for use in the polymer and to introduce a reactive functional group such as an epoxy group, a hydroxyl group, an amino group, an amide group, a vinyl group, or the like into the molecular framework. It is sufficient that the amount of carboxyl group contained in the resin is 100 to 2,000 acid equivalents, and preferably 100 to 800 acid equivalents. Here, the term "acid equivalent" refers to the weight of a polymer having 1 equivalent of a carboxyl group therein. In the case where the acid equivalent is excessively low, it is likely that compatibility with a solvent or other compositions is deteriorated or resistance to a pre-treatment fluid for plating is deteriorated. In the case where the acid equivalent is excessively high, separability is likely to deteriorate. The composition ratio of the monomer (a) is 5 to 70 mass %.

Any monomer and oligomer may be used as long as they are resistant to the chemical for forming plating nuclei and easily removable with an alkali. It can be envisaged that they are used as tackifiers in a manner similar to a plasticizer in order to enhance attachment of the dry film (DFR). Moreover, a cross-linking agent may be added to increase various kinds of resistance. Specific examples include methyl(meth)acrylate, ethyl(meth)acrylate, iso-propyl (meth)acrylate, n-butyl (meth)acrylate, sec-butyl(meth)acrylate, tert-butyl(meth) acrylate, 2-hydroxylethyl(meth)acrylate, 2-hydroxylpropyl (meth)acrylate, and the like. Other examples include vinyl alcohol esters such as vinyl acetate, (meth)acrylonitrile, styrene or polymerizable styrene derivatives, and the like. Also, it is possible to obtain by polymerization of only the aforementioned carboxylic acid or acid anhydride having one polymerizable unsaturated group within the molecule. Moreover, a polyfunctional unsaturated compound may also be contained. Any of the aforementioned monomers or oligomers obtained by reacting the monomers may be used. In addition to the aforementioned monomers, it is also possible to contain two or more other photopolymerizable monomers. Examples of such monomers include 1,6-hexanediol di(meth)acrylate, 1,4-cyclohexanediol di(meth)acrylate, polypropyleneglycol di(meth)acrylate, polyethyleneglycol di(meth)acrylate, polyoxyethylenepolyoxypropyleneglycol di(meth)acrylate, and like polyoxyalkyleneglycol di(meth) acrylates, 2-di(p-hydroxyphenyl)propane di(meth)acrylate, glycerol tri(meth)acrylate, dipentaerythritol penta(meth) acrylate, trimethylolpropane triglycidyl ether tri(meth)acrylate, bisphenol A diglycidyl ether tri(meth)acrylate, 2,2-bis (4-methacryloxypentaethoxyphenyl)propane, polyfunctional (meth)acrylates containing a urethane group, and the like. Any of the aforementioned monomers or oligomers obtained by reacting the monomers may be used.

Furthermore, a filler may be contained. The filler is not particularly limited, and examples include silica, aluminum hydroxide, magnesium hydroxide, calcium carbonate, clay, kaolin, titanium oxide, barium sulfate, alumina, zinc oxide, talc, mica, glass, potassium titanate, wollastonite, magnesium sulfate, aluminum borate, organic fillers, and the like. Since the resist is thin, with its thickness generally being 1 to 10 μm, it is preferable that the size of the filler is also small. Although it is preferable to use a filler that has a small average particle size, and from which coarse particles are taken away, it is possible to crush the particles when dispersing or remove coarse particles by filtration.

Examples of other additives include photopolymerizable resins (photopolymerization initiators), polymerization inhibitors, colorants (dyes, pigments, color producing pigments), thermal-polymerization initiators, crosslinking agents such as epoxy and urethane, and the like.

In the printed board processing process of the present invention, for example, there may be a case where laser processing is used. In the case of laser processing, it is necessary to impart laser ablation characteristics to the resist material. Regarding a laser processing machine, for example, a carbon dioxide laser, an excimer laser, a UV-YAG laser, or the like is selected. These laser processing machines have various specific wavelengths, and it is thus possible to enhance productivity by selecting a material that exhibits a large absorption coefficient at such a wavelength. Among them, a UV-YAG laser is suitable for microprocessing, and since the laser wavelength has third-order harmonics at 355 nm and forth-order harmonics at 266 nm, it is desirable that the material exhibits a large absorption coefficient at these wavelengths. In contrast, there may be a case where a material that exhibits a somewhat low absorption coefficient is preferable. Specifically, for example, when a resist that exhibits a low UV absorption coefficient is used, UV light passes through the resist, thus making it possible to concentrate energy on processing on the insulating layer that serves as a base. That is, the advantage is different according to the laser light absorption coefficient, and it is thus preferable to use a resist that has a laser light absorption coefficient adjusted according to the situation.

Also, as DFR, it is possible to use, for example, a sheet made of a photocurable resin composition containing a photopolymerization initiator and composed of a resin component such as acrylic resin, epoxy resin, styrene resin, phenol resin or urethane resin, containing a specific amount of carboxyl groups. Specific examples of the DFR include sheets obtained by entirely curing a dry film of a photopolymerizable resin composition as disclosed in JP 2000-231190A, JP 2001-201851A and JP H11-212262A, and commercially available alkali-developable DFR such as UFG series manufactured by Asahi Kasei Corporation.

Furthermore, other examples of the resin coating film include resin composed mainly of rosin and containing a carboxyl group (for example, NAZDAR 229 manufactured by Yoshikawa Chemical Co., Ltd.) and resin composed mainly of phenol and containing a carboxyl group (for example, 104F manufactured by LEKTRACHEM Ltd.).

The swellable resin coating film can be easily formed by a method in which a resin suspension or emulsion is applied to the surface of the insulating base substrate by a conventionally known application means such as a spin coating method or bar coater method and dried, or a method in which DFR formed on a support base substrate is attached to the surface of the insulating base substrate by using a vacuum laminator or the like and entirely cured.

In addition to those described above, examples of the resin coating film are as follows. For example, resist materials for constituting the resin coating film include as follows.

Examples of properties required of resist materials for constituting the resin coating film include (1) strong resistance to a fluid (a chemical for forming plating nuclei) for immersion of the insulating base substrate on which the resin coating film has been formed in a catalyst application step, which will be described below, (2) ease of removal of the resin coating film (resist) in a coating film removal step, which will be described below, for example, a step of immersing in an alkali the insulating base substrate on which the resin coating film has been formed, (3) high film formability, (4) ease of dry film (DFR) formation, (5) high storage stability, and like properties.

As the chemical for forming plating nuclei, in the case of an acidic colloidal Pd—Sn catalyst system, which will be described below, examples of the chemical for forming plating nuclei are all aqueous acidic (pH 1 to 2) solutions. In the case of an alkaline Pd ion catalyst system, the catalyst-added activator is weakly alkaline (pH 8 to 12), and others are acidic. Accordingly, for resistance to the chemical for forming plating nuclei, resistance that allows to withstand pH 1 to 11 and preferably pH 1 to 12 is needed. Note that, the phrase "allows to withstand" means that when a sample on which a resist film has been formed is immersed in the chemical, swelling and dissolution of the resist are sufficiently suppressed, thus enabling it to serve as a resist. Generally, the immersion temperature is room temperature to 60° C., the immersion time is 1 to 10 minutes, and the resist film thickness is about 1 to 10 μm, but the present invention is not limited to these ranges.

As an alkali separation chemical for use in the coating film removal step, as will be described below, for example, an aqueous NaOH solution and an aqueous sodium carbonate solution are generally used. It is desirable that the chemical has a pH of 11 to 14 and preferably a pH of 12 to 14, and the resist film can be easily removed therewith. Immersion and spraying treatments are generally performed at an aqueous NaOH solution concentration of about 1 to 10%, the treatment temperature of room temperature to 50° C., and the treatment time of 1 to 10 minutes, but the present invention is not limited to these ranges.

Since the resist is formed on an insulating material, film formability is also important. Uniform film formation is necessary that does not cause repelling or the like. Dry-film formation is carried out for simplification of the production process, reduction of material loss, and the like, but film flexibility is necessary to secure handleability. A dry-filmed resist is attached to an insulating material by a laminator (roll, vacuum). The attachment temperature is room temperature to 160° C., and the pressure and the time are suitably selected. Accordingly, tackiness is required at the time of attachment. For this reason, the dry-filmed resist is generally processed to have a three-layer structure, being sandwiched between a carrier film and a cover film while this also serves to prevent grime adhesion, but the present invention is not limited thereto.

Storage stability refers most preferably to storage stability at room temperature, but storage stability under refrigeration and freezing is also necessary. Accordingly, it is necessary to process the dry film so as not to undergo compositional separation or cracking due to impaired flexibility under low temperatures.

It is possible that the resin composition of the resist material contains a main resin (binder resin) as its essential component and that at least one of oligomers, monomers, fillers, and other additives is added thereto.

The main resin is preferably a linear polymer having thermoplastic properties. In order to control fluidity, crystallinity, and like properties, grafting may be performed for branching. The molecular weight thereof is a number average molecular weight of about 1,000 to 500,000, and preferably 5,000 to 50,000. An excessively small molecular weight is likely to result in impaired film flexibility and impaired resistance to the chemical for forming plating nuclei (acid resistance). An excessively large molecular weight is likely to result in deteriorated alkali separability and deteriorated attachability in the case of processing into a dry film. Crosslinking points may be introduced for enhancement of resistance to the chemical for forming plating nuclei as well as for thermal deformation suppression at the time of laser processing and fluidity control.

Regarding the composition of the main resin, the main resin can be obtained by polymerizing (a) a carboxylic acid or acid anhydride monomer having at least one polymerizable unsaturated group within the molecule and (b) a monomer polymerizable with the monomer (a). Examples of known techniques include those disclosed in JP H7-281437A, JP 2000-231190A, and JP 2001-201851A. Examples of the monomer (a) include (meth)acrylic acid, fumaric acid, cinnamic acid, crotonic acid, itaconic acid, maleic anhydride, maleic acid half ester, butyl acrylate, and the like, and such monomers may be used singly or as a combination of two or more. An example of the monomer (b) is generally a monomer that is non-acidic and has one polymerizable unsaturated group within the molecule, but the monomer (b) is not limited thereto. The monomer (b) is selected so as to maintain various properties such as resistance in a plating step and flexibility of a cured film. Specific examples include methyl(meth)acrylate, ethyl (meth)acrylate, iso-propyl(meth)acrylate, n-butyl (meth)acrylate, sec-butyl(meth)acrylate, tert -butyl(meth) acrylate, 2-hydroxylethyl(meth)acrylate, 2-hydroxylpropyl (meth)acrylate, and the like. Other examples include vinyl alcohol esters such as vinyl acetate, (meth)acrylonitrile, styrene or polymerizable styrene derivatives, and the like. Also, it is possible to obtain by polymerization of only the aforementioned carboxylic acid or acid anhydride having one polymerizable unsaturated group within the molecule. Furthermore, in order to allow a three-dimensional crosslink, it is possible to select a monomer having multiple unsaturated groups as the monomer for use in the polymer and to introduce a reactive functional group such as an epoxy group, a hydroxyl group, an amino group, an amide group, a vinyl group, or the like into the molecular framework. In the case where a carboxyl group is contained in the resin, it is sufficient that the amount of carboxyl group contained in the resin is 100 to 2,000 acid equivalents, and preferably 100 to 800 acid equivalents. Here, the term "acid equivalent" refers to the weight of a polymer having 1 equivalent of a carboxyl group therein. In the case where the acid equivalent is excessively low, it is likely that compatibility with a solvent or other compositions is deteriorated or resistance to a pre-treatment fluid for plating is deteriorated. In the case where the acid equivalent is excessively high, separability is likely to deteriorate. The composition ratio of the monomer (a) is 5 to 70 wt %.

Any monomer and oligomer may be used as long as they are resistant to the chemical for forming plating nuclei and easily removable with an alkali. It can be envisaged that they are used as tackifiers in a manner similar to a plasticizer in order to enhance attachment of the dry film (DFR). Moreover, a cross-linking agent may be added to increase various kinds of resistance. Specific examples include methyl(meth)acrylate, ethyl(meth)acrylate, iso-propyl (meth)acrylate, n-butyl (meth)acrylate, sec-butyl(meth)acrylate, tert-butyl(meth) acrylate, 2-hydroxylethyl(meth)acrylate, 2-hydroxylpropyl (meth)acrylate, and the like. Other examples include vinyl alcohol esters such as vinyl acetate, (meth)acrylonitrile, styrene or polymerizable styrene derivatives, and the like. Also, it is possible to obtain by polymerization of only the aforementioned carboxylic acid or acid anhydride having one polymerizable unsaturated group within the molecule. Moreover, a polyfunctional unsaturated compound may also be contained. Any of the aforementioned monomers or oligomers obtained by reacting the monomers may be used. In addition to the aforementioned monomers, it is also possible to contain two or more other photopolymerizable monomers. Examples of such monomers include 1,6-hexanediol di(meth)acrylate, 1,4-cyclohexanediol di(meth)acrylate, polypropyleneglycol di(meth)acrylate, polyethyleneglycol di(meth)acrylate, polyoxyethylenepolyoxypropyleneglycol di(meth)acrylate, and like polyoxyalkyleneglycol di(meth) acrylates, 2-di(p-hydroxyphenyl)propane di(meth)acrylate, glycerol tri(meth)acrylate, dipentaerythritol penta(meth) acrylate, trimethylolpropane triglycidyl ether tri(meth)acrylate, bisphenol A diglycidyl ether tri(meth)acrylate, 2,2-bis (4-methacryloxypentaethoxyphenyl)propane,
polyfunctional (meth)acrylates containing a urethane group, and the like. Any of the aforementioned monomers or oligomers obtained by reacting the monomers may be used.

Furthermore, a filler may be contained. The filler is not particularly limited, and specific examples include silica, aluminum hydroxide, magnesium hydroxide, calcium carbonate, clay, kaolin, titanium oxide, barium sulfate, alumina, zinc oxide, talc, mica, glass, potassium titanate, wollastonite, magnesium sulfate, aluminum borate, organic fillers, and the like. Since the resist is thin, with its thickness generally being 1 to 10 µm, it is preferable that the size of the filler is also small. Although it is preferable to use a filler that has a small average particle size, and from which coarse particles are taken away, it is possible to crush the particles when dispersing or remove coarse particles by filtration.

Examples of other additives include photopolymerizable resins (photopolymerization initiators), polymerization inhibitors, colorants (dyes, pigments, color producing pigments), thermal-polymerization initiators, crosslinking agents such as epoxy and urethane, and the like.

In the printed board processing process of the present invention, for example, there may be a case where laser processing is used. In the case of laser processing, it is necessary to impart laser ablation characteristics to the resist material. Regarding a laser processing machine, for example, a carbon dioxide laser, an excimer laser, a UV-YAG laser, or the like is selected. These laser processing machines have various specific wavelengths, and it is thus possible to enhance productivity by selecting a material that exhibits a large absorption coefficient at such a wavelength. Among them, a UV-YAG laser is suitable for microprocessing, and since the laser wavelength has third-order harmonics at 355 nm and forth-order harmonics at 266 nm, it is desirable that the resist material exhibits a large absorption coefficient at these wavelengths. In contrast, there may be a case where a material that exhibits a somewhat low absorption coefficient is preferable. Specifically, for example, when a resist that exhibits a low UV absorption coefficient is used, UV light passes through the resist, thus making it possible to concentrate energy on processing on the insulating layer that serves as a base. That is, the advantage is different according to the laser light absorption coefficient, and it is thus preferable to use a resist that has a laser light absorption coefficient adjusted according to the situation.

<Circuit Pattern Forming Step>

The circuit pattern forming step is a step in which a circuit pattern section such as a circuit trench C3 is formed in the insulating base substrate C1. As described above, the circuit pattern section includes not only the circuit trench C3, but also a recess that extends through the resin coating film C2 to the surface of the insulating base substrate C1, or a through-hole C4.

The method for forming the circuit pattern section is not particularly limited. A specific example is a method in which a circuit trench C3 having a desired shape and depth is formed by performing laser processing, cutting work such as dicing or machining work such as embossing on the insulating base substrate C1 on which the resin coating film C2 has been formed, from the outer surface side of the resin coating film C2. It is preferable to use laser processing in the case of forming a highly precise fine circuit. With the laser processing, the depth of cut or the like can be adjusted freely by varying the output of the laser or the like. For embossing, it is preferable to use embossing with a fine resin die as used in, for example, the field of nano-imprinting.

Also, a through-hole C4 for forming a via hole or the like may be formed as a part of the circuit trench C3.

With this step, the shape of the circuit pattern section such as the shape and depth of the circuit trench C3 and the diameter and position of the through-hole C4 is defined. In the circuit pattern forming step, it is sufficient to recess the insulating base substrate to a depth greater than or equal to the thickness of the resin coating film C2, that is, the insulating base substrate may be recessed to a depth equal to the thickness of the resin coating film C2 or a depth greater than the thickness of the resin coating film C2.

The width of the circuit pattern section formed in the circuit pattern forming step such as the circuit trench C3 is not particularly limited. In the case where laser processing is used, a fine circuit having a line width of 20 µm or less can also be easily formed. The depth of the circuit trench is, in the case where the level difference between the electric circuit and the insulating base substrate is removed by fill-up plating, the depth of the electric circuit formed in the present embodiment.

<Catalyst Application Step>

The catalyst application step is a step in which a plating catalyst or precursor thereof is applied to the surface of the circuit pattern section such as the circuit trench C3 and the surface of the resin coating film C2. In the case where a through-hole C4 has been formed, the plating catalyst or precursor thereof is also applied to the inner wall surface of the through-hole C4.

The plating catalyst or precursor thereof C5 is a catalyst applied in order to form an electroless plating film only on a portion where the formation of the electroless plating film by electroless plating in the plating treatment step is desired. As the plating catalyst, catalysts known for use in electroless plating can be used without particular limitations. Also, it is possible that a precursor of the plating catalyst is applied in advance and the plating catalyst is generated after separating the resin coating film. Specific examples of the plating catalyst include metal palladium (Pd), platinum (Pt), silver (Ag), and the like, and precursors and the like that generate such catalysts.

An example of a method for applying the plating catalyst or precursor thereof C5 may be a method that involves treatment under acidic conditions of pH 1 to 3 with an acidic colloidal Pd—Sn solution and then treatment with an acid solution, or a like method. A specific example may be as follows.

First, the surface of the insulating base substrate C1 in which the circuit trench C3 and the through-hole C4 have been formed is washed for a specific period of time with a warm solution of a surfactant (cleaner/conditioner) to remove oil or the like adhering to the surface. Next, if necessary, soft etching treatment is performed with a sodium persulfate-sulfuric acid-based soft etching agent. Further, acid washing is performed in an acidic solution, such as an aqueous sulfuric acid solution or an aqueous hydrochloric acid solution, having a pH of 1 to 2. Next, pre-dip treatment for allowing chloride ions to be adsorbed on the surface of the insulating base substrate C1 is performed by immersing the substrate in a pre-dip fluid containing an aqueous stannous chloride solution as a principal component in a concentration of about 0.1%. Thereafter, the substrate is further immersed in an acidic colloidal plating catalyst solution, such as an acidic Pd—Sn colloid, having a pH of 1 to 3 that contains stannous chloride and palladium chloride to cause aggregation and adsorption of Pd and Sn. Then, a redox reaction is caused between adsorbed stannous chloride and palladium chloride ($SnCl_2+PdCl_2 \rightarrow SnCl_4+Pd\downarrow$). Thereby, metal palladium, which is a plating catalyst, deposits.

As the acidic colloidal plating catalyst solution, a known acidic colloidal Pd—Sn catalyst solution or the like can be used, and a commercially available plating process using an acidic colloidal plating catalyst solution may be used. Such a process is, for example, systematized and commercially distributed by Rohm and Haas Company.

Through the catalyst application process, the plating catalyst or precursor thereof C5 can be applied to the surface of the circuit trench C3, the inner wall surface of the through-hole C4 and the surface of the resin coating film C2.

<Coating Film Removal Step>

The coating film removal step is a step in which the resin coating film C2 is removed from the insulating base substrate C1 that has undergone the catalyst application step.

The method for removing the resin coating film C2 is not particularly limited. Specific examples include a method in which the resin coating film C2 is swollen with a specific solution (a swelling fluid) and then the resin coating film C2 is separated from the insulating base substrate C1, a method in which the resin coating film C2 is swollen with and further partially dissolved in a specific solution (a swelling fluid), and then the resin coating film C2 is separated from the insulating base substrate C1, a method in which the resin coating film C2 is dissolved in a specific solution (a swelling fluid) and removed, and the like. The swelling fluid is not particularly limited as long as it can swell the resin coating film C2. The aforementioned swelling or dissolution is carried out by, for example, immersing the insulating base substrate C1 that has been coated with the resin coating film C2 in the swelling fluid for a specific period of time. Removal efficiency may be enhanced by ultrasonic irradiation during immersion. When the coating film is separated after being swollen, the coating film may be peeled off with light force.

The case will be described in which the aforementioned swellable resin coating film is used as the resin coating film C2.

As the fluid (swelling fluid) for swelling the swellable resin coating film C2, any fluid can be used without any particular limitation as long as it can swell or dissolve the swellable resin coating film C2 without substantially decomposing or dissolving the insulating base substrate C1 and the plating catalyst or precursor thereof C5. It is also preferable to use a fluid that can swell the swellable resin coating film C2 to such a degree that the resin coating film C2 can be easily separated. Such a swelling fluid is suitably selected according to the kind and the thickness of the swellable resin coating film C2. Specifically, for example, in the case where the swellable resin coating film is made of an elastomer such as a diene-based elastomer, acryl-based elastomer or polyester-based elastomer, polymer resin obtained by polymerizing (a) at least one carboxylic acid or acid anhydride monomer having at least one polymerizable unsaturated group within the molecule and (b) at least one monomer polymerizable with the monomer (a), or a resin composition containing the polymer resin, or a carboxyl group-containing acrylic resin, for example, an aqueous alkaline solution, such as an aqueous sodium hydroxide solution, having a concentration of about 1 to 10% can be preferably used.

In the case where a plating process including treatment under acidic conditions as described above is used in the catalyst application step, it is preferable that the swellable resin coating film C2 is made of an elastomer having a degree of swelling under acidic conditions of less than 50%, preferably 40% or less, and a degree of swelling under alkaline conditions of 50% or greater such as an diene-based elastomer, an acryl-based elastomer or a polyester-based elastomer, polymer resin obtained by polymerizing (a) at least one carboxylic acid or acid anhydride monomer having at least one polymerizable unsaturated group within the molecule and (b) at least one monomer polymerizable with the monomer (a), or a resin composition containing the polymer resin, or a carboxyl group-containing acrylic resin. Such a swellable resin coating film easily swells and separates with an aqueous alkaline solution having a pH of 12 to 14, for example, an aqueous sodium hydroxide solution having a concentration of about 1 to 10%. In order to enhance separability, ultrasonic irradiation may be performed during immersion. The coating film may be peeled off with light force to achieve separation if necessary.

As the method for swelling the swellable resin coating film C2, a method can be used in which the insulating base substrate C1 that has been coated with the swellable resin coating film C2 is immersed in the swelling fluid for a specific period of time. In order to enhance separability, it is particularly preferable to perform ultrasonic irradiation during immersion. If the swellable resin coating film is not separated by simply being swollen, the resin coating film may be peeled off with light force if necessary.

<Plating Treatment Step>

The plating treatment step is a step in which electroless plating treatment is performed on the insulating base substrate C1 from which the resin coating film C2 has been removed.

A usable method of the electroless plating treatment may be a method in which the insulating base substrate C1 to which the plating catalyst or precursor thereof C5 has been partially applied is immersed in an electroless plating fluid, and an electroless plating film (a plating layer) is deposited only on the portion to which the plating catalyst or precursor thereof C5 has been applied.

Examples of metals for use in electroless plating include copper (Cu), nickel (Ni), cobalt (Co), aluminum (Al), and the like. Among these, plating containing Cu as a principal component is preferable in terms of excellent conductivity. In the case where Ni is contained, such plating is preferable in terms of excellent corrosion resistance and adhesion to solder.

The thickness of the electroless plating film C6 is not particularly limited. Specifically, it is preferably, for example, about 0.1 to 10 μm and more preferably about 1 to 5 μm. In particular, creating the circuit trench C3 so as to have a large depth enables plating having a large thickness and metal wiring having a large cross-sectional area to be easily formed. In this case, such a thickness is preferable in terms of enhancement of the strength of metal wiring.

Due to the plating treatment step, the electroless plating film deposits only on the portion on the surface of the insulating base substrate C1 where the plating catalyst or precursor thereof C5 remains. Accordingly, a conductive layer can be precisely formed only on the portion where formation of the circuit pattern section is desired, while deposition of the electroless plating film on the portion where the circuit pattern section is not formed can be suppressed. Accordingly, even in the case where a plurality of fine circuits having a narrow line width with a small pitch interval are to be formed, unnecessary plating film does not remain between adjacent circuits. Therefore, the occurrence of short circuiting and migration can be suppressed.

<Inspection Step>

In the circuit board manufacturing method of the present embodiment, the resin coating film C2 may contain a fluorescent material, and the method may further include, after the coating film removal step, an inspection step of performing inspection for a film removal failure by using luminescence from the fluorescent material. That is, the presence or absence of a film removal failure and the location of the film removal failure can be checked by inclusion of a fluorescent material in the resin coating film C2 and using luminescence from the fluorescent material by directing ultraviolet light or near ultraviolet light to the inspection target surface after the coating film removal step. With the production method of the present embodiment, an electric circuit with an extremely small line width and line interval can be formed.

Figure 13:
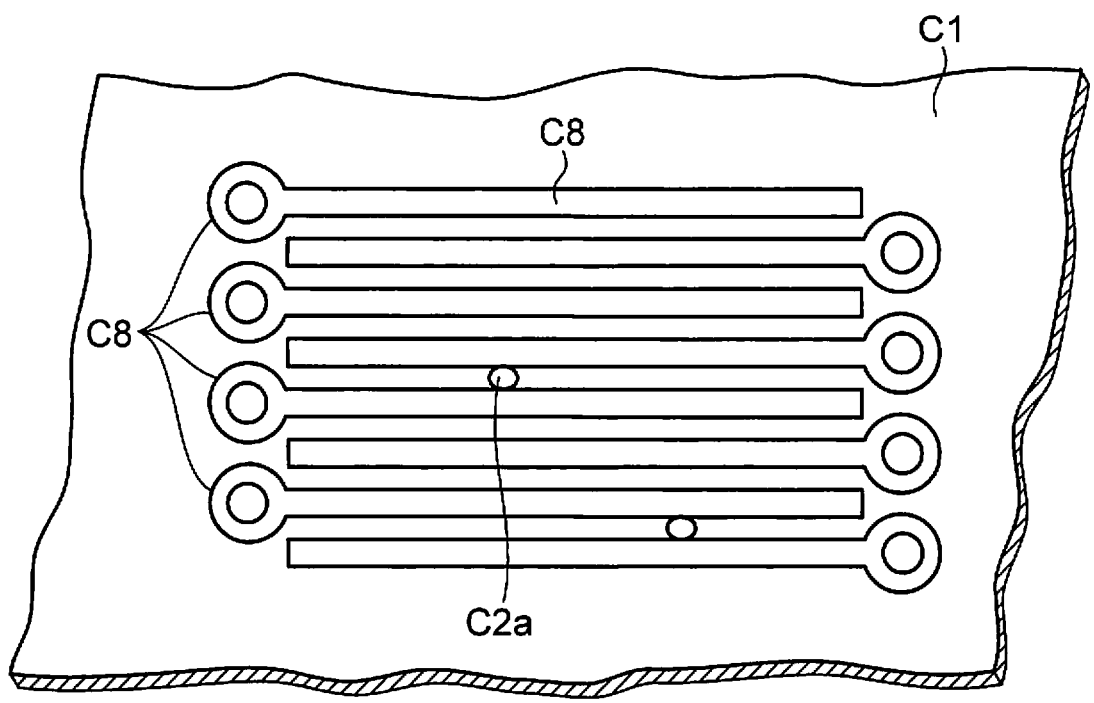
FIG. 13 is a diagram illustrating an inspection step of performing inspection for a film removal failure by inclusion of a fluorescent material in a resin coating film and using luminescence from the fluorescent material.

In the case of forming an electric circuit with an extremely small line width and line interval, for example, as shown in FIG. 13, there is concern that the resin coating film might remain between adjacent electric circuits C8 formed in the surface of the insulating base substrate C1 without being removed completely. In this case, an electroless plating film will be formed on that portion, which may cause migration, short-circuiting or the like. Even if such a situation occurs, the presence or absence of a film removal failure and the location of the film removal failure can be checked if the above inspection step is provided. FIG. 13 is a diagram illustrating the inspection step of including a fluorescent material in the resin coating film and performing inspection for a film removal failure by using luminescence from the fluorescent material.

The fluorescent material that can be included in the resin coating film C2 used in the inspection step is not particularly limited as long as it exhibits light emitting characteristics when light is directed from a specific light source. Specific examples thereof include fluoresceine, eosine, and pyronine G.

A portion in which luminescence from the fluorescent material has been detected in the inspection step is the portion in which a residue C2a of the resin coating film C2 remains. Accordingly, by removing the portion in which the luminescence has been detected, it is possible to suppress a situation in which an electroless plating film will be formed in that portion. By doing so, the occurrence of migration, short-circuiting and the like can be prevented.

<Desmear Treatment Step>

In the method for manufacturing a circuit board according to the present invention, after performing the plating treatment step, in particular, before performing or after performing fill-up plating, a desmear treatment step in which desmear treatment is performed may additionally be included. Performing desmear treatment enables removal of unnecessary resin adhering to the electroless plating film. Moreover, in the case of a multi-layer circuit board furnished with a resulting circuit board, it is possible that the portion of the surface of the insulating base substrate where the electroless plating film is not formed is roughened so as to enhance adhesion with the upper layer of the circuit board or the like. Moreover, desmear treatment may be performed on the via-hole bottom. By doing so, unnecessary resin adhering to the via-hole bottom can be removed. The desmear treatment is not particularly limited, and known desmear treatment can be used. A specific example may be a treatment that involves immersion in a permanganate solution or the like.

Through the aforementioned steps, the circuit board C10 as shown in FIG. 12E is formed.

Figure 14:
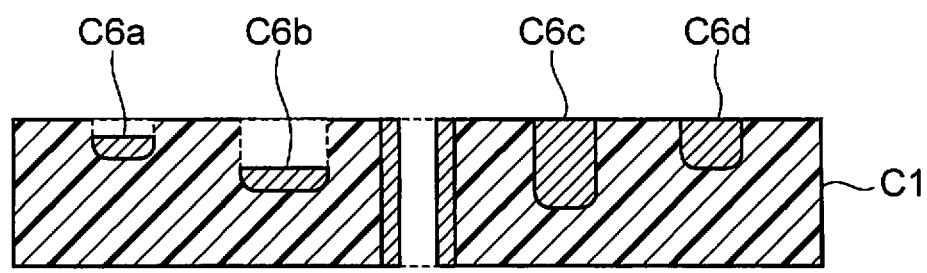
FIG. 14 is a schematic cross-sectional view of an electroless plating film formed when a circuit pattern section (circuit trench) is formed by recessing the insulating base substrate to a depth greater than the thickness of the resin coating film in a circuit pattern forming step.

In the circuit pattern forming step, in the case where recessing is performed to a depth exceeding the thickness of the resin coating film C2, as shown in FIG. 14, an electric circuit made of an electroless plating film C6a can be formed in a deep portion of the insulating base substrate C1. It is also possible to form a circuit in a plurality of positions (for example, C6a and C6b in FIG. 14) having different depths between conductive layers. Furthermore, as indicated by C6c and C6d in FIG. 14, it is also possible to form a circuit by forming a circuit trench having a specific depth in the insulating base substrate C1 and thereafter filling the circuit trench by electroless plating treatment. This configuration is preferable because a circuit having a large cross-sectional area can be easily formed, and therefore the electrical capacitance of the circuit can be increased.

[Embodiment 3-2]

In Embodiment 3-1 above, a circuit board obtained by forming an electric circuit on a planar insulating base substrate has been described, but the present invention is not particularly limited thereto. Specifically, a circuit board (three-dimensional circuit board) provided with an electric circuit with precise wiring can be obtained even when a three-dimensional insulating base substrate having a stepped three-dimensional face is used as an insulating base substrate.

Hereinafter, a three-dimensional method for manufacturing a circuit board according to Embodiment 3-2 will be described.

FIG. 15 shows schematic cross-sectional views illustrating respective steps for producing a three-dimensional circuit board according to Embodiment 3-2.

First, as shown in FIG. 15A, a resin coating film C2 is formed on the surface of a three-dimensional insulating base substrate C51 having a stepped portion. This step corresponds to the coating film forming step.

As the three-dimensional insulating base substrate C51, any type of resin molded article that can be used to produce a conventionally known three-dimensional circuit board can be used without any particular limitation. It is preferable to obtain such a molded article by injection molding from the viewpoint of production efficiency. Specific examples of the resin material for obtaining the resin molded article include polycarbonate resin, polyamide resin, various types of polyester resins, polyimide resin, and polyphenylene sulfide resin.

The method for forming the resin coating film C2 is not particularly limited. Specifically, for example, the same forming method as that used in Embodiment 3-1 can be used.

Next, as shown in FIG. 15B, a circuit pattern section such as a circuit trench C3 having a depth greater than the thickness of the resin coating film C2 is formed with respect to the outer surface of the resin coating film C2. The method for forming the circuit pattern section is not particularly limited. Specifically, for example, the same forming method as that used in Embodiment 3-1 can be used. The portion in which the electroless plating film is formed by electroless plating, or in other words, the portion in which the electric circuit is formed is defined by the circuit pattern section such as the circuit trench C3. This step corresponds to the circuit pattern forming step.

Next, as shown in FIG. 15C, a plating catalyst or precursor thereof C5 is applied to the surface of the circuit pattern section such as the circuit trench C3 and the surface, in which the circuit pattern section is not formed, of the resin coating film C2. The method for applying the plating catalyst or precursor thereof C5 is not particularly limited. Specifically, for example, the same method as that used in Embodiment 3-1 above can be used. This step corresponds to the catalyst application step. Through the catalyst application process, as shown in FIG. 15C, the plating catalyst or precursor thereof C5 can be applied to the surface of the circuit pattern section such as the circuit trench C3 and the surface of the resin coating film C2.

Next, as shown in FIG. 15D, the resin coating film C2 is removed from the three-dimensional insulating base substrate C51. By doing so, the plating catalyst or precursor thereof C5 can be left only in the surface of the portion in which the circuit pattern section such as the circuit trench C3 is formed, of the three-dimensional insulating base substrate C51. The plating catalyst or precursor thereof C5 applied to the surface of the resin coating film C2, on the other hand, is removed together with the resin coating film C2, while being carried on the resin coating film C2. The method for removing the resin coating film C2 is not particularly limited. Specifically, for example, the same method as that used in Embodiment 3-1 above can be used. This step corresponds to the coating film removal step.

Next, as shown in FIG. 15E, an electroless plating is applied to the three-dimensional insulating base substrate C51 from which the resin coating film C2 has been removed. By doing so, an electroless plating film C6 is formed only in the portion in which the plating catalyst or precursor thereof C5 remains. In other words, the electroless plating film C6 that will be an electric circuit is formed in the portion in which the circuit trench C3 and the through-hole C4 have been formed. The method for forming the electroless plating film C6 is not particularly limited. Specifically, for example, the same forming method as that used in Embodiment 3-1 above can be used. This step corresponds to the plating treatment step.

Through the aforementioned steps, the circuit board C60 as shown in FIG. 15E is formed in which the electric circuit C6 is formed in the three-dimensional insulating base substrate C51. In the circuit board C60 formed in the manner described above, the electric circuit can be formed with high precision despite the fact that the electric circuit formed on the insulating base substrate has a small line width and line interval. Also, in the circuit board according to the present embodiment, the circuit is formed even in the face having a stepped portion of the three-dimensional circuit board with precision and ease.

[Embodiment 4]

The present invention further relates to another method for manufacturing a circuit board and a circuit board obtained by the production method.

In electric equipment such as portable information terminal devices, e.g., mobile phones; computers and peripherals therefor; various types of home information appliances; and the like, its functionality is being rapidly enhanced. Along with this trend, there is a growing demand for electric circuits with a further increased density in circuit boards mounted on such electric equipment. In order to meet the demand for circuits with an increased density, there is a need for methods that can precisely form electric circuit wiring having an even smaller line width and line interval (the width of a space between adjacent electric circuits). Highly densified circuit wiring is likely to cause short-circuiting, migration and the like between wires.

A known method for manufacturing a circuit board is to form an electric circuit on an insulating base substrate by a subtractive method, additive method or the like. The subtractive method is a method for forming an electric circuit by removing (subtracting), a metal foil from a portion of the surface of a metal foil-clad laminate plate other than the portion where formation of an electric circuit is desired. The additive method is a method for forming an electric circuit by applying an electroless plating only to the portion of an insulating base substrate where formation of an electric circuit is desired.

The subtractive method is a method in which a thick metal foil is etched such that the metal foil is left on the portion where formation of an electric circuit is desired and that the metal foil on the other portion is removed. This method is disadvantageous in terms of production cost because the metal of the removed portion is wasted. With the additive method, on the other hand, metal wiring can be formed only in the portion where formation of an electric circuit is desired by electroless plating. Accordingly, waste of metal is avoided and waste of resources is little. From such a point of view, the additive method is a preferable circuit forming method.

A method for forming an electric circuit made of metal wiring using a full additive method, which is a conventional typical additive method, will be described with reference to FIG. 22. FIG. 22 shows schematic cross-sectional views illustrating respective steps for forming metal wiring by a conventional full additive method.

Figure 22A:
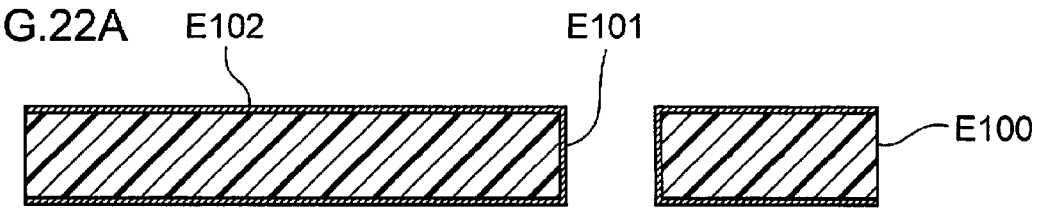
FIGS. 22A-22E show schematic cross-sectional views illustrating respective steps for forming metal wiring by a conventional full additive method.
Figure 22B:
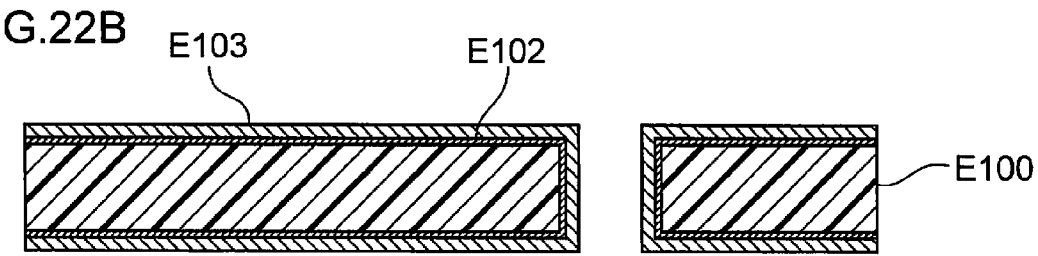
Figure 22C:
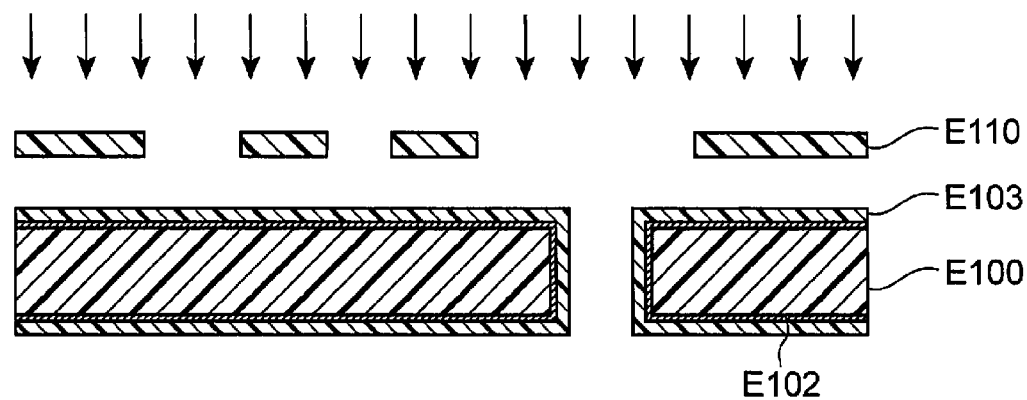
Figure 22D:
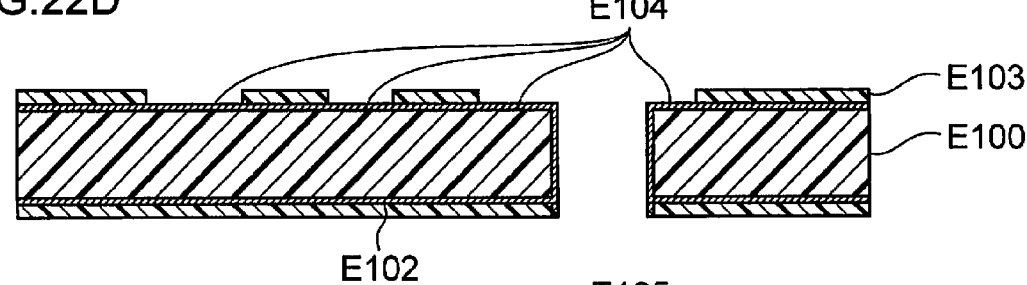
Figure 22E:
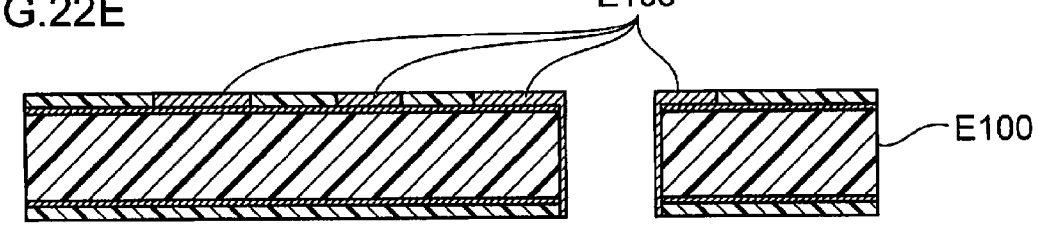

First, as shown in FIG. 22A, a plating catalyst E102 is applied to the surface of an insulating base substrate E100 in which a through-hole E101 has been formed. The surface of the insulating base substrate E100 has been roughened in advance. Next, as shown in FIG. 22B, a photoresist layer E103 is formed on the insulating base substrate E100 to which the plating catalyst E102 has been applied. Next, as shown in FIG. 22C, the photoresist layer E103 is exposed to light via a photomask E110 in which a specific circuit pattern has been formed. Next, as shown in FIG. 22D, the exposed photoresist layer E103 is developed to form a circuit pattern E104. Then, as shown in FIG. 22E, an electroless plating such as an electroless copper plating is applied so as to form metal wiring E105 in the surface of the circuit pattern E104 formed as a result of development and the inner wall surface of the through-hole E101. By performing steps as described above, a circuit made of the metal wiring E105 is formed on the insulating base substrate E100.

Figure 23:
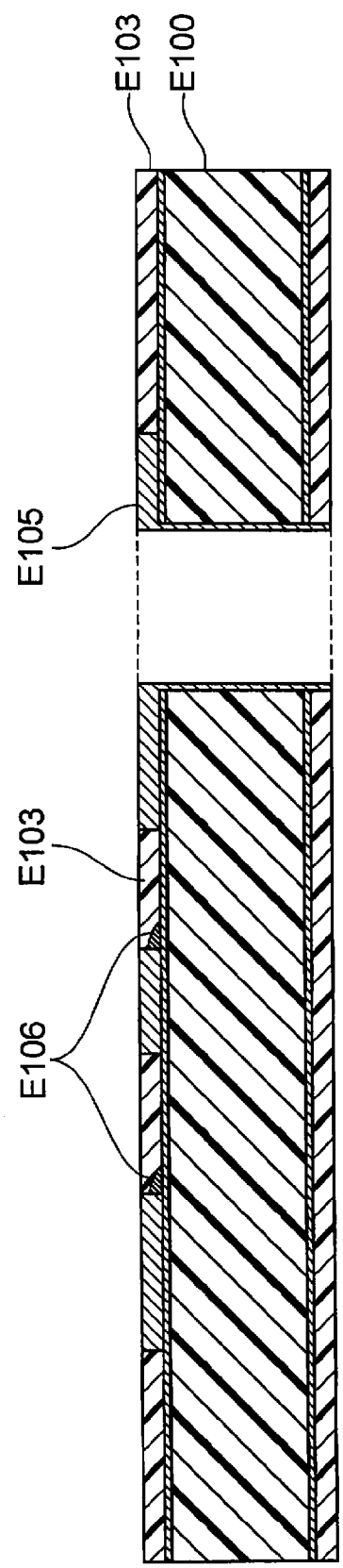
FIG. 23 is a schematic cross-sectional view illustrating the contour of a circuit formed by the conventional full additive method.

With the above-described conventional additive method, the plating catalyst E102 is applied to the entire surface of the insulating base substrate E100. As a result, the following problem arises. Specifically, if the photoresist layer E103 is developed with high precision, a plating can be formed only in the portion that is not protected by the photoresist. However, if the photoresist layer E103 is not developed with high precision, as shown in FIG. 23, an unwanted plated portion E106 may remain in the portion in which a plating does not need to be formed. Such a situation occurs because the plating catalyst E102 is applied to the entire surface of the insulating base substrate E100. The unwanted plated portion E106 causes short-circuiting, migration and the like between adjacent circuits. Such short-circuiting and migration are more likely to occur in the case where a circuit having a small line width and line interval is formed. FIG. 23 is a schematic cross-sectional view illustrating the contour of a circuit formed by the conventional full additive method.

There are production methods that are different from the above-described method for manufacturing a circuit board, for example, those disclosed in JP S57-134996A and JP S58-186994A.

As another additive method, JP S57-134996A discloses the following method.

First, a solvent-soluble first photosensitive resin layer and an alkali-soluble second photosensitive resin layer are formed on an insulating substrate (insulating base substrate). Then, the first and second photosensitive resin layers are exposed to light via a photomask having a specific circuit pattern. Next, the first and second photosensitive resin layers are developed. Next, a catalyst is adsorbed to the entire surface that includes recesses created as a result of development, after which the alkali-soluble second photosensitive resin is dissolved with an alkali solution so as to remove only an unnecessary catalyst. Thereafter, an electroless plating is applied so as to precisely form a circuit only in the portion in which the catalyst is present.

JP S58-186994A discloses the following method.

First, a resin protective film is coated on an insulating substrate (insulating base substrate) (first step). Next, a trench and a through-hole that correspond to a wiring pattern are independently or simultaneously drawn/formed in the insulating substrate coated with the protective film by machining or laser beam radiation (second step). Next, an activation layer is formed on the entire surface of the insulating substrate (third step). Next, the protective film is separated so as to remove the activation layer on the insulating substrate and leave the activation layer only in the trench and the inner wall surface of the through-hole (fourth step). Next, a plating without a plating protective film is applied to the insulating substrate so as to selectively form a conductive layer only in the trench and the inner wall surface of the through-hole that have been activated (fifth step).

The method disclosed in JP S57-134996A, however, requires forming two types of photosensitive resin layers having different solvent-solubilities, developing the photosensitive resin layers using two types of solvents, and dissolving the second photosensitive resin in an alkali solution after the catalyst has been adsorbed, and thus the production process is very complex.

JP S58-186994A also discloses that thermosetting resin serving as a protective film is coated on an insulating substrate, heated and cured, and thereafter the protective film and the insulating substrate are cut along a specific wiring pattern, and that the thermosetting resin on the surface of the insulating substrate is removed with a solvent (line 16 of the lower left column to line 11 of the lower right column on page 2 of JP S58-186994A).

JP S58-186994A does not disclose specific types of thermosetting resins that can be used as the protective film. Generally used thermosetting resins have strong resistance to solvents, and thus there has been a problem in that it is difficult to remove the resin with an ordinary solvent. Also, such thermosetting resins have a high level of adhesion to a resin base substrate, and thus it has been difficult to precisely remove only the protective film, without leaving a fragment of the protective film on the surface of the resin base substrate. Also, if a strong solvent is used to sufficiently separate the resin or where immersion is performed for a long time, the plating catalyst on the surface of the base substrate is also removed. In this case, no conductive layer will be formed in the portion from which the plating catalyst has been removed.

Also, if a strong solvent is used or immersion is performed for a long time, there are cases where the protective film made of thermosetting resin is broken into pieces, causing the plating catalyst in the protective film to be re-dispersed in the solvent. Also, there is a possibility that the plating catalyst that has been re-dispersed in the solvent might re-attach to the surface of the resin base substrate, forming an unwanted plating film in that portion. Accordingly, with a method such as that disclosed in JP S58-186994, it is difficult to form a circuit having a precise contour.

The present invention has been conceived in view of the above circumstances, and it is an object of the present invention to provide a method for manufacturing a circuit board with which it is possible to form a highly precise electric circuit on an insulating base substrate with ease. Another object is to provide a circuit board obtained by the method for manufacturing a circuit board.

A method for manufacturing a circuit board according to an embodiment of the present invention includes: an application step of applying a fluid material containing resin for constituting a resin coating film to a portion other than a portion in which a circuit pattern section is to be formed, of a surface of an insulating base substrate; a circuit pattern forming step of forming a circuit pattern section by drying the applied fluid material to form a resin coating film in the portion other than a portion in which a circuit pattern section is to be formed; a catalyst application step of applying a plating catalyst or precursor thereof to a surface of the circuit pattern section and a surface of the resin coating film; a coating film removal step of removing the resin coating film from the insulating base substrate; and a plating treatment step of applying an electroless plating to the insulating base substrate from which the resin coating film has been separated.

According to such a production method, a circuit pattern section can be formed by applying a fluid material containing resin for constituting a resin coating film to a portion other than a portion in which a circuit pattern section is to be formed, of the surface of an insulating base substrate, and thereafter drying the applied fluid material to form a resin coating film on a portion other than the portion in which a circuit pattern section is to be formed. In other words, the circuit pattern section can be formed by drying the fluid material after it has been applied to a portion other than the portion in which a circuit pattern section is to be formed, and therefore the circuit pattern section can be formed without using laser processing, cutting work such as dicing or machining work such as embossing. Then, a plating catalyst or precursor thereof is applied to the surface of the circuit trench and the surface of the resin coating film while the portion in which a plating film is not to be formed is protected with the resin coating film. Thereafter, the resin coating film is removed from the insulating base substrate, whereby it is possible to easily leave the plating catalyst or precursor thereof in the portion where formation of a plating film is desired, and remove the plating catalyst or precursor thereof from the other portion. Accordingly, by performing the plating treatment step of forming an electroless plating film, the electroless plating film can be easily formed only in the portion where formation of a plating film is desired, which is the portion in which the plating catalyst or precursor thereof remains.

Accordingly, a highly precise electric circuit can be easily formed on the insulating base substrate. That is, the contour of the formed circuit can be maintained highly precisely. As a result, for example, even when a plurality of circuits are formed at a regular interval, it is possible to suppress a situation in which fragments of the electroless plating film or the like are left between circuits, as a result of which the occurrence of short-circuiting, migration and the like can be suppressed.

Also, it is preferable that the application step is a step that uses an inkjet printing method, screen printing method, flexographic printing method, gravure printing method or offset printing method. According to such a production method, it is possible to easily apply a fluid material containing resin for constituting a resin coating film to a portion other than the portion, in which the circuit pattern section is to be formed, of the surface of the insulating base substrate. Consequently, a highly precise electric circuit can be more easily formed on the insulating base substrate.

Also, the coating film removal step is preferably a step in which the resin coating film is separated from the insulating base substrate after the resin coating film is swollen with a specific fluid or after the resin coating film is partially dissolved in a specific fluid. According to such a production method, the resin coating film can be easily separated from the insulating base substrate. Consequently, a highly precise electric circuit can be more easily formed on the insulating base substrate.

Also, the degree of swelling in the fluid of the resin coating film is preferably 50% or greater. By using a resin coating film having such a degree of swelling, the resin coating film can be easily separated from the insulating base substrate. Consequently, a highly precise electric circuit can be more easily formed on the insulating base substrate. The resin coating film may be a film that has a large degree of swelling in the fluid and dissolves in the fluid.

It is preferable that the catalyst application step includes a step of treatment in an acidic colloidal catalyst metal solution, the specific fluid in the coating film removal step is an alkaline solution, and the resin coating film has a degree of swelling in the acidic colloidal catalyst metal solution of less than 50% and a degree of swelling in the alkaline solution of 50% or greater.

According to such a production method, the resin coating film is not easily separated in the catalyst application step in which it is treated under acidic conditions, but is easily separated in the coating film removal step in which it is treated with an alkaline solution, performed after the catalyst application step. Therefore, the resin coating film is selectively separated in the coating film removal step. Accordingly, in the catalyst application step, the portion in which the electroless plating film is not to be formed is precisely protected, and in the coating film removal step performed after application of the plating catalyst or precursor thereof, the resin coating film can be easily separated. Consequently, more precise circuit forming is possible.

The coating film removal step is preferably a step in which the resin coating film is dissolved in a specific fluid and removed. According to such a production method, the resin coating film can be easily removed from the insulating base substrate. Consequently, a highly precise electric circuit can be more easily formed on the insulating base substrate.

The fluid material is preferably an elastomer suspension or emulsion. By using such a fluid material, the resin coating film can be easily formed in a portion other than the portion in which a circuit pattern section is to be formed of the surface of the insulating base substrate. In other words, the circuit pattern section can be easily formed on the surface of the insulating base substrate. Consequently, a highly precise electric circuit can be more easily formed on the insulating base substrate.

The elastomer is preferably selected from the group consisting of a diene-based elastomer, an acryl-based elastomer and a polyester-based elastomer that have a carboxyl group. More preferably, the diene-based elastomer is a styrene-butadiene copolymer. With such an elastomer, a resin coating film having a desired degree of swelling can be easily formed by adjusting the degree of crosslinking or the degree of gelation. Also, a resin coating film that has a large degree of swelling in the fluid used in the coating film removal step and dissolves in the fluid can be easily formed.

The resin is composed mainly of resin containing an acrylic resin having 100 to 800 acid equivalents of carboxyl groups is preferably used.

The resin included in the fluid material is preferably polymer resin obtained by polymerizing (a) at least one carboxylic acid or acid anhydride monomer having at least one polymerizable unsaturated group within the molecule and (b) at least one monomer polymerizable with the monomer (a), or a resin composition containing the polymer resin. By using such resin, the resin coating film can be easily formed on the surface of the insulating base substrate. Consequently, a highly precise electric circuit can be more easily formed on the insulating base substrate. Also, the resin coating film obtained in the above manner is often capable of dissolving in the fluid used in the coating film removal step, and thus can be effectively used not only for separation-removal but also for dissolution-removal.

The acid equivalent of the polymer resin is preferably 100 to 800 acid equivalents.

The resin coating film preferably has a thickness of 10 μm or less because a fine circuit can be formed with high precision.

Also, the circuit pattern section preferably includes a portion having a width of 20 μm or less because an antenna circuit or the like that requires microprocessing can be formed.

A configuration in which the insulating base substrate has a stepped surface formed in a step shape and the insulating base substrate surface is the stepped surface is also preferable. Specifically, a configuration in which the insulating base substrate includes a stepped surface formed in a step shape, and the application step, the circuit pattern forming step, the catalyst application step, the coating film removal step and the plating treatment step are performed on the stepped surface is also preferable. According to such a production method, a circuit that rides over the step can be easily formed.

Also, it is preferable that the resin coating film contains a fluorescent material, and after the coating film removal step, an inspection step of performing inspection for a film removal failure by using luminescence from the fluorescent material is further performed. In the production method described above, there is concern that in the case where the line width and the line interval are extremely small, the resin coating film that should have been removed might remain in a very small amount between adjacent circuit pattern sections without being removed completely. There is another concern that a fragment of the resin coating film removed when forming the circuit pattern section might enter and remain in the formed circuit pattern section. If the resin coating film is left between circuit pattern sections, an electroless plating film will be formed on that portion, which may cause migration, short-circuiting or the like. If a fragment of the resin coating film is left in the formed circuit pattern section, it may cause poor heat resistance or propagation loss in the electric circuit. In such cases, as described above, the presence or absence of a film removal failure and the location of the film removal failure can be checked by inclusion of a fluorescent material in the resin coating film, and after the coating film removal step, directing light from a specific light emitting source to the surface from which the coating film has been removed so as to cause the fluorescent material of only the portion in which the resin coating film remains to be lit.

Also, a circuit board according to another embodiment of the present invention is obtained by the above method for manufacturing a circuit board. With this configuration, it is possible to obtain a circuit board in which a highly precise electric circuit is formed on an insulating base substrate.

Specifically, Embodiment 4 of the present invention encompasses the following.

4-1. A method for manufacturing a circuit board including:

an application step of applying a fluid material containing resin for constituting a resin coating film to a portion other than a portion in which a circuit pattern section is to be formed of a surface of an insulating base substrate;

a circuit pattern forming step of forming a circuit pattern section by drying the applied fluid material to form a resin coating film in the portion other than a portion in which a circuit pattern section is to be formed;

a catalyst application step of applying a plating catalyst or precursor thereof to a surface of the circuit pattern section and a surface of the resin coating film;

a coating film removal step of removing the resin coating film from the insulating base substrate; and a plating treatment step of applying an electroless plating to the insulating base substrate from which the resin coating film has been separated.

4-2. The method for manufacturing a circuit board according to 4-1, wherein the application step is a step that uses an inkjet printing method, screen printing method, flexographic printing method, gravure printing method or offset printing method.

4-3. The method for manufacturing a circuit board according to 4-1 or 4-2, wherein the coating film removal step is a step in which the resin coating film is separated from the insulating base substrate after the resin coating film is swollen with a specific fluid or after the resin coating film is partially dissolved in a specific fluid.

4-4. The method for manufacturing a circuit board according to 4-3, wherein the resin coating film has a degree of swelling in the fluid of 50% or greater.

4-5. The method for manufacturing a circuit board according to 4-3, wherein the catalyst application step includes a step of treatment in an acidic colloidal catalyst metal solution, the specific fluid in the coating film removal step is an alkaline solution, and the resin coating film has a degree of swelling in the acidic colloidal catalyst metal solution of less than 50% and a degree of swelling in the alkaline solution of 50% or greater.

4-6. The method for manufacturing a circuit board according to 4-1 or 4-2, wherein the coating film removal step is a step in which the resin coating film is dissolved in the specific fluid and removed.

4-7. The method for manufacturing a circuit board according to any one of 4-1 to 4-6, wherein the fluid material is an elastomer suspension or emulsion.

4-8. The method for manufacturing a circuit board according to 4-7, wherein the elastomer is selected from the group consisting of a diene-based elastomer, an acryl-based elastomer and a polyester-based elastomer that have a carboxyl group.

4-9. The method for manufacturing a circuit board according to 4-8, wherein the diene-based elastomer is a styrene-butadiene copolymer.

4-10. The method for manufacturing a circuit board according to any one of 4-1 to 4-9, wherein the resin is composed mainly of resin containing an acrylic resin having 100 to 800 acid equivalents of carboxyl groups.

4-11. The method for manufacturing a circuit board according to any one of 4-1 to 4-6, wherein the resin included in the fluid material comprises polymer resin obtained by polymerizing (a) at least one carboxylic acid or acid anhydride monomer having at least one polymerizable unsaturated group within the molecule and (b) at least one monomer polymerizable with the monomer (a), or a resin composition containing the polymer resin.

4-12. The method for manufacturing a circuit board according to 4-11, wherein the polymer resin has an acid equivalent of 100 to 800.

4-13. The method for manufacturing a circuit board according to any one of 4-1 to 4-12, wherein the resin coating film has a thickness of 10 μm or less.

4-14. The method for manufacturing a circuit board according to any one of 4-1 to 4-13, wherein the circuit pattern section includes a portion having a width of 20 μm or less.

4-15. The method for manufacturing a circuit board according to any one of 4-1 to 4-14, wherein the insulating base substrate includes a stepped surface that is formed in a step shape, and the insulating base substrate surface is the stepped surface.

4-16. The method for manufacturing a circuit board according to any one of 4-1 to 4-15, wherein the resin coating film contains a fluorescent material, and the method further includes, after the coating film removal step, an inspection step of performing inspection for a film removal failure by using luminescence from the fluorescent material.

4-17. A circuit board obtained by the method for manufacturing a circuit board according to any one of 4-1 to 4-16.

According to the present invention, it is possible to provide a method for manufacturing a circuit board with which a highly precise electric circuit can be formed on an insulating base substrate. Also, a circuit board obtained by the method for manufacturing a circuit board is provided. That is, the contour of the electric circuit that is formed by an electroless plating film can be maintained highly precisely. By doing so, it is possible to suppress a situation in which an unwanted fragment of the electroless plating film is left in a portion other than the circuit forming portion, as a result of which the occurrence of short-circuiting, migration and the like can be suppressed.

Hereinafter, embodiments of the present invention will be described, but the present invention is not limited thereto.

[Embodiment 4-1]

The method for manufacturing a circuit board of the present embodiment includes: an application step of applying a fluid material containing resin for constituting a resin coating film to a portion other than a portion in which a circuit pattern section is to be formed of a surface of an insulating base substrate; a circuit pattern forming step of forming a circuit pattern section by drying the applied fluid material to form a resin coating film in the portion other than a portion in which a circuit pattern section is to be formed; a catalyst application step of applying a plating catalyst or precursor thereof to a surface of the circuit pattern section and a surface of the resin coating film; a coating film removal step of removing the resin coating film from the insulating base substrate; and a plating treatment step of applying an electroless plating to the insulating base substrate from which the resin coating film has been separated.

First, a method for manufacturing a circuit board according to Embodiment 4-1 of the present invention will be described. FIG. 18 shows schematic cross-sectional views illustrating respective steps of the method for manufacturing a circuit board according to Embodiment 4-1.

Figure 18A:
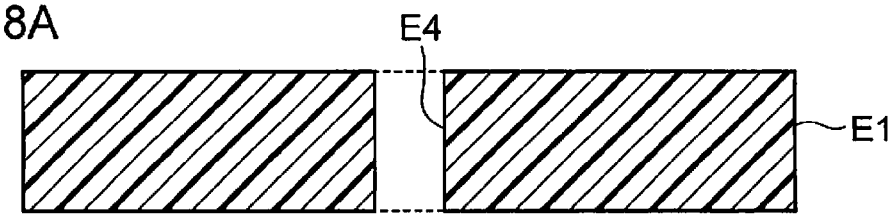
FIGS. 18A-18E show schematic cross-sectional views illustrating respective steps of a method for manufacturing a circuit board according to Embodiment 4-1.
Figure 18B:
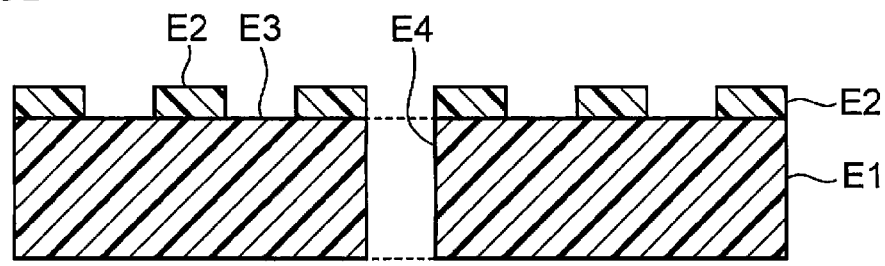

First, a fluid material containing resin for constituting a resin coating film is applied to a portion other than a portion in which a circuit pattern section is to be formed of the surface of an insulating base substrate E1 as shown in FIG. 18A, and thereafter the applied fluid material is dried. By doing so, as shown in FIG. 18B, a circuit pattern section E3 is formed by forming a resin coating film E2 in a portion other than the portion in which a circuit pattern section is to be formed. This step corresponds to the application step and the circuit pattern forming step. A through-hole E4 may be formed in the insulating base substrate E1 before the fluid material is applied.

Figure 18C:
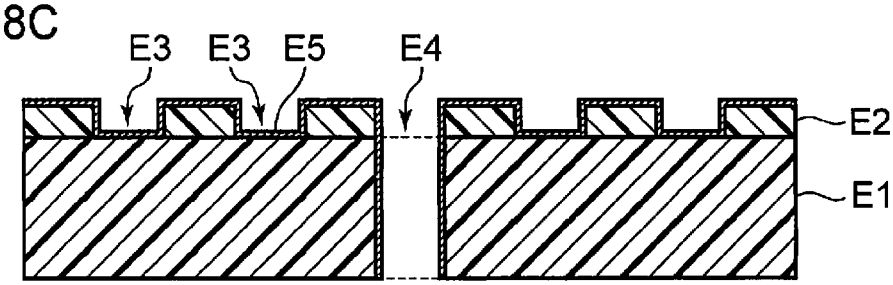

Next, as shown in FIG. 18C, a plating catalyst or precursor thereof E5 is applied to the surface of the circuit pattern section E3 and the surface of the resin coating film E2. This step corresponds to the catalyst application step.

Figure 18D:
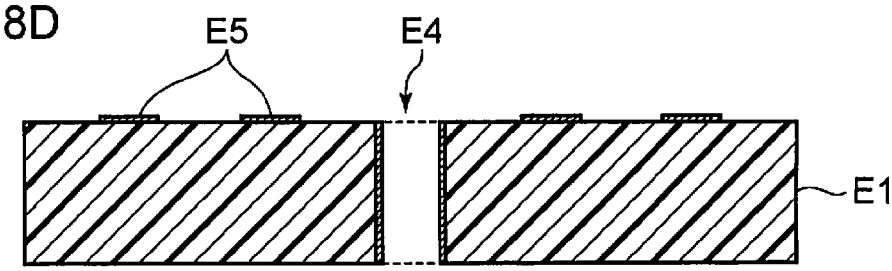

Next, as shown in FIG. 18D, the resin coating film E2 is removed from the insulating base substrate E1. By doing so, the plating catalyst or precursor thereof E5 can be left only in the surface of the portion in which the circuit pattern section E3 has been formed, on the insulating base substrate E1. The plating catalyst or precursor thereof E5 applied to the surface of the resin coating film E2, on the other hand, is removed together with the resin coating film E2, while being carried on the resin coating film E2. This step corresponds to the coating film removal step.

Figure 18E:
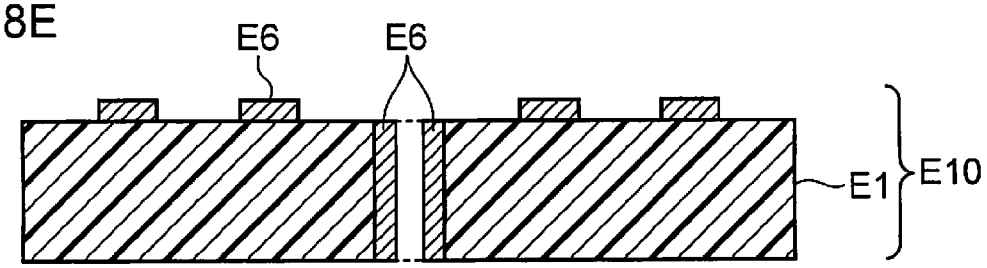

Next, an electroless plating is applied to the insulating base substrate E1 from which the resin coating film E2 has been removed. By doing so, an electroless plating film E6 is formed only in the portion in which the plating catalyst or precursor thereof E5 remains. Specifically, as shown in FIG. 18E, the electroless plating film that will be an electric circuit E6 is formed in the portion in which the circuit pattern section E3 has been formed. The electric circuit E6 may be made of the electroless plating film or a thick film formed by further applying an electroless plating (fill-up plating) to the electroless plating film. This step corresponds to the plating treatment step.

Through the aforementioned steps, the circuit board E10 as shown in FIG. 18E is formed. In the circuit board E10 formed in the manner described above, the electric circuit E6 is formed on the insulating base substrate E1 with high precision.

Hereinafter, each constituent element of the present embodiment will be described.

<Application Step>

Figure 19A:
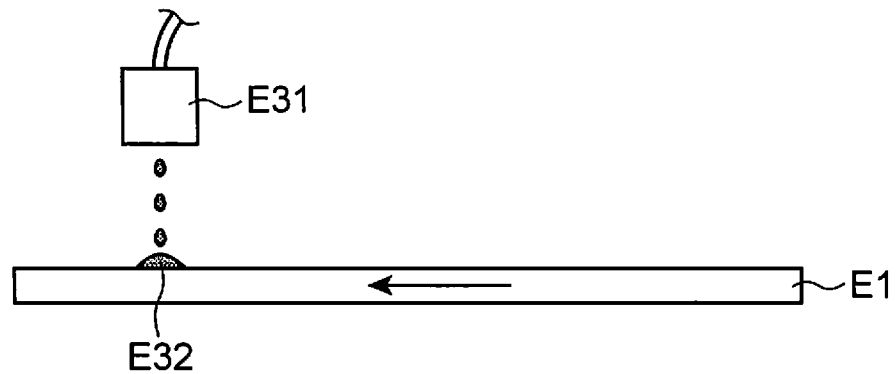
FIGS. 19A-19C show diagrams illustrating an example of the application step according to Embodiment 4-1.
Figure 19B:
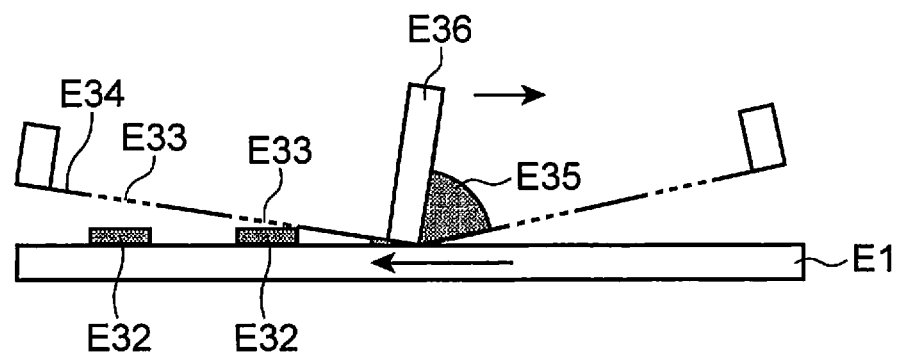
Figure 19C:
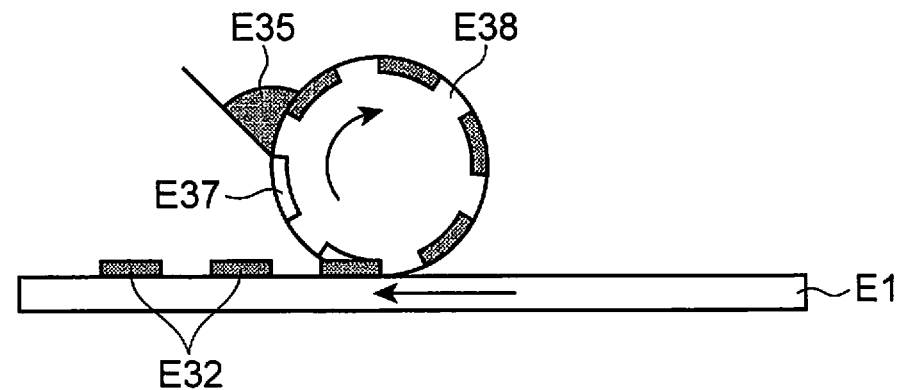

As described above, the application step is a step in which a fluid material containing resin for constituting a resin coating film is applied to a portion other than a portion, in which a circuit pattern section is formed, of the surface of an insulating base substrate. The application step is not particularly limited as long as it is possible to apply the fluid material to a portion other than a portion in which a circuit pattern section is to be formed of the surface of an insulating base substrate. Specifically, for example, an inkjet printing method, screen printing method, flexographic printing method, gravure printing method or offset printing method can be used, and more specifically, for example, a method as shown in FIG. 19 can be used. FIG. 19 shows diagrams illustrating the application step. FIG. 19A shows an inkjet printing method, FIG. 19B shows a screen printing method, and FIG. 19C shows a gravure printing method.

The application step using an inkjet printing method is not particularly limited as long as the fluid material can be applied to a portion other than a portion in which a circuit pattern section is to be formed. Specifically, for example, a known inkjet apparatus can be used. It is preferable to use an inkjet apparatus because the thickness of the formed resin coating film can be changed by varying the amount of discharged fluid material according to the conveying speed of the insulating base substrate E1. More specifically, for example, as shown in FIG. 19A, the application using an inkjet printing method is a step in which a fluid layer E32 made of the fluid material is formed in a specific shape (in a portion other than a portion in which a circuit pattern section is to be formed) by discharging the fluid material from a discharge unit E31 of an inkjet apparatus to the insulating base substrate E1. The fluid layer E32 will be the resin coating film E2 formed in a portion other than a portion in which a circuit pattern section is to be formed by being dried in the circuit pattern forming step, which will be described below.

The application step using a screen printing method is not particularly limited as long as the fluid material can be applied to a portion other than a portion in which a circuit pattern section is to be formed. Specifically, as shown in FIG. 19B, the application step using a screen printing method is a step in which a fluid layer E32 made of the fluid material is formed in a specific shape (a portion other than a portion in which a circuit pattern section is to be formed) on the insulating base substrate E1 by placing a fluid material E35 on a screen E34 having a formed mesh portion E33 corresponding to a portion other than the portion in which a circuit pattern is to be formed and moving a squeegee E36 while pressing the inner surface of the screen E34. The fluid layer E32 will be the resin coating film E2 formed in a portion other than a portion in which a circuit pattern section is to be formed by being dried in the circuit pattern forming step, which will be described below.

The application step using a gravure printing method is not particularly limited as long as the fluid material can be applied to a portion other than a portion in which a circuit pattern section is to be formed. Specifically, as shown in FIG. 19C, the application step using a gravure printing method is a step in which a fluid layer E32 made of the fluid material is formed in a specific shape (a portion other than a portion in which a circuit pattern section is to be formed) on the insulating base substrate E1 by applying a fluid material E35 to a gravure cylinder E38 having a formed indentation E37 corresponding to a portion other than the portion in which a circuit pattern is to be formed so as to fill the indentation E37 of the gravure cylinder E38, and then, bringing the gravure cylinder E38 filled with the fluid material E35 into contact with the insulating base substrate E1. The fluid layer E32 will be the resin coating film E2 formed in a portion other than a portion in which a circuit pattern section is to be formed by being dried in the circuit pattern forming step, which will be described below.

(Liquid Material)

The fluid material is not particularly limited as long as the resin coating film E2 that can be removed in the coating film removal step is formed in the circuit pattern forming step. Specific examples of the resin coating film that can be removed in the coating film removal step include a resin coating film made of soluble resin that can easily dissolve in an organic solvent or an alkali solution and swellable resin coating film that is made of resin that can swell with a specific fluid (swelling fluid), which will be described below. Among them, it is particularly preferable to use the swellable resin coating film because precise removal is easy. The swellable resin coating film preferably has, for example, a degree of swelling in the fluid (swelling fluid) of 50% or greater. As the swellable resin coating film, not only a resin coating film that does not substantially dissolve in the fluid (swelling fluid) and can be easily separated from the surface of the insulating base substrate E1, but also a resin coating film that swells with and at least partially dissolves in the fluid (swelling fluid) and thereby easily separates from the surface of the insulating base substrate E1 and a resin coating film that dissolves in the fluid (swelling fluid), and thereby easily separates from the surface of the insulating base substrate E1 can be used.

As the fluid material that can form the swellable resin coating film, for example, an elastomer suspension, emulsion or the like can be used. Specific examples of the elastomer include diene-based elastomers such as styrene-butadiene copolymers, acryl-based elastomers such as acrylic acid ester copolymers, and polyester-based elastomers. With such an elastomer, a swellable resin coating film having a desired degree of swelling can be easily formed by adjusting the degree of crosslinking, the degree of gelation or the like of the elastomer resin particles dispersed as a suspension or emulsion.

Specific examples of the elastomer having a carboxyl group include elastomers having a carboxyl group within the molecule by inclusion of a monomer unit having the carboxyl group as a copolymerizable component: diene-based elastomers, such as styrene-butadiene copolymers and acryl-based elastomers such as acrylic acid ester copolymers, and polyester-based elastomers. With such an elastomer, a swellable resin coating film having a desired alkali degree of swelling can be formed by adjusting the acid equivalent, the degree of crosslinking, the degree of gelation or the like of the elastomer dispersed as a suspension or emulsion. The carboxyl group in the elastomer has the effect of separating the swellable resin coating film from the surface of the insulating base substrate by swelling the swellable resin coating film with an aqueous alkaline solution. As used herein, "acid equivalent" refers to a polymer weight per equivalent of carboxyl group.

Specific examples of the monomer unit having a carboxyl group include (meth)acrylic acid, fumaric acid, cinnamic acid, crotonic acid, itaconic acid and maleic anhydride.

The carboxyl group content in such an elastomer having a carboxyl group is preferably 100 to 2,000 acid equivalents, and more preferably 100 to 800 acid equivalents. In the case where the acid equivalent is excessively small, it is likely that compatibility with a solvent or other compositions is deteriorated and resistance to a pre-treatment fluid for plating is deteriorated. In the case where the acid equivalent is excessively large, separability in an aqueous alkaline solution is likely to deteriorate.

The molecular weight of the elastomer is preferably 10,000 to 1,000,000, and more preferably 20,000 to 60,000. In the case where the molecular weight of the elastomer is excessively large, separability is likely to deteriorate. In the case where the molecular weight of the elastomer is excessively small, viscosity is likely to deteriorate, as a result of which it will be difficult to maintain a uniform thickness of the swellable resin coating film, and the resistance to the pre-treatment fluid for plating is likely to deteriorate.

As the fluid material, in addition to those listed above, the following can be used. For example, as the resin included in the fluid material, the following resins can be used.

As the resin, polymer resin obtained by polymerizing (a) at least one carboxylic acid or acid anhydride monomer having at least one polymerizable unsaturated group within the molecule and (b) at least one monomer polymerizable with the monomer (a), and a resin composition containing the polymer resin can be used.

It is possible that the resin composition contains as a main resin the aforementioned polymer resin that serves as an essential component and that at least one of oligomers, monomers, fillers, and other additives is added thereto. The main resin is preferably a linear polymer having thermoplastic properties. In order to control fluidity, crystallinity, and like properties, grafting may be performed for branching. The molecular weight thereof is a number average molecular weight of about 1,000 to 500,000, and preferably 5,000 to 50,000. An excessively small molecular weight is likely to result in impaired film flexibility and impaired resistance to the chemical for forming plating nuclei (acid resistance). An excessively large molecular weight is likely to result in deteriorated alkali separability and deteriorated attachability in the case of processing into a dry film. Crosslinking points may be introduced for enhancement of resistance to the chemical for forming plating nuclei as well as for thermal deformation suppression at the time of laser processing and fluidity control.

Regarding the composition of the polymer resin as the main resin, as described above, it can be obtained by polymerizing (a) a carboxylic acid or acid anhydride monomer having at least one polymerizable unsaturated group within the molecule and (b) a monomer polymerizable with the monomer (a). Examples of known techniques include those disclosed in JP H7-281437A, JP 2000-231190A, and JP 2001-201851A.

Examples of the monomer (a) include (meth)acrylic acid, fumaric acid, cinnamic acid, crotonic acid, itaconic acid, maleic anhydride, maleic acid half ester, butyl acrylate, and the like, and such monomers may be used singly or as a combination of two or more.

An example of the monomer (b) is generally a monomer that is non-acidic and has one polymerizable unsaturated group within the molecule, but the monomer (b) is not limited thereto. The monomer (b) is selected so as to maintain various properties such as resistance in a plating step and flexibility of a cured film. Specific examples include methyl(meth)acrylate, ethyl (meth)acrylate, iso-propyl(meth)acrylate, n-butyl (meth)acrylate, sec-butyl(meth)acrylate, tert -butyl(meth) acrylate, 2-hydroxylethyl(meth)acrylate, 2-hydroxylpropyl (meth)acrylate, and the like. Other examples include vinyl alcohol esters such as vinyl acetate, (meth)acrylonitrile, styrene or polymerizable styrene derivatives, and the like. Also, it is possible to obtain by polymerization of only the aforementioned carboxylic acid or acid anhydride having one polymerizable unsaturated group within the molecule. Furthermore, in order to allow a three-dimensional crosslink, it is possible to select a monomer having multiple unsaturated groups as the monomer for use in the polymer and to introduce a reactive functional group such as an epoxy group, a hydroxyl group, an amino group, an amide group, a vinyl group, or the like into the molecular framework. It is sufficient that the amount of carboxyl group contained in the resin is 100 to 2,000 acid equivalents, and preferably 100 to 800 acid equivalents. Here, the term "acid equivalent" refers to the weight of a polymer having 1 equivalent of a carboxyl group therein. In the case where the acid equivalent is excessively low, it is likely that compatibility with a solvent or other compositions is deteriorated or resistance to a pre-treatment fluid for plating is deteriorated. In the case where the acid equivalent is excessively high, separability is likely to deteriorate. The composition ratio of the monomer (a) is 5 to 70 mass %.

Any monomer and oligomer may be used as long as they are resistant to the chemical for forming plating nuclei and easily removable with an alkali. It can be envisaged that they are used as tackifiers in a manner similar to a plasticizer in order to enhance attachment of the dry film (DFR). Moreover, a cross-linking agent may be added to increase various kinds of resistance. Specific examples include methyl(meth)acrylate, ethyl(meth)acrylate, iso-propyl (meth)acrylate, n-butyl (meth)acrylate, sec-butyl(meth)acrylate, tert-butyl(meth) acrylate, 2-hydroxylethyl(meth)acrylate, 2-hydroxylpropyl (meth)acrylate, and the like. Other examples include vinyl alcohol esters such as vinyl acetate, (meth)acrylonitrile, styrene or polymerizable styrene derivatives, and the like. Also, it is possible to obtain by polymerization of only the aforementioned carboxylic acid or acid anhydride having one polymerizable unsaturated group within the molecule. Moreover, a polyfunctional unsaturated compound may also be contained. Any of the aforementioned monomers or oligomers obtained by reacting the monomers may be used. In addition to the aforementioned monomers, it is also possible to contain two or more other photopolymerizable monomers. Examples of such monomers include 1,6-hexanediol di(meth)acrylate, 1,4-cyclohexanediol di(meth)acrylate, polypropyleneglycol di(meth)acrylate, polyethyleneglycol di(meth)acrylate, polyoxyethylenepolyoxypropyleneglycol di(meth)acrylate, and like polyoxyalkyleneglycol di(meth) acrylates, 2-di(p-hydroxyphenyl)propane di(meth)acrylate, glycerol tri(meth)acrylate, dipentaerythritol penta(meth) acrylate, trimethylolpropane triglycidyl ether tri(meth)acrylate, bisphenol A diglycidyl ether tri(meth)acrylate, 2,2-bis (4-methacryloxypentaethoxyphenyl)propane,
polyfunctional (meth)acrylates containing a urethane group, and the like. Any of the aforementioned monomers or oligomers obtained by reacting the monomers may be used.

Furthermore, a filler may be contained. The filler is not particularly limited, and examples include silica, aluminum hydroxide, magnesium hydroxide, calcium carbonate, clay, kaolin, titanium oxide, barium sulfate, alumina, zinc oxide, talc, mica, glass, potassium titanate, wollastonite, magnesium sulfate, aluminum borate, organic fillers, and the like. Since the resist is thin, with its thickness generally being 1 to 10 µm, it is preferable that the size of the filler is also small. Although it is preferable to use a filler that has a small average particle size, and from which coarse particles are taken away, it is possible to crush the particles when dispersing or remove coarse particles by filtration.

Examples of other additives include photopolymerizable resins (photopolymerization initiators), polymerization inhibitors, colorants (dyes, pigments, color producing pigments), thermal-polymerization initiators, crosslinking agents such as epoxy and urethane, and the like.

(Insulating Base Substrate)

The insulating base substrate E1 used in the coating film forming step is not particularly limited as long as it can be used to produce a circuit board. Specifically, for example, a resin base substrate containing a resin can be used.

As the resin base substrate, any type of organic substrate that can be used to produce a circuit board, for example, a multilayer circuit board can be used without any particular limitation. Specific examples of the organic substrate include substrates conventionally used to produce multilayer circuit boards, such as substrates made of epoxy resin, acrylic resin, polycarbonate resin, polyimide resin, polyphenylene sulfide resin, polyphenylene ether resin, cyanate resin, benzoxazine resin and bismaleimide resin.

The epoxy resin is not particularly limited as long as it can constitute any type of organic substrate that can be used to produce a circuit board. Specific examples include bisphenol A epoxy resin, bisphenol F epoxy resin, bisphenol S epoxy resin, aralkyl epoxy resin, phenol novolac epoxy resin, alkyl phenol novolac epoxy resin, biphenol epoxy resin, naphthalene epoxy resin, dicyclopentadiene epoxy resin, an epoxidized product of a condensate of phenol and aromatic aldehyde having a phenolic hydroxy group, triglycidyl isocyanurate, and cycloaliphatic epoxy resin. Furthermore, in order to impart flame retardancy, epoxy resin as described above, nitrogen-containing resin, silicone-containing resin or the like that has been brominated or phosphorus-modified can be used. As the epoxy resin and the resin, any of the epoxy resins and the resins can be used singly or as a combination of two or more.

In the case where the base substrate is made of any of the aforementioned resins, generally, a curing agent is contained to cure the resin. The curing agent is not particularly limited as long as it can be used as a curing agent. Specifically, for example, dicyandiamide, a phenolic curing agent, an anhydride curing agent, an aminotriazine novolac curing agent, cyanate resin or the like can be used. As the phenolic curing agent, for example, a novolac, aralkyl or terpene-type phenolic curing agent can be used. Furthermore, in order to impart flame retardancy, phosphorus-modified phenol resin, phosphorus-modified cyanate resin or the like can be used. As the curing agent, any of the curing agents listed above may be used singly or as a combination of two or more.

Also, the insulating base substrate (insulating layer) may contain a filler. The filler is not particularly limited, and may be inorganic or organic fine particles. By inclusion of a filler, the filler will be exposed, and the adhesion between the plating and the resin can be increased by irregularities formed by the filler.

Specific examples of materials for constituting the inorganic fine particles include: high dielectric fillers such as aluminum oxide ($Al_2O_3$), magnesium oxide (MgO), boron nitride (BN), aluminum nitride (AlN), silica ($SiO_2$), barium titanate ($BaTiO_3$) and titanium oxide ($TiO_2$); magnetic fillers such as hard ferrite; inorganic flame retardants such as magnesium hydroxide ($Mg(OH)_2$), aluminum hydroxide ($Al(OH)_2$), antimony trioxide ($Sb_2O_3$), antimony pentoxide ($Sb_2O_5$), guanidine salt, zinc borate, molybdenum compound and zinc stannate; talc ($Mg_3(Si_4O_{10})(OH)_2$), barium sulfate ($BaSO_4$), calcium carbonate ($CaCO_3$), and mica. As the inorganic fine particles, any of the inorganic fine particles listed above may be used singly or as a combination of two or more. The inorganic fine particles listed above have high levels of heat conductivity, relative dielectric constant, flame retardancy, particle size distribution and flexibility in selecting the color, and therefore in order to selectively exhibit a desired function, appropriate blending and particle size design are performed, and thereby a high level of filling can be easily achieved. Although not particularly limited, it is preferable to use a filler having an average particle size that is less than or equal to the thickness of the insulating layer, more preferably, a filler having an average particle size of 0.01 µm to 10 µm, and even more preferably 0.05 µm to 5 µm.

The inorganic fine particles may be surface-treated with a silane coupling agent in order to enhance the dispersibility in the insulating base substrate. The insulating base substrate may contain a silane coupling agent in order to enhance the dispersibility of the inorganic fine particles in the insulating base substrate. The silane coupling agent is not particularly limited. Specific examples include epoxy silane, mercapto silane, amino silane, vinyl silane, styryl silane, methacryloxy silane, acryloxy silane and titanate-based silane coupling agents. As the silane coupling agent, any of the silane coupling agents listed above may be used singly or as a combination of two or more.

Also, the insulating base substrate may contain a dispersing agent in order to enhance the dispersibility of the inorganic fine particles in the insulating base substrate. The dispersing agent is not particularly limited. Specific examples include alkyl ether, sorbitan ester, alkyl polyether amine, and polymer-based dispersing agents. As the dispersing agent, any of the dispersing agents listed above may be used singly or as a combination of two or more.

<Circuit Pattern Forming Step>

As described above, the circuit pattern step is a step in which a circuit pattern forming section E3 is formed by forming the resin coating film E2 in a portion other than a portion in which a circuit pattern section is to be formed by drying the applied fluid material. The circuit pattern forming step is not particularly limited as long as it is possible to form the resin coating film E2 in a portion other than a portion in which a circuit pattern section is to be formed.

The drying temperature is not particularly limited as long as a resin coating film can be formed from the fluid material. Although depending on the composition of the fluid material, it is preferable to perform drying, for example, at 50 to 100° C. for 5 to 60 minutes.

The resin coating film E2 preferably has a thickness of 10 μm or less, and more preferably 5 μm or less. On the other hand, the resin coating film E2 preferably has a thickness of 0.1 μm or greater, and more preferably 1 μm or greater. In the case where the resin coating film E2 is excessively thin, it tends to be difficult to form a resin coating film having a uniform thickness. In the case where the resin coating film E2 is excessively thick, it tends to be difficult to remove the resin coating film E2 in the coating film removal step. Particularly in the case of dissolution-removal, it tends to be difficult to remove the resin coating film E2.

Next is a description of an example of a swellable resin coating film suitable as the resin coating film E2.

As the swellable resin coating film, a resin coating film having a degree of swelling in a swelling fluid of 50% or greater can be preferably used. Furthermore, it is more preferable to use a resin coating film having a degree of swelling in a swelling fluid of 100% or greater. In the case where the degree of swelling is excessively low, the swellable resin coating film is likely to be less separable in the coating film removal step.

As the swellable resin coating film, in particular, it is preferable to use a coating film whose degree of swelling varies depending on the pH of the swelling fluid. In the case where such a coating film is used, by using different fluid conditions in the catalyst application step and in the coating film removal step, the swellable resin coating film can maintain strong adhesion to the insulating base substrate at the pH used in catalyst application step, and the swellable resin coating film can be easily separated at the pH used in the coating film removal step.

More specifically, for example, in the case where the catalyst application step includes a step of treatment in an acidic plating catalyst colloidal solution (acidic colloidal catalyst metal solution) having a pH in the range of 1 to 3, and the coating film removal step includes a step of swelling the swellable resin coating film in an alkaline solution having a pH in the range of 12 to 14, the swellable resin coating film is preferably a resin coating film that has a degree of swelling in the acidic plating catalyst colloidal solution of less than 50%, and more preferably 40% or less, and preferably has a degree of swelling in the alkaline solution of 50% or greater, more preferably 100% or greater, and even more preferably 500% or greater.

The shape, position and the like of the circuit pattern section E3 are defined in the circuit pattern forming step. Also, the width of the circuit pattern section E3 formed in the circuit pattern forming step is not particularly limited. Specifically, for example, the circuit pattern section E3 preferably includes a portion having a width of 20 μm or less because an antenna circuit or the like that requires microprocessing can be formed.

<Catalyst Application Step>

The catalyst application step is a step in which a plating catalyst or precursor thereof is applied to the surface of the circuit pattern section E3 and the surface of the resin coating film E2. In the case where a through-hole E4 has been formed, on the insulating base substrate E1, the plating catalyst or precursor thereof is also applied to the inner wall surface of the through-hole E4.

The plating catalyst or precursor thereof E5 is a catalyst applied in order to form an electroless plating film only on a portion where the formation of the electroless plating film by electroless plating in the plating treatment step is desired. As the plating catalyst, catalysts known for use in electroless plating can be used without particular limitations. Also, it is possible that a precursor of the plating catalyst is applied in advance and the plating catalyst is generated after removing the resin coating film. Specific examples of the plating catalyst include metal palladium (Pd), platinum (Pt), silver (Ag), and the like, and precursors and the like that generate such catalysts.

An example of a method for applying the plating catalyst or precursor thereof E5 may be a method that involves treatment under acidic conditions of pH 1 to 3 with an acidic colloidal Pd—Sn solution and then treatment with an acid solution, or a like method. Specifically, for example, the following method can be used.

First, the surface of the insulating base substrate E1 in which the circuit pattern section E3 and the through-hole E4 have been formed is washed for a specific period of time with a warm solution of a surfactant (cleaner/conditioner) to remove oil or the like adhering to the surface. Next, if necessary, soft etching treatment is performed with a sodium persulfate-sulfuric acid-based soft etching agent. Further, acid washing is performed in an acidic solution, such as an aqueous sulfuric acid solution or an aqueous hydrochloric acid solution, having a pH of 1 to 2. Next, pre-dip treatment for allowing chloride ions to be adsorbed on the surface of the insulating base substrate E1 is performed by immersing the substrate in a pre-dip fluid containing an aqueous stannous chloride solution as a principal component in a concentration of about 0.1%. Thereafter, the substrate is further immersed in an acidic colloidal plating catalyst solution, such as an acidic Pd—Sn colloid, having a pH of 1 to 3 that contains stannous chloride and palladium chloride to cause aggregation and adsorption of Pd and Sn. Then, a redox reaction is caused between adsorbed stannous chloride and palladium chloride ($SnCl_2 + PdCl_2 \rightarrow SnCl_4 + Pd\downarrow$). Thereby, metal palladium, which is a plating catalyst, deposits.

As the acidic colloidal plating catalyst solution, a known acidic colloidal Pd—Sn catalyst solution or the like can be used, and a commercially available plating process using an acidic colloidal plating catalyst solution may be used. Such a process is, for example, systematized and commercially distributed by Rohm and Haas Company.

Through the catalyst application process, the plating catalyst or precursor thereof E5 can be applied to the surface of the circuit pattern section E3, the inner wall surface of the through-hole E4 and the surface of the resin coating film E2.

<Coating Film Removal Step>

The coating film removal step is a step in which the resin coating film E2 is removed from the insulating base substrate E1 that has undergone the catalyst application step.

The method for removing the resin coating film E2 is not particularly limited. Specific examples include a method in which the resin coating film E2 is swollen with a specific solution (a swelling fluid) and then the resin coating film E2 is separated from the insulating base substrate E1, a method in which the resin coating film E2 is swollen with and further partially dissolved in a specific solution (a swelling fluid), and then the resin coating film E2 is separated from the insulating base substrate E1, a method in which the resin coating film E2 is dissolved in a specific solution (a swelling fluid) and removed, and the like. The swelling fluid is not particularly limited as long as it can swell the resin coating film E2. The aforementioned swelling or dissolution is carried out by, for example, immersing the insulating base substrate E1 that has been coated with the resin coating film E2 in the swelling fluid for a specific period of time. Removal efficiency may be enhanced by ultrasonic irradiation during immersion. When the coating film is separated after being swollen, the coating film may be peeled off with light force.

The case will be described in which the aforementioned swellable resin coating film is used as the resin coating film E2.

As the fluid (swelling fluid) for swelling the swellable resin coating film E2, any fluid can be used without any particular limitation as long as it can swell or dissolve the swellable resin coating film E2 without substantially decomposing or dissolving the insulating base substrate E1 and the plating catalyst or precursor thereof E5. It is preferable to use a fluid that can swell the swellable resin coating film E2 to such an extent that the swellable resin coating film E2 can be easily separated. Such a swelling fluid is suitably selected according to the kind and the thickness of the swellable resin coating film E2. Specifically, for example, in the case where the swellable resin coating film is made of an elastomer such as a diene-based elastomer, acryl-based elastomer or polyester-based elastomer, polymer resin obtained by polymerizing (a) at least one carboxylic acid or acid anhydride monomer having at least one polymerizable unsaturated group within the molecule and (b) at least one monomer polymerizable with the monomer (a), or a resin composition containing the polymer resin, or a carboxyl group-containing acrylic resin, for example, an aqueous alkaline solution, such as an aqueous sodium hydroxide solution, having a concentration of about 1 to 10% can be preferably used.

In the case where a plating process including treatment under acidic conditions as described above is used in the catalyst application step, it is preferable that the swellable resin coating film E2 is made of an elastomer having a degree of swelling under acidic conditions of less than 50%, preferably 40% or less, and a degree of swelling under alkaline conditions of 50% or greater such as an diene-based elastomer, an acryl-based elastomer or a polyester-based elastomer, polymer resin obtained by polymerizing (a) at least one carboxylic acid or acid anhydride monomer having at least one polymerizable unsaturated group within the molecule and (b) at least one monomer polymerizable with the monomer (a), or a resin composition containing the polymer resin, or a carboxyl group-containing acrylic resin. Such a swellable resin coating film easily swells and separates with an aqueous alkaline solution having a pH of 12 to 14, for example, an aqueous sodium hydroxide solution having a concentration of about 1 to 10%. In order to enhance separability, ultrasonic irradiation may be performed during immersion. The swellable resin coating film may be peeled off with light force to achieve separation if necessary.

As the method for swelling the swellable resin coating film E2, a method can be used in which the insulating base substrate E1 that has been coated with the swellable resin coating film E2 is immersed in the swelling fluid for a specific period of time. In order to enhance separability, it is particularly preferable to perform ultrasonic irradiation during immersion. If the swellable resin coating film is not separated by simply being swollen, the resin coating film may be peeled off with light force if necessary.

<Plating Treatment Step>

The plating treatment step is a step in which electroless plating treatment is performed on the insulating base substrate E1 from which the resin coating film E2 has been removed.

A usable method of the electroless plating treatment may be a method in which the insulating base substrate E1 to which the plating catalyst or precursor thereof E5 has been partially applied is immersed in an electroless plating fluid, and an electroless plating film (a plating layer) is deposited only on the portion to which the plating catalyst or precursor thereof E5 has been applied.

Examples of metals for use in electroless plating include copper (Cu), nickel (Ni), cobalt (Co), aluminum (Al), and the like. Among these, plating containing Cu as a principal component is preferable in terms of excellent conductivity. In the case where Ni is contained, such plating is preferable in terms of excellent corrosion resistance and adhesion to solder.

Due to the plating treatment step, the electroless plating film deposits only on the portion on the surface of the insulating base substrate E1 where the plating catalyst or precursor thereof E5 remains. Accordingly, a conductive layer can be precisely formed only on the portion where formation of the circuit trench is desired, while deposition of the electroless plating film on the portion where the circuit trench is not formed can be suppressed. Accordingly, even in the case where a plurality of fine circuits having a narrow line width with a small pitch interval are to be formed, unnecessary plating film does not remain between adjacent circuits. Therefore, the occurrence of short circuiting and migration can be suppressed.

<Inspection Step>

In the method for manufacturing a circuit board of the present embodiment, the resin coating film E2 may contain a fluorescent material, and the method may further include, after the coating film removal step, an inspection step of performing inspection for a film removal failure by using luminescence from the fluorescent material. That is, the presence or absence of a film removal failure and the location of the film removal failure can be checked by inclusion of a fluorescent material in the resin coating film E2 and using luminescence from the fluorescent material by directing ultraviolet light or near ultraviolet light to the inspection target surface after the coating film removal step. With the production method of the present embodiment, an electric circuit with an extremely small line width and line interval can be formed.

Figure 20:
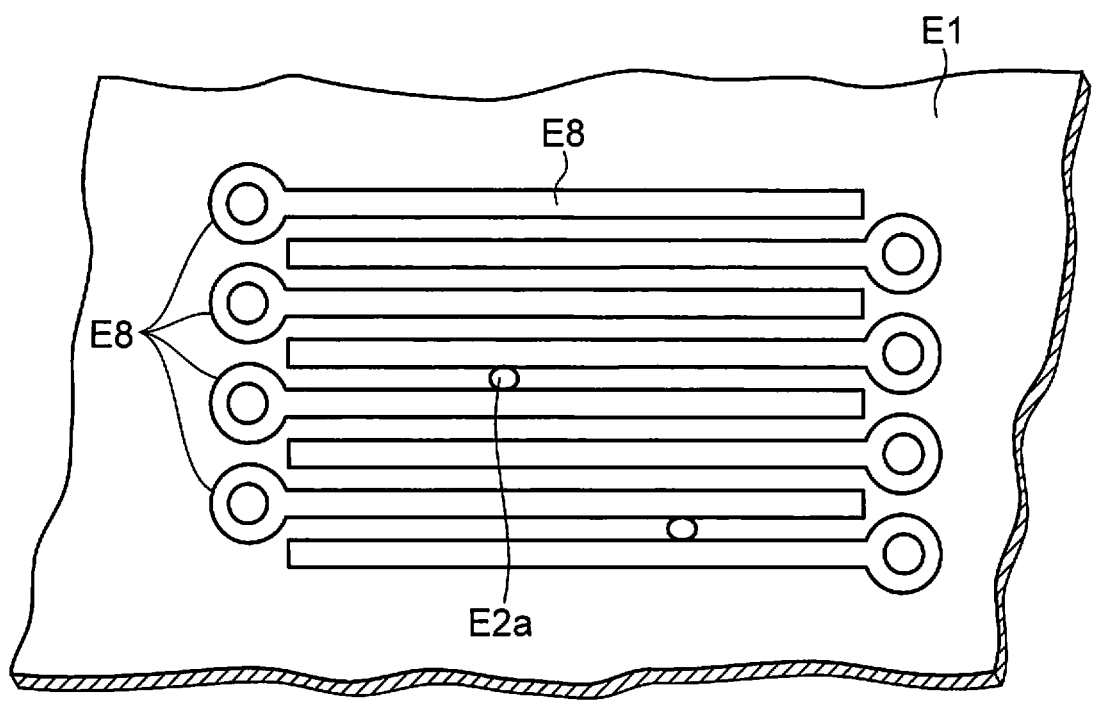
FIG. 20 is a diagram illustrating an inspection step of performing inspection for a film removal failure by inclusion of a fluorescent material in a resin coating film and using luminescence from the fluorescent material.

In the case of forming an electric circuit with an extremely small line width and line interval, for example, as shown in FIG. 20, there is concern that the resin coating film might remain between adjacent electric circuits E8 formed in the surface of the insulating base substrate E1 without being removed completely. In this case, an electroless film will be formed on that portion, which may cause migration, short-circuiting or the like. Even if such a situation occurs, the presence or absence of a film removal failure and the location of the film removal failure can be checked if the above inspection step is provided. FIG. 20 is a diagram illustrating the inspection step of including a fluorescent material in the resin coating film and performing inspection for a film removal failure by using luminescence from the fluorescent material.

The fluorescent material that can be included in the resin coating film E2 used in the inspection step is not particularly limited as long as it exhibits light emitting characteristics when light is directed from a specific light source. Specific examples thereof include fluoresceine, eosine, and pyronine G.

A portion in which luminescence from the fluorescent material has been detected in the inspection step is the portion in which a residue E2a of the resin coating film E2 remains. Accordingly, by removing the portion in which the luminescence has been detected, it is possible to suppress a situation in which an electroless plating film will be formed in that portion. By doing so, the occurrence of migration, short-circuiting and the like can be prevented.

<Desmear Treatment Step>

In the method for manufacturing a circuit board according to the present invention, after performing the plating treatment step, in particular, before performing or after performing fill-up plating, a desmear treatment step in which desmear treatment is performed may additionally be included. Performing desmear treatment enables removal of unnecessary resin adhering to the electroless plating film. Moreover, in the case of a multi-layer circuit board furnished with a resulting circuit board, it is possible that the portion of the surface of the insulating base substrate where the electroless plating film is not formed is roughened so as to enhance adhesion with the upper layer of the circuit board or the like. Moreover, desmear treatment may be performed on the via-hole bottom. By doing so, unnecessary resin adhering to the via-hole bottom can be removed. The desmear treatment is not particularly limited, and known desmear treatment can be used. A specific example may be a treatment that involves immersion in a permanganate solution or the like.

Through the aforementioned steps, the circuit board E10 as shown in FIG. 18E is formed.

[Embodiment 4-2]

In Embodiment 4-1, a circuit board obtained by forming an electric circuit on a planar insulating base substrate has been described, but the present invention is not particularly limited thereto. Specifically, a circuit board (three-dimensional circuit board) provided with an electric circuit with precise wiring can be obtained even when a three-dimensional insulating base substrate having a stepped three-dimensional face is used as an insulating base substrate.

Hereinafter, a three-dimensional method for manufacturing a circuit board according to Embodiment 4-2 will be described.

FIG. 21 shows schematic cross-sectional views illustrating respective steps for producing a three-dimensional circuit board according to Embodiment 4-2.

First, a fluid material containing resin for constituting a resin coating film is applied to a portion other than a portion in which a circuit pattern section is to be formed of the surface of a three-dimensional insulating base substrate E51 as shown in FIG. 21A and thereafter the applied fluid material is dried. By doing so, as shown in FIG. 21B, a circuit pattern section E3 is formed by forming a resin coating film E12 in a portion other than a portion in which a circuit pattern section is to be formed. This step corresponds to the application step and the circuit pattern forming step.

As the three-dimensional insulating base substrate E51, any type of resin molded article that can be used to produce a conventionally known three-dimensional circuit board can be used without any particular limitation. It is preferable to obtain such a molded article by injection molding from the viewpoint of production efficiency. Specific examples of the resin material for obtaining the resin molded article include polycarbonate resin, polyamide resin, various types of polyester resins, polyimide resin, and polyphenylene sulfide resin.

The method for applying the fluid material and the method for drying the fluid material are not particularly limited. Specifically, for example, the same methods as those used in Embodiment 4-1 above can be used.

Next, as shown in FIG. 21C, a plating catalyst or precursor thereof E5 is applied to the surface of the circuit pattern section E3 and the surface of the resin coating film E2. The method for applying the plating catalyst or precursor thereof E5 is not particularly limited. Specifically, for example, the same method as that used in Embodiment 4-1 above can be used. This step corresponds to the catalyst application step. Through the catalyst application process, as shown in FIG. 21C, the plating catalyst or precursor thereof E5 can be applied to the surface of the circuit pattern section E3 and the surface of the resin coating film E2.

Next, as shown in FIG. 21D, the resin coating film E2 is removed from the three-dimensional insulating base substrate E51. By doing so, the plating catalyst or precursor thereof E5 can be left only in the surface of the portion in which the circuit pattern section E3 is formed, in the three-dimensional insulating base substrate E51. The plating catalyst or precursor thereof E5 applied to the surface of the resin coating film E2, on the other hand, is removed together with the resin coating film E2, while being carried on the resin coating film E2. The method for removing resin coating film E2 is not particularly limited. Specifically, for example, the same method as that used in Embodiment 4-1 above can be used. This step corresponds to the coating film removal step.

Next, as shown in FIG. 21E, an electroless plating is applied to the three-dimensional insulating base substrate E51 from which the resin coating film E2 has been removed. By doing so, an electroless plating film E6 is formed only in the portion in which the plating catalyst or precursor thereof E5 remains. In other words, the electroless plating film E6 that will be an electric circuit is formed in the portion in which the circuit pattern section E3 and the through-hole E4 have been formed. The method for forming the electroless plating film E6 is not particularly limited. Specifically, for example, the same forming method as that used in Embodiment 4-1 can be used. This step corresponds to the plating treatment step.

Through the above steps, a circuit board E60 as shown in FIG. 21E is formed in which the electric circuit E6 is formed in the three-dimensional insulating base substrate E51. In the circuit board E60 formed in the manner described above, the electric circuit can be formed with high precision despite the fact that the line width and line interval of the electric circuit formed on the insulating base substrate are small. Also, in the circuit board according to the present embodiment, the circuit is formed even in the face having a stepped portion of the three-dimensional circuit board with precision and ease.

[Embodiment 5]

The present invention further relates to a circuit board for use in various types of electronic devices.

Figure 26A:
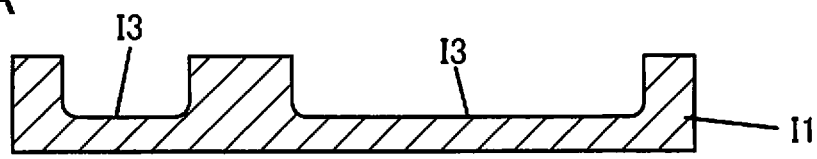
FIGS. 26A-26D show schematic cross-sectional views illustrating respective steps of a conventional method for manufacturing a circuit board.
Figure 26B:
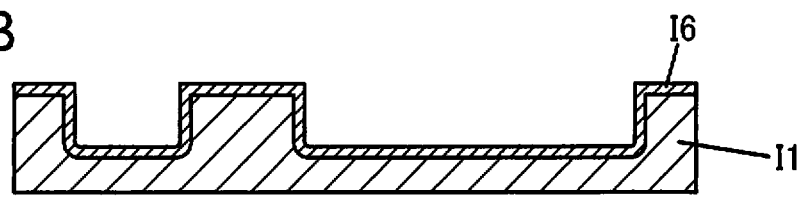
Figure 26C:
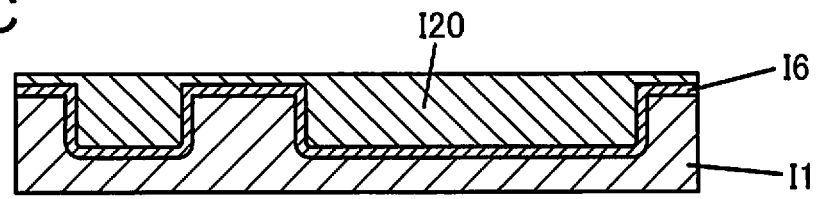
Figure 26D:
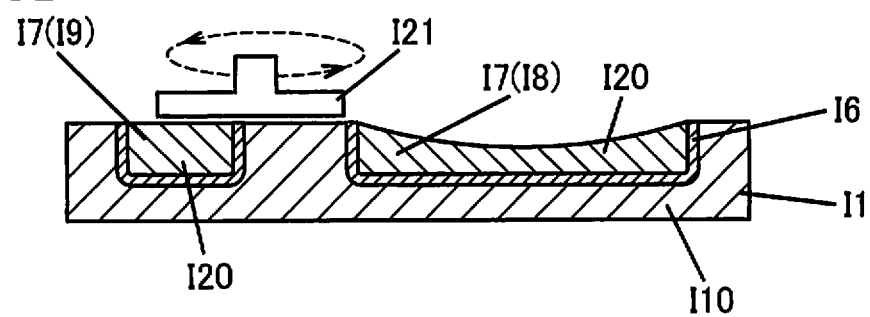

According to conventional technology, when a fine pattern (micro pattern) is formed in an insulating base substrate I1, an electric circuit I7 such as a fine pattern is formed to be embedded in the insulating base substrate I1 because it is necessary to improve the peel strength (see, for example, JP 2000-49162A). FIG. 26 shows an example of such a process for producing a circuit board I10. In this process, as shown in FIG. 26A, first, a circuit trench I3 (trench) for forming an electric circuit is formed in the surface of an insulating base substrate I1 by laser processing or the like. Next, as shown in FIG. 26B, an electroless plating is applied to form an electroless plating film I6 on the entire surface of the insulating base substrate I1 including the inner surface of the circuit trench I3. After that, as shown in FIG. 26C, an electroplating is applied so as to fill the inside of the circuit trench I3 and form an electroplating layer I20 on the entire surface of the electroless plating film I6. Then, as shown in FIG. 26D, the electroless plating film I6 and the electroplating layer I20 that are formed on the surface of the insulating base substrate I1 are polished and removed by CMP (Chemical Mechanical Polishing) using a polishing pad I21 such that the electroless plating film I6 and the electroplating layer I20 that are formed inside the circuit trench I3 are not removed, whereby a circuit board I10 is obtained in which an electric circuit I7 is formed embedded in the insulating base substrate I1. Usually, in the circuit board I10 obtained in the manner described above, the electric circuit I7 is constituted by a threadlike line portion I9 and a pad section I8 for mounting a surface mount component (not shown).

However, the pad section I8 of the electric circuit I7 has a problem in that because it is larger in area than the line portion I9 and thus will be easily separated from the insulating base substrate I1.

Also, the pad section I8 of the electric circuit I7 is likely to be polished by CMP because it is larger in area than the line portion I9. As a result, a problem arises in that as shown in FIG. 26D, the surface of the pad section I8 is formed in a concave shape (dished), a surface mount component mounted on that portion will tilt, compromising the electrical connection reliability. Also, when another substrate (not shown) is laminated on the circuit board I10, because the surface of the pad section I8 has been formed in a concave shape, a cavity will be formed in that portion as a result of the other substrate being laminated, and a problem arises in that when the circuit board I10 and the other substrate are pressed in the lamination direction, pressure will be less likely to be applied to the portion in which the cavity is formed.

The present invention has been conceived in view of the above respects, and it is an object of the present invention to provide a circuit board in which a pad section having a larger area than a line portion can be made less separable from an insulating base substrate and a surface mount component can be mounted stably without tilting.

Specifically, Embodiment 5 of the present invention encompasses the following.

5-1. A circuit board in which a line portion and a pad section are formed, as an electric circuit, by being embedded in an insulating base substrate such that the line portion and the pad section are exposed, wherein a circuit trench in which the line portion is formed is made shallow, a circuit trench in which the pad section is formed is made deep, and the pad section has a substantially uniform thickness.

5-2. The circuit board according to 5-1, wherein a difference in thickness between the thickest portion and the thinnest portion of the pad section is 20% or less of the thickness of the thickest portion.

5-3. The circuit board according to 5-1 or 5-2, wherein the line portion and the pad section have a substantially equal thickness.

According to the circuit board of 5-1 of the present invention, the pad section having a larger area than the line portion can be made less separable from the insulating base substrate and a surface mount component can be mounted stably without tilting.

According to the invention of 5-2, the surface of the pad section is substantially flat, so that a surface mount component can be mounted more stably.

According to the invention of 5-3, the thickness of the electric circuit is substantially uniform, so that it is relatively easy to design the impedance.

Hereinafter, an embodiment of the present invention will be described.

A method for manufacturing a circuit board of the present invention will be described first. FIG. 24 shows schematic cross-sectional views illustrating the respective steps of the method for manufacturing a circuit board of the present invention.

Figure 24A:
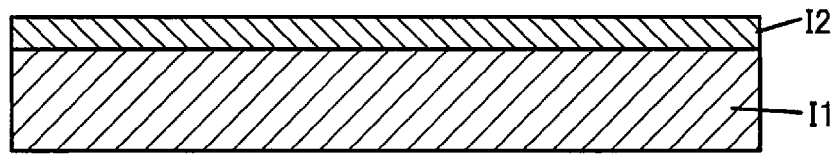
FIGS. 24A-24E show schematic cross-sectional views illustrating respective steps of an example of the method for manufacturing a circuit board of the present invention.

First, as shown in FIG. 24A, a resin coating film I2 is formed on the surface of an insulating base substrate I1. This step corresponds to the coating film forming step.

Figure 24B:
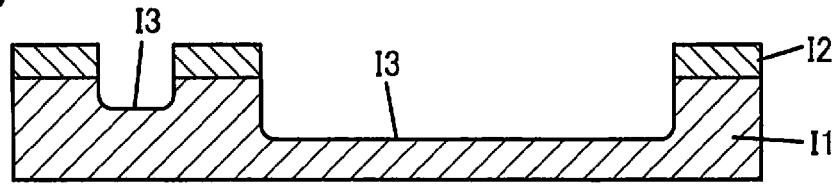

Next, as shown in FIG. 24B, a recess having a depth greater than the thickness of the resin coating film I2 with respect to the outer surface of the resin coating film I2 is formed to form a circuit trench I3. The circuit trench I3 defines a portion in which an electroless plating film I6 is to be formed by electroless plating, which will be described below, or in other words, a portion in which an electric circuit I7 is to be formed. The circuit trench I3 includes a circuit trench I3 for forming a threadlike line portion I9 of an electric circuit I7 and a circuit trench I3 for forming a pad section I8 on which a surface mount component (not shown) is to be mounted, the former circuit trench I3 is made shallow, and the latter circuit trench I3 is made deep. With this configuration, the pad section I8 having a larger area than the line portion I9 can be made less separable from the insulating base substrate I1. This step corresponds to the circuit trench forming step.

Figure 24C:
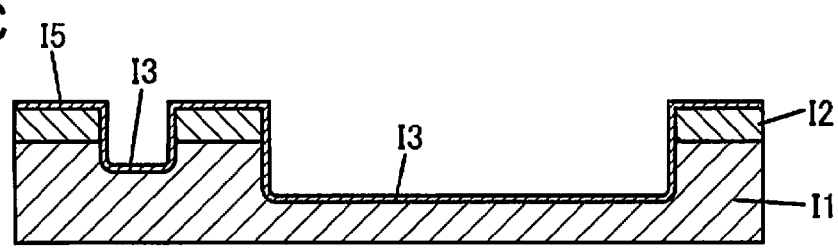

Next, as shown in FIG. 24C, a plating catalyst or precursor thereof I5 is applied to the surface of the circuit trench I3 and the surface of the resin coating film I2 in which the circuit trench I3 is not formed. This step corresponds to the catalyst application step.

Figure 24D:
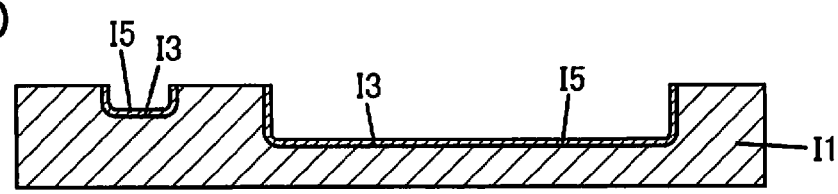

Next, as shown in FIG. 24D, the resin coating film I2 is removed from the insulating base substrate I1. By doing so, the plating catalyst or precursor thereof I5 can be left only in the surface of the portion in which the circuit trench I3 is formed, in the insulating base substrate I1. The plating catalyst or precursor thereof I5 applied to the surface of the resin coating film I2, on the other hand, is removed together with the resin coating film I2, while being carried on the resin coating film I2. This step corresponds to the coating film removal step.

Figure 24E:
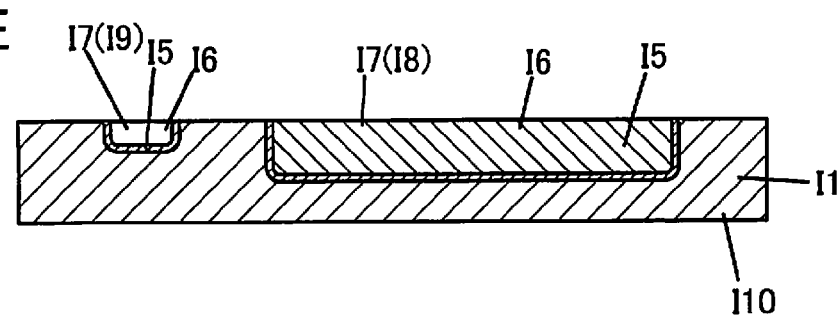
Figure 25A:
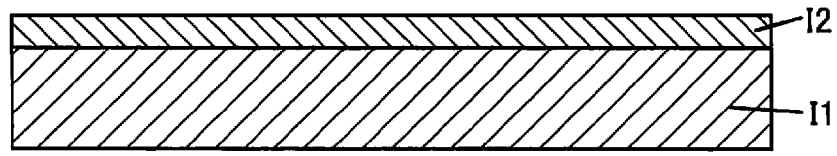
FIGS. 25A-25E show schematic cross-sectional views illustrating respective steps of another example of the method for manufacturing a circuit board of the present invention.
Figure 25B:
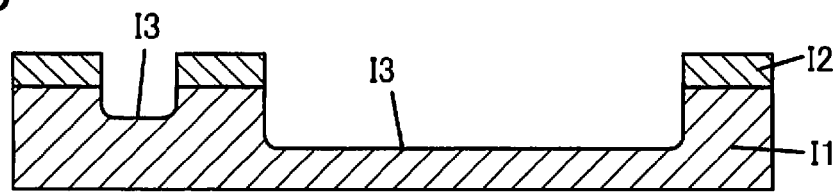
Figure 25C:
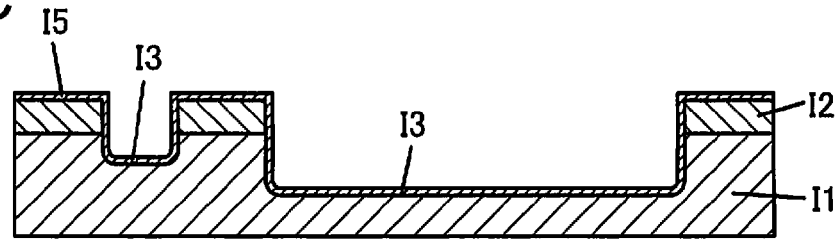
Figure 25D:
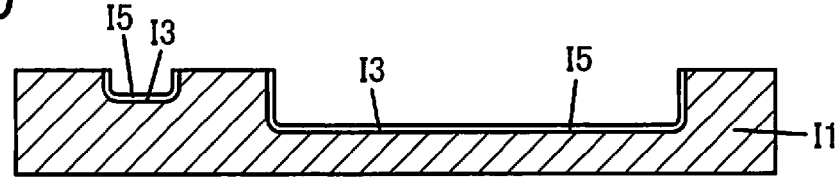
Figure 25E:
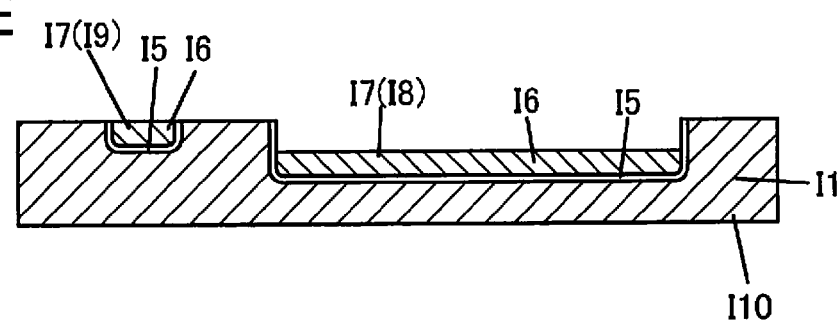

Next, an electroless plating is applied to the insulating base substrate I1 from which the resin coating film I2 has been removed. By doing so, an electroless plating film I6 is formed only in the portion in which the plating catalyst or precursor thereof I5 remains. Specifically, as shown in FIG. 24E, the electroless plating film I6 that will be the electric circuit I7 is formed in the portion in which the circuit trench I3 has been formed. The electric circuit I7 may be made of the electroless plating film I6 or a thick film formed by further applying an electroless plating (fill-up plating) to the electroless plating film I6. Specifically, for example, as shown in FIG. 24E, the electric circuit I7 made of the electroless plating film I6 is preferably formed so as to fill the entire circuit trench I3, thereby removing the level difference between the insulating base substrate I1 and the electric circuit I7, but there may be a step as shown in FIG. 25E. In this case, it is preferable that the step (height difference) between the outer surface of the insulating base substrate I1 and the surface of the electric circuit I7 (particularly, the pad section I8) is 0 to 4 µm. The pad section I8 preferably has a substantially uniform thickness. By doing so, a surface mount component (not shown) can be mounted stably without tilting. Also, as shown in FIG. 25E, it is preferable that the thickness of the line portion I9 and the thickness of the pad section I8 are substantially equal. Because the electric circuit I7 has a substantially uniform thickness, it is relatively easy to design the impedance. This step corresponds to the plating treatment step.

Through the aforementioned steps, the circuit board I10 as shown in FIG. 24E is formed. In the circuit board I10 formed in the manner described above, the electric circuit I7 is formed on the insulating base substrate I1 with high precision. Specifically, in the circuit board I10, the electric circuit I7 is formed by being embedded in the insulating base substrate I1 such that the electric circuit I7 is exposed, and the difference in thickness between the thickest portion and the thinnest portion of the pad section I8 of the electric circuit I7 is 20% or less (with a lower limit of 0%) of the thickness of the thickest portion. As described above, because the surface of the pad section I8 is substantially flat, a surface mount component can be mounted stably without tilting.

Hereinafter, each constituent element of the present embodiment will be described.

<Coating Film Forming Step>

As described above, the coating film forming step is a step in which a resin coating film I2 is formed on the surface of an insulating base substrate I1.

(Insulating Base Substrate)

The insulating base substrate I1 used in the coating film forming step is not particularly limited as long as it can be used to produce a circuit board I10. Specifically, for example, a resin base substrate containing a resin can be used.

As the resin, any resin can be used without any particular limitation as long as it can constitute any type of organic substrate that can be used to produce a circuit board I10. Specific examples include epoxy resin, acrylic resin, polycarbonate resin, polyimide resin, polyphenylene sulfide resin, polyphenylene ether resin, cyanate resin, benzoxazine resin, and bismaleimide resin.

The epoxy resin is not particularly limited as long as it can constitute any type of organic substrate that can be used to produce a circuit board I10. Specific examples include bisphenol A epoxy resin, bisphenol F epoxy resin, bisphenol S epoxy resin, aralkyl epoxy resin, phenol novolac epoxy resin, alkyl phenol novolac epoxy resin, biphenol epoxy resin, naphthalene epoxy resin, dicyclopentadiene epoxy resin, an epoxidized product of a condensate of phenol and aromatic aldehyde having a phenolic hydroxy group, triglycidyl isocyanurate, and cycloaliphatic epoxy resin. Furthermore, in order to impart flame retardancy, epoxy resin as described above, nitrogen-containing resin, silicone-containing resin or the like that has been brominated or phosphorus-modified can be used. As the epoxy resin, any of the epoxy resins can be used singly or as a combination of two or more.

In the case where the insulating base substrate I1 is made of any of the aforementioned resins, generally, a curing agent is contained to cure the resin. The curing agent is not particularly limited as long as it can be used as a curing agent. Specifically, for example, dicyandiamide, a phenolic curing agent, an anhydride curing agent, an aminotriazine novolac curing agent, cyanate resin or the like can be used. As the phenolic curing agent, for example, a novolac, aralkyl or terpene-type phenolic curing agent can be used. Furthermore, in order to impart flame retardancy, phosphorus-modified phenol resin, phosphorus-modified cyanate resin or the like can be used. As the curing agent, any of the curing agents listed above may be used singly or as a combination of two or more.

Although not particularly limited, when the circuit trench I3 is formed by laser processing, it is preferable to use a resin having a good laser light absorption coefficient in a wavelength range of 100 to 400 nm. For example, polyimide resin can be used.

Also, the insulating base substrate I1 may contain a filler. The filler is not particularly limited, and may be inorganic or organic fine particles. By inclusion of a filler, the filler will be exposed at the laser processed portion, and the adhesion between the plating and the resin can be increased by irregularities formed by the filler.

Specific examples of materials for constituting the inorganic fine particles include: high dielectric fillers such as aluminum oxide ($Al_2O_3$), magnesium oxide (MgO), boron nitride (BN), aluminum nitride (AlN), silica ($SiO_2$), barium titanate ($BaTiO_3$) and titanium oxide ($TiO_2$); magnetic fillers such as hard ferrite; inorganic flame retardants such as magnesium hydroxide ($Mg(OH)_2$), aluminum hydroxide ($Al(OH)_2$), antimony trioxide ($Sb_2O_3$), antimony pentoxide ($Sb_2O_5$), guanidine salt, zinc borate, molybdenum compound and zinc stannate; talc ($Mg_3(Si_4O_{10})(OH)_2$), barium sulfate ($BaSO_4$), calcium carbonate ($CaCO_3$), and mica. As the inorganic fine particles, any of the inorganic fine particles listed above may be used singly or as a combination of two or more. The inorganic fine particles listed above have high levels of heat conductivity, relative dielectric constant, flame retardancy, particle size distribution and flexibility in selecting the color, and therefore in order to selectively exhibit a desired function, appropriate blending and particle size design are performed, and thereby a high level of filling can be easily achieved. Although not particularly limited, it is preferable to use a filler having an average particle size that is less than or equal to the thickness of the insulating base substrate I1, more preferably, a filler having an average particle size of 0.01 to 10 µm, and most preferably 0.05 to 5 µm.

The inorganic fine particles may be surface-treated with a silane coupling agent in order to enhance the dispersibility in the insulating base substrate I1. The insulating base substrate I1 may contain a silane coupling agent in order to enhance the dispersibility of the inorganic fine particles in the insulating base substrate I1. Specific examples of the silane coupling agent include epoxy silane, mercapto silane, amino silane, vinyl silane, styryl silane, methacryloxy silane, acryloxy silane and titanate-based silane coupling agents. As the silane coupling agent, any of the silane coupling agents listed above may be used singly or as a combination of two or more.

Also, the insulating base substrate I1 may contain a dispersing agent in order to enhance the dispersibility of the inorganic fine particles in the insulating base substrate I1. Specific examples of the dispersing agent include alkyl ether, sorbitan ester, alkyl polyether amine, and polymer-based dispersing agents. As the dispersing agent, any of the dispersing agents listed above may be used singly or as a combination of two or more.

A specific example of the organic fine particles can be fine rubber particles.

The form of the insulating base substrate I1 is not particularly limited. Specifically, it may be a sheet, a film, a prepreg, a molded article having a three-dimensional shape, or the like.

The thickness of the insulating base substrate I1 is not particularly limited. Specifically, in the case where the insulating base substrate is a sheet, a film or a prepreg, the thickness is preferably, for example, about 10 to 200 µm, and more preferably 20 to 100 µm. The insulating base substrate I1 may contain inorganic fine particles such as silica particles.

(Resin Coating Film)

The resin coating film I2 is not particularly limited as long as it can be removed in the coating film removal step. Specifically, for example, it is possible to use swellable resin coating film I2 made of soluble resin that can easily dissolve in an organic solvent or an alkali solution or resin that can swell with a specific fluid (swelling fluid), which will be described below. Among them, it is particularly preferable to use the swellable resin coating film I2 because precise removal is easy. The swellable resin coating film I2 preferably has, for example, a degree of swelling in the fluid (swelling fluid) of 50% or greater. As the swellable resin coating film I2, not only a resin coating film I2 that does not substantially dissolve in the fluid (swelling fluid) and can be easily separated from the surface of the insulating base substrate I1, but also a resin coating film I2 that swells with and at least partially dissolves in the fluid (swelling fluid) and thereby easily separates from the surface of the insulating base substrate I1 and a resin coating film I2 that dissolves in the fluid (swelling fluid), and thereby easily separates from the surface of the insulating base substrate I1 can be used.

The method for forming the resin coating film I2 is not particularly limited. Specific examples include a method in which a fluid material that can form a resin coating film is applied to the surface of the insulating base substrate I1 and then dried, and a method in which a fluid material as described above is applied to a support substrate and dried to form a resin coating film I2 and the resin coating film I2 is transferred to the surface of the insulating base substrate I1. The method for applying the fluid material is not particularly limited. Specifically, for example, a conventionally known spin coating method, a bar coater method or the like can be used.

The resin coating film I2 preferably has a thickness of 10 µm or less and more preferably 5 µm or less. On the other hand, the resin coating film I2 preferably has a thickness of 0.1 µm or greater, and more preferably 1 µm or greater. In the case where the resin coating film I2 is excessively thick, the precision of a circuit trench formed by laser processing or machining in the circuit trench forming step is likely to be low. In the case where the resin coating film I2 is excessively thin, it tends to be difficult to form a resin coating film I2 having a uniform thickness.

Next is a description of a swellable resin coating film I2 suitable as the resin coating film I2 as an example As the swellable resin coating film I2, a resin coating film I2 having a degree of swelling in a swelling fluid of 50% or greater can be preferably used. Furthermore, it is more preferable to use a resin coating film I2 having a degree of swelling in a swelling fluid of 100% or greater. In the case where the degree of swelling is excessively low, the swellable resin coating film I2 is likely to be less separable in the coating film removal step.

The method for forming the swellable resin coating film I2 is not particularly limited, and the same method as the method for forming the resin coating film I2 described above can be used. Specific examples include a method in which a fluid material that can form a swellable resin coating film I2 is applied to the surface of the insulating base substrate I1 and then dried, and a method in which a fluid material as described above is applied to a support substrate and dried to form a swellable resin coating film I2 and the swellable resin coating film I2 is transferred to the surface of the insulating base substrate I1.

As the fluid material that can form the swellable resin coating film I2, for example, an elastomer suspension, emulsion or the like can be used. Specific examples of the elastomer include diene-based elastomers such as styrene-butadiene copolymers, acryl-based elastomers such as acrylic acid ester copolymers, and polyester-based elastomers. With such an elastomer, a swellable resin coating film I2 having a desired degree of swelling can be easily formed by adjusting the degree of crosslinking, the degree of gelation or the like of the elastomer resin particles dispersed as a suspension or emulsion.

As the swellable resin coating film I2, in particular, it is preferable to use a coating film whose degree of swelling varies depending on the pH of the swelling fluid. In the case where such a coating film is used, by using different fluid conditions in the catalyst application step and in the coating film removal step, the swellable resin coating film I2 can maintain strong adhesion to the insulating base substrate I1 at the pH used in catalyst application step, and the swellable resin coating film I2 can be easily separated at the pH used in the coating film removal step.

More specifically, for example, in the case where the catalyst application step includes a step of treatment in an acidic plating catalyst colloidal solution (acidic colloidal catalyst metal solution) having a pH in the range of 1 to 3, and the coating film removal step includes a step of swelling the swellable resin coating film I2 in an alkaline solution having a pH in the range of 12 to 14, the swellable resin coating film I2 is preferably a resin coating film I2 that has a degree of swelling in the acidic plating catalyst colloidal solution of 60% or less, and more preferably 40% or less, and preferably has a degree of swelling in the alkaline solution of 50% or greater, more preferably 100% or greater, and even more preferably 500% or greater.

Examples of the swellable resin coating film I2 include a sheet made of an elastomer having a specific amount of carboxyl groups, a sheet obtained by entirely curing an alkali-developable photocurable resist used as a dry film resist (hereinafter also referred to as "DFR") for patterning a printed circuit board, a thermosetting sheet and an alkali-developable sheet.

Specific examples of the elastomer having a carboxyl group include elastomers having a carboxyl group within the molecule by inclusion of a monomer unit having the carboxyl group as a copolymerizable component: diene-based elastomers, such as styrene-butadiene copolymers and acryl-based elastomers such as acrylic acid ester copolymers, and polyester-based elastomers. With such an elastomer, a swellable resin coating film I2 having a desired alkali degree of swelling can be formed by adjusting the acid equivalent, the degree of crosslinking, the degree of gelation or the like of the elastomer dispersed as a suspension or emulsion. The carboxyl group in the elastomer has the effect of separating the swellable resin coating film I2 from the surface of the insulating base substrate I1 by swelling the swellable resin coating film I2 with an aqueous alkaline solution. As used herein, "acid equivalent" refers to a polymer weight per equivalent of carboxyl group.

Specific examples of the monomer unit having a carboxyl group include (meth)acrylic acid, fumaric acid, cinnamic acid, crotonic acid, itaconic acid and maleic anhydride.

The carboxyl group content in such an elastomer having a carboxyl group is preferably 100 to 2,000 acid equivalents, and more preferably 100 to 800 acid equivalents. In the case where the acid equivalent is excessively small, it is likely that compatibility with a solvent or other compositions is deteriorated and resistance to a pre-treatment fluid for plating is deteriorated. In the case where the acid equivalent is excessively large, separability in an aqueous alkaline solution is likely to deteriorate.

The molecular weight of the elastomer is preferably 10,000 to 1,000,000, and more preferably 20,000 to 60,000. In the case where the molecular weight of the elastomer is excessively large, separability is likely to deteriorate. In the case where the molecular weight of the elastomer is excessively small, viscosity is likely to deteriorate, as a result of which it will be difficult to maintain a uniform thickness of the swellable resin coating film I2, and the resistance to the pre-treatment fluid for plating is likely to deteriorate.

Also, as DFR, it is possible to use, for example, a sheet made of a photocurable resin composition containing a photopolymerization initiator and composed of a resin component such as acrylic resin, epoxy resin, styrene resin, phenol resin or urethane resin, containing a specific amount of carboxyl groups. Specific examples of the DFR include sheets obtained by entirely curing a dry film of a photopolymerizable resin composition as disclosed in JP 2000-231190A, JP 2001-201851A and JP H11-212262A, and commercially available alkali-developable DFR such as UFG series manufactured by Asahi Kasei Corporation.

Furthermore, other examples of the resin coating film I2 include resin composed mainly of rosin and containing a carboxyl group (for example, NAZDAR 229 manufactured by Yoshikawa Chemical Co., Ltd.) and resin composed mainly of phenol and containing a carboxyl group (for example, 104F manufactured by LEKTRACHEM Ltd.).

The swellable resin coating film I2 can be easily formed by a method in which a resin suspension or emulsion is applied to the surface of the insulating base substrate I1 by a conventionally known application means such as a spin coating method or bar coater method and dried, or a method in which DFR formed on a support base substrate is attached to the surface of the insulating base substrate I1 by using a vacuum laminator or the like and entirely cured.

In addition to those described above, examples of the resin coating film I2 are as follows. For example, resist materials for constituting the resin coating film I2 include as follows.

Examples of properties required of resist materials for constituting the resin coating film I2 include (1) strong resistance to a fluid (a chemical for forming plating nuclei) for immersion of the insulating base substrate I1 on which the resin coating film I2 has been formed in a catalyst application step, which will be described below, (2) ease of removal of the resin coating film I2 (resist) in a coating film removal step, which will be described below, for example, a step of immersing in an alkali the insulating base substrate I1 on which the resin coating film I2 has been formed, (3) high film formability, (4) ease of dry film (DFR) formation, (5) high storage stability, and like properties.

As the chemical for forming plating nuclei, in the case of an acidic colloidal Pd—Sn catalyst system, which will be described below, examples of the chemical for forming plating nuclei are all aqueous acidic (pH 1 to 2) solutions. In the case of an alkaline Pd ion catalyst system, the catalyst-added activator is weakly alkaline (pH 8 to 12), and others are acidic. Accordingly, for resistance to the chemical for forming plating nuclei, resistance that allows to withstand pH 1 to 11 and preferably pH 1 to 12 is needed. Note that, the phrase "allows to withstand" means that when a sample on which a resist film has been formed is immersed in the chemical, swelling and dissolution of the resist are sufficiently suppressed, thus enabling it to serve as a resist. Generally, the immersion temperature is room temperature to 60° C., the immersion time is 1 to 10 minutes, and the resist film thickness is about 1 to 10 µm, but the present invention is not limited to these ranges.

As an alkali separation chemical for use in the coating film removal step, as will be described below, for example, an aqueous NaOH solution and an aqueous sodium carbonate solution are generally used. It is desirable that the chemical has a pH of 11 to 14 and preferably a pH of 12 to 14, and the resist film can be easily removed therewith. Immersion and spraying treatments are generally performed at an aqueous NaOH solution concentration of about 1 to 10%, the treatment temperature of room temperature to 50° C., and the treatment time of 1 to 10 minutes, but the present invention is not limited to these ranges.

Since the resist is formed on an insulating material, film formability is also important. Uniform film formation is necessary that does not cause repelling or the like. Dry-film formation is carried out for simplification of the production process, reduction of material loss, and the like, but film flexibility is necessary to secure handleability. A dry-filmed resist is attached to an insulating material by a laminator (roll, vacuum). The attachment temperature is room temperature to 160° C., and the pressure and the time are suitably selected. Accordingly, tackiness is required at the time of attachment. For this reason, the dry-filmed resist is generally processed to have a three-layer structure, being sandwiched between a carrier film and a cover film while this also serves to prevent grime adhesion, but the present invention is not limited thereto.

Storage stability refers most preferably to storage stability at room temperature, but storage stability under refrigeration and freezing is also necessary. Accordingly, it is necessary to process the dry film so as not to undergo compositional separation or cracking due to impaired flexibility under low temperatures.

It is possible that the resin composition of the resist material contains a main resin (binder resin) as its essential component and that at least one of oligomers, monomers, fillers, and other additives is added thereto.

The resin coating film I2 may be made of polymer resin obtained by polymerizing (a) at least one carboxylic acid or acid anhydride monomer having at least one polymerizable unsaturated group within the molecule and (b) at least one monomer polymerizable with the monomer (a), or a resin composition containing the polymer resin.

It is possible that the resin composition contains as a main resin the aforementioned polymer resin that serves as an essential component and that at least one of oligomers, monomers, fillers, and other additives is added thereto. The main resin is preferably a linear polymer having thermoplastic properties. In order to control fluidity, crystallinity, and like properties, grafting may be performed for branching. The molecular weight thereof is a number average molecular weight of about 1,000 to 500,000, and preferably 5,000 to 50,000. An excessively small molecular weight is likely to result in impaired film flexibility and impaired resistance to the chemical for forming plating nuclei (acid resistance). An excessively large molecular weight is likely to result in deteriorated alkali separability and deteriorated attachability in the case of processing into a dry film. Crosslinking points may be introduced for enhancement of resistance to the chemical for forming plating nuclei as well as for thermal deformation suppression at the time of laser processing and fluidity control.

Regarding the composition of the main resin, the main resin can be obtained by polymerizing (a) a carboxylic acid or acid anhydride monomer having at least one polymerizable unsaturated group within the molecule and (b) a monomer polymerizable with the monomer (a). Examples of known techniques include those disclosed in JP H7-281437A, JP 2000-231190A, and JP 2001-201851A. Examples of the monomer (a) include (meth)acrylic acid, fumaric acid, cinnamic acid, crotonic acid, itaconic acid, maleic anhydride, maleic acid half ester, butyl acrylate, and the like, and such monomers may be used singly or as a combination of two or more. An example of the monomer (b) is generally a monomer that is non-acidic and has one polymerizable unsaturated group within the molecule, but the monomer (b) is not limited thereto. The monomer (b) is selected so as to maintain various properties such as resistance in a plating step and flexibility of a cured film. Specific examples include methyl(meth)acrylate, ethyl (meth)acrylate, iso-propyl(meth)acrylate, n-butyl (meth)acrylate, sec-butyl(meth)acrylate, tert -butyl(meth) acrylate, 2-hydroxylethyl(meth)acrylate, 2-hydroxylpropyl (meth)acrylate, and the like. Other examples include vinyl alcohol esters such as vinyl acetate, (meth)acrylonitrile, styrene or polymerizable styrene derivatives, and the like. Also, the monomer can be obtained by polymerization of only the aforementioned carboxylic acid or acid anhydride having one polymerizable unsaturated group within the molecule. Furthermore, in order to allow a three-dimensional crosslink, it is possible to select a monomer having multiple unsaturated groups as the monomer for use in the polymer and to introduce a reactive functional group such as an epoxy group, a hydroxyl group, an amino group, an amide group, a vinyl group, or the like into the molecular framework. In the case where a carboxyl group is contained in the resin, it is sufficient that the amount of carboxyl group contained in the resin is 100 to 2,000 acid equivalents, and preferably 100 to 800 acid equivalents. Here, the term "acid equivalent" refers to the weight of a polymer having 1 equivalent of a carboxyl group therein. In the case where the acid equivalent is excessively low, it is likely that compatibility with a solvent or other compositions is deteriorated or resistance to a pre-treatment fluid for plating is deteriorated. In the case where the acid equivalent is excessively high, separability is likely to deteriorate. The composition ratio of the monomer (a) is 5 to 70 wt %.

Any monomer and oligomer may be used as long as they are resistant to the chemical for forming plating nuclei and easily removable with an alkali. It can be envisaged that they are used as tackifiers in a manner similar to a plasticizer in order to enhance attachment of the dry film (DFR). Moreover, a cross-linking agent may be added to increase various kinds of resistance. Specific examples include methyl(meth)acrylate, ethyl(meth)acrylate, iso-propyl (meth)acrylate, n-butyl (meth)acrylate, sec-butyl(meth)acrylate, tert-butyl(meth) acrylate, 2-hydroxylethyl(meth)acrylate, 2-hydroxylpropyl (meth)acrylate, and the like. Other examples include vinyl alcohol esters such as vinyl acetate, (meth)acrylonitrile, styrene or polymerizable styrene derivatives, and the like. Also, the monomer (b) can be obtained by polymerization of only the aforementioned carboxylic acid or acid anhydride having one polymerizable unsaturated group within the molecule. Moreover, a polyfunctional unsaturated compound may also be contained. Any of the aforementioned monomers or oligomers obtained by reacting the monomers may be used. In addition to the aforementioned monomers, it is also possible to contain two or more other photopolymerizable monomers. Examples of such monomers include 1,6-hexanediol di(meth)acrylate, 1,4-cyclohexanediol di(meth)acrylate, polypropyleneglycol di(meth)acrylate, polyethyleneglycol di(meth)acrylate, polyoxyethylenepolyoxypropyleneglycol di(meth)acrylate, and like polyoxyalkyleneglycol di(meth) acrylates, 2-di(p-hydroxyphenyl)propane di(meth)acrylate, glycerol tri(meth)acrylate, dipentaerythritol penta(meth) acrylate, trimethylolpropane triglycidyl ether tri(meth)acrylate, bisphenol A diglycidyl ether tri(meth)acrylate, 2,2-bis (4-methacryloxypentaethoxyphenyl)propane, polyfunctional(meth)acrylates containing a urethane group, and the like. Any of the aforementioned monomers or oligomers obtained by reacting the monomers may be used.

Furthermore, a filler may be contained. The filler is not particularly limited, and specific examples include silica, aluminum hydroxide, magnesium hydroxide, calcium carbonate, clay, kaolin, titanium oxide, barium sulfate, alumina, zinc oxide, talc, mica, glass, potassium titanate, wollastonite, magnesium sulfate, aluminum borate, organic fillers, and the like. Since the resist is thin, with its thickness generally being 1 to 10 µm, it is preferable that the size of the filler is also small. Although it is preferable to use a filler that has a small average particle size, and from which coarse particles are taken away, it is possible to crush the particles when dispersing or remove coarse particles by filtration.

Examples of other additives include photopolymerizable resins (photopolymerization initiators), polymerization inhibitors, colorants (dyes, pigments, color producing pigments), thermal-polymerization initiators, crosslinking agents such as epoxy and urethane, and the like.

In the printed board processing process of the present invention, for example, there may be a case where laser processing is used. In the case of laser processing, it is necessary to impart laser ablation characteristics to the resist material. Regarding a laser processing machine, for example, a carbon dioxide laser, an excimer laser, a UV-YAG laser, or the like is selected. These laser processing machines have various specific wavelengths, and it is thus possible to enhance productivity by selecting a material that exhibits a large absorption coefficient at such a wavelength. Among them, a UV-YAG laser is suitable for microprocessing, and since the laser wavelength has third-order harmonics at 355 nm and forth-order harmonics at 266 nm, it is desirable that the resist material exhibits a large absorption coefficient at these wavelengths. In contrast, there may be a case where a material that exhibits a somewhat low absorption coefficient is preferable. Specifically, for example, when a resin coating film I2 that exhibits a low UV absorption coefficient is used, UV light passes through the resin coating film I2, thus making it possible to concentrate energy on processing on the insulating base substrate I1 that serves as a base. That is, the advantage is different according to the laser light absorption coefficient, and it is thus preferable to use a resin coating film I2 that has a laser light absorption coefficient adjusted according to the situation.

<Circuit Trench Forming Step>

The circuit trench forming step is a step of forming circuit trenches I3 in the insulating base substrate I1.

A method for forming the circuit trenches I3 is not particularly limited. A specific example may be a method that performs, from the outer surface side of the resin coating film I2, laser processing, cutting work such as dicing, and machining work such as embossing on the insulating base substrate I1 on which the resin coating film I2 has been formed, in order to form circuit trenches I3 having a desired shape and depth, or a like method. In the case of forming highly precise fine circuits, it is preferable to use laser processing. According to laser processing, changing a laser output or the like allows liberal adjustment of the cutting depth or the like, thus enabling the circuit trenches I3 to be formed so as to have a flat bottom, and the outer surface of the insulating base substrate I1 and the bottoms of the circuit trenches I3 to be in parallel with each other. For embossing, it is preferable to use embossing with a fine resin die as used in, for example, the field of nano-imprinting.

As the circuit trenches I3, in addition to a circuit trench I3 for forming a line section I9 in a fine line form and a circuit trench I3 for forming a pad section I8 on which a surface mount component is to be mounted, a through-hole (not shown) for forming a via-hole or the like may be formed.

By this step, the shape, the depth, the position, and the like of the circuit trenches I3 are defined.

The width of the circuit trenches I3 formed in the aforementioned circuit trench forming step is not particularly limited. In the case where laser processing is used, a fine circuit such as one having a line width of 20 µm or less (the line section I9) can also be easily formed. In the case where the level difference between the electric circuits I7 and the insulating base substrate I1 is removed by fill-up plating, the depth of the circuit trenches I3 is the same as the depth of the electric circuits I7 formed in this embodiment.

<Catalyst Application Step>

The catalyst application step is a step of applying a plating catalyst or precursor thereof I5 to the surface of the circuit trenches I3 and the surface of the resin coating film I2. At this time, in the case where a through-hole (not shown) is formed, the plating catalyst or precursor thereof I5 is applied also to the inner wall surface of the through-hole.

The plating catalyst or precursor thereof I5 is a catalyst applied in order to form an electroless plating film I6 only on a portion where the formation of the electroless plating film I6 by electroless plating in the plating treatment step is desired. As the plating catalyst, catalysts known for use in electroless plating can be used without particular limitations. Also, it is possible that the precursor I5 of the plating catalyst is applied in advance and the plating catalyst is generated after removing the resin coating film I2. Specific examples of the plating catalyst include metal palladium (Pd), platinum (Pt), silver (Ag), and the like, and precursors and the like that generate such catalysts.

An example of a method for applying the plating catalyst or precursor thereof I5 may be a method that involves treatment under acidic conditions of pH 1 to 3 with an acidic colloidal Pd—Sn solution and then treatment with an acid solution, or a like method. A specific example may be as follows.

First, the surface of the insulating base substrate I1 in which the circuit trenches I3 have been formed is washed for a specific period of time with a warm solution of a surfactant (cleaner/conditioner) to remove oil or the like adhering to the surface. Next, if necessary, soft etching treatment is performed with a sodium persulfate-sulfuric acid-based soft etching agent. Further, acid washing is performed in an acidic solution, such as an aqueous sulfuric acid solution or an aqueous hydrochloric acid solution, having a pH of 1 to 2. Next, pre-dip treatment for allowing chloride ions to be adsorbed on the surface of the insulating base substrate I1 is performed by immersing the substrate in a pre-dip fluid containing an aqueous stannous chloride solution as a principal component in a concentration of about 0.1%. Thereafter, the substrate is further immersed in an acidic colloidal plating catalyst solution, such as an acidic Pd—Sn colloid, having a pH of 1 to 3 that contains stannous chloride and palladium chloride to cause aggregation and adsorption of Pd and Sn. Then, a redox reaction is caused between adsorbed stannous chloride and palladium chloride ($SnCl_2 + PdCl_2 \rightarrow SnCl_4 + Pd\downarrow$). Thereby, metal palladium, which is a plating catalyst, deposits.

As the acidic colloidal plating catalyst solution, a known acidic colloidal Pd—Sn catalyst solution or the like can be used, and a commercially available plating process using an acidic colloidal plating catalyst solution may be used. Such a process is, for example, systematized and commercially distributed by Rohm and Haas Company.

Such catalyst applying treatment enables application of the plating catalyst or precursor thereof I5 to be applied to the surface of the circuit trenches I3 and the surface of the resin coating film I2.

<Coating Film Removal Step>

The coating film removal step is a step of removing the resin coating film I2 from the insulating base substrate I1 that has undergone the catalyst application step.

The method for removing the resin coating film I2 is not particularly limited. Specific examples include a method in which the resin coating film I2 is swollen with a specific solution (a swelling fluid) and then the resin coating film I2 is separated from the insulating base substrate I1, a method in which the resin coating film I2 is swollen with and further partially dissolved in a specific solution (a swelling fluid), and then the resin coating film I2 is separated from the insulating base substrate I1, a method in which the resin coating film I2 is dissolved in a specific solution (a swelling fluid) and removed, and the like. The swelling fluid is not particularly limited as long as it can swell the resin coating film I2. The aforementioned swelling or dissolution is carried out by, for example, immersing the insulating base substrate I1 that has been coated with the resin coating film I2 in the swelling fluid for a specific period of time. Removal efficiency may be enhanced by ultrasonic irradiation during immersion. When the coating film is separated after being swollen, the coating film may be peeled off with light force.

A case where swellable resin coating film I2 is used as the resin coating film I2 will now be described.

Any fluid (swelling fluid) for swelling the swellable resin coating film I2 can be used without any particular limitation as long as it can swell or dissolve the swellable resin coating film I2 without substantially decomposing or dissolving the insulating base substrate I1 as well as the plating catalyst or precursor thereof I5. Also, it is preferable to use a fluid that can swell the swellable resin coating film I2 to such an extent that the coating film can be easily separated. Such a swelling fluid is suitably selected according to the kind and the thickness of the swellable resin coating film I2. Specifically, for example, in the case where the swellable resin coating film I2 is composed of an elastomer such as a diene-based elastomer, an acryl-based elastomer, or a polyester-based elastomer, it is preferable to use, for example, an aqueous alkaline solution, such as an aqueous sodium hydroxide solution, having a concentration of about 1 to 10%.

In the case where a plating process is used in which treatment is performed under acidic conditions as described above for the catalyst application step, it is preferable that the swellable resin coating film I2 is formed from, for example, an elastomer such as a diene-based elastomer, an acryl-based elastomer, or a polyester-based elastomer that has a degree of swelling of less than 50% under acidic conditions and a degree of swelling of 50% or greater under alkaline conditions. Such a swellable resin coating film I2 easily swells and separates with an aqueous alkaline solution having a pH of 12 to 14, for example, an aqueous sodium hydroxide solution having a concentration of about 1 to 10%. In order to enhance separability, ultrasonic irradiation may be performed during immersion. The swellable resin coating film may be peeled off with light force to achieve separation if necessary.

As the method for swelling the swellable resin coating film I2, a method can be used in which the insulating base substrate I1 that has been coated with the swellable resin coating film I2 is immersed in the swelling fluid for a specific period of time. In order to enhance separability, it is particularly preferable to perform ultrasonic irradiation during immersion. If the swellable resin coating film is not separated by simply being swollen, the resin coating film may be peeled off with light force if necessary.

<Plating Treatment Step>

The plating treatment step is a step in which electroless plating treatment is performed on the insulating base substrate I1 from which the resin coating film I2 has been removed.

A usable method of the electroless plating treatment may be a method in which the insulating base substrate I1 to which the plating catalyst or precursor thereof I5 has been partially applied is immersed in an electroless plating fluid, and an electroless plating film (a plating layer) is deposited only on the portion to which the plating catalyst or precursor thereof I5 has been applied.

Examples of metals for use in electroless plating include copper (Cu), nickel (Ni), cobalt (Co), aluminum (Al), and the like. Among these, plating containing Cu as a principal component is preferable in terms of excellent conductivity. In the case where Ni is contained, such plating is preferable in terms of excellent corrosion resistance and adhesion to solder.

The thickness of the electroless plating film I6 is not particularly limited. Specifically, it is preferably, for example, about 0.1 to 10 μm and more preferably about 1 to 5 μm. In particular, creating the circuit trenches I3 so as to have a large depth enables plating having a large thickness and metal wiring having a large cross-sectional area to be easily formed. In this case, such a thickness is preferable in terms of enhancement of the strength of metal wiring.

Due to the plating treatment step, the electroless plating film I6 deposits only on the portion on the surface of the insulating base substrate I1 where the plating catalyst or precursor thereof I5 remains. Accordingly, a conductive layer can be precisely formed only on the portion where formation of the circuit trenches I3 is desired, while deposition of the electroless plating film I6 on the portion where the circuit trenches I3 are not formed can be suppressed. Accordingly, even in the case where a plurality of fine circuits having a narrow line width with a small pitch interval are to be formed, unnecessary plating film does not remain between adjacent circuits. Therefore, the occurrence of short circuiting and migration can be suppressed.

<Desmear Treatment Step>

In the method for manufacturing a circuit board according to the present invention, after performing the plating treatment step, in particular, before performing or after performing fill-up plating, a desmear treatment step in which desmear treatment is performed may additionally be included. Performing desmear treatment enables removal of unnecessary resin adhering to the electroless plating film I6. Moreover, in the case of a multi-layer circuit board furnished with a resulting circuit board I10, it is possible that the portion of the surface of the insulating base substrate I1 where the electroless plating film I6 is not formed is roughened so as to enhance adhesion with the upper layer of the circuit board I10 or the like. Moreover, desmear treatment may be performed on the via-hole bottom. By doing so, unnecessary resin adhering to the via-hole bottom can be removed. The desmear treatment is not particularly limited, and known desmear treatment can be used. A specific example may be a treatment that involves immersion in a permanganate solution or the like.

Through the aforementioned steps, the circuit board I10 as shown in FIG. 24E is formed.

[Embodiment 6]

Moreover, the present invention relates to a circuit board for use in electric equipment such as portable information terminal devices, e.g., mobile phones; computers and peripherals therefor; various types of home information appliances; and the like.

Figure 28A:
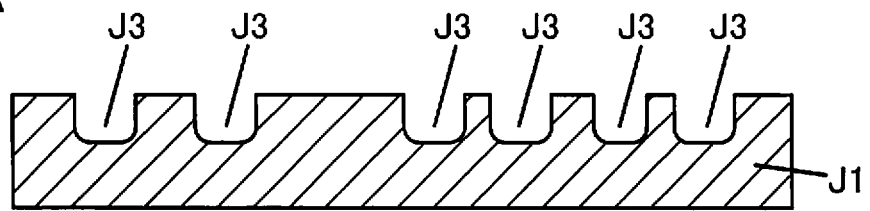
FIGS. 28A-28D show schematic cross-sectional views of a conventional production process.
Figure 28B:
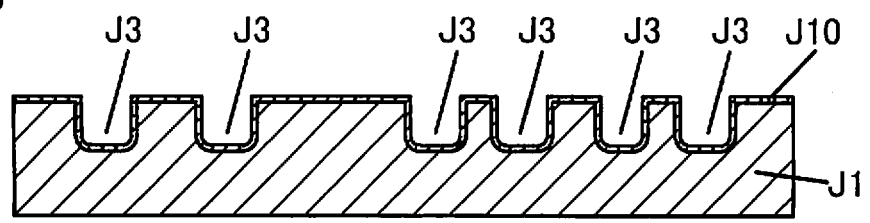
Figure 28C:
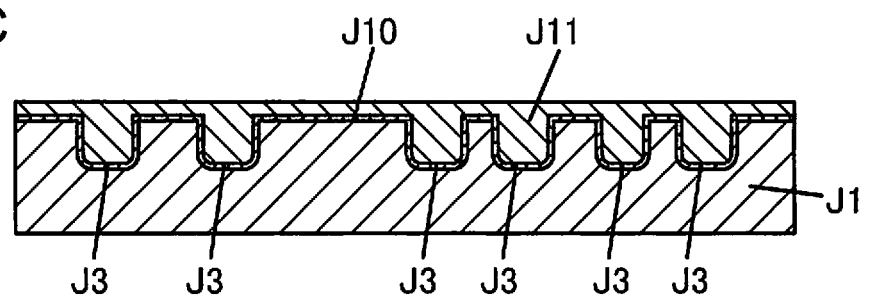
Figure 28D:
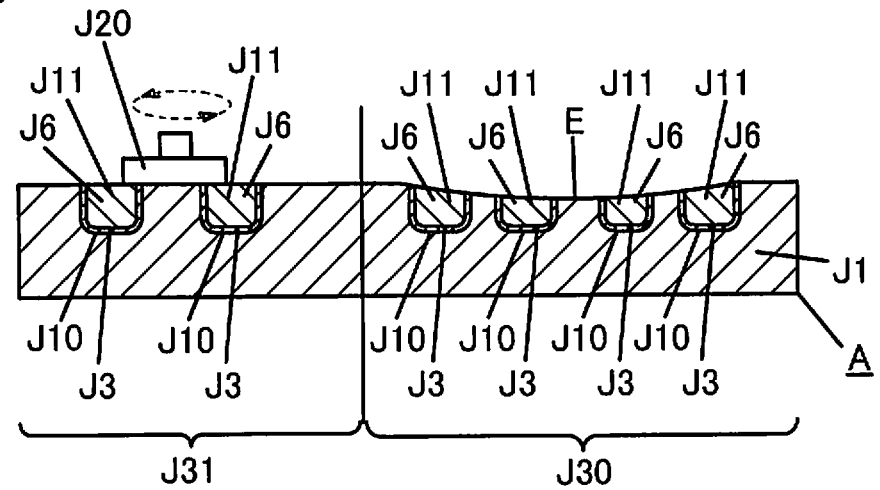

Previously, a method for forming wiring using chemical mechanical polishing (CMP) was proposed (for example, see JP 2000-49162A). In this method, first, as shown in FIG. 28A, circuit trenches J3 are formed in the surface of an insulating base substrate J1 by laser processing or the like. Next, as shown in FIG. 28B, an electroless plating layer J10 is formed over the entire surface of the insulating base substrate J1 in which the circuit trenches J3 have been formed (including the side surface and the bottom surface of the circuit trenches J3). This electroless plating layer J10 can be formed by electroless plating of a thin film of a metal such as copper. Next, as shown in FIG. 28C, an electrolytic plating layer J11 is formed with a metal such as copper over the surface of the electroless plating layer J10. The electrolytic plating layer J11 is formed so as to fill the circuit trenches J3 and coat the entire surface of the electroless plating layer J10. Thereafter, the unnecessary portion of the electrolytic plating layer J11 is removed such that the surface of the insulating base substrate J1, the surface of the electrolytic plating layer J11 filling the circuit trenches J3, and the upper end surface of the electroless plating layer J10 adhering to the side surface of the circuit trenches J3 are flush with each other. Here, a CMP method with which the electrolytic plating layer J11 is ground and removed by a polishing machine J20 is employed. In this manner, a circuit board A having electric circuits (wiring) J6 composed of the electrolytic plating layer J11 and the electroless plating layer J10 filling the circuit trenches J3 can be formed.

However, a circuit board formed as described above is problematic in that erosion E occurs in a portion where the electric circuits J6 concentrate. The erosion E refers to a portion where the surfaces of the electric circuits J6 and the surfaces of the surrounding insulating base substrate J1 are shaved off so as to appear depressed in a dish form or a like form. It seems that this erosion occurs due to the difference in hardness, the difference in resistance to the polishing machine J20 or a polishing fluid, or the like between the insulating base substrate J1 and the electrolytic plating layer J11. The circuit board A to which such erosion E has occurred is problematic as follows. First, in a build-up method or the like, in the case where an insulating material such as a prepreg is placed on top of the surface of the circuit board A, and then molded by application of heat and pressure to form an insulating layer, a pressure decrease in the erosion E becomes large, and a laminate thin-spot failure (a portion not filled with resin) is likely to occur. Also, depressions may be created on the surface of the portions of the insulating layer corresponding to the erosion, and the flatness of the surface of the insulating layer is deteriorated. Accordingly, it is likely that the depth of laser processing varies in the case where circuits are formed on the surface of the insulating layer, resulting in a variation in the conductor cross-sectional area (circuit cross-sectional area) and affecting the resistance values of the electric circuits J6. Moreover, since the thickness of the insulating layer is different between a portion where the electric circuits J6 are concentrated (high-density portion J30) and a portion where not concentrated (low-density portion J31), impedance varies between the low-density portion and the high-density portion of the electric circuits J6, thus not providing room for circuit design.

Meanwhile, a circuit board as described above has been formed using printing foil. In this case, prepreg resin flows unevenly in the concentrated portion (high-density portion J30) and the unconcentrated portion (low-density portion J31) of the electric circuits J6 when electric circuits are printed, and thus the thickness of the insulating layer in the concentrated portion (high-density portion J30) and that in the unconcentrated portion (low-density portion J31) of the electric circuits J6 are different, thus failing to solve the aforementioned problem.

The present invention was accomplished in view of the aforementioned point, and an object is to provide a circuit board with which a lamination thin spot is not created, that is unlikely to result in a variation in the cross-sectional areas of electric circuits or to affect a resistance value, and that is unlikely to result in a variation in impedance between the low-density portion and the high-density portion of electric circuits, thus providing sufficient room for circuit design.

Embodiment 6 of the present invention encompasses the following.

6-1. A circuit board having a plurality of circuit trenches in an insulating base substrate, each circuit trench being filled with a plating layer that forms an electric circuit, wherein a high-density portion where the electric circuits are densely formed and a low-density portion where the electric circuits are sparsely formed are provided, and each surface of the insulating base substrate and the electric circuit in the high-density portion and each surface of the insulating base substrate and the electric circuit in the low-density portion are formed flush with each other.

6-2. The circuit board according to 6-1 having a plurality of circuit trenches in an insulating base substrate, each circuit trench being filled with a plating layer that forms an electric circuit, wherein a high-density portion where the electric circuits are densely formed and a low-density portion where the electric circuits are sparsely formed are provided, and the distance from the surface on the side opposite the surface of the insulating base substrate in which the circuit trenches are formed to the bottom of the circuit trenches in the high-density portion and the distance from the surface on the side opposite the surface of the insulating base substrate in which the circuit trenches are formed to the bottom of the circuit trenches in the low-density portion are formed so as to be the same.

6-3. The circuit board having a plurality of circuit trenches in an insulating base substrate, each circuit trench being filled with a plating layer that forms an electric circuit, according to 6-1, wherein a high-density portion where the electric circuits are densely formed and a low-density portion where the electric circuits are sparsely formed are provided, and a conductor thickness of the electric circuits in the high-density portion and a conductor thickness of the electric circuits in the low-density portion are formed so as to be the same.

In the present invention, since the surface of the insulating base substrate and the surface of each electric circuit in the high-density portion and the surface of the insulating base substrate and the surface of each electric circuit in the low-density portion are formed flush with each other, in the case where an insulating material such as prepreg is placed over the surface of the circuit board, and then molded by application of heat and pressure is performed to form an insulating layer, it is possible not to allow a pressure drop caused by erosion to occur, and it is possible not to allow a laminate thin-spot failure to occur. Also, it is possible not to create a variation in the depth of laser processing in the case where circuits are formed on the surface of the insulating layer, and it is possible not to create a variation in conductor cross-sectional areas (the cross-sectional areas of electric circuits) or to affect the resistance values of the electric circuits. Moreover, since the thickness of the insulating layer is uniform throughout the low-density portion and the high-density portion of the electric circuits, impedance does not vary in the low-density portion and the high-density portion of the electric circuits, thus providing room for circuit design.

Also, since the distance from the surface on the side opposite the surface of the insulating base substrate in which the circuit trenches are formed to the bottom of the circuit trenches in the high-density portion and the distance from the surface on the side opposite the surface of the insulating base substrate in which the circuit trenches are formed to the bottom of the circuit trenches in the low-density portion are formed so as to be the same, and the conductor thickness of the electric circuits in the high-density portion and the conductor thickness of the electric circuits in the low-density portion are formed so as to be the same, the effect of the present invention can be securely attained.

Below, embodiments of carrying out the present invention will now be described.

Figure 27A:
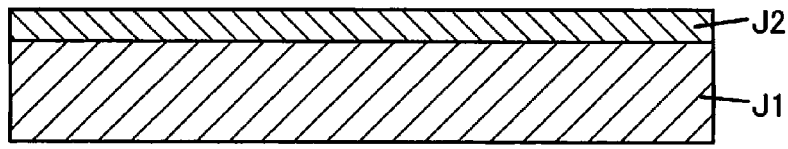
FIGS. 27A-27E show schematic cross-sectional views of a production process of the present invention.
Figure 27B:
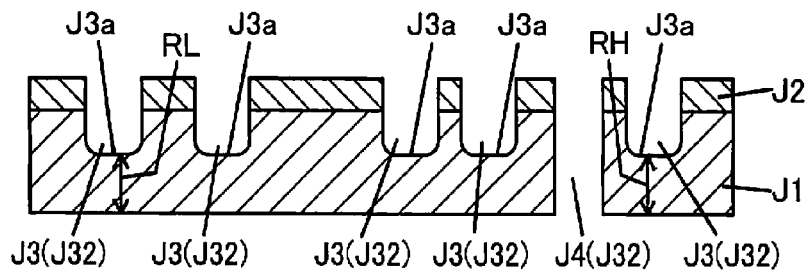
Figure 27C:
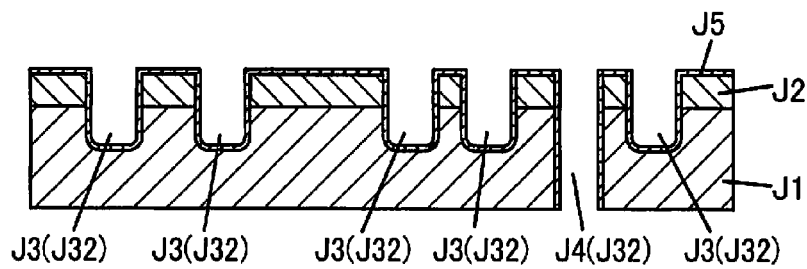
Figure 27D:
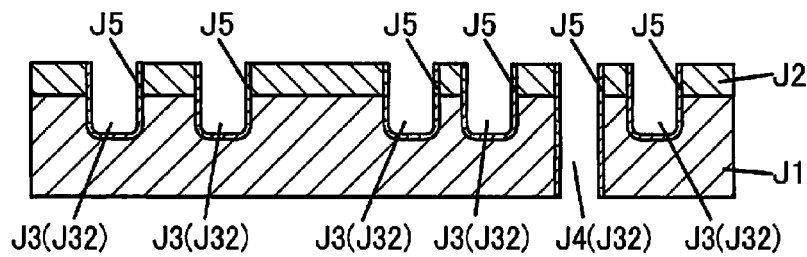
Figure 27E:
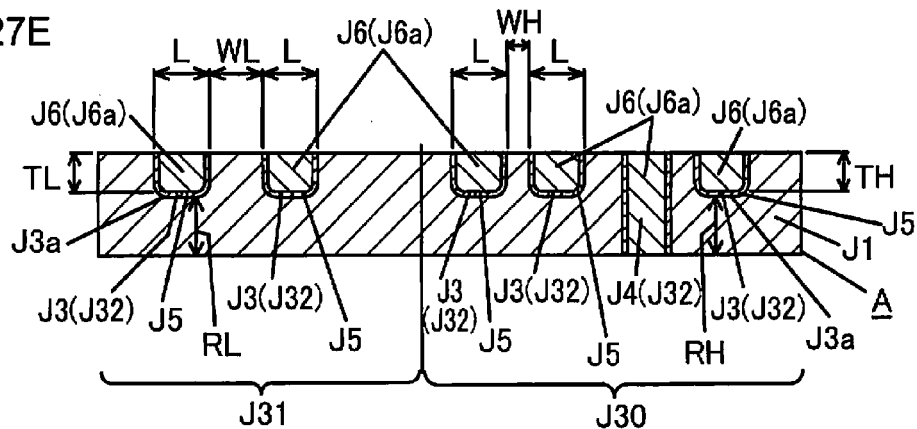

FIG. 27E shows a circuit board A of the present invention. The circuit board A has a plurality of circuit trenches J3 and a through-hole J4 in an insulating base substrate J1, and also has a plurality of electric circuits J6 in which each circuit trench J3 and the through-hole J4 are filled with electroless plating. The surface of the electric circuits J6 is exposed on one or both surfaces of the insulating base substrate J1. It is preferable that the width sizes (line widths) of all electric circuits J6 are the same, but the present invention is not limited to such a configuration, and the width sizes of the electric circuits J6 may be different between the respective electric circuits J6.

The circuit board A of the present invention has a high-density portion J30 in which the electric circuits J6 are formed densely, and a low-density portion J31 in which the electric circuits J6 are formed sparsely. Here, in the case where the width sizes L of the electric circuits J6 are the same (for example, 5 to 50 μm), it is possible to regard a portion where a distance WH between adjacent electric circuits J6, J6 is 100 μm or less, preferably 70 μm or less, and more preferably 50 μm or less (the lower limit is 5 μm) as the high-density portion J30, and a portion where a distance WL between adjacent electric circuits J6, J6 is 50 μm or greater, preferably 70 μm or greater, and more preferably 100 μm or greater (the upper limit is not particularly limited) as the low-density portion J31. The high-density portion J30 is formed such that the surface of the insulating base substrate J1 and the surfaces of the electric circuits J6 are substantially flat and substantially flush with each other. The low-density portion J31 is formed such that the surface of the insulating base substrate J1 and the surfaces of the electric circuits J6 are substantially flat and substantially flush with each other. Also, the surface of the insulating base substrate J1 in the high-density portion J30 and the surface of the insulating base substrate J1 in the low-density portion J31 are formed so as to be substantially flat and substantially flush with each other, and the surfaces of the electric circuits J6 in the high-density portion J30 and the surfaces of the electric circuits J6 in the low-density portion J31 are formed so as to be substantially flat and substantially flush with each other. That is, the circuit board of the present invention is formed such that the entire surface on the side on which the electric circuits J6 expose are substantially flat, with no depressions such as erosion being present. Note that, it is possible with the circuit board of the present invention that the thickness of the insulating base substrate J1 is entirely the same, and the thicknesses of all electric circuits J6 are the same, but the present invention is not limited to this configuration.

A method for manufacturing a circuit board of the present embodiment includes: a coating film forming step of forming a resin coating film on a surface of an insulating base substrate; a circuit pattern forming step of forming a circuit pattern section by forming recesses having a depth greater than a thickness of the resin coating film with reference to an outer surface of the resin coating film; a catalyst application step of applying a plating catalyst or precursor thereof to a surface of the circuit pattern section and a surface of the resin coating film; a coating film removal step of removing the resin coating film from the insulating base substrate; and a plating treatment step of forming an electroless plating film in a portion in which the plating catalyst or precursor thereof remains after the resin coating film is removed.

FIGS. 27A-27E show schematic cross-sectional views illustrating respective steps of the method for manufacturing a circuit board according to the present invention. First, as shown in FIG. 27A, a resin coating film J2 is formed on the surface of an insulating base substrate J1. This step corresponds to the coating film forming step. Next, as shown in FIG. 27B, a circuit pattern section J32 is formed by forming recesses having a depth greater than the thickness of the resin coating film J2 with respect to the outer surface of the resin coating film J2. The circuit pattern section J32 may have circuit trenches J3 that are formed by recessing into the insulating base substrate J1, and if necessary, the insulating base substrate J1 may be drilled to form through-holes J4 therein as the circuit pattern section J32. The circuit pattern section J32 (the circuit trenches J3 and the through-hole J4) defines the portion in which an electroless plating film is formed by electroless plating, or in other words, the portion in which electric circuits J6 are formed. By this step, the circuit trenches J3 and the through-hole J4 are densely formed in the portion regarded as the high-density portion J30, and the circuit trenches J3 and the through-hole J4 are sparsely formed in the portion regarded as the low-density portion J31. This step corresponds to the circuit pattern forming step.

Next, as shown in FIG. 27C, a plating catalyst or precursor thereof J5 is applied to the bottom surface and side surface of the circuit trenches J3, the inner surface of the through-hole J4 and the surface of the resin coating film J2 in which neither the circuit trenches J3 nor the through-hole J4 are formed. This step corresponds to the catalyst application step.

Next, as shown in FIG. 27D, the resin coating film J2 is removed from the insulating base substrate J1. By doing so, the plating catalyst or precursor thereof J5 can be left only in the surface of the portion, in which the bottom surface and side surface of the circuit trenches J3 and the inner surface of the through-hole J4 are formed, of the insulating base substrate J1. The plating catalyst or precursor thereof J5 applied to the surface of the resin coating film J2, on the other hand, is removed together with the resin coating film J2, while being carried on the resin coating film J2. This step corresponds to the coating film removal step.

Next, an electroless plating is applied to the insulating base substrate J1 from which the resin coating film J2 has been removed. By doing so, an electroless plating layer J6a is formed only in the portion in which the plating catalyst or precursor thereof J5 remains. Specifically as shown in FIG. 27E, the electroless plating layer J6a that will be electric circuits J6 is formed in the portion in which the circuit trenches J3 and the through-hole J4 have been formed. The electric circuit J6 may be made of the electroless plating or a thick film formed by further applying an electroless plating (fill-up plating) to the electroless plating layer J6a. Specifically, for example, as shown in FIG. 27E, the electric circuits J6 made of the electroless plating layer are formed so as to fill the circuit trenches J3 and the entire through-hole J4, thereby removing the level difference between the insulating base substrate J1 and the electric circuits J6. This step corresponds to the plating treatment step.

Through the aforementioned steps, the circuit board A as shown in FIG. 27E is formed. In the circuit board A formed in the manner described above, the electric circuits J6 are formed on the insulating base substrate J1 with high precision.

Hereinafter, each constituent element of the present embodiment will be described.

<Coating Film Forming Step>

As described above, the coating film forming step is a step in which a resin coating film J2 is formed on the surface of an insulating base substrate J1.

(Insulating Base Substrate)

The insulating base substrate J1 used in the coating film forming step is not particularly limited as long as it can be used to produce a circuit board. Specifically, for example, a resin base substrate containing resin can be used.

As the resin, any resin can be used without any particular limitation as long as it can constitute any type of organic substrate that can be used to produce a circuit board. Specific examples include epoxy resin, acrylic resin, polycarbonate resin, polyimide resin, polyphenylene sulfide resin, polyphenylene ether resin, cyanate resin, benzoxazine resin, and bismaleimide resin.

The epoxy resin is not particularly limited as long as it can constitute any type of organic substrate that can be used to produce a circuit board. Specific examples include bisphenol A epoxy resin, bisphenol F epoxy resin, bisphenol S epoxy resin, aralkyl epoxy resin, phenol novolac epoxy resin, alkyl phenol novolac epoxy resin, biphenol epoxy resin, naphthalene epoxy resin, dicyclopentadiene epoxy resin, an epoxidized product of a condensate of phenol and aromatic aldehyde having a phenolic hydroxy group, triglycidyl isocyanurate, and cycloaliphatic epoxy resin. Furthermore, in order to impart flame retardancy, epoxy resin as described above, nitrogen-containing resin, silicone-containing resin or the like that has been brominated or phosphorus-modified can be used. As the epoxy resin, any of the epoxy resins can be used singly or as a combination of two or more.

In the case where the base substrate is made of any of the aforementioned resins, generally, a curing agent is contained to cure the resin. The curing agent is not particularly limited as long as it can be used as a curing agent. Specifically, for example, dicyandiamide, a phenolic curing agent, an anhydride curing agent, an aminotriazine novolac curing agent, cyanate resin or the like can be used. As the phenolic curing agent, for example, a novolac, aralkyl or terpene-type phenolic curing agent can be used. Furthermore, in order to impart flame retardancy, phosphorus-modified phenol resin, phosphorus-modified cyanate resin or the like can be used. As the curing agent, any of the curing agents listed above may be used singly or as a combination of two or more.

Although not particularly limited, because the circuit pattern is formed by laser processing, it is preferable to use a resin having a good laser light absorption coefficient in a wavelength range of 10 to 400 nm. Specifically, for example, polyimide resin can be used.

Also, the insulating base substrate J1 may contain a filler. The filler is not particularly limited, and may be inorganic or organic fine particles. By inclusion of a filler, the filler will be exposed at the laser processed portion, and the adhesion between the plating and the resin can be increased by irregularities formed by the filler. Specific examples of materials for constituting the inorganic fine particles include: high dielectric fillers such as aluminum oxide ($Al_2O_3$), magnesium oxide (MgO), boron nitride (BN), aluminum nitride (AlN), silica ($SiO_2$), barium titanate ($BaTiO_3$) and titanium oxide ($TiO_2$); magnetic fillers such as hard ferrite; inorganic flame retardants such as magnesium hydroxide ($Mg(OH)_2$), aluminum hydroxide ($Al(OH)_2$), antimony trioxide ($Sb_2O_3$), antimony pentoxide ($Sb_2O_5$), guanidine salt, zinc borate, molybdenum compound and zinc stannate; talc ($Mg_3(Si_4O_{10})(OH)_2$), barium sulfate ($BaSO_4$), calcium carbonate ($CaCO_3$), and mica. As the inorganic fine particles, any of the inorganic fine particles listed above may be used singly or as a combination of two or more. The inorganic fine particles listed above have high levels of heat conductivity, relative dielectric constant, flame retardancy, particle size distribution and flexibility in selecting the color, and therefore in order to selectively exhibit a desired function, appropriate blending and particle size design are performed, and thereby a high level of filling can be easily achieved. Although not particularly limited, it is preferable to use a filler having an average particle size that is less than or equal to the thickness of the insulating layer, more preferably, a filler having an average particle size of 0.01 μm to 10 μm, and even more preferably 0.05 μm to 5 μm.

The inorganic fine particles may be surface-treated with a silane coupling agent in order to enhance the dispersibility in the insulating base substrate. The insulating base substrate may contain a silane coupling agent in order to enhance the dispersibility of the inorganic fine particles in the insulating base substrate. Specific examples of the silane coupling agent include epoxy silane, mercapto silane, amino silane, vinyl silane, styryl silane, methacryloxy silane, acryloxy silane and titanate-based silane coupling agents. As the silane coupling agent, any of the silane coupling agents listed above may be used singly or as a combination of two or more.

Also, the insulating base substrate may contain a dispersing agent in order to enhance the dispersibility of the inorganic fine particles in the insulating base substrate. Specific examples of the dispersing agent include alkyl ether, sorbitan ester, alkyl polyether amine, and polymer-based dispersing agents. As the dispersing agent, any of the dispersing agents listed above may be used singly or as a combination of two or more.

A specific example of the organic fine particles can be fine rubber particles.

The form of the insulating base substrate is not particularly limited. Specifically, it may be a sheet, a film, a prepreg, a molded article having a three-dimensional shape, or the like. The thickness of the insulating base substrate J1 is not particularly limited. Specifically, in the case where the insulating base substrate is a sheet, a film or a prepreg, the thickness is preferably, for example, about 10 to 500 μm, and more preferably 20 to 200 μm. The insulating base substrate may contain inorganic fine particles such as silica particles.

(Resin Coating Film)

The resin coating film J2 is not particularly limited as long as it can be removed in the coating film removal step. Specifically, for example, soluble resin that can easily dissolve in an organic solvent or an alkali solution, swellable resin coating film made of resin that can swell with a specific fluid (swelling fluid), which will be described below, or the like can be used. Among them, it is particularly preferable to use the swellable resin coating film because precise removal is easy. The swellable resin coating film preferably has, for example, a degree of swelling in the fluid (swelling fluid) of 50% or greater. As the swellable resin coating film, not only a resin coating film that does not substantially dissolve in the fluid (swelling fluid) and can be easily separated from the surface of the insulating base substrate J1, but also a resin coating film that swells with and at least partially dissolves in the fluid (swelling fluid) and thereby easily separates from the surface of the insulating base substrate J1 and a resin coating film that dissolves in the fluid (swelling fluid), and thereby easily separates from the surface of the insulating base substrate J1 can be used.

The method for forming the resin coating film J2 is not particularly limited. Specific examples include a method in which a fluid material that can form a resin coating film is applied to the surface of the insulating base substrate J1 and then dried, and a method in which a fluid material as described above is applied to a support substrate and dried to form a resin coating film and the resin coating film is transferred to the surface of the insulating base substrate J1. The method for applying the fluid material is not particularly limited. Specifically, for example, a conventionally known spin coating method, a bar coater method or the like can be used.

The resin coating film J2 preferably has a thickness of 10 μm or less, and more preferably 5 μm or less. Also, the resin coating film J2 preferably has a thickness of 0.1 μm or greater, and more preferably 1 μm or greater. In the case where the resin coating film J2 is excessively thick, the precision of the circuit pattern section, including such as a circuit trench and a through-hole, formed by laser processing or machining in the circuit pattern forming step is likely to be low. In the case where the resin coating film J2 is excessively thin, it tends to be difficult to form a resin coating film having a uniform thickness.

Next is a description of an example of a swellable resin coating film suitable as the resin coating film J2.

As the swellable resin coating film, a resin coating film having a degree of swelling in a swelling fluid of 50% or greater can be preferably used. Furthermore, it is more preferable to use a resin coating film having a degree of swelling in a swelling fluid of 100% or greater. In the case where the degree of swelling is excessively low, the swellable resin coating film is likely to be less separable in the coating film removal step.

The method for forming the swellable resin coating film is not particularly limited, and the same method as the method for forming the resin coating film J2 described above can be used. Specific examples include a method in which a fluid material that can form a swellable resin coating film is applied to the surface of the insulating base substrate J1 and then dried, and a method in which a fluid material as described above is applied to a support substrate and dried to form a swellable resin coating film and the swellable resin coating film is transferred to the surface of the insulating base substrate J1.

As the fluid material that can form the swellable resin coating film, for example, an elastomer suspension, emulsion or the like can be used. Specific examples of the elastomer include diene-based elastomers such as styrene-butadiene copolymers, acryl-based elastomers such as acrylic acid ester copolymers, and polyester-based elastomers. With such an elastomer, a swellable resin coating film having a desired degree of swelling can be easily formed by adjusting the degree of crosslinking, the degree of gelation or the like of the elastomer resin particles dispersed as a suspension or emulsion.

As the swellable resin coating film, in particular, it is preferable to use a coating film whose degree of swelling varies depending on the pH of the swelling fluid. In the case where such a coating film is used, by using different fluid conditions in the catalyst application step and in the coating film removal step, the swellable resin coating film can maintain strong adhesion to the insulating base substrate at the pH used in catalyst application step, and the swellable resin coating film can be easily separated at the pH used in the coating film removal step.

More specifically, for example, in the case where the catalyst application step includes a step of treatment in an acidic plating catalyst colloidal solution (acidic colloidal catalyst metal solution) having a pH in the range of 1 to 3, and the coating film removal step includes a step of swelling the swellable resin coating film in an alkaline solution having a pH in the range of 12 to 14, the swellable resin coating film is preferably a resin coating film that has a degree of swelling in the acidic plating catalyst colloidal solution of 60% or less, and more preferably 40% or less, and preferably has a degree of swelling in the alkaline solution of 50% or greater, more preferably 100% or greater, and even more preferably 500% or greater.

Examples of the swellable resin coating film include a sheet made of an elastomer having a specific amount of carboxyl groups, a sheet obtained by entirely curing an alkali-developable photocurable resist used as a dry film resist (hereinafter also referred to as "DFR") for patterning a printed circuit board, a thermosetting sheet and an alkali-developable sheet.

Specific examples of the elastomer having a carboxyl group include elastomers having a carboxyl group within the molecule by inclusion of a monomer unit having the carboxyl group as a copolymerizable component: diene-based elastomers, such as styrene-butadiene copolymers and acryl-based elastomers such as acrylic acid ester copolymers, and polyester-based elastomers. With such an elastomer, a swellable resin coating film having a desired alkali degree of swelling can be formed by adjusting the acid equivalent, the degree of crosslinking, the degree of gelation or the like of the elastomer dispersed as a suspension or emulsion. The carboxyl group in the elastomer has the effect of separating the swellable resin coating film from the surface of the insulating base substrate by swelling the swellable resin coating film with an aqueous alkaline solution. As used herein, "acid equivalent" refers to a polymer weight per equivalent of carboxyl group.

Specific examples of the monomer unit having a carboxyl group include (meth)acrylic acid, fumaric acid, cinnamic acid, crotonic acid, itaconic acid and maleic anhydride.

The carboxyl group content in such an elastomer having a carboxyl group is preferably 100 to 2,000 acid equivalents, and more preferably 100 to 800 acid equivalents. In the case where the acid equivalent is excessively small, it is likely that compatibility with a solvent or other compositions is deteriorated and resistance to a pre-treatment fluid for plating is deteriorated. In the case where the acid equivalent is excessively large, separability in an aqueous alkaline solution is likely to deteriorate.

The molecular weight of the elastomer is preferably 10,000 to 1,000,000, and more preferably 20,000 to 60,000. In the case where the molecular weight of the elastomer is excessively large, separability is likely to deteriorate. In the case where the molecular weight of the elastomer is excessively small, viscosity is likely to deteriorate, as a result of which it will be difficult to maintain a uniform thickness of the swellable resin coating film, and the resistance to the pre-treatment fluid for plating is likely to deteriorate.

Also, as DFR, it is possible to use, for example, a sheet made of a photocurable resin composition containing a photopolymerization initiator and composed of a resin component such as acrylic resin, epoxy resin, styrene resin, phenol resin or urethane resin, containing a specific amount of carboxyl groups. Specific examples of the DFR include sheets obtained by entirely curing a dry film of a photopolymerizable resin composition as disclosed in JP 2000-231190A, JP 2001-201851A and JP H11-212262A, and commercially available alkali-developable DFR such as UFG series manufactured by Asahi Kasei Corporation.

Furthermore, other examples of the resin coating film include resin composed mainly of rosin and containing a carboxyl group (for example, NAZDAR 229 manufactured by Yoshikawa Chemical Co., Ltd.) and resin composed mainly of phenol and containing a carboxyl group (for example, 104F manufactured by LEKTRACHEM Ltd.).

The swellable resin coating film can be easily formed by a method in which a resin suspension or emulsion is applied to the surface of the insulating base substrate by a conventionally known application means such as a spin coating method or bar coater method and dried, or a method in which DFR formed on a support base substrate is attached to the surface of the insulating base substrate by using a vacuum laminator or the like and entirely cured.

In addition to those described above, examples of the resin coating film are as follows. For example, resist materials for constituting the resin coating film include as follows.

Examples of properties required of resist materials for constituting the resin coating film include (1) strong resistance to a fluid (a chemical for forming plating nuclei) for immersion of the insulating base substrate on which the resin coating film has been formed in a catalyst application step, which will be described below, (2) ease of removal of the resin coating film (resist) in a coating film removal step, which will be described below, for example, a step of immersing in an alkali the insulating base substrate on which the resin coating film has been formed, (3) high film formability, (4) ease of dry film (DFR) formation, (5) high storage stability, and like properties.

In the case of an acidic colloidal Pd—Sn catalyst system, which will be described below, examples of the chemical for forming plating nuclei are all aqueous acidic (pH 1 to 2) solutions. In the case of an alkaline Pd ion catalyst system, the catalyst-added activator is weakly alkaline (pH 8 to 12), and others are acidic. Accordingly, for resistance to the chemical for forming plating nuclei, resistance that allows to withstand pH 1 to 11 and preferably pH 1 to 12 is needed. Note that, the phrase "allows to withstand" means that when a sample on which a resist film has been formed is immersed in the chemical, swelling and dissolution of the resist are sufficiently suppressed, thus enabling it to serve as a resist. Generally, the immersion temperature is room temperature to 60° C., the immersion time is 1 to 10 minutes, and the resist film thickness is about 1 to 10 μm, but the present invention is not limited to these ranges.

As an alkali separation chemical for use in the coating film removal step, as will be described below, for example, an aqueous NaOH solution and an aqueous sodium carbonate solution are generally used. It is desirable that the chemical has a pH of 11 to 14 and preferably a pH of 12 to 14, and the resist film can be easily removed therewith. Immersion and spraying treatments are generally performed at an aqueous NaOH solution concentration of about 1 to 10%, the treatment temperature of room temperature to 50° C., and the treatment time of 1 to 10 minutes, but the present invention is not limited to these ranges.

Since the resist is formed on an insulating material, film formability is also important. Uniform film formation is necessary that does not exhibit repelling or the like. Dry-film formation is carried out for simplification of the production process, reduction of material loss, and the like, but film flexibility is necessary to secure handleability. A dry-filmed resist is attached to an insulating material by a laminator (roll, vacuum). The attachment temperature is room temperature to 160° C., and the pressure and the time are suitably selected. Accordingly, tackiness is required at the time of attachment. For this reason, the dry-filmed resist is generally processed to have a three-layer structure, being sandwiched between a carrier film and a cover film while this also serves to prevent grime adhesion, but the present invention is not limited thereto.

Storage stability refers most preferably to storage stability at room temperature, but storage stability under refrigeration and freezing is also necessary. Accordingly, it is necessary to process the dry film so as not to undergo compositional separation or cracking due to impaired flexibility under low temperatures.

The resin coating film may be made of polymer resin obtained by polymerizing (a) at least one carboxylic acid or acid anhydride monomer having at least one polymerizable unsaturated group within the molecule and (b) at least one monomer polymerizable with the monomer (a), or a resin composition containing the polymer resin.

It is possible that the resin composition (the resin composition for the resist material) contains as its essential component the aforementioned polymer resin that serves as a main resin (binder resin) and that at least one of oligomers, monomers, fillers, and other additives is added thereto.

The main resin is preferably a linear polymer having thermoplastic properties. In order to control fluidity, crystallinity, and like properties, grafting may be performed for branching. The molecular weight thereof is a number average molecular weight of about 1,000 to 500,000, and preferably 5,000 to 50,000. An excessively small molecular weight is likely to result in impaired film flexibility and impaired resistance to the chemical for forming plating nuclei (acid resistance). An excessively large molecular weight is likely to result in deteriorated alkali separability and deteriorated attachability in the case of processing into a dry film. Crosslinking points may be introduced for enhancement of resistance to the chemical for forming plating nuclei as well as for thermal deformation suppression at the time of laser processing and fluidity control.

Regarding the composition of the main resin, the main resin can be obtained by polymerizing (a) a carboxylic acid or acid anhydride monomer having at least one polymerizable unsaturated group within the molecule and (b) a monomer polymerizable with the monomer (a). Examples of known techniques include those disclosed in JP H7-281437A, JP 2000-231190A, and JP 2001-201851A. Examples of the monomer (a) include (meth)acrylic acid, fumaric acid, cinnamic acid, crotonic acid, itaconic acid, maleic anhydride, maleic acid half ester, butyl acrylate, and the like, and such monomers may be used singly or as a combination of two or more. An example of the monomer (b) is generally a monomer that is non-acidic and has one polymerizable unsaturated group within the molecule, but the monomer (b) is not limited thereto. The monomer (b) is selected so as to maintain various properties such as resistance in a plating step, flexibility of a cured film, and the like. Specific examples include methyl (meth)acrylate, ethyl(meth)acrylate, iso-propyl(meth)acrylate, n-butyl(meth)acrylate, sec-butyl(meth)acrylate, tert-butyl(meth)acrylate, 2-hydroxyethyl(meth)acrylate, 2-hydroxylpropyl(meth)acrylate, and the like. Other examples include vinyl alcohol esters such as vinyl acetate, (meth)acrylonitrile, styrene or polymerizable styrene derivatives, and the like. Also, the monomer (b) can be obtained by polymerization of only the aforementioned carboxylic acid or acid anhydride having one polymerizable unsaturated group within the molecule. Furthermore, in order to allow a three-dimensional crosslink, it is possible to select a monomer having multiple unsaturated groups as the monomer for use in the polymer and to introduce a reactive functional group such as an epoxy group, a hydroxyl group, an amino group, an amide group, a vinyl group, or the like into the molecular framework. In the case where a carboxyl group is contained in the resin, it is sufficient that the amount of carboxyl group contained in the resin is 100 to 2000 acid equivalents, and preferably 100 to 800 acid equivalents. Here, the term "acid equivalent" refers to the weight of a polymer having 1 equivalent of a carboxyl group therein. In the case where the acid equivalent is excessively low, it is likely that compatibility with a solvent or other compositions is deteriorated or resistance to a pre-treatment fluid for plating is deteriorated. In the case where the acid equivalent is excessively high, separability is likely to deteriorate. The composition ratio of the monomer (a) is 5 to 70 wt %.

Any monomer and oligomer may be used as long as they are resistant to the chemical for forming plating nuclei and easily removable with an alkali. It can be envisaged that they are used as tackifiers in a manner similar to a plasticizer in order to enhance attachment of the dry film (DFR). Moreover, a cross-linking agent to increase various kinds of resistance is added. Specific examples include methyl(meth)acrylate, ethyl(meth)acrylate, iso-propyl(meth)acrylate, n-butyl(meth)acrylate, sec-butyl(meth)acrylate, tert-butyl(meth)acrylate, 2-hydroxyethyl (meth)acrylate, 2-hydroxylpropyl(meth) acrylate, and the like. Other examples include vinyl alcohol esters such as vinyl acetate, (meth)acrylonitrile, styrene or polymerizable styrene derivatives, and the like. Also, the monomer can be obtained by polymerization of only the aforementioned carboxylic acid or acid anhydride having one polymerizable unsaturated group within the molecule. Moreover, a polyfunctional unsaturated compound may also be contained. Any of the aforementioned monomers or oligomers obtained by reacting the monomers may be used. In addition to the aforementioned monomers, it is also possible to contain two or more other photopolymerizable monomers. Examples of such monomers include 1,6-hexanediol di(meth)acrylate, 1,4-cyclohexanediol di(meth)acrylate, polypropyleneglycol di(meth)acrylate, polyethyleneglycol di(meth)acrylate, polyoxyethylenepolyoxypropyleneglycol di(meth)acrylate, and like polyoxyalkyleneglycol di(meth) acrylates, 2-di(p-hydroxyphenyl)propane di(meth)acrylate, glycerol tri(meth)acrylate, dipentaerythritol penta(meth) acrylate, trimethylolpropane triglycidyl ether tri(meth)acrylate, bisphenol A diglycidyl ether tri(meth)acrylate, 2,2-bis (4-methacryloxypentaethoxyphenyl)propane, polyfunctional (meth)acrylates containing a urethane group, and the like. Also, any of the aforementioned monomers or oligomers obtained by reacting the monomers may be used.

Furthermore, a filler may be contained. The filler is not particularly limited, and specific examples include silica, aluminum hydroxide, magnesium hydroxide, calcium carbonate, clay, kaolin, titanium oxide, barium sulfate, alumina, zinc oxide, talc, mica, glass, potassium titanate, wollastonite, magnesium sulfate, aluminum borate, organic fillers, and the like. Since the resist is thin, with its thickness generally being 1 to 10 µm, it is preferable that the size of the filler is also small. Although it is preferable to use a filler that has a small average particle size and from which coarse particles are taken away, it is possible to crush the particles when dispersing or remove coarse particles by filtration.

Examples of other additives include photopolymerizable resins (photopolymerization initiators), polymerization inhibitors, colorants (dyes, pigments, color producing pigments), thermal-polymerization initiators, crosslinking agents such as epoxy and urethane, and the like.

In the printed board processing process, for example, there may be a case where laser processing is used. In the case of laser processing when forming the circuit board A of the present invention, it is necessary to impart laser ablation characteristics to the resist material. Regarding a laser processing machine, for example, a carbon dioxide laser, an excimer laser, a UV-YAG laser, or the like is selected. These laser processing machines have various specific wavelengths, and it is thus possible to enhance productivity by selecting a material that exhibits a large absorption coefficient at such a wavelength. Among them, the UV-YAG laser is suitable for microprocessing, and since the laser wavelength has third-order harmonics at 355 nm and forth-order harmonics at 266 nm, it is desirable that the resist material exhibits a large absorption coefficient at these wavelengths. In contrast, there may be a case where a material that exhibits a somewhat low absorption coefficient is preferable. Specifically, for example, when a resist that exhibits a low UV absorption coefficient is used, UV light passes through the resist, thus making it possible to concentrate energy on processing of the insulating layer that serves as a base. That is, the advantage is different according to the laser light absorption coefficient, and it is thus preferable to use a resist that has a laser light absorption coefficient adjusted according to the situation. It is desirable that the resist material exhibits an absorption coefficient of 50% or greater at these wavelengths.

<Circuit Pattern Forming Step>

The circuit pattern forming step is a step in which a circuit pattern section J32 such as circuit trenches J3 is formed in the insulating base substrate J1. As described above, the circuit pattern section J32 includes not only circuit trenches J3 but also through-holes J4 that extend through the resin coating film J2 and the insulating base substrate J1 in the thickness direction.

A method for forming the circuit pattern section J32 is not particularly limited. A specific example may be a method that performs, from the outer surface side of the resin coating film J2, laser processing, cutting work such as dicing, and machining work such as embossing on the insulating base substrate J1 on which the resin coating film J2 has been formed, to form circuit trenches J3 having a desired shape and depth, or a like method. In the case of forming highly precise fine circuits, it is preferable to use laser processing. According to laser processing, changing a laser output or the like allows liberal adjustment of the cutting depth or the like. For embossing, it is preferable to use embossing with a fine resin die as used in, for example, the field of nano-imprinting.

Also, through-holes J4 for forming via holes or the like may be formed as the circuit pattern section J32.

With this step, the shape of the circuit pattern section such as the shape and depth of the circuit trenches J3 and the diameter and position of the through-holes J4 is defined. In the circuit pattern forming step, it is sufficient to recess the insulating base substrate to a depth greater than or equal to the thickness of the resin coating film J2, that is, the insulating base substrate may be recessed to a depth equal to the thickness of the resin coating film J2 or a depth greater than the thickness of the resin coating film J2. In the case where the insulating base substrate J1 is flat, it is preferable that the insulating base substrate is formed such that a distance RH from the surface on the side opposite the surface of the insulating base substrate J1 in which the circuit trenches J3 are formed to a bottom J3a of the circuit trenches J3 in a high-density portion J30 and a distance RL from the surface on the side opposite the surface of the insulating base substrate J1 in which the circuit trenches J3 are formed to the bottom J3a of the circuit trenches J3 in a low-density portion J31 are formed so as to be the same and satisfy RH=RL. The flat insulating base substrate J1 refers to the insulating base substrate J1 whose upper surface and lower surface are formed flat. The surface of the insulating base substrate J1, in which the circuit trenches J3 are formed, refers to the surface of the insulating base substrate J1, on which the circuit trenches J3 open, and refers to the upper surface of the insulating base substrate J1 in FIGS. 27A-27E. The surface opposite the surface of the insulating base substrate J1, in which the circuit trenches J3 are formed, refers to the surface of the insulating base substrate J1, on which the circuit trenches J3 do not open, and refers to the lower surface of the insulating base substrate J1 in FIGS. 27A-27E.

The width of the circuit pattern section J32 such as circuit trenches J3 formed in the aforementioned circuit pattern forming step is not particularly limited. In the case where laser processing is used, a fine circuit such as one having a line width of 20 μm or less can also be easily formed. In the case where the level difference between the electric circuits J6 and the insulating base substrate J1 is removed by fill-up plating, the depth of the circuit trenches J3 is the same as the size of the thickness of the electric circuits J6.

<Catalyst Application Step>

The catalyst application step is a step of applying a plating catalyst or precursor thereof to the surface of the circuit pattern section such as the circuit trenches J3 and the surface of the resin coating film J2. At this time, in the case where a through-hole J4 is formed, the plating catalyst or precursor thereof is applied also to the inner wall surface of the through-hole J4.

The plating catalyst or precursor thereof J5 is a catalyst applied in order to form an electroless plating film only on a portion where the formation of the electroless plating film by electroless plating in the plating treatment step is desired. As the plating catalyst, catalysts known for use in electroless plating can be used without particular limitations. Also, it is possible that the precursor of the plating catalyst is applied in advance and the plating catalyst is generated after removing the resin coating film. Specific examples of the plating catalyst include metal palladium (Pd), platinum (Pt), silver (Ag), and the like, or precursors and the like that generate such catalysts.

An example of a method for applying the plating catalyst or precursor thereof J5 may be a method that involves treatment under an acidic condition of pH 1 to 3 with an acidic Pd—Sn colloidal solution and then treatment with an acid solution, or a like method. A specific example may be as follows.

First, the surface of the insulating base substrate J1 in which the circuit trenches J3 and the through-hole J4 have been formed is washed for a specific period of time with a warm solution of a surfactant (cleaner/conditioner) to remove oil or the like adhering to the surface. Next, if necessary, soft etching treatment is performed with a sodium persulfate-sulfuric acid-based soft etching agent. Further, acid washing is performed in an acidic solution, such as an aqueous sulfuric acid or an aqueous hydrochloric acid solution, having a pH of 1 to 2. Next, pre-dip treatment for allowing chloride ions to be adsorbed on the surface of the insulating base substrate J1 is performed by immersing the substrate in a pre-dip fluid containing an aqueous stannous chloride solution having a concentration of about 0.1% as a principal component. Thereafter, the substrate is further immersed in an acidic colloidal plating catalyst solution, such as an acidic Pd—Sn colloid, having a pH of 1 to 3 that contains stannous chloride and palladium chloride to cause aggregation and adsorption of Pd and Sn. Then, a redox reaction is caused between adsorbed stannous chloride and palladium chloride ($SnCl_2$+ $PdCl_2 \rightarrow SnCl_4 + Pd\downarrow$). Thereby, metal palladium, which is a plating catalyst, deposits.

As the acidic colloidal plating catalyst solution, a known acidic colloidal Pd—Sn catalyst solution or the like can be used, and a commercially available plating process using an acidic colloidal plating catalyst solution may be used. Such a process is, for example, systematized and commercially distributed by Rohm and Haas Company.

Such catalyst applying treatment enables application of the plating catalyst or precursor thereof J5 to be applied to the surfaces (bottom surface and side surface) of the circuit trenches J3, the inner wall surface of the through-hole J4, and the surface of the resin coating film J2.

<Coating Film Removal Step>

The coating film removal step is a step of removing the resin coating film J2 from the insulating base substrate J1 that has undergone the catalyst application step.

A method for removing the resin coating film J2 is not particularly limited. Specific examples include a method in which the resin coating film J2 is swollen with a specific solution (a swelling fluid) and then the resin coating film J2 is separated from the insulating base substrate J1, a method in which the resin coating film J2 is swollen with and further partially dissolved in a specific solution (a swelling fluid), and then the resin coating film J2 is separated from the insulating base substrate J1, a method in which the resin coating film J2 is dissolved in a specific solution (a swelling fluid), and the like. The swelling fluid is not particularly limited as long as it can swell the resin coating film J2. The aforementioned swelling or dissolution is carried out by, for example, immersing the insulating base substrate J1 that has been coated with the resin coating film J2 in the swelling fluid for a specific period of time. Removal efficiency may be enhanced by ultrasonic irradiation during immersion. When the coating film is separated after being swollen, the coating film may be peeled off with light force.

A case where the aforementioned swellable resin coating film is used as the resin coating film J2 will now be described.

Any fluid (swelling fluid) for swelling the swellable resin coating film J2 can be used without any particular limitation as long as it can swell or dissolve the swellable resin coating film J2 without substantially decomposing or dissolving the insulating base substrate J1 and the plating catalyst or precursor thereof J5. Also, it is preferable to use a fluid that can swell the swellable resin coating film J2 to such an extent that the coating film can be easily separated. Such a swelling fluid is suitably selected according to the kind and the thickness of the swellable resin coating film J2. Specifically, for example, in the case where the swellable resin coating film is formed from an elastomer such as a diene-based elastomer, an acryl-based elastomer, and a polyester-based elastomer; polymer resin obtained from polymerizing (a) at least one carboxylic acid or acid anhydride monomer having at least one polymerizable unsaturated group within the molecule and (b) at least one monomer polymerizable with the monomer (a), or a resin composition containing the polymer resin; or an acrylic resin containing a carboxyl group, for example, an aqueous alkaline solution, such as an aqueous sodium hydroxide solution, having a concentration of about 1 to 10% can be preferably used.

In the case where a plating process including treatment under acidic conditions as described above is used in the catalyst application step, it is preferable that the swellable resin coating film J2 is made of an elastomer having a degree of swelling under acidic conditions of 60% or less, preferably 40% or less, and a degree of swelling under alkaline conditions of 50% or greater such as an diene-based elastomer, an acryl-based elastomer or a polyester-based elastomer, polymer resin obtained by polymerizing (a) at least one carboxylic acid or acid anhydride monomer having at least one polymerizable unsaturated group within the molecule and (b) at least one monomer polymerizable with the monomer (a), or a resin composition containing the polymer resin, or a carboxyl group-containing acrylic resin. Such a swellable resin coating film easily swells and separates with an aqueous alkaline solution having a pH of 12 to 14, for example, an aqueous sodium hydroxide solution having a concentration of about 1 to 10%. In order to enhance separability, ultrasonic irradiation may be performed during immersion. The swellable resin coating film may be peeled off with light force to achieve separation if necessary.

It is preferable that the resin coating film is composed of polymer resin obtained by polymerizing (a) at least one carboxylic acid or acid anhydride monomer having at least one polymerizable unsaturated group within the molecule and (b) at least one monomer polymerizable with the monomer (a), or a resin composition containing the polymer resin. By using such a resin coating film, the resin coating film can be easily formed on the surface of the insulating base substrate. Consequently, a highly precise electric circuit can be more easily formed on the insulating base substrate. Also, such a resin coating film is often capable of dissolving in the fluid used in the coating film removal step, and thus can be effectively used not only for separation-removal but also for dissolution-removal.

As the method for swelling the swellable resin coating film J2, a method can be used in which the insulating base substrate J1 that has been coated with the swellable resin coating film J2 is immersed in the swelling fluid for a specific period of time. In order to enhance separability, it is particularly preferable to perform ultrasonic irradiation during immersion. If the swellable resin coating film is not separated by simply being swollen, the resin coating film may be peeled off with light force if necessary.

<Plating Treatment Step>

The plating treatment step is a step in which electroless plating treatment is performed on the insulating base substrate J1 from which the resin coating film J2 has been removed. In the present invention, electrolytic plating treatment may be performed in place of electroless plating treatment.

A usable method of the electroless plating treatment may be a method in which the insulating base substrate J1 to which the plating catalyst or precursor thereof J5 has been partially applied is immersed in an electroless plating fluid, and an electroless plating layer J6a is deposited only on the portions to which the plating catalyst or precursor thereof J5 has been applied. The electroless plating layer J6a is formed such that the circuit trenches J3 and the through-hole J4 are completely filled therewith, and that the surface of the electroless plating layer J6a does not project out from the surface of the insulating base substrate J1. It is preferable that the electroless plating layer J6a is formed such that a thickness TH of the electroless plating layer J6a in the high-density portion J30 and a thickness TL of the electroless plating layer J6a in the low-density portion J31 are the same, thus satisfying TH=TL. Note that, the thickness of the electroless plating layer J6a refers to the conductor thickness of the electric circuit J6 formed in the circuit board.

Examples of metals for use in electroless plating include copper (Cu), nickel (Ni), cobalt (Co), aluminum (Al), and the like. Among these, plating containing Cu as a principal component is preferable in terms of excellent conductivity. In the case where Ni is contained, such plating is preferable in terms of excellent corrosion resistance and adhesion to solder.

Due to the plating treatment step, electroless plating deposits only on the portions on the surface of the insulating base substrate J1 where the plating catalyst or precursor thereof J5 remains. Accordingly, a conductive layer can be precisely formed only on the portions where formation of the circuit pattern section J32 is desired, while deposition of the electroless plating on the portions where the circuit pattern section J32 is not formed can be suppressed. Accordingly, even in the case where a plurality of fine electric circuits J6 having a narrow line width with a small pitch interval is to be formed, unnecessary plating does not remain between adjacent electric circuits J6, J6. Therefore, the occurrence of short circuiting and migration can be suppressed.

<Desmear Treatment Step>

In the method for producing the circuit board A, after performing the plating treatment step, in particular, before performing or after performing fill-up plating, a desmear treatment step in which desmear treatment is performed may additionally be included. Performing desmear treatment enables removal of unnecessary resin adhering to the electroless plating film. Moreover, in the case of a multi-layer circuit board furnished with the resulting circuit board, it is possible that the portion of the surface of the insulating base substrate where the electroless plating film is not formed is roughened so as to enhance adhesion with the upper layer of the circuit board or the like. Moreover, desmear treatment may be performed on the via-hole bottom. By doing so, unnecessary resin adhering to the via-hole bottom can be removed. The desmear treatment is not particularly limited, and known desmear treatment can be used. A specific example may be a treatment that involves immersion in a permanganate solution or the like.

Hereinbelow, the present invention will now be described in more detail by way of examples. The scope of the present invention, however, should not be understood as being limited to the examples presented below.

EXAMPLES

<Resin Film Forming Step>

A coating film of a styrene-butadiene copolymer (SBR) having a thickness of 2 μm was formed on the surface of epoxy resin base substrate having a thickness of 100 μm ("R1766" manufactured by Panasonic Electric Works Co., Ltd.). Formation of the coating film was carried out by applying a methyl ethyl ketone (MEK) suspension of a styrene-butadiene copolymer (SBR) (manufactured by Zeon Corporation, 800 acid equivalents, particle size of 200 nm, solid content of 15%) to the principal surface of the epoxy resin base substrate, and drying the suspension at 80° C. for 30 minutes.

<Circuit Pattern Forming Step>

Next, a circuit recess having a wiring section having a width of 20 μm and a depth of 30 μm and a pad section having a specific width and depth was formed by performing laser processing on the epoxy resin base substrate on which a coating film had been formed. A MODEL 5330 equipped with a UV-YAG laser manufactured by ESI Japan was used for laser processing. Then, the ten-point average roughness (RzPB) of the bottom surface of the resulting circuit recess of the pad section, and the ten-point average roughness (RzLB) of the bottom surface of the resulting circuit recess of the wiring section were determined to be both (RzPB and RzLB) within the range of 0.01 to 100 μm. The ratio (RzPB/RzLB) of (RzPB) to (RzLB) was determined to be 2 or greater ((RzPB/RzLB)≥2).

<Catalyst Application Step>

Next, the epoxy resin base substrate in which the circuit recess had been formed was immersed in a cleaner-conditioner (a surfactant solution, pH<1: "C/N3320" manufactured by Rohm and Haas Company), and then washed with water. Then, soft etching treatment was carried out with a sodium persulfate-sulfuric acid-based soft etching agent having a pH<1. Then, a pre-dip step was carried out using PD404 (manufactured by Shipley Far East Ltd., pH<1). Then, immersion in "CAT44" (manufactured by Shipley Far East Ltd.), an acidic colloidal Pd—Sn solution having a pH of 1 and containing stannous chloride and palladium chloride allowed palladium that serves as a nucleus of electroless copper plating to be adsorbed in a tin-palladium colloid state on the epoxy resin base substrate. Then, immersion in "ACC19E" (manufactured by Shipley Far East Ltd.), an accelerator chemical having a pH<1 generated a palladium nucleus.

<Coating Film Removal Step>

Next, the epoxy resin base substrate was immersed in a 5% aqueous sodium hydroxide solution having a pH of 14 for 10 minutes while being sonicated. Thereby, the SBR coating film present on the surface swollen and was separated thoroughly. At this time, no fragment whatsoever of the SBR coating film remained on the epoxy resin base substrate surface.

<Plating Step>

Next, the epoxy resin base substrate was immersed in electroless plating fluids (CM328A, CM328L and CM328C, manufactured by Shipley Far East Ltd.) to carry out electroless copper plating treatment. Due to the electroless copper plating treatment, an electroless copper plating film having a thickness of 3 to 5 μm deposited. Observation under an SEM (scanning microscope) of the epoxy base substrate surface-treated with electroless copper plating revealed that an electroless copper plating film was precisely formed in an embedded manner only in the portion where the circuit recess had been formed. Then, the ten-point average roughness (RzPT) of the surface of the resulting electroless copper plating film of the pad section, and the ten-point average roughness (RzLT) of the surface of the resulting electroless copper plating film of the wiring section were determined to be both (RzPT and RzLT) within the range of 0.01 to 100 μm. The ratio (RzPT/RzLT) of (RzPT) to (RzLT) was determined to be 2 or greater ((RzPT/RzLT)≥2). Moreover, the ratio (RzT/RzB) of the ten-point average roughness (RzT) of the surface of the resulting electroless copper plating film to the ten-point average roughness (RzB) of the bottom surface of the circuit recess were determined to be within the range of 1 or greater and 2.0 or less (0.1≤(RzT/RzB)≤2.0).

Example 2

Example 2-1

First, a PET film (TN 100 manufactured by Toyobo Co., Ltd., Ra: 0.05 μm, Rz: 0.8 μm) was laminated on the surface of a base substrate composed of a resin composition containing a bisphenol A epoxy resin (850 S manufactured by DIC Corporation), dicyandiamide as a curing agent (DICY manufactured by Nippon Carbide Industries Co., Inc.), 2-methyl-4-methylimidazole as a curing accelerator (2E4MZ manufactured by Shikoku Chemicals Corporation), silica as an inorganic filler (FB1SDX manufactured by Denki Kagaku Kogyo K.K.), and methyl ethyl ketone (MEK) and N,N-dimethylformamide (DMF) as solvents. Then, the laminate was molded by application of heat and pressure at 0.4 Pa at 100° C. for 1 minute. Thereafter, the laminate was dried by heating at 175° C. for 90 minutes to cure the substrate. Thereafter, the PET film was separated, thus giving an insulating base substrate. Then, the surface roughness of the resulting insulating base substrate was measured under a scanning confocal laser microscope (LEXT OLS3000 manufactured by Olympus Corporation). As a result, Ra was 0.05 μm and Rz was 0.8 μm.

Next, a coating film of a styrene-butadiene copolymer (SBR) (resin coating film) having a thickness of 3 μm was formed on the surface of the insulating base substrate. Formation of the coating film was carried out by applying a methyl ethyl ketone (MEK) suspension of a styrene-butadiene copolymer (SBR) (manufactured by Zeon Corporation, 600 acid equivalents, particle size of 200 nm, solid content of 15%) to the principal surface (smooth surface) of the insulating base substrate, and drying the suspension at 80° C. for 30 minutes. The proportion of the Ra of the insulating base substrate to the thickness of the resin coating film was 1/60, and the Rz of the insulating base substrate was smaller than the thickness of the resin coating film.

Then, a circuit trench having a substantially rectangular cross-section and having a width of 20 μm, a depth of 20 μm, and a length of 30 mm was formed by performing laser processing on the insulating base substrate on which the resin coating film had been formed. A laser light irradiation device equipped with a UV-YAG laser (MODEL 5330 manufactured by ESI Japan) was used for laser processing.

Next, the insulating base substrate in which the circuit trench had been formed was immersed in a cleaner-conditioner (a surfactant solution, pH<1: "C/N 3320" manufactured by Rohm and Haas Company), and then washed with water. Then, soft etching treatment was carried out with a sodium persulfate-sulfuric acid-based soft etching agent having a pH<1. Then, a pre-dip step was carried out using PD404 (manufactured by Shipley Far East Ltd., pH<1). Then, immersion in an acidic colloidal Pd—Sn solution having a pH of 1 and containing stannous chloride and palladium chloride (CAT44 manufactured by Shipley Far East Ltd.) allowed palladium that serves as a nucleus of electroless copper plating (a plating catalyst) to be adsorbed in a tin-palladium colloid state on the insulating base substrate.

Next, immersion in an accelerator chemical having a pH<1 (ACC19E manufactured by Shipley Far East Ltd.) generated a palladium nucleus. Then, the insulating base substrate was immersed in a 5% aqueous sodium hydroxide solution having a pH of 14 for 10 minutes while being sonicated. Thereby, the SBR coating film present on the surface swollen and was separated thoroughly. At this time, no fragment whatsoever of the SBR coating film remained on the insulating base substrate surface. Then, the insulating base substrate was immersed in electroless plating fluids (CM328A, CM328L and CM328C, manufactured by Shipley Far East Ltd.) to carry out electroless copper plating treatment.

Due to the electroless copper plating treatment, a plating layer having a thickness of 5 μm was formed on the circuit trench. Moreover, electroless copper plating treatment (fill-up plating) was carried out until the circuit trench was filled.

The degree of swelling of the swellable resin coating film was determined as follows.

An SBR suspension applied in order to form swellable resin coating film was applied to exfoliate paper and dried at 80° C. for 30 minutes. Thereby, a resin coating film having a thickness of 3 μm was formed. Then, the formed coating film was forcibly separated to give a sample.

Then, about 0.02 g of the resulting sample was weighed. The sample weight at this time was regarded as a pre-swelling weight m(b). Then, the weighed sample was immersed in 10 ml of a 5% aqueous sodium hydroxide solution at 20±2° C. for 15 minutes. Also, another sample was immersed in a similar manner in 10 ml of a 5% aqueous hydrochloric acid solution (pH 1) at 20±2° C. for 15 minutes.

Then, centrifugal separation treatment was carried out at 1000 G for about 10 minutes using a centrifuge to remove moisture and the like adhering to the sample. Then, the weight of the swollen sample after centrifugal separation was measured and regarded as a post-swelling weight m(a). From the resulting pre-swelling weight m(b) and the post-swelling weight m(a), the degree of swelling was calculated using the formula "degree of swelling $SW=(m(a)-m(b))/m(b)\times 100(\%)$". Other conditions were in accordance with JIS L1015 8.27 (a method for measuring degree of alkali swelling).

At this time, the degree of swelling by a 5% aqueous sodium hydroxide solution having a pH of 14 was 750%. In contrast, the degree of swelling by a 5% aqueous hydrochloric acid solution having a pH of 1 was 3%.

Example 2-2

Example 2-2 was carried out in the same manner as in Example 2-1 except that a resin coating film was formed so as to attain a thickness of 7 μm. The proportion of the Ra of the insulating base substrate to the thickness of the resin coating film was 1/140, and the Rz of the insulating base substrate was smaller than the thickness of the resin coating film.

Example 2-3

Example 2-3 was carried out in the same manner as in Example 2-1 except that an insulating base substrate, which will be described below, was used as the insulating base substrate, and a resin coating film was formed so as to attain a thickness of 5 μm.

The insulating base substrate used in Example 2-3 was produced as follows. First, copper foil (JTC manufactured by Nikko Metals Corporation, 12 μm foil) was laminated on the surface of a base substrate composed of a resin composition containing a bisphenol A epoxy resin (850 S manufactured by DIC Corporation), dicyandiamide as a curing agent (DICY manufactured by Nippon Carbide Industries Co., Inc.), 2-methyl-4-methylimidazole as a curing accelerator (2E4MZ manufactured by Shikoku Chemicals Corporation), silica as an inorganic filler (FB1SDX manufactured by Denki Kagaku Kogyo K.K.), and methyl ethyl ketone (MEK) and N,N-dimethylformamide (DMF) as solvents such that the M plane of the copper foil was in contact with the substrate surface. Then, the laminate was molded by application of heat and pressure at 0.4 Pa at 100° C. for 1 minute. Thereafter, the laminate was dried by heating at 175° C. for 90 minutes to cure the substrate. Thereafter, the copper foil was removed by etching, thus giving an insulating base substrate. Then, the surface roughness of the resulting insulating base substrate was measured under a scanning confocal laser microscope (LEXT OLS3000 manufactured by Olympus Corporation). As a result, Ra was 0.4 μm and Rz was 5 μm.

The proportion of the Ra of the insulating base substrate to the thickness of the resin coating film was 0.4/5, and the Rz of the insulating base substrate was comparable to the thickness of the resin coating film.

Comparative Example 2-1

Comparative Example 2-1 was carried out in the same manner as in Example 1 except that an insulating base substrate, which will be described below, was used as the insulating base substrate.

The insulating base substrate used in Comparative Example 2-1 was produced as follows. Cured CCL (R1515T manufactured by Panasonic Electric Works Co., Ltd.) copper foil was removed by etching, thus giving an insulating base substrate. The surface roughness of the resulting insulating base substrate was measured under a scanning confocal laser microscope (LEXT OLS3000 manufactured by Olympus Corporation). As a result, Ra was 0.6 µm and Rz was 7.0 µm.

The proportion of the Ra of the insulating base substrate to the thickness of the resin coating film was 1/5, and the Rz of the insulating base substrate was greater than the thickness of the resin coating film.

Comparative Example 2-2

Comparative Example 2-2 was carried out in the same manner as in Comparative

Example 2-1 except that a resin coating film was formed so as to attain a thickness of 7 µm. The proportion of the Ra of the insulating base substrate to the thickness of the resin coating film was 0.6/7, and the Rz of the insulating base substrate was comparable to the thickness of the resin coating film.

Examples 2-1 to 2-3 and Comparative Examples 2-1 and 2-2 were evaluated as follows.
(Precision of Electric Circuit)
Observation over the entire electric circuit (width of 20 µm and length of 30 mm) formed on an insulating base substrate was carried out using a microscope (KH-7700 manufactured by Hirox Co., Ltd.). Then, the substrate was evaluated using the following criteria: if completely no formation of plating layer was observed on a portion other than the circuit forming portion, the substrate was evaluated as "good"; if a plating layer was formed on two or fewer portions other than the circuit forming portion, the substrate was evaluated as "fair"; and if a plating layer was formed on two or more portions other than the circuit-formed portion, the substrate was evaluated as "poor".

As a result, the circuit boards of Examples 2-1 to 2-3 were evaluated as "good". In contrast, the circuit board of Comparative Example 2-1 was evaluated as "poor", and the circuit board of Comparative Example 2-2 was evaluated as "fair". As can be understood from the results of evaluation above, it was possible to highly precisely form electric circuits with circuit boards obtained by a method for manufacturing a circuit board in which an insulating base substrate having a smooth surface with a surface roughness Ra of 0.5 µm or less is used and a resin coating film is formed on the smooth surface (Examples 2-1 to 2-3). In contrast, it was difficult to highly precisely form electric circuits with circuit boards obtained by a method for manufacturing a circuit board in which an insulating base substrate having a surface with a surface roughness Ra exceeding 0.5 µm is used (Comparative Examples 2-1 and Comparative Example 2-2). It was thus found that, according to Examples 2-1 to 2-3, a circuit board having a highly precise electric circuit can be obtained.

In Comparative Example 2-2, the resin coating film formed on the insulating base substrate surface was thicker than in Comparative Example 2-1. Accordingly, the number of portions where a plating layer was formed other than the circuit forming portion was reduced. However, when the resin coating film formed on the insulating base substrate surface is thick, it tends to be difficult to form circuit trenches and through-holes highly precisely, and such a resin coating film is not preferable. Therefore, according to the present invention, it is possible to form a highly precise electric circuit with which no formation of a plating layer is observed on a portion other than the circuit forming portion even when the thickness of the resin coating film is as small as 2 µm.

Example 3

Example 3-1

A coating film of a styrene-butadiene copolymer (SBR) having a thickness of 2 µm was formed on the surface of epoxy resin base substrate having a thickness of 100 µm (R1766 manufactured by Panasonic Electric Works Co., Ltd.). Formation of the coating film was carried out by applying a methyl ethyl ketone (MEK) suspension of a styrene-butadiene copolymer (SBR) (manufactured by Zeon Corporation, 600 acid equivalents, particle size of 200 nm, solid content of 15%) to the principal surface of the epoxy resin base substrate, and drying the suspension at 80° C. for 30 minutes.

Then, a circuit trench having a substantially rectangular cross-section and having a width of 20 µm and a depth of 30 µm was formed by performing laser processing on the insulating base substrate on which a coating film had been formed. A MODEL 5330 equipped with a UV-YAG laser manufactured by ESI Japan was used for laser processing.

Next, the epoxy resin base substrate in which a trench had been formed was immersed in a cleaner-conditioner (a surfactant solution, pH<1: "C/N 3320" manufactured by Rohm and Haas Company), and then washed with water. Then, soft etching treatment was carried out with a sodium persulfate-sulfuric acid-based soft etching agent having a pH<1. Then, a pre-dip step was carried out using PD404 (manufactured by Shipley Far East Ltd., pH<1). Then, immersion in an acidic colloidal Pd—Sn solution having a pH of 1 and containing stannous chloride and palladium chloride (CAT44, manufactured by Shipley Far East Ltd.) allowed palladium that serves as a nucleus of electroless copper plating to be adsorbed in a tin-palladium colloid state on the epoxy resin base substrate.

Next, immersion in an accelerator chemical having a pH<1 (ACC19E, manufactured by Shipley Far East Ltd.) generated a palladium nucleus. Then, the epoxy resin base substrate was immersed in a 5% aqueous sodium hydroxide solution having a pH of 14 for 10 minutes while being sonicated. Thereby, the SBR coating film present on the surface swollen and was separated thoroughly. At this time, no fragment whatsoever of the SBR coating film remained on the epoxy resin base substrate surface. Then, the epoxy resin base substrate was immersed in electroless plating fluids (CM328A, CM328L and CM328C, manufactured by Shipley Far East Ltd.) to carry out electroless copper plating treatment.

Due to the electroless copper plating treatment, an electroless copper plating film having a thickness of 3 to 5 µm deposited. Observation under an SEM (scanning microscope) of the epoxy base substrate surface-treated with electroless copper plating revealed that an electroless plating film was precisely formed only on the portion where cutting work had been performed.

The degree of swelling of the swellable resin coating film was determined as follows.

An SBR suspension applied in order to form swellable resin coating film was applied to exfoliate paper and dried at 80° C. for 30 minutes. Thereby, a resin coating film having a thickness of 2 μm was formed. Then, the formed coating film was forcibly separated to give a sample.

Then, about 0.02 g of the resulting sample was weighed. The sample weight at this time was regarded as a pre-swelling weight m(b). Then, the weighed sample was immersed in 10 ml of a 5% aqueous sodium hydroxide solution at 20±2° C. for 15 minutes. Also, another sample was immersed in a similar manner in 10 ml of a 5% aqueous hydrochloric acid solution (pH 1) at 20±2° C. for 15 minutes.

Then, centrifugal separation treatment was carried out at 1000 G for about 10 minutes using a centrifuge to remove moisture and the like adhering to the sample. Then, the weight of the swollen sample after centrifugal separation was measured and regarded as a post-swelling weight m(a). From the resulting pre-swelling weight m(b) and the post-swelling weight m(a), the degree of swelling was calculated using the formula "degree of swelling SW=(m(a)−m(b))/m(b)×100(%)". Other conditions were in accordance to JIS L1015 8.27 (a method for measuring degree of alkali swelling).

At this time, the degree of swelling by a 5% aqueous sodium hydroxide solution having a pH of 14 was 750%. In contrast, the degree of swelling by a 5% aqueous hydrochloric acid solution having a pH of 1 was 3%.

Example 3-2

Example 3-2 was carried out in the same manner as in Example 3-1 except that a carboxyl group-containing polymer (manufactured by Zeon Corporation Co., Ltd., 500 acid equivalents, weight average molecular weight of 25000, solid content of 20%) was used in place of a methyl ethyl ketone (MEK) suspension of a styrene-butadiene copolymer (SBR) (manufactured by Zeon Corporation, 600 acid equivalents, particle size of 200 nm, solid content of 15%).

At this time, the degree of swelling by a 5% aqueous sodium hydroxide solution having a pH of 14 was 1000%. In contrast, the degree of swelling by a 5% aqueous hydrochloric acid solution having a pH of 1 was 30%.

As presented above, using the production method according to this embodiment, by separating swellable resin coating film, it is possible to apply a plating catalyst only to the portion on the substrate surface where formation of a circuit is desired. Therefore, an electroless plating film is precisely formed only on the portion to which a plating catalyst has been applied. Moreover, since the swellable resin coating film can be easily separated due to its swelling action, it is also possible to easily and precisely perform a coating film removal step.

Example 4

Example 4-1

A methyl ethyl ketone (MEK) suspension of a styrene-butadiene copolymer (SBR) (manufactured by Zeon Corporation, 600 acid equivalents, particle size of 200 nm, solid content of 15%) was applied to the surface (a portion other than the portion where a circuit pattern section is to be formed) of epoxy resin base substrate having a thickness of 100 μm (R1766 manufactured by Panasonic Electric Works Co., Ltd.) by ink-jet printing so as to attain a specific shape. Thereafter, drying was carried out at 80° C. for 30 minutes.

Accordingly, a styrene-butadiene copolymer (SBR) coating film having a thickness of 2 μm was formed in a specific shape (a portion other than the portion where a circuit pattern section is to be formed). The circuit pattern section had a width of 20 μm.

Next, the epoxy resin base substrate on which the circuit pattern section had been formed was immersed in a cleaner-conditioner (a surfactant solution, pH<1: "C/N3320" manufactured by Rohm and Haas Company), and then washed with water. Then, soft etching treatment was carried out with a sodium persulfate-sulfuric acid-based soft etching agent having a pH<1. Then, a pre-dip step was carried out using PD404 (manufactured by Shipley Far East Ltd., pH<1). Then, immersion in an acidic colloidal Pd—Sn solution having a pH of 1 and containing stannous chloride and palladium chloride (CAT44, manufactured by Shipley Far East Ltd.) allowed palladium that serves as a nucleus of electroless copper plating to be adsorbed in a tin-palladium colloid state on the epoxy resin base substrate.

Next, immersion in an accelerator chemical having a pH<1 (ACC19E, manufactured by Shipley Far East Ltd.) generated a palladium nucleus. Then, the epoxy resin base substrate was immersed in a 5% aqueous sodium hydroxide solution having a pH of 14 for 10 minutes while being sonicated. Thereby, the SBR coating film present on the surface swollen and was separated thoroughly. At this time, no fragment whatsoever of the SBR coating film remained on the epoxy resin base substrate surface. Then, the epoxy substrate was immersed in electroless plating fluids (CM328A, CM328L and CM328C, manufactured by Shipley Far East Ltd.) to carry out electroless copper plating treatment.

Due to the electroless copper plating treatment, an electroless copper plating film having a thickness of 3 to 5 μm deposited. Observation under an SEM (scanning microscope) of the epoxy base substrate surface-treated with electroless copper plating revealed that an electroless plating film was precisely formed only on the portion where cutting work had been performed.

The degree of swelling of the swellable resin coating film was determined as follows.

An SBR suspension applied in order to form swellable resin coating film was applied to exfoliate paper and dried at 80° C. for 30 minutes. Thereby, a resin coating film having a thickness of 2 μm was formed. Then, the formed coating film was forcibly separated to give a sample.

Then, about 0.02 g of the resulting sample was weighed. The sample weight at this time was regarded as a pre-swelling weight m(b). Then, the weighed sample was immersed in 10 ml of a 5% aqueous sodium hydroxide solution at 20±2° C. for 15 minutes. Also, another sample was immersed in a similar manner in 10 ml of a 5% aqueous hydrochloric acid solution (pH 1) at 20±2° C. for 15 minutes.

Then, centrifugal separation treatment was carried out at 1000 G for about 10 minutes using a centrifuge to remove moisture and the like adhering to the sample. Then, the weight of the swollen sample after centrifugal separation was measured and regarded as a post-swelling weight m(a). From the resulting pre-swelling weight m(b) and the post-swelling weight m(a), the degree of swelling was calculated using the formula "degree of swelling SW=(m(a)−m(b))/m(b)×100(%)". Other conditions were in accordance to JIS L1015 8.27 (a method for measuring degree of alkali swelling).

At this time, the degree of swelling by a 5% aqueous sodium hydroxide solution having a pH of 14 was 750%. In contrast, the degree of swelling by a 5% aqueous hydrochloric acid solution having a pH of 1 was 3%.

Example 4-2

Example 4-2 was carried out in the same manner as in Example 1 except that a carboxyl group-containing polymer (manufactured by Zeon Corporation Co., Ltd., 500 acid equivalents, weight average molecular weight of 25000, solid content of 20%) was used in place of a methyl ethyl ketone (MEK) suspension of a styrene-butadiene copolymer (SBR) (manufactured by Zeon Corporation, 600 acid equivalents, particle size of 200 nm, solid content of 15%).

At this time, the degree of swelling by a 5% aqueous sodium hydroxide solution having a pH of 14 was 1000%. In contrast, the degree of swelling by a 5% aqueous hydrochloric acid solution having a pH of 1 was 30%.

As presented above, using the production method according to this embodiment, by separating swellable resin coating film, it is possible to apply a plating catalyst only to the portion on the substrate surface where formation of a circuit is desired. Therefore, an electroless plating film is precisely formed only on the portion to which a plating catalyst has been applied. Moreover, since the swellable resin coating film can be easily separated due to its swelling action, it is also possible to easily and precisely perform a coating film removal step.

Example 5

Example 5-1

A resin coating film I2 of a styrene-butadiene copolymer (SBR) having a thickness of 2 μm was formed on the surface of an insulating epoxy resin base substrate I1 having a thickness of 100 μm (R1766 manufactured by Panasonic Electric Works Co., Ltd.) (see FIG. 24A). Formation of the resin coating film I2 was carried out by applying a methyl ethyl ketone (MEK) suspension of a styrene-butadiene copolymer (SBR) (manufactured by Zeon Corporation, 600 acid equivalents, particle size of 200 nm, solid content of 15%) to the principal surface of the epoxy resin base substrate, and drying the suspension at 80° C. for 30 minutes.

A circuit trench I3 for forming a line section I9, having a width of 20 μm and a depth of 20 μm and a substantially rectangular cross-section, and a circuit trench I3 for forming a pad section I8, having a length of 5000 μm, a width of 5000 μm, and a depth of 30 μm as well as a rectangular shape when planarly viewed and a substantially rectangular cross-section, were formed by performing laser processing on the insulating epoxy resin base substrate I1 on which the resin coating film I2 had been formed (see FIG. 24B). The bottom of each circuit trench I3 was flat. A MODEL 5330 equipped with a UV-YAG laser manufactured by ESI Japan was used for laser processing.

Next, the insulating epoxy resin base substrate I1 in which the circuit trenches I3 had been formed was immersed in a cleaner-conditioner (a surfactant solution, pH<1: "C/N3320" manufactured by Rohm and Haas Company), and then washed with water. Then, soft etching treatment was carried out with a sodium persulfate-sulfuric acid-based soft etching agent having a pH<1. Then, a pre-dip step was carried out using PD404 (manufactured by Shipley Far East Ltd., pH<1). Then, immersion in an acidic colloidal Pd—Sn solution having a pH of 1 and containing stannous chloride and palladium chloride (CAT44, manufactured by Shipley Far East Ltd.) allowed palladium that serves as a nucleus of electroless copper plating to be adsorbed in a tin-palladium colloid state on the insulating epoxy resin base substrate I1.

Then, immersion in an accelerator chemical having a pH<1 (ACC19E, manufactured by Shipley Far East Ltd.) generated a palladium nucleus as a plating catalyst or precursor thereof I5 (see FIG. 24C). Then, the insulating epoxy resin base substrate I1 was immersed in a 5% aqueous sodium hydroxide solution having a pH of 14 for 10 minutes while being sonicated. Thereby, the SBR resin coating film I2 present on the surface swollen and was separated thoroughly (see FIG. 24D). At this time, no fragment whatsoever of the SBR resin coating film I2 remained on the surface of the insulating epoxy resin base substrate I1. Then, the insulating epoxy resin base substrate I1 was immersed in electroless plating fluids (CM328A, CM328L and CM328C, manufactured by Shipley Far East Ltd.) to carry out electroless copper plating treatment.

Electroless copper plating treatment allowed an electroless copper plating film having a thickness of 3 to 5 μm to deposit as an electroless plating film I6, thus making it possible to form the pad section I8 and the line section I9 constituting an electric circuit I7 (see FIG. 24E). Observation under an SEM (scanning microscope) of the surface of the insulating epoxy resin base substrate I1 treated with electroless copper plating revealed that the electroless plating film I6 was precisely formed only on the portion where cutting work had been performed. A circuit board I10 formed as described above was formed such that the electric circuit I7 was embedded in the insulating base substrate I1 so as to expose, and the difference between the thicknesses of the thickest portion and the thinnest portion of the pad section I8 of the electric circuit I7 was 5% relative to the thickness of the thickest portion. The level difference (difference in height) between the outer surface of the insulating base substrate I1 and the surface of an electric circuit I7 (the pad section I8) was 0 to 1.5 μm.

Example 5-2

Example 5-2 was carried out in the same manner as in Example 1 except that a carboxyl group-containing polymer (manufactured by Zeon Corporation Co., Ltd., 500 acid equivalents, weight average molecular weight of 25000, solid content of 20%) was used in place of a methyl ethyl ketone (MEK) suspension of a styrene-butadiene copolymer (SBR) (manufactured by Zeon Corporation, 600 acid equivalents, particle size of 200 nm, solid content of 15%).

At this time, the degree of swelling by a 5% aqueous sodium hydroxide solution having a pH of 14 was 1000%. In contrast, the degree of swelling by a 5% aqueous hydrochloric acid solution having a pH of 1 was 30%.

The degree of swelling of swellable resin coating film I2 was determined as follows.

An SBR suspension applied in order to form the swellable resin coating film I2 was applied to exfoliate paper and dried at 80° C. for 30 minutes. Thereby, the resin coating film I2 having a thickness of 2 μm was formed. Then, the formed resin coating film I2 was forcibly separated to give a sample.

Then, about 0.02 g of the resulting sample was weighed. The sample weight at this time was regarded as a pre-swelling weight m(b). Then, the weighed sample was immersed in 10 ml of a 5% aqueous sodium hydroxide solution at 20±2° C. for 15 minutes. Also, another sample was immersed in a similar manner in 10 ml of a 5% aqueous hydrochloric acid solution (pH 1) at 20±2° C. for 15 minutes.

Then, centrifugal separation treatment was carried out at 1000 G for about 10 minutes using a centrifuge to remove moisture and the like adhering to the sample. Then, the weight of the swollen sample after centrifugal separation was measured and regarded as a post-swelling weight m(a). From the resulting pre-swelling weight m(b) and the post-swelling weight m(a), the degree of swelling was calculated using the formula "degree of swelling $SW=(m(a)-m(b))/m(b)\times 100(\%)$". Other conditions were in accordance to JIS L1015 8.27 (a method for measuring degree of alkali swelling).

At this time, the degree of swelling by a 5% aqueous sodium hydroxide solution having a pH of 14 was 750%. In contrast, the degree of swelling by a 5% aqueous hydrochloric acid solution having a pH of 1 was 3%.

As presented above, by separating the swellable resin coating film I2, it is possible to apply a plating catalyst only to the portion on the surface of an insulating base substrate I1 where formation of a circuit is desired. Therefore, an electroless plating film I6 is precisely formed only on the portion to which the plating catalyst has been applied. Moreover, since the swellable resin coating film I2 can be easily separated due to its swelling action, it is also possible to easily and precisely perform a coating film removal step.

Example 6

Example 6-1

A resin coating film J2 of a styrene-butadiene copolymer (SBR) having a thickness of 2 μm was formed on the surface of an insulating base substrate J1 having a thickness of 100 μm (R1766 manufactured by Panasonic Electric Works Co., Ltd., using epoxy resin). Formation of the resin coating film J2 was carried out by applying a methyl ethyl ketone (MEK) suspension of a styrene-butadiene copolymer (SBR) (manufactured by Zeon Corporation, 600 acid equivalents, particle size of 200 nm, solid content of 15%) to the principal surface of the insulating base substrate J1, and drying the suspension at 80° C. for 30 minutes.

Then, a plurality of circuit trenches J3 having a substantially rectangular cross-section and having a width of 20 μm and a depth of 30 μm were formed by performing laser processing on the insulating base substrate J1 on which the resin coating film J2 had been formed. A MODEL 5330 equipped with a UV-YAG laser manufactured by ESI Japan was used for laser processing.

Next, the insulating base substrate J1 in which the circuit trenches J3 had been formed was immersed in a cleaner-conditioner (a surfactant solution, pH<1: C/N3320 manufactured by Rohm and Haas Company), and then washed with water. Then, soft etching treatment was carried out with a sodium persulfate-sulfuric acid-based soft etching agent having a pH<1. Thereafter, a pre-dip step was carried out using PD404 (manufactured by Shipley Far East Ltd., pH<1). Next, immersion in an acidic colloidal Pd—Sn solution having a pH of 1 and containing stannous chloride and palladium chloride (CAT44 manufactured by Shipley Far East Ltd.) allowed palladium that serves as a nucleus of electroless copper plating to be adsorbed in a tin-palladium colloid state on the bottom surface and the side surface of the insulating base substrate J1 and the surface of the resin coating film J2.

Next, immersion in an accelerator chemical having a pH<1 (ACC19E, manufactured by Shipley Far East Ltd.) generated a palladium nucleus. Then, the insulating base substrate J1 was immersed in a 5% aqueous sodium hydroxide solution having a pH of 14 for 10 minutes while being sonicated. Thereby, the resin coating film (SBR coating film) present on the surface swollen and was separated thoroughly. At this time, no fragment whatsoever of the resin coating film J2 remained on the surface of the insulating base substrate J1.

Then, the insulating base substrate J1 was immersed in electroless plating fluids (CM328A, CM328L and CM328C, manufactured by Shipley Far East Ltd.) to carry out electroless copper plating treatment. Due to the electroless copper plating treatment, an electroless copper plating layer J6a deposited on the circuit trenches J3, thus forming an electric circuit J6. Observation under an SEM (scanning microscope) of the surface of the insulating base substrate J1 treated with electroless copper plating revealed that the electroless plating layer J6a was precisely formed only on the portions where trench forming processing had been performed (circuit trench J3 portions).

Regarding a circuit board A formed in this manner, a line width L of an electric circuit J6 was 20 μm, an interval WH between adjacent electric circuits J6, J6 in a high-density portion J30 was 20 μm, and an interval WL between adjacent electric circuits J6, J6 in a low-density portion J31 was 50000 μm. Depressions that appeared like erosion were not formed in the circuit board A, and the surface of the insulating base substrate J1 and the surface of each electric circuit J6 in the high-density portion J30 and the surface of the insulating base substrate J1 and the surface of each electric circuit J6 in the low-density portion J31 were formed flush with each other.

Then, placing a prepreg over the surface of the circuit board A and then forming an insulating layer by molding by application of heat and pressure made it possible not to cause any pressure reduction, and no laminate thin-spot failure occurred. Also, it was possible not to create a variation in the depth of laser processing in the case where circuits were formed on the surface of the insulating layer, and it was possible not to create a variation in conductor cross-sectional areas (the cross-sectional areas of electric circuits) or to affect the resistance values of the electric circuits. Moreover, since the thickness of the insulating layer was identical between the low-density portion and the high-density portion of the electric circuits, the impedance of the low-density portion and that of the high-density portion of the electric circuits did not vary, thug allowing sufficient room for circuit design.

Example 6-2

Example 6-2 was carried out in the same manner as in Example 6-1 except that a carboxyl group-containing polymer (manufactured by Zeon Corporation Co., Ltd., 500 acid equivalents, weight average molecular weight of 25000, solid content of 20%) was used in place of a methyl ethyl ketone (MEK) suspension of a styrene-butadiene copolymer (SBR) (manufactured by Zeon Corporation, 600 acid equivalents, particle size of 200 nm, solid content of 15%).

At this time, the degree of swelling by a 5% aqueous sodium hydroxide solution having a pH of 14 was 1000%. In contrast, the degree of swelling by a 5% aqueous hydrochloric acid solution having a pH of 1 was 30%.

REFERENCE SIGNS LIST

H1 Insulating Base Substrate
H2 Resin Coating Film
H3 Circuit Recess
H3a Circuit Recess in Wiring Section
H3b Circuit Recess in Pad Section
H4 Plating Catalyst
H5 Conductor
H6 Electric Circuit
H6a Wiring Section
H6b Pad Section
H10 Circuit Board H20 Component
H30 Semiconductor Device
B1, B21 Insulating Base Substrate
B2, B22 Resin Coating Film
B3, B23 Circuit Trench
B4 Through-Hole
B5 Plating Catalyst or Precursor Thereof
B6 Plating Layer (Electric Circuit)
B7 Plating Layer
B10 Circuit Board
B11 Filler
B51 Three-Dimensional Insulating Base Substrate
B60 Circuit Board
C1, C21 Insulating Base Substrate
C2, C22 Resin Coating Film
C3, C23 Circuit Trench
C4 Through-Hole
C5 Plating Catalyst or Precursor Thereof
C6 Electroless Plating Film (Electric Circuit)
C10 Circuit Board
C11 Filler
C51 Three-Dimensional Insulating Base Substrate
C60 Circuit Board
E1 Insulating Base Substrate
E2 Resin Coating Film
E3 Circuit Pattern Section
E4 Through-Hole
E5 Plating Catalyst or Precursor Thereof
E6 Electroless Plating Film (Electric Circuit)
E10, E60 Circuit Board
E12 Resin Coating Film
E31 Discharge Unit
E32 Fluid Layer
E33 Mesh Portion
E34 Screen
E35 Fluid Material
E36 Squeegee
E37 Indentation
E38 Gravure Cylinder
E51 Three-Dimensional Insulating Base Substrate
I1 Insulating Base Substrate
I7 Electric Circuit
I8 Pad Section
A Circuit Board
J1 Insulating Base Substrate
J3 Circuit Trench
J6 Electric Circuit
J30 High-Density Portion
J31 Low-Density Portion

The invention claimed is:

1. A circuit board in which an electric circuit including a wiring section and a pad section is provided on a surface of an insulating base substrate,
    wherein the electric circuit has a configuration in which a conductor is embedded in a circuit recess formed in the surface of the insulating base substrate,
    a surface roughness of the conductor is different in the wiring section and the pad section of the electric circuit,
    fine recesses in a shape of a line, curve, grid, ring, spiral, zig-zag and/or dot are formed in a surface of the conductor in the pad section when planarly viewed, as a result of which the surface roughness of the conductor in the pad section is greater than the surface roughness of the conductor in the wiring section,
    fine recesses in a shape of a line, curve, grid, ring, spiral, zig-zag and/or dot are formed in a bottom surface of the circuit recess in the pad section when planarly viewed, and as a result of the conductor following the shape of the bottom surface of the circuit recess in the pad section, the fine recesses are formed in the surface of the conductor in the pad section, and
    a ratio (RzT/RzB) between a ten-point average roughness (RzT) of a top surface of the conductor and a ten-point average roughness (RzB) of a bottom surface of the circuit recess is 0.1 or greater and 2.0 ($0.1 \leq (RzT/RzB) \leq 2.0$).

2. The circuit board according to claim 1,
    wherein the surface roughness of the conductor in the pad section is greater than the surface roughness of the conductor in the wiring section.

* * * * *